United States Patent
Deng et al.

(10) Patent No.: US 12,421,448 B2
(45) Date of Patent: Sep. 23, 2025

(54) ORGANIC COMPOUND AND ELECTROLUMINESCENCE APPLICATION THEREOF

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Dongyang Deng, Shanghai (CN); Qing Chen, Shanghai (CN); Ying Liu, Shanghai (CN); Lei Zhang, Shanghai (CN)

(73) Assignees: Wuhan Tianma Micro-Electronics Co., Ltd., Wuhan (CN); Wuhan Tianma MicroElectronics Co., Ltd. Shanghai Branch., Shanghai (CN)

( * ) Notice: Subject to any disclaimer, the term of this patent is extended or adjusted under 35 U.S.C. 154(b) by 954 days.

(21) Appl. No.: 17/365,251

(22) Filed: Jul. 1, 2021

(65) Prior Publication Data
US 2022/0328765 A1     Oct. 13, 2022

(30) Foreign Application Priority Data
Apr. 6, 2021 (CN) .......................... 202110367101.2

(51) Int. Cl.
*H01L 51/00* (2006.01)
*C07F 5/02* (2006.01)
(Continued)

(52) U.S. Cl.
CPC ............. *C09K 11/06* (2013.01); *C07F 5/027* (2013.01); *C07F 7/0816* (2013.01);
(Continued)

(58) Field of Classification Search
None
See application file for complete search history.

(56) References Cited

FOREIGN PATENT DOCUMENTS

| CN | 106831817 A | 6/2017 |
|---|---|---|
| CN | 110790782 A | 2/2020 |

(Continued)

OTHER PUBLICATIONS

Machine English translation of Li et al. (WO 2022/042737 A1). Apr. 19, 2024.*

(Continued)

*Primary Examiner* — Jay Yang
(74) *Attorney, Agent, or Firm* — Anova Law Group, PLLC

(57) ABSTRACT

An organic compound, having a structure shown in formula (I), is provided. The organic compound includes:

formula (I)

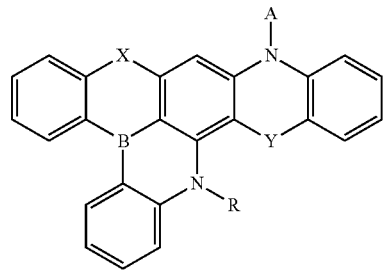

where X and Y are each independently selected from substituted carbon, divalent heteroatom or substituted heteroatom with a valence greater than 2; A and R are each independently selected from hydrogen, deuterium, substituted or unsubstituted C1-C10 alkyl, substituted or unsubstituted C6-C30 aryl, or substituted or unsubstituted C2-C30 heterocyclic; and when one of A and R is hydrogen or deuterium, another of A and R is not
(Continued)

hydrogen or deuterium; and substituents of the substituted carbon, the substituted heteroatom with the valence greater than 2, the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, or substituted and unsubstituted C2~C30 heterocyclic.

16 Claims, 2 Drawing Sheets

(51) Int. Cl.
| | | |
|---|---|---|
| *C07F 7/08* | (2006.01) | |
| *C09K 11/06* | (2006.01) | |
| *H10K 85/30* | (2023.01) | |
| *H10K 85/40* | (2023.01) | |
| *H10K 85/60* | (2023.01) | |
| *H10K 50/11* | (2023.01) | |
| *H10K 50/16* | (2023.01) | |
| *H10K 101/10* | (2023.01) | |
| *H10K 101/20* | (2023.01) | |

(52) U.S. Cl.
CPC ........... *H10K 85/322* (2023.02); *H10K 85/40* (2023.02); *H10K 85/658* (2023.02); *C09K 2211/1018* (2013.01); *H10K 50/11* (2023.02); *H10K 50/16* (2023.02); *H10K 2101/10* (2023.02); *H10K 2101/20* (2023.02)

(56) References Cited

FOREIGN PATENT DOCUMENTS

| | | |
|---|---|---|
| CN | 111018898 A | 4/2020 |
| CN | 112592363 A | 4/2021 |
| CN | 112778343 A | 5/2021 |
| WO | 2021008374 A1 | 1/2021 |
| WO | WO-2022/042737 A1 * | 3/2022 |

OTHER PUBLICATIONS

CAS No. 2098942-23-3.
CAS No. 2468706-54-7.

* cited by examiner

ORGANIC COMPOUND AND ELECTROLUMINESCENCE APPLICATION THEREOF

CROSS-REFERENCE TO RELATED APPLICATION

This application claims the priority of Chinese Patent Application No. 202110367101.2, filed on Apr. 6, 2021, the content of which is incorporated herein by reference in its entirety.

TECHNICAL FIELD

The present disclosure generally relates to the field of organic electroluminescence technology and, more particularly, relates to an organic compound and its electroluminescence application.

BACKGROUND

Due to the advantages of ultra-thin, self-illumination, wide viewing-angle, fast response, high luminous efficiency, desirable temperature adaptability, simple production process, low driving voltage, low energy consumption and the like, OLED devices, as a new generation display technology, have been widely used in industries including flat panel displays, flexible displays, solid-state lighting, automotive displays and the like.

According to light-emitting mechanism, the materials which can be used for an OLED light-emitting layer mainly include four types such as fluorescent materials, phosphorescent materials, triplet-triplet annihilation (TTA) materials, and thermally activated delayed fluorescence (TADF) materials. Fluorescence is the radiation decay transition of singlet excitons. Phosphorescence is the light emitted by the radiation of triplet excitons decayed to the ground state. For the TTA materials, two triplet excitons react to produce a singlet exciton, which returns to the ground state through radiation transition. For the TADF materials, when the energy gap between the $S_1$ state and the $T_1$ state is small and $T_1$ state excitons have a relatively long lifetime, under a certain temperature condition, the $T_1$ state excitons may use reverse intersystem crossing (RISC) to achieve the $T_1 \to S_1$ process, and may decay from the $S_1$ state to the ground state through radiation.

For the TADF materials, when the energy level difference between the singlet excited state and the triplet excited state is relatively small, the reverse intersystem crossing RISC occurs inside the molecule, the T1 state excitons are converted to the $S_1$ state by absorbing environmental heat, 5% triplet excitons and 25% singlet excitons may be used simultaneously, and the theoretical maximum internal quantum yield may reach 100%. Furthermore, the TADF materials are mainly organic compounds, which do not require rare metal elements, have a low production cost, and may also be chemically modified by a variety of manners. However, currently, only limited TADF materials have been developed. Therefore, there is a need to develop new types of TADF materials which can be used in the OLED devices.

SUMMARY

One aspect of the present disclosure provides an organic compound, having a structure shown in formula (I):

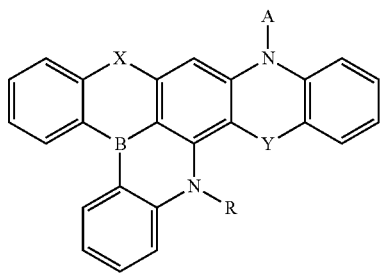

formula (I)

where X and Y are each independently selected from substituted carbon, divalent heteroatom, or substituted heteroatom with a valence greater than 2;

A and R are each independently selected from hydrogen, deuterium, substituted or unsubstituted C1-C10 alkyl, substituted or unsubstituted C6-C30 aryl, or substituted or unsubstituted C2-C30 heterocyclic; and when one of A and R is hydrogen or deuterium, another of A and R is not hydrogen or deuterium; and substituents of the substituted carbon, the substituted heteroatom with the valence greater than 2, the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, or substituted and unsubstituted C2~C30 heterocyclic.

Another aspect of the present disclosure provides a display panel, including an organic light-emitting element. The organic light-emitting element includes an anode, a cathode, and at least one organic compound layer between the anode and the cathode; and the organic compound layer includes an organic compound, having a structure shown in formula (I):

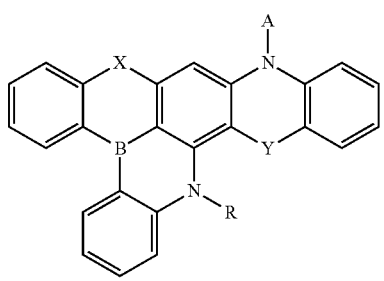

formula (I)

where X and Y are each independently selected from substituted carbon, divalent heteroatom, or substituted heteroatom with a valence greater than 2;

A and R are each independently selected from hydrogen, deuterium, substituted or unsubstituted C1-C10 alkyl, substituted or unsubstituted C6-C30 aryl, or substituted or unsubstituted C2-C30 heterocyclic; and when one of A and R is hydrogen or deuterium, another of A and R is not hydrogen or deuterium; and substituents of the substituted carbon, the substituted heteroatom with the valence greater than 2, the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, or substituted and unsubstituted C2~C30 heterocyclic.

Another aspect of the present disclosure provides a display device including a display panel. The display panel includes an organic light-emitting element; the organic light-emitting element includes an anode, a cathode, and at least one organic compound layer between the anode and the cathode; and the organic compound layer includes an organic compound, having a structure shown in formula (I):

formula (I)

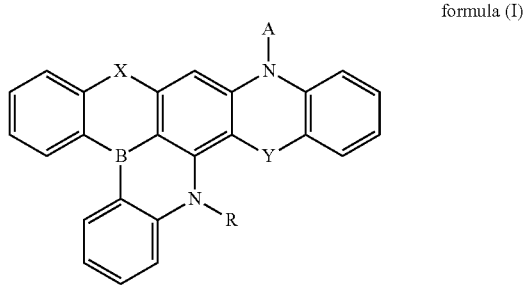

where X and Y are each independently selected from substituted carbon, divalent heteroatom, or substituted heteroatom with a valence greater than 2;

A and R are each independently selected from hydrogen, deuterium, substituted or unsubstituted C1-C10 alkyl, substituted or unsubstituted C6-C30 aryl, or substituted or unsubstituted C2-C30 heterocyclic; and when one of A and R is hydrogen or deuterium, another of A and R is not hydrogen or deuterium; and substituents of the substituted carbon, the substituted heteroatom with the valence greater than 2, the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, or substituted and unsubstituted C2~C30 heterocyclic.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
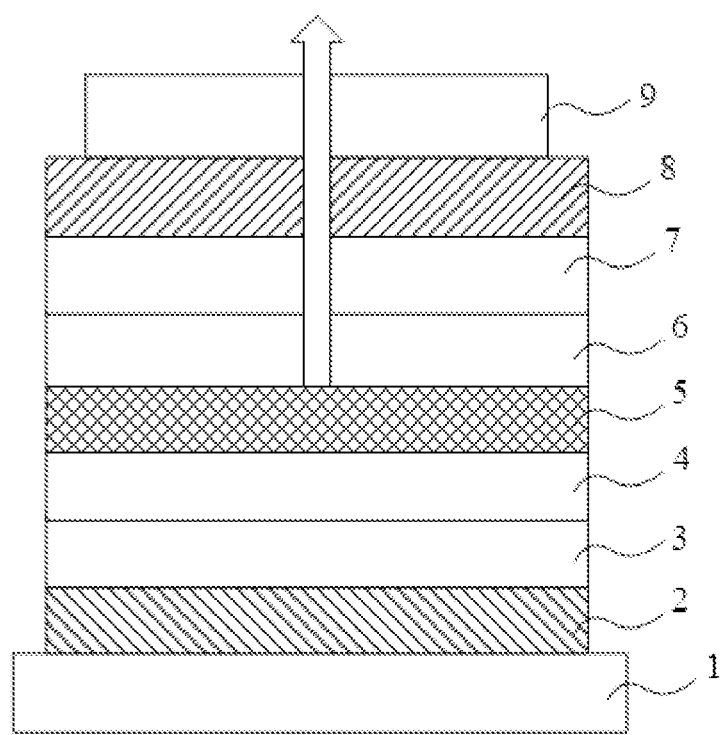
FIG. 1 illustrates a structural schematic of an organic light-emitting element according to various embodiments of the present disclosure.

The technical solutions in various embodiments of the present disclosure are clearly and completely described below in conjunction with various embodiments of the present disclosure. Obviously, the described embodiments are only a part of various embodiments of the present disclosure, rather than all of various embodiments of the present disclosure. Based on various embodiments of the present disclosure, all other embodiments obtained by those skilled in the art without creative work shall fall within the protection scope of the present disclosure.

The present disclosure provides an organic compound having a structure represented by formula (I):

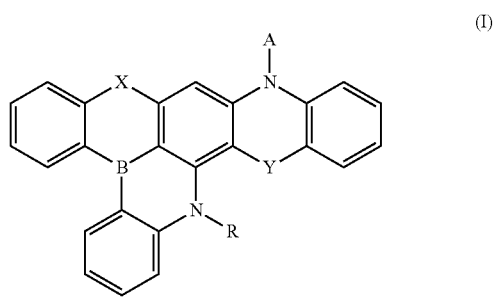

(I)

where, X and Y are each independently selected from substituted carbon, divalent heteroatom or substituted heteroatom with a valence greater than 2, and optionally, are each independently selected from substituted carbon, oxygen, sulfur, substituted nitrogen, substituted boron, or substituted silicon.

A and R are each independently selected from hydrogen, deuterium, substituted or unsubstituted C1-C10 alkyl, substituted or unsubstituted C6-C30 aryl, or substituted or unsubstituted C2-C30 heterocyclic, where when one of A and R is hydrogen or deuterium, another of A and R is not hydrogen or deuterium. Optionally, A and R are each independently selected from hydrogen, deuterium, substituted or unsubstituted C1~C6 alkyl, substituted or unsubstituted C6~C24 aryl, or substituted or unsubstituted C2~24 heterocyclic, where when one of A and R is hydrogen or deuterium, another of A and R is not hydrogen or deuterium. Optionally, A and R are each independently selected from hydrogen, deuterium, substituted or unsubstituted phenyl, substituted or unsubstituted biphenyl, substituted or unsubstituted terphenyl, substituted or unsubstituted tetraphenyl, substituted or unsubstituted naphthyl, substituted or unsubstituted phenanthrenyl, substituted or unsubstituted anthracenyl, substituted or unsubstituted triphenylene, substituted or unsubstituted pyrenyl, substituted or substituted chrysenyl, substituted or unsubstituted fluorenyl, substituted or unsubstituted spirobifluorenyl, substituted or unsubstituted pyrrolyl, substituted or unsubstituted furyl, substituted or unsubstituted thienyl, substituted or unsubstituted indolyl, substituted or unsubstituted benzofuranyl, substituted or unsubstituted benzothienyl, substituted or unsubstituted phenanthrolinyl, substituted or unsubstituted carbazolyl, substituted or unsubstituted dibenzofuranyl, substituted or unsubstituted dibenzothienyl, substituted or unsubstituted fluoranthryl, substituted or unsubstituted indenocarbazolyl, substituted or unsubstituted pyridyl, substituted or unsubstituted pyrimidinyl, substituted or unsubstituted pyrazinyl, substituted or unsubstituted pyridazinyl, substituted or unsubstituted triazinyl, substituted or unsubstituted indolocarbazolyl, substituted or unsubstituted indolobenzofuranyl, substituted or unsubstituted indolobenzothienyl, substituted or unsubstituted benzofuran pyrimidinyl, or substituted or unsubstituted benzothiophene pyrimidinyl. Optionally, A and R are each independently selected from hydrogen, deuterium, phenyl, nitro-substituted phenyl, cyano-substituted phenyl, biphenyl, nitro-substituted biphenyl, cyano-substituted biphenyl, terphenyl, nitro-substituted terphenyl, cyano-substituted terphenyl, tetraphenyl, nitro-substituted tetraphenyl, cyano-substituted tetraphenyl, naphthyl, nitro-substituted naphthyl, cyano-substituted naphthyl, phenanthrenyl, nitro-substituted phenanthrenyl, cyano-substituted phenanthrenyl, anthracenyl, nitro-substituted anthryl, cyano-substituted anthracenyl, triphenylene, nitro-substituted triphenylene, cyano-substituted triphenylene, pyrenyl, nitro-substituted pyrenyl, cyano-substituted pyrenyl, chrysenyl, nitro-substituted chrysenyl, cyano-substituted chrysenyl, fluorenyl, nitro-substituted fluorene, cyano-substituted fluorenyl, spirobifluorenyl, nitro-substituted spirobifluorenyl, cyano-substituted spirobifluorenyl, pyrrolyl, nitro-substituted pyrrolyl, cyano-substituted pyrrolyl, furyl, nitro-substituted furyl, cyano-substituted furyl, thienyl, nitro-substituted thienyl, cyano-substituted thienyl, indolyl, nitro-substituted indolyl, cyano-substituted indolyl, benzofuranyl, nitro-substituted benzofuranyl, cyano-substituted benzofuranyl, benzothienyl, nitro-substituted benzothienyl, cyano-substituted benzothienyl, phenanthrolinyl, nitro-substituted phenanthrolinyl, cyano-substituted phenanthrolinyl, carbazolyl, nitro-substituted carbazolyl, cyano-substituted carbazolyl, dibenzofuranyl, nitro-substituted dibenzofuranyl, cyano-substituted dibenzofuranyl, dibenzothienyl, nitro-substituted dibenzothienyl, cyano-substituted dibenzothienyl, fluoranthryl, nitro-substituted fluoranthryl, cyano-substituted fluoranthryl, indenocarbazolyl, nitro-substituted indenocarbazolyl, cyano-substituted indenocarbazolyl, pyridyl, nitro-substituted pyridyl, cyano-substituted pyridyl, pyrimidinyl, nitro-substituted pyrimidinyl, cyano-substituted pyrimidinyl, pyrazinyl, nitro-substituted pyrazinyl, cyano-substituted pyrazinyl, pyridazinyl, nitro-substituted pyridazinyl azinyl, cyano-substituted pyridazinyl, triazinyl, nitro-substituted triazinyl, cyano-substituted triazinyl, indolocarbazolyl, nitro-substituted indolocarbazolyl, cyano-substituted indolocarbazolyl, indolobenzofuranyl, nitro-substituted indolobenzofuranyl, cyano-substituted indolobenzofuranyl, indolobenzothienyl, nitro-substituted indolobenzothienyl, cyano-substituted indolobenzothienyl, benzofuran pyrimidinyl, nitro-substituted benzofuran pyrimidinyl, cyano-substituted benzofuran pyrimidinyl, benzothiophene pyrimidinyl, nitro-substituted benzothiophene pyrimidinyl, cyano-substituted benzothiophene pyrimidinyl, a group formed by a combination of the above-mentioned groups, or a group formed by fusing the above-mentioned groups.

The substituents of the substituted carbon, the substituted heteroatom with the valence greater than 2, the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, substituted and unsubstituted C2~C30 heterocyclic. Optionally, the substituents of the substituted carbon, the substituted heteroatom with the valence greater than 2, the substituted C1-C10 alkyl, the substituted C6-C30 aryl and the substituted C2-C30 heterocyclic are each independently selected from hydrogen, deuterium, nitro, cyano, substituted or unsubstituted C1~C6 alkyl, substituted or unsubstituted C6~C24 aryl, substituted or unsubstituted C2~24 heterocyclic. Optionally, the substituents of the substituted carbon, the substituted heteroatom with the valence greater than 2, the substituted C1-C10 alkyl, the substituted C6-C30 aryl and the substituted C2-C30 heterocyclic are each independently selected from hydrogen, deuterium, substituted or unsubstituted phenyl, substituted or unsubstituted biphenyl, substituted or unsubstituted terphenyl, substituted or unsubstituted tetraphenyl, substituted or unsubstituted naphthyl, substituted or unsubstituted phenanthrenyl, substituted or unsubstituted anthracenyl, substituted or unsubstituted triphenylene, substituted or unsubstituted pyrenyl, substituted or substituted chrysenyl, substituted or unsubstituted fluorenyl, substituted or unsubstituted spirobifluorenyl, substituted or unsubstituted pyrrolyl, substituted or unsubstituted furyl, substituted or unsubstituted thienyl, substituted or unsubstituted indolyl, substituted or unsubstituted benzofuranyl, substituted or unsubstituted benzothienyl, substituted or unsubstituted phenanthrolinyl, substituted or unsubstituted carbazolyl, substituted or unsubstituted dibenzofuranyl, substituted or unsubstituted dibenzothienyl, substituted or unsubstituted fluoranthryl, substituted or unsubstituted indenocarbazolyl, substituted or unsubstituted pyridyl, substituted or unsubstituted pyrimidinyl, substituted or unsubstituted pyrazinyl, substituted or unsubstituted pyridazinyl, substituted or unsubstituted triazinyl, substituted or unsubstituted indolocarbazolyl, substituted or unsubstituted indolobenzofuranyl, substituted or unsubstituted indolobenzothienyl, substituted or unsubstituted benzofuran pyrimidinyl, or substituted or unsubstituted benzothiophene pyrimidinyl. Optionally, the substituents of the substituted carbon, the substituted heteroatom with the valence greater than 2, the substituted C1-C10 alkyl, the substituted C6-C30 aryl and the substituted C2-C30 heterocyclic are each independently selected from hydrogen, deuterium, phenyl, nitro-substituted phenyl, cyano-substituted phenyl, biphenyl, nitro-substituted biphenyl, cyano-substituted biphenyl, terphenyl, nitro-substituted terphenyl, cyano-substituted terphenyl, tetraphenyl, nitro-substituted tetraphenyl, cyano-substituted tetraphenyl, naphthyl, nitro-substituted naphthyl, cyano-substituted naphthyl, phenanthrenyl, nitro-substituted phenanthrenyl, cyano-substituted phenanthrenyl, anthracenyl, nitro-substituted anthryl, cyano-substituted anthracenyl, triphenylene, nitro-substituted triphenylene, cyano-substituted triphenylene, pyrenyl, nitro-substituted pyrenyl, cyano-substituted pyrenyl, chrysenyl, nitro-substituted chrysenyl, cyano-substituted chrysenyl, fluorenyl, nitro-substituted fluorene, cyano-substituted fluorenyl, spirobifluorenyl, nitro-substituted spirobifluorenyl, cyano-substituted spirobifluorenyl, pyrrolyl, nitro-substituted pyrrolyl, cyano-substituted pyrrolyl, furyl, nitro-substituted furyl, cyano-substituted furyl, thienyl, nitro-substituted thienyl, cyano-substituted thienyl, indolyl, nitro-substituted indolyl, cyano-substituted indolyl, benzofuranyl, nitro-substituted benzofuranyl, cyano-substituted benzofuranyl, benzothienyl, nitro-substituted benzothienyl, cyano-substituted benzothienyl, phenanthrolinyl, nitro-substituted phenanthrolinyl, cyano-substituted phenanthrolinyl, carbazolyl, nitro-substituted carbazolyl, cyano-substituted carbazolyl, dibenzofuranyl, nitro-substituted dibenzofuranyl, cyano-substituted dibenzofuranyl, dibenzothienyl, nitro-substituted dibenzothienyl, cyano-substituted dibenzothienyl, fluoranthryl, nitro-substituted fluoranthryl, cyano-substituted fluoranthryl, indenocarbazolyl, nitro-substituted indenocarbazolyl, cyano-substituted indenocarbazolyl, pyridyl, nitro-substituted pyridyl, cyano-substituted pyridyl, pyrimidinyl, nitro-substituted pyrimidinyl, cyano-substituted pyrimidinyl, pyrazinyl, nitro-substituted pyrazinyl, cyano-substituted pyrazinyl, pyridazinyl, nitro-substituted pyridazinyl azinyl, cyano-substituted pyridazinyl, triazinyl, nitro-substituted triazinyl, cyano-substituted triazinyl, indolocarbazolyl, nitro-substituted indolocarbazolyl, cyano-substituted indolocarbazolyl, indolobenzofuranyl, nitro-substituted indolobenzofuranyl, cyano-substituted indolobenzofuranyl, indolobenzothienyl, nitro-substituted indolobenzothienyl, cyano-substituted indolobenzothienyl, benzofuran pyrimidinyl, nitro-substituted benzofuran pyrimidinyl, cyano-substituted benzofuran pyrimidinyl, benzothiophene pyrimidinyl, nitro-substituted benzothiophene pyrimidinyl, cyano-substituted benzothiophene pyrimidinyl, a group formed by a combination of the above-mentioned groups, or a group formed by fusing the above-mentioned groups.

Optionally, the organic compound may have one of the structures shown in formula (II) to formula (VII):

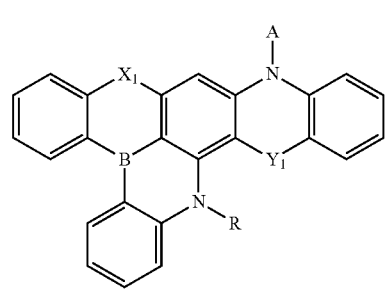

(II)

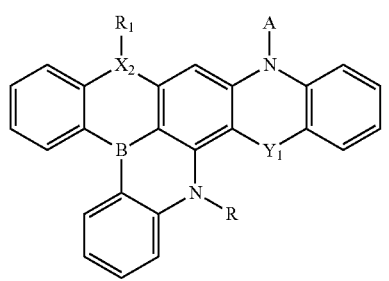

(III)

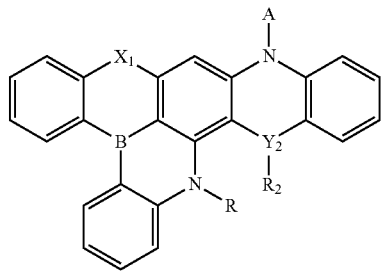

(IV)

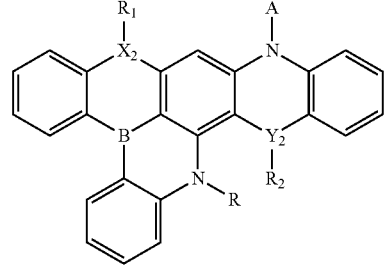

(V)

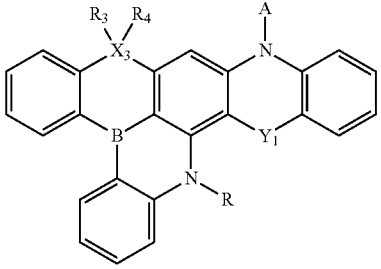

(VI)

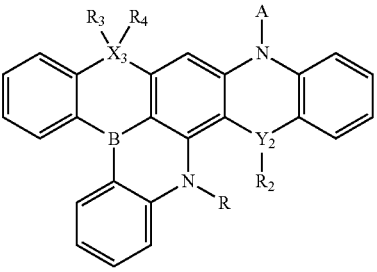

(VII)

where, $X_1$ and $Y_1$ are each independently selected from oxygen or sulfur; $X_2$ and $Y_2$ are each independently selected from nitrogen or boron; and $X_3$ is carbon or silicon. A and R are each independently selected from hydrogen, deuterium, substituted or unsubstituted C1-C10 alkyl, substituted or unsubstituted C6-C30 aryl, or substituted or unsubstituted C2-C30 heterocyclic, where when one of A and R is hydrogen or deuterium, another of A and R is not hydrogen or deuterium. Optionally, A and R are each independently selected from hydrogen, deuterium, substituted or unsubstituted C1~C6 alkyl, substituted or unsubstituted C6~C24 aryl, or substituted or unsubstituted C2~24 heterocyclic, where when one of A and R is hydrogen or deuterium, another of A and R is not hydrogen or deuterium. Optionally, A and R are each independently selected from hydrogen, deuterium, substituted or unsubstituted phenyl, substituted or unsubstituted biphenyl, substituted or unsubstituted terphenyl, substituted or unsubstituted tetraphenyl, substituted or unsubstituted naphthyl, substituted or unsubstituted phenanthrenyl, substituted or unsubstituted anthracenyl, substituted or unsubstituted triphenylene, substituted or unsubstituted pyrenyl, substituted or substituted chrysenyl, substituted or unsubstituted fluorenyl, substituted or unsubstituted spirobifluorenyl, substituted or unsubstituted pyrrolyl, substituted or unsubstituted furyl, substituted or unsubstituted thienyl, substituted or unsubstituted indolyl, substituted or unsubstituted benzofuranyl, substituted or unsubstituted benzothienyl, substituted or unsubstituted phenanthrolinyl, substituted or unsubstituted carbazolyl, substituted or unsubstituted dibenzofuranyl, substituted or unsubstituted dibenzothienyl, substituted or unsubstituted fluoranthryl, substituted or unsubstituted indenocarbazolyl, substituted or unsubstituted pyridyl, substituted or unsubstituted pyrimidinyl, substituted or unsubstituted pyrazinyl, substituted or unsubstituted pyridazinyl, substituted or unsubstituted triazinyl, substituted or unsubstituted indolocarbazolyl, substituted or unsubstituted indolobenzofuranyl, substituted or unsubstituted indolobenzothienyl, substituted or unsubstituted benzofuran pyrimidinyl, or substituted or unsubstituted benzothiophene pyrimidinyl. Optionally, A and R are each independently selected from hydrogen, deuterium, phenyl, nitro-substituted phenyl, cyano-substituted phenyl, biphenyl, nitro-substituted biphenyl, cyano-substituted biphenyl, terphenyl, nitro-substituted terphenyl, cyano-substituted terphenyl, tetraphenyl, nitro-substituted tetraphenyl, cyano-substituted tetraphenyl, naphthyl, nitro-substituted naphthyl, cyano-substituted naphthyl, phenanthrenyl, nitro-substituted phenanthrenyl, cyano-substituted phenanthrenyl, anthracenyl, nitro-substituted anthryl, cyano-substituted anthracenyl, triphenylene, nitro-substituted triphenylene, cyano-substituted triphenylene, pyrenyl, nitro-substituted pyrenyl, cyano-substituted pyrenyl, chrysenyl, nitro-substituted chrysenyl, cyano-substituted chrysenyl, fluorenyl, nitro-substituted fluorene, cyano-substituted fluorenyl, spirobifluorenyl, nitro-substituted spirobifluorenyl, cyano-substituted spirobifluorenyl, pyrrolyl, nitro-substituted pyrrolyl, cyano-substituted pyrrolyl, furyl, nitro-substituted furyl, cyano-substituted furyl, thienyl, nitro-substituted thienyl, cyano-substituted thienyl, indolyl, nitro-substituted indolyl, cyano-substituted indolyl, benzofuranyl, nitro-substituted benzofuranyl, cyano-substituted benzofuranyl, benzothienyl, nitro-substituted benzothienyl, cyano-substituted benzothienyl, phenanthrolinyl, nitro-substituted phenanthrolinyl, cyano-substituted phenanthrolinyl, carbazolyl, nitro-substituted carbazolyl, cyano-substituted carbazolyl, dibenzofuranyl, nitro-substituted dibenzofuranyl, cyano-substituted dibenzofuranyl, dibenzothienyl, nitro-substituted dibenzothienyl, cyano-substituted dibenzothienyl, fluoranthryl, nitro-substituted fluoranthryl, cyano-substituted fluoranthryl, indenocarbazolyl, nitro-substituted indenocarbazolyl, cyano-substituted indenocarbazolyl, pyridyl, nitro-substituted pyridyl, cyano-substituted pyridyl, pyrimidinyl, nitro-substituted pyrimidinyl, cyano-substituted pyrimidinyl, pyrazinyl, nitro-substituted pyrazinyl, cyano-substituted pyrazinyl, pyridazinyl, nitro-substituted pyridazinyl azinyl, cyano-substituted pyridazinyl, triazinyl, nitro-substituted triazinyl, cyano-substituted triazinyl, indolocarbazolyl, nitro-substituted indolocarbazolyl, cyano-substituted indolocarbazolyl, indolobenzofuranyl, nitro-substituted indolobenzofuranyl, cyano-substituted indolobenzofuranyl, indolobenzothienyl, nitro-substituted indolobenzothienyl, cyano-substituted indolobenzothienyl, benzofuran pyrimidinyl, nitro-substituted benzofuran pyrimidinyl, cyano-substituted benzofuran pyrimidinyl, benzothiophene pyrimidinyl, nitro-substituted benzothiophene pyrimidinyl, cyano-substituted benzothiophene pyrimidinyl, a group formed by a combination of the above-mentioned groups, or a group formed by fusing the above-mentioned groups.

$R_1$ to $R_4$ are each independently selected from substituted or unsubstituted C1-C10 alkyl, substituted or unsubstituted C6-C30 aryl, substituted or unsubstituted C2-C30 heterocyclic. Optionally, $R_1$ to $R_4$ are each independently selected from substituted or unsubstituted C1-C6 alkyl, substituted or unsubstituted C6-C24 aryl, substituted or unsubstituted C2-C24 heterocyclic. Optionally, $R_1$ to $R_4$ are each independently selected from substituted or unsubstituted phenyl, substituted or unsubstituted biphenyl, substituted or unsubstituted terphenyl, substituted or unsubstituted tetraphenyl, substituted or unsubstituted naphthyl, substituted or unsubstituted phenanthrenyl, substituted or unsubstituted anthracenyl, substituted or unsubstituted triphenylene, substituted or unsubstituted pyrenyl, substituted or substituted chrysenyl, substituted or unsubstituted fluorenyl, substituted or unsubstituted spirobifluorenyl, substituted or unsubstituted pyrrolyl, substituted or unsubstituted furyl, substituted or unsubstituted thienyl, substituted or unsubstituted indolyl, substituted or unsubstituted benzofuranyl, substituted or unsubstituted benzothienyl, substituted or unsubstituted phenanthrolinyl, substituted or unsubstituted carbazolyl, substituted or unsubstituted dibenzofuranyl, substituted or unsubstituted dibenzothienyl, substituted or unsubstituted fluoranthryl, substituted or unsubstituted indenocarbazolyl, substituted or unsubstituted pyridyl, substituted or unsubstituted pyrimidinyl, substituted or unsubstituted pyrazinyl, substituted or unsubstituted pyridazinyl, substituted or unsubstituted triazinyl, substituted or unsubstituted indolocarbazolyl, substituted or unsubstituted indolobenzofuranyl, substituted or unsubstituted indolobenzothienyl, substituted or unsubstituted benzofuran pyrimidinyl, or substituted or unsubstituted benzothiophene pyrimidinyl. Optionally, $R_1$ to $R_4$ are each independently selected from phenyl, nitro-substituted phenyl, cyano-substituted phenyl, biphenyl, nitro-substituted biphenyl, cyano-substituted biphenyl, terphenyl, nitro-substituted terphenyl, cyano-substituted terphenyl, tetraphenyl, nitro-substituted tetraphenyl, cyano-substituted tetraphenyl, naphthyl, nitro-substituted naphthyl, cyano-substituted naphthyl, phenanthrenyl, nitro-substituted phenanthrenyl, cyano-substituted phenanthrenyl, anthracenyl, nitro-substituted anthryl, cyano-substituted anthracenyl, triphenylene, nitro-substituted triphenylene, cyano-substituted triphenylene, pyrenyl, nitro-substituted pyrenyl, cyano-substituted pyrenyl, chrysenyl, nitro-substituted chrysenyl, cyano-substituted chrysenyl, fluorenyl, nitro-substituted fluorene, cyano-substituted fluorenyl, spirobifluorenyl, nitro-substituted spirobifluorenyl, cyano-substituted spirobifluorenyl, pyrrolyl, nitro-substituted pyrrolyl, cyano-substituted pyrrolyl, furyl, nitro-substituted furyl, cyano-substituted furyl, thienyl, nitro-substituted thienyl, cyano-substituted thienyl, indolyl, nitro-substituted indolyl, cyano-substituted indolyl, benzofuranyl, nitro-substituted benzofuranyl, cyano-substituted benzofuranyl, benzothienyl, nitro-substituted benzothienyl, cyano-substituted benzothienyl, phenanthrolinyl, nitro-substituted phenanthrolinyl, cyano-substituted phenanthrolinyl, carbazolyl, nitro-substituted carbazolyl, cyano-substituted carbazolyl, dibenzofuranyl, nitro-substituted dibenzofuranyl, cyano-substituted dibenzofuranyl, dibenzothienyl, nitro-substituted dibenzothienyl, cyano-substituted dibenzothienyl, fluoranthryl, nitro-substituted fluoranthryl, cyano-substituted fluoranthryl, indenocarbazolyl, nitro-substituted indenocarbazolyl, cyano-substituted indenocarbazolyl, pyridyl, nitro-substituted pyridyl, cyano-substituted pyridyl, pyrimidinyl, nitro-substituted pyrimidinyl, cyano-substituted pyrimidinyl, pyrazinyl, nitro-substituted pyrazinyl, cyano-substituted pyrazinyl, pyridazinyl, nitro-substituted pyridazinyl azinyl, cyano-substituted pyridazinyl, triazinyl, nitro-substituted triazinyl, cyano-substituted triazinyl, indolocarbazolyl, nitro-substituted indolocarbazolyl, cyano-substituted indolocarbazolyl, indolobenzofuranyl, nitro-substituted indolobenzofuranyl, cyano-substituted indolobenzofuranyl, indolobenzothienyl, nitro-substituted indolobenzothienyl, cyano-substituted indolobenzothienyl, benzofuran pyrimidinyl, nitro-substituted benzofuran pyrimidinyl, cyano-substituted benzofuran pyrimidinyl, benzothiophene pyrimidinyl, nitro-substituted benzothiophene pyrimidinyl, cyano-substituted benzothiophene pyrimidinyl, a group formed by a combination of the above-mentioned groups, or a group formed by fusing the above-mentioned groups.

Furthermore, optionally, in the organic compound provided by the present disclosure, the X and Y may be same or different.

When both X and Y are divalent heteroatoms, such as both oxygen atoms or both sulfur atoms, the organic compound may have any one of the structures shown in formula (001) to formula (038):

001
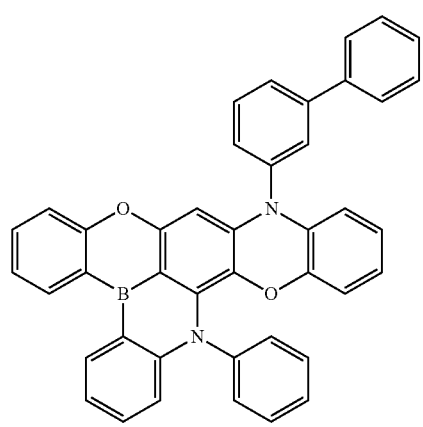

002
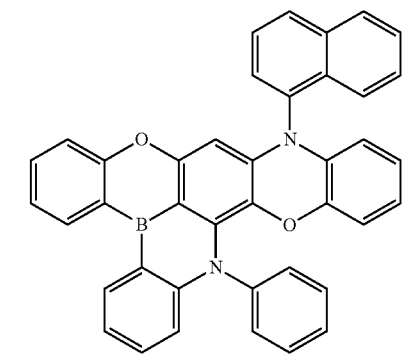

003
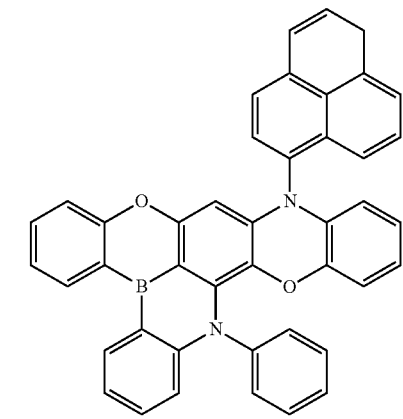

004
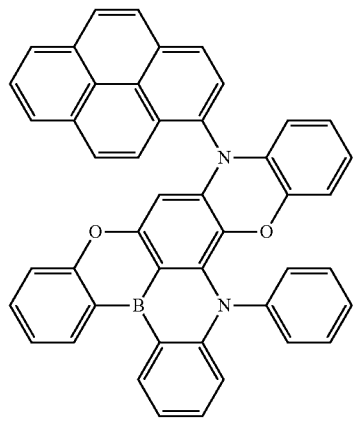

005
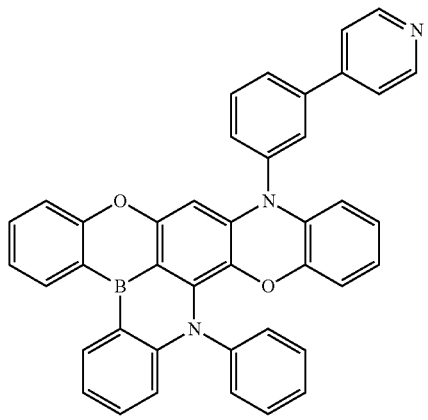

006
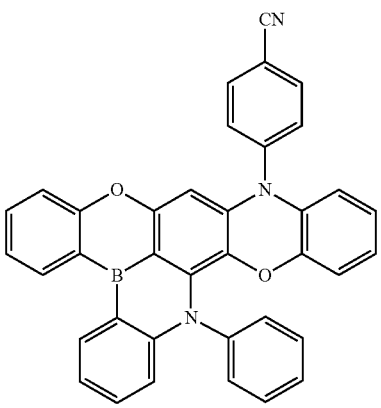

007
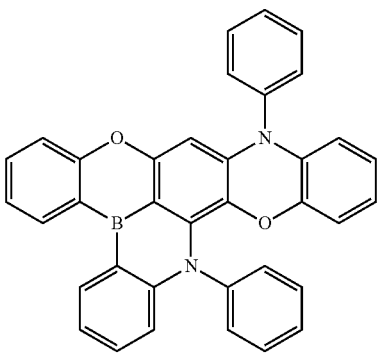

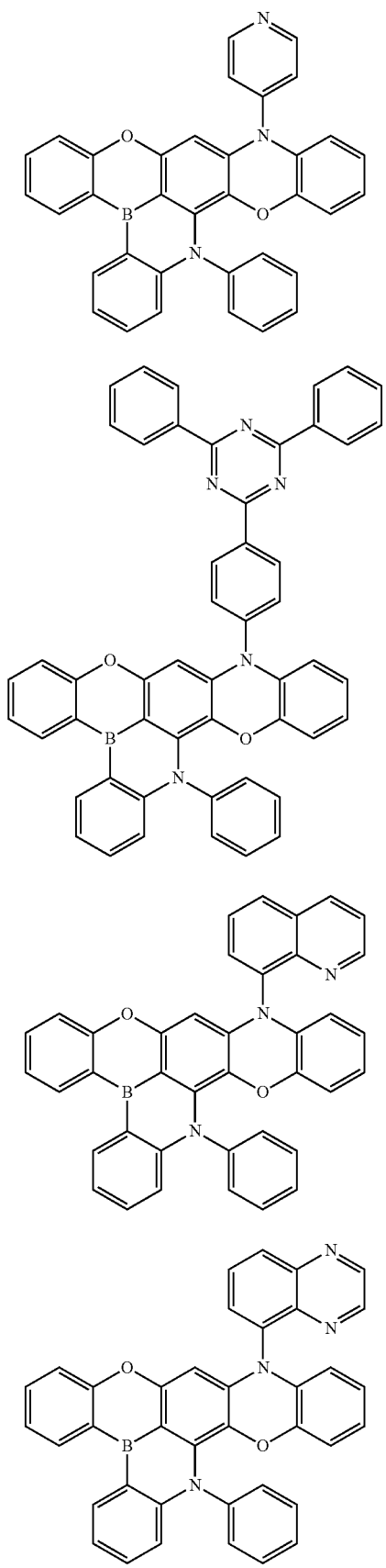
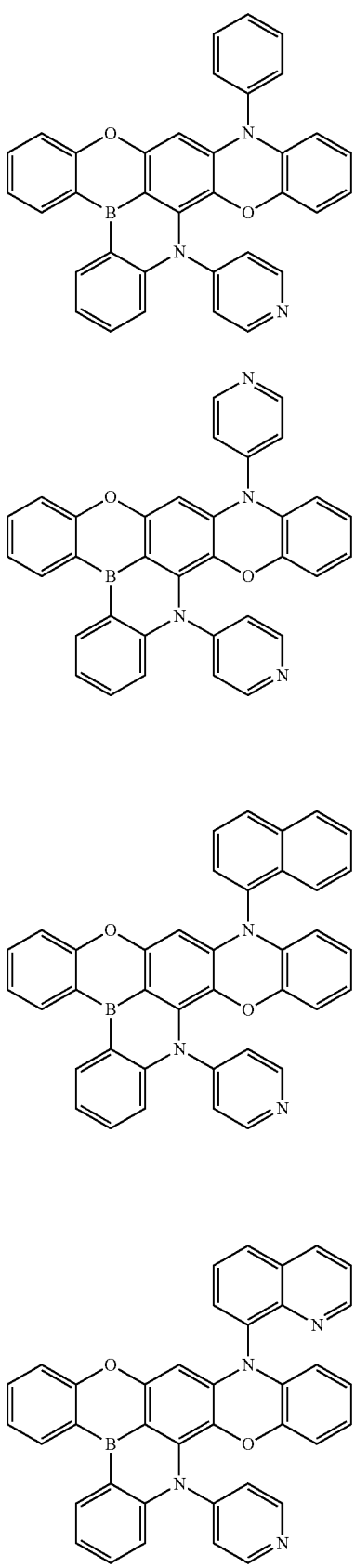

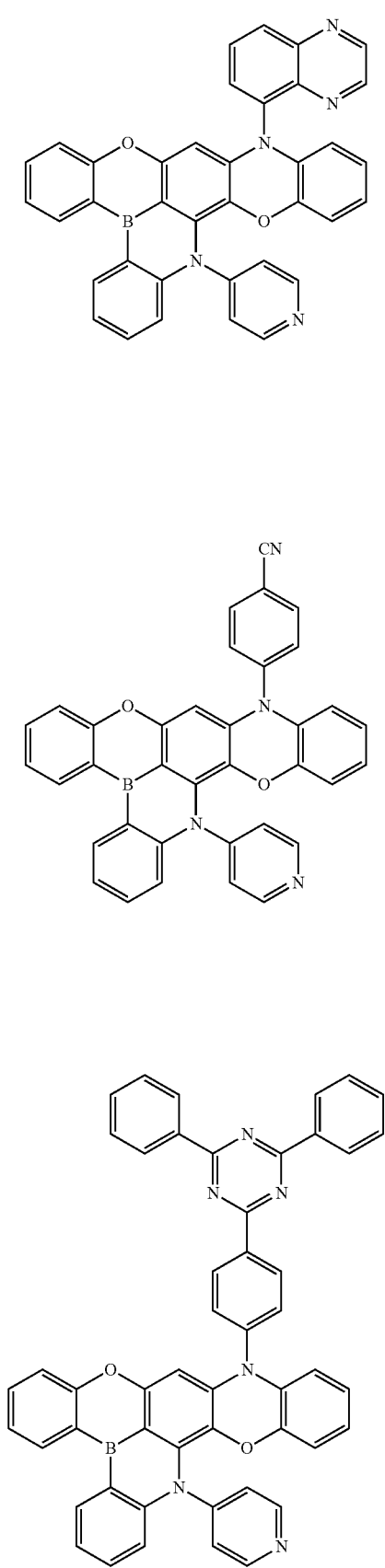

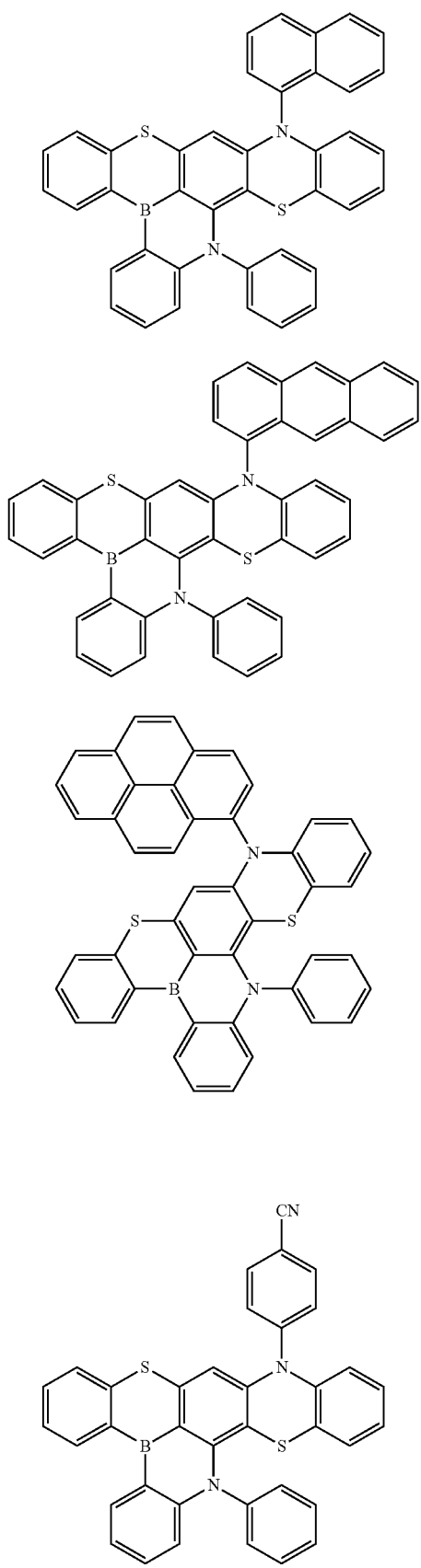
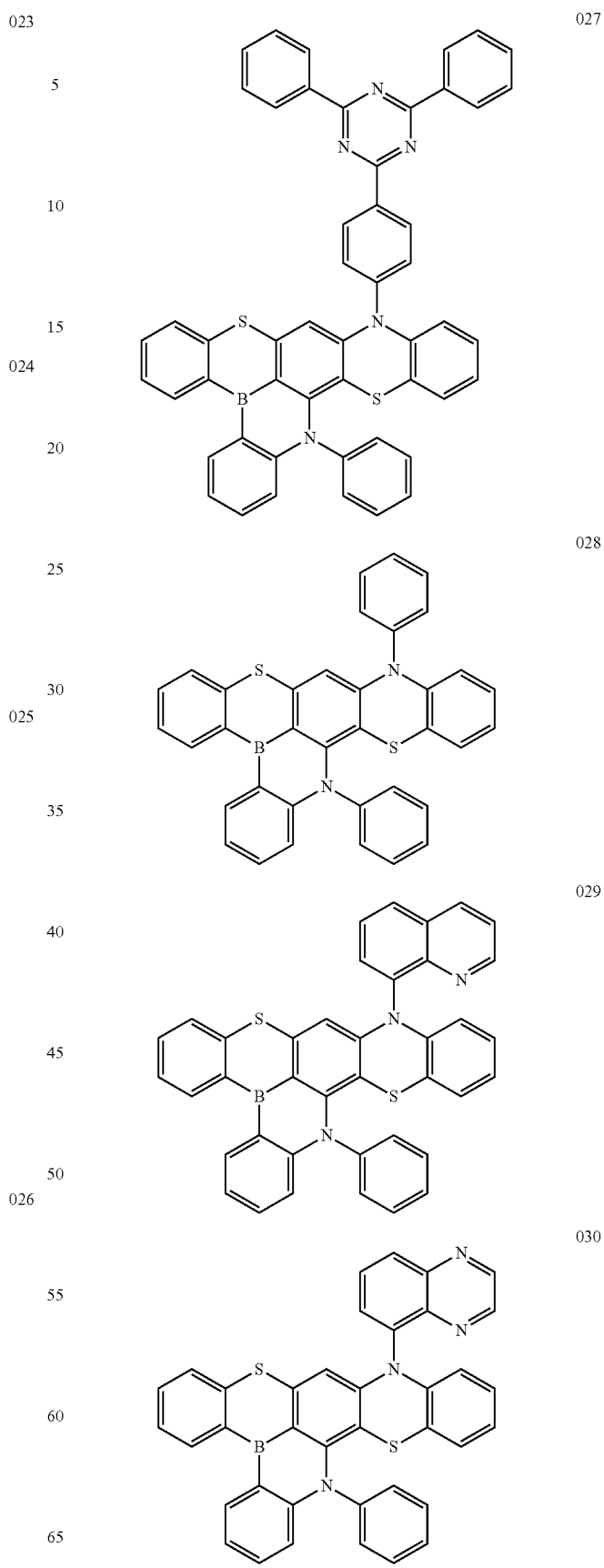

-continued
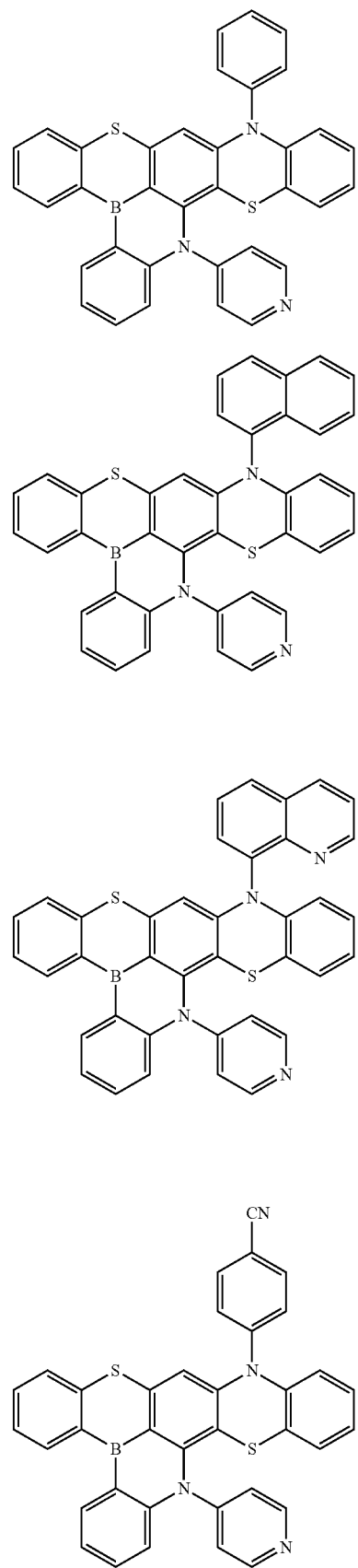
031
032
033
034
-continued
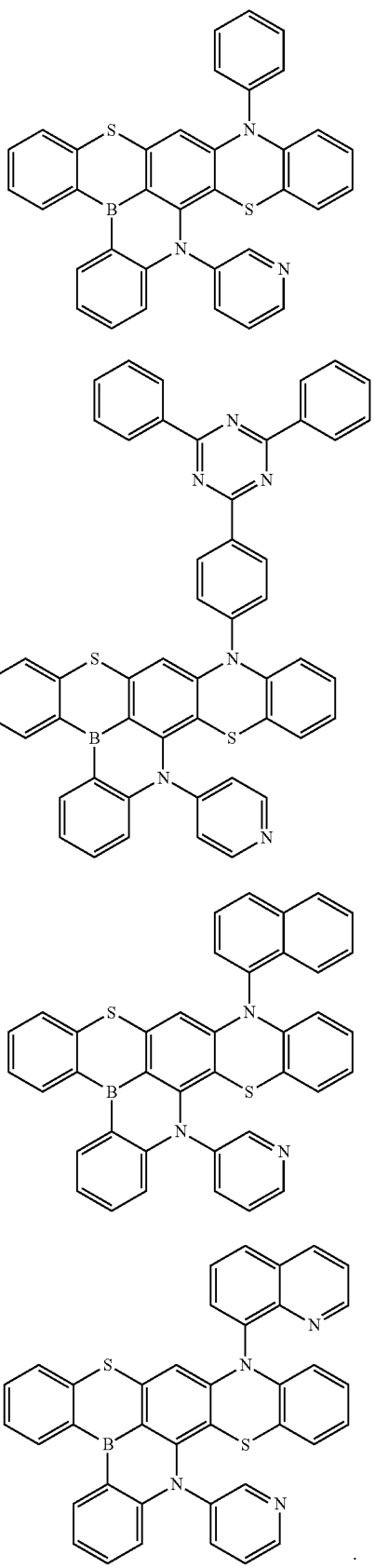
035
036
037
038

When X or Y are different divalent heteroatoms, if one of X and Y is an oxygen atom and another one of X and Y is a sulfur atom, the organic compound may have any one of the structures shown in formula (039) to formula (074):
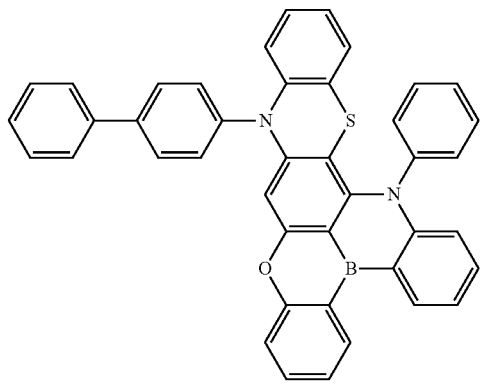
039
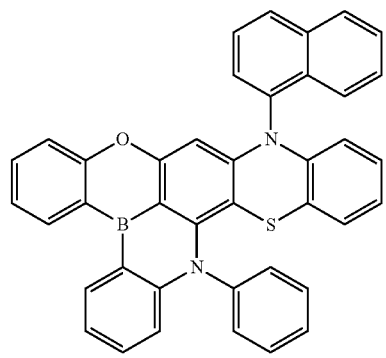
040
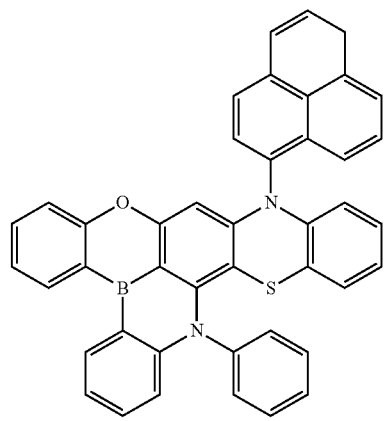
041
-continued
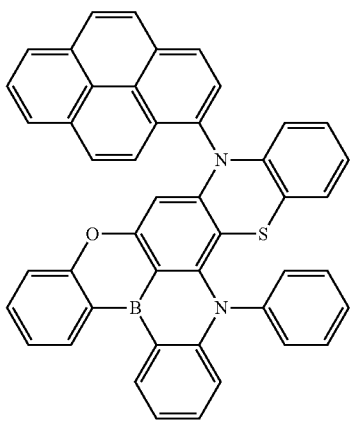
042
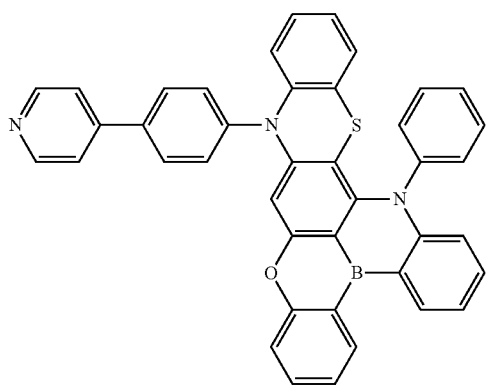
043
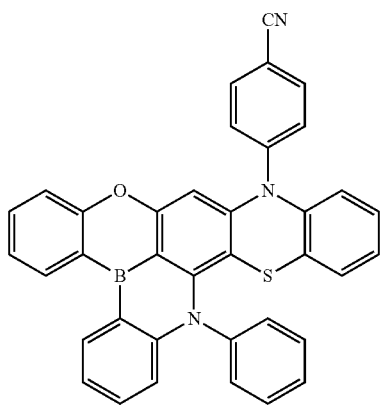
044

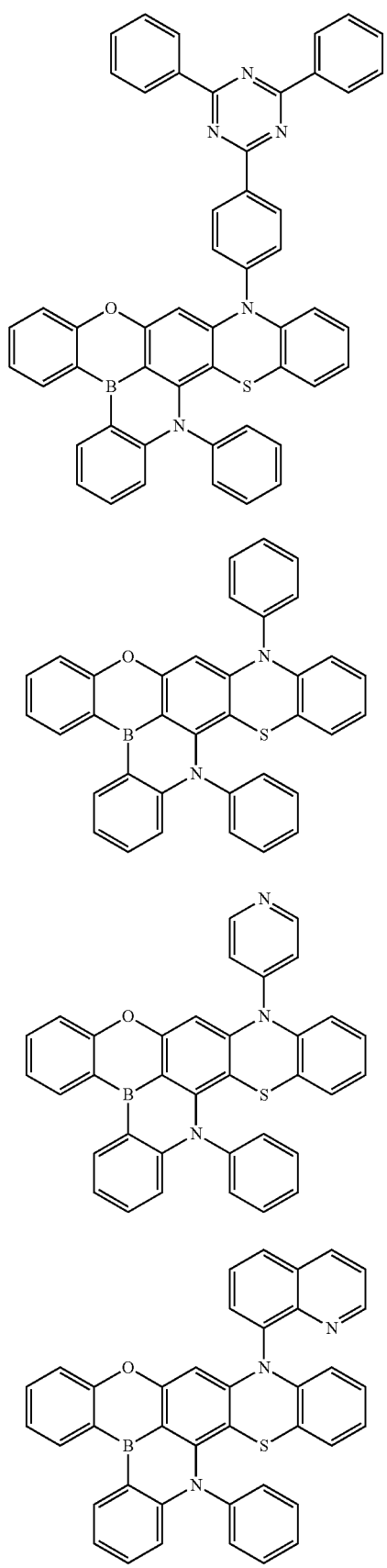
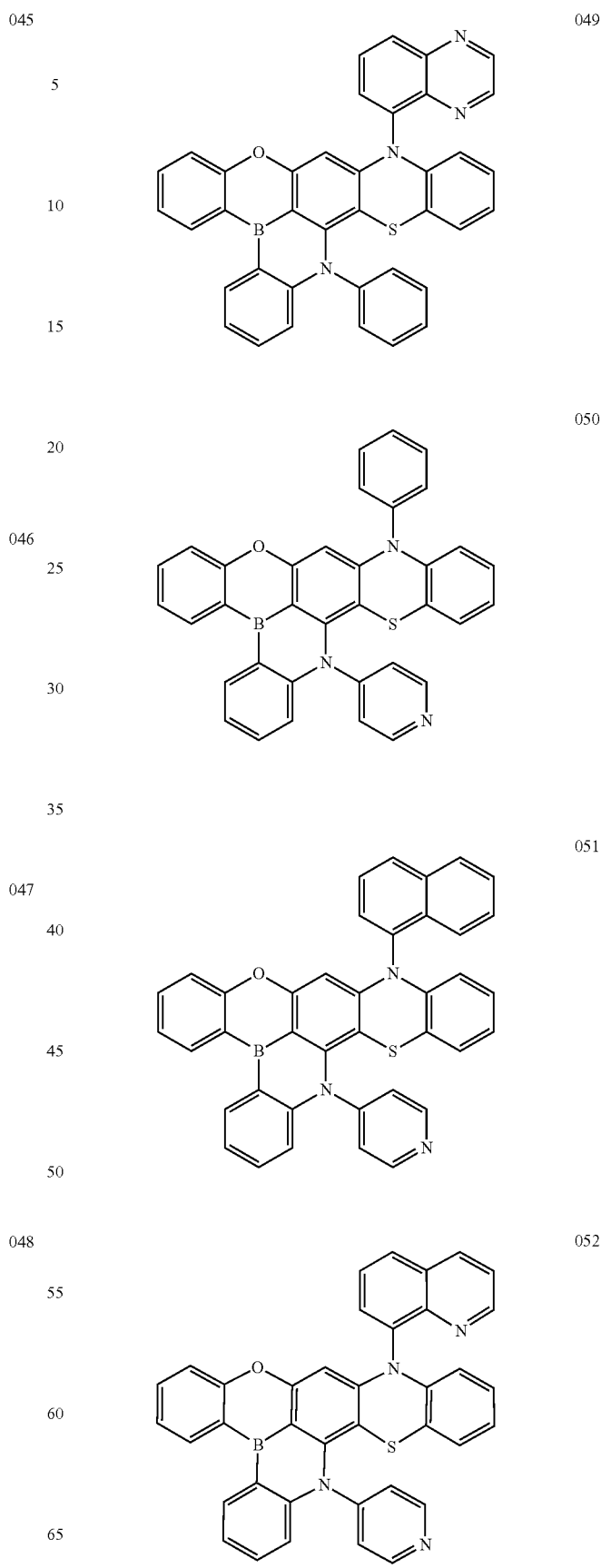

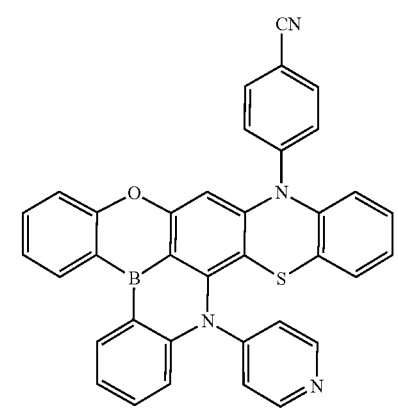
053
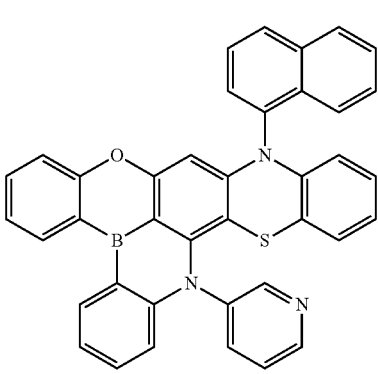
056
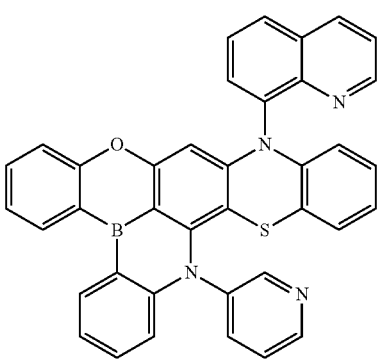
057
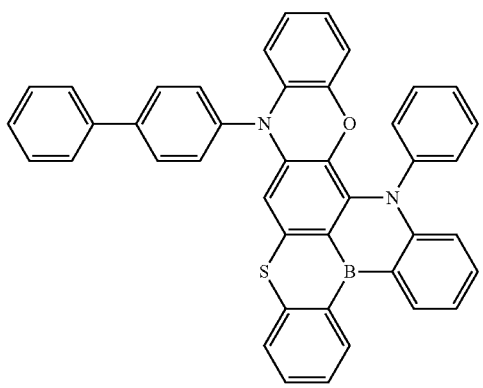
054
058
055
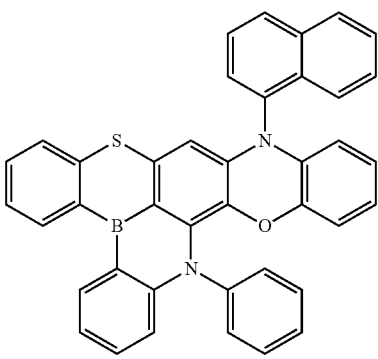
059

-continued
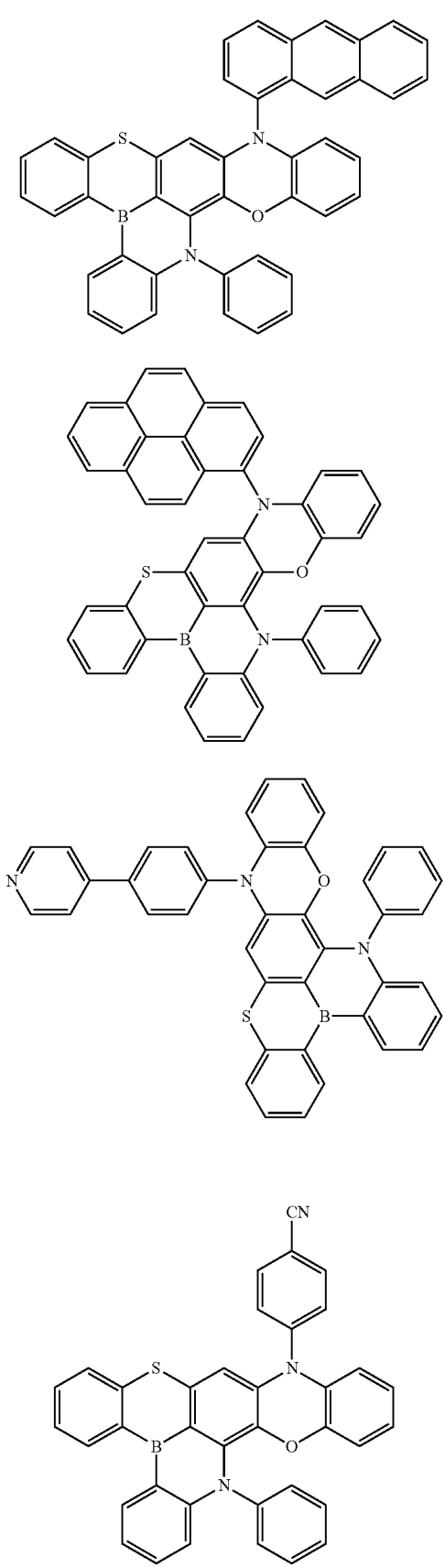
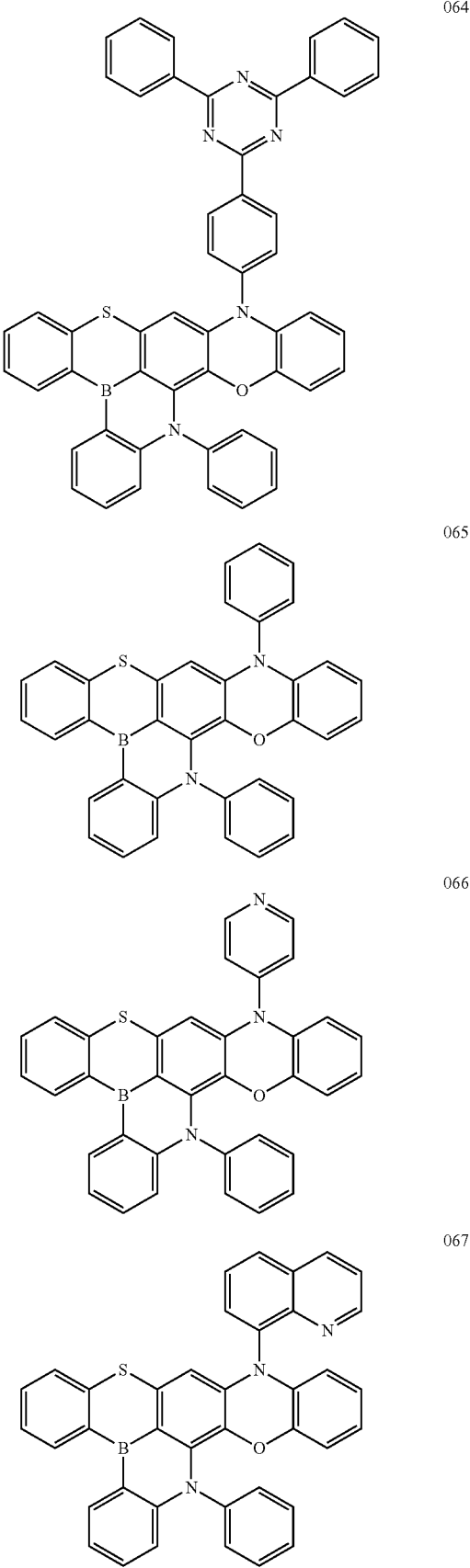

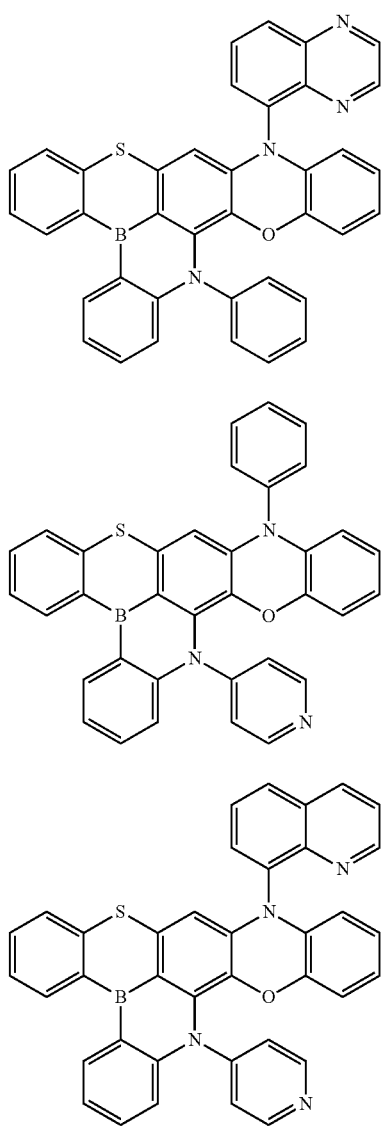
068
069
070
071
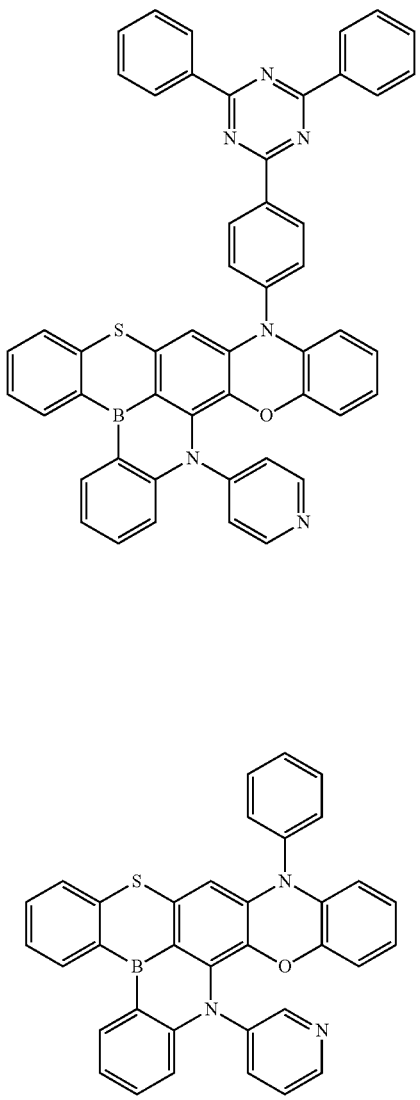
072
073
074
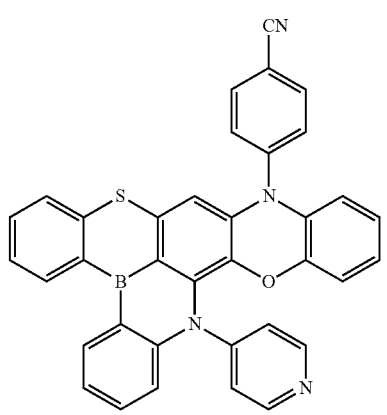
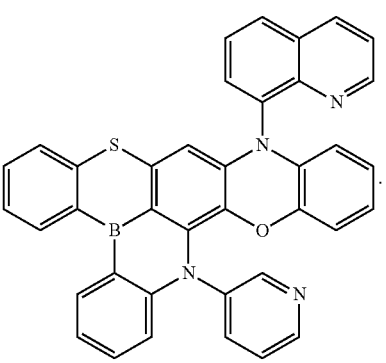
When X is a trivalent heteroatom and Y is a divalent heteroatom, the organic compound may have any one of the structures shown in formula (075) to formula (114):

-continued
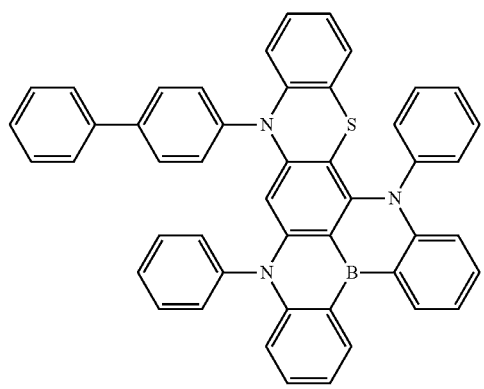
075
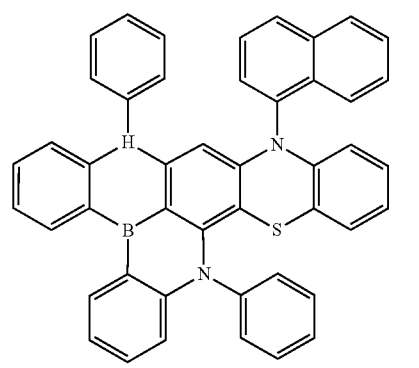
076
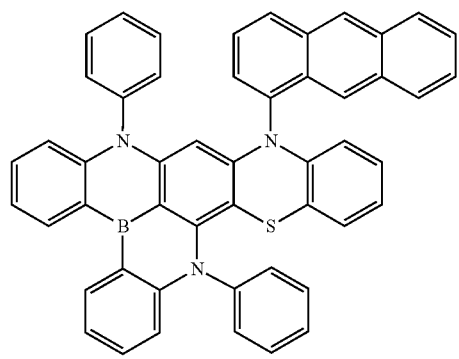
077
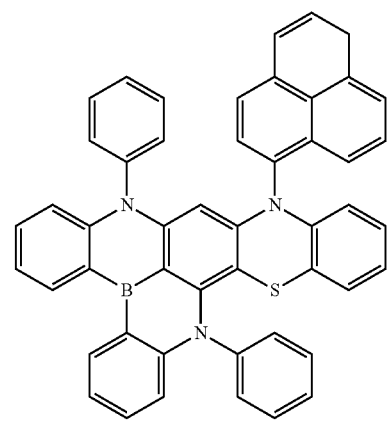
078
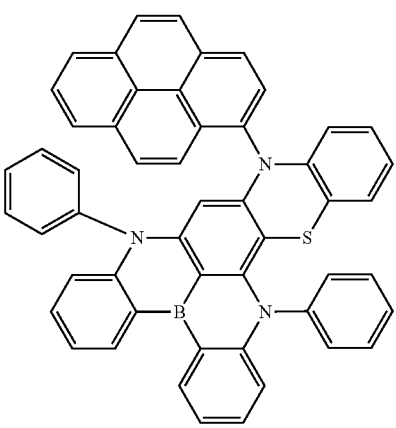
079
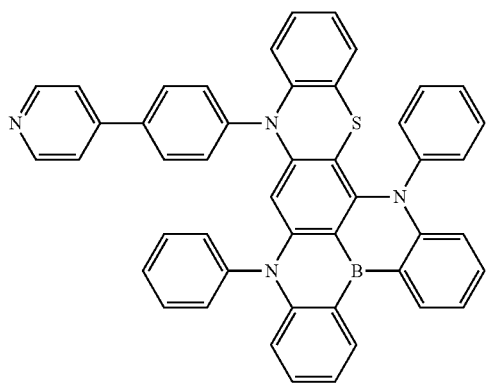
080
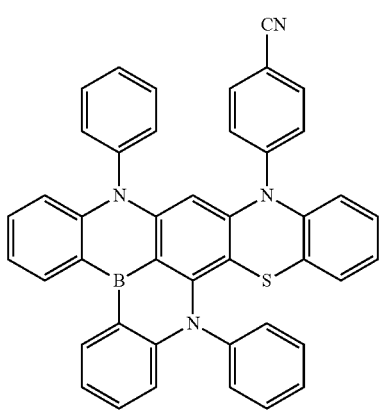
081

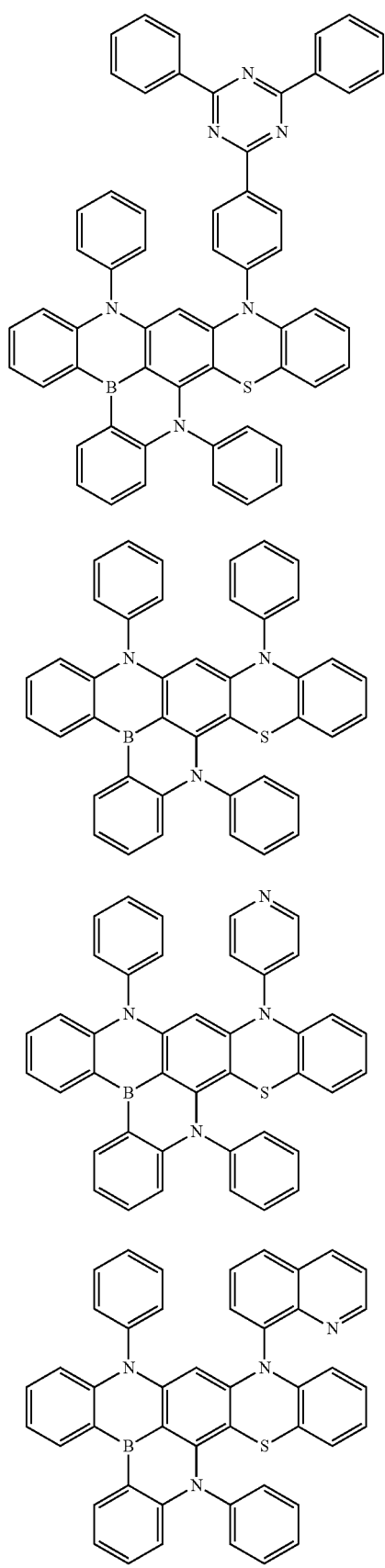
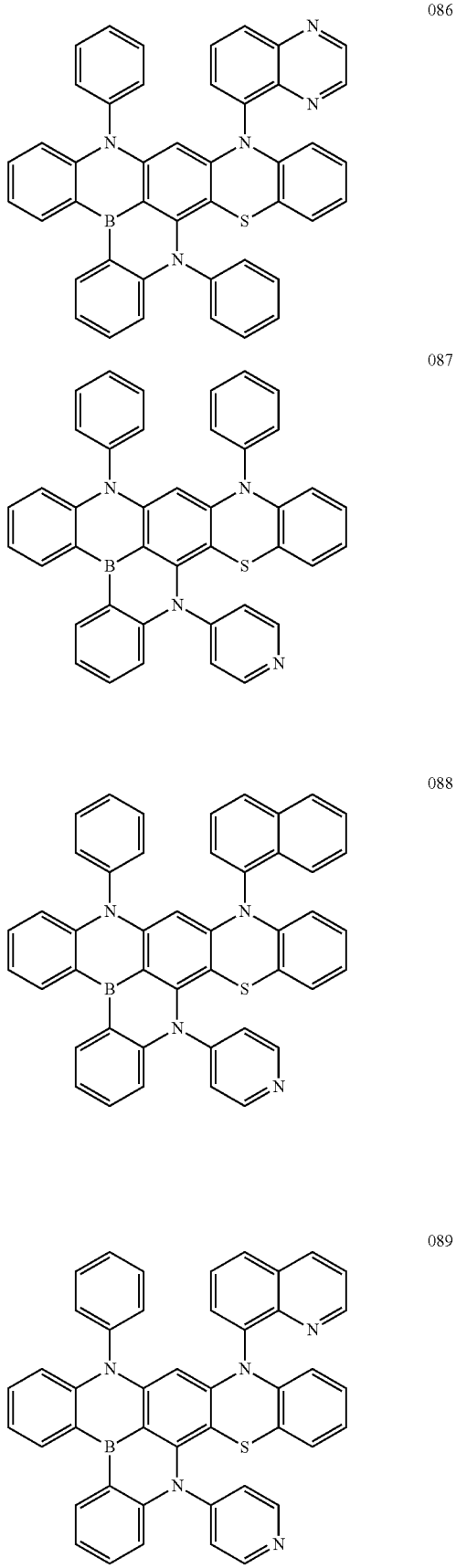

090
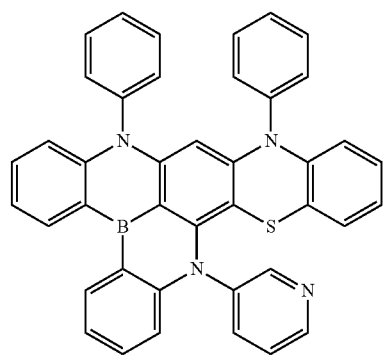
091
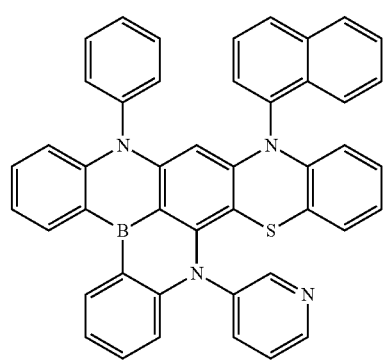
092
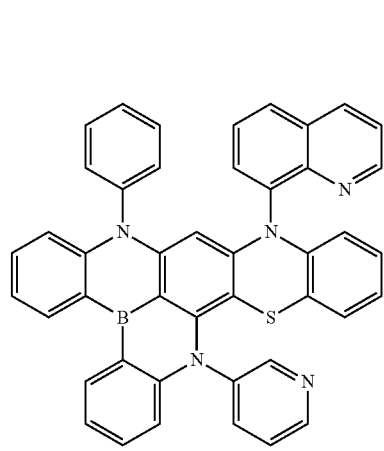
093
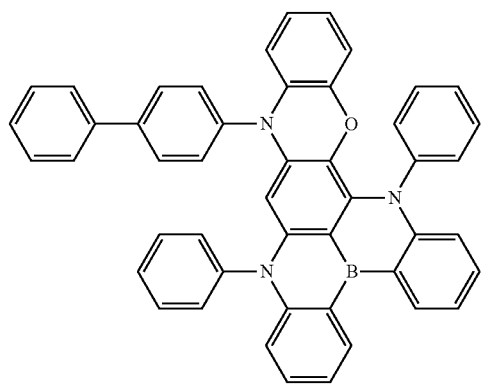
094
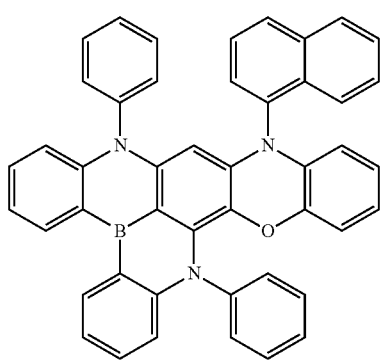
095
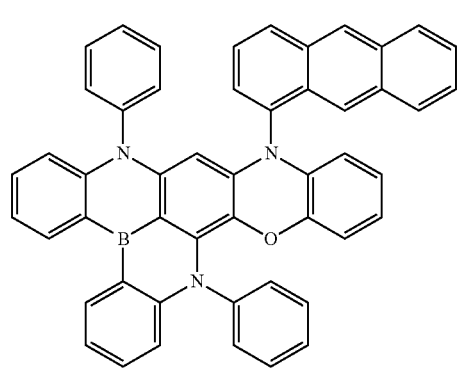
096
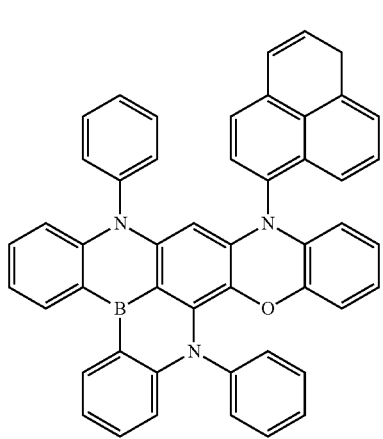
097
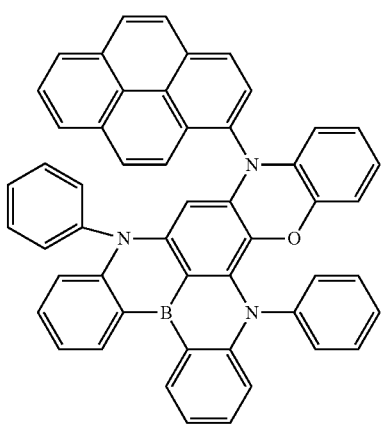

-continued
098
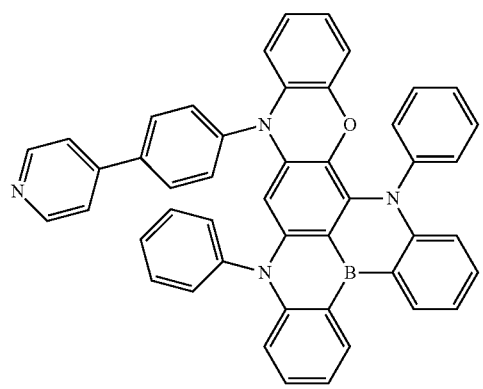
099
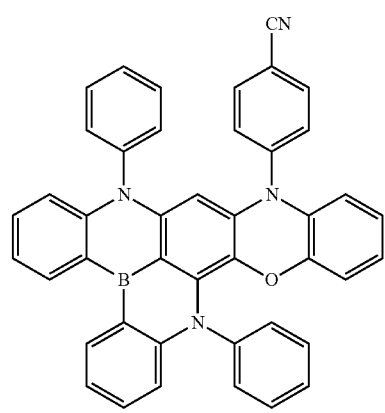
100
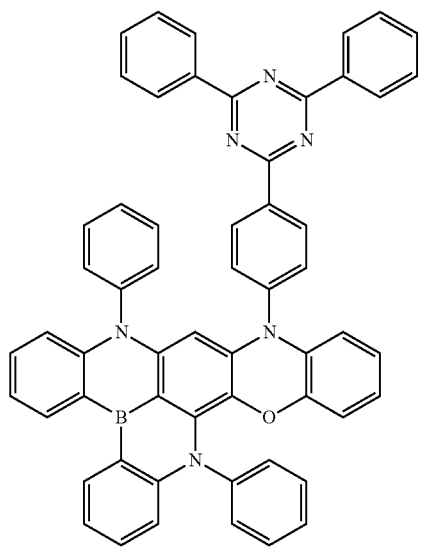
-continued
101
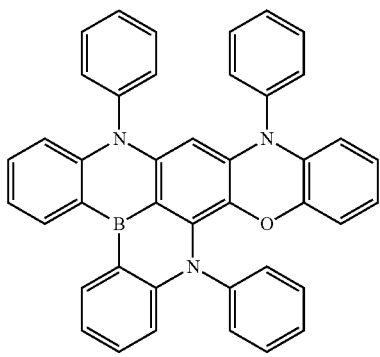
102
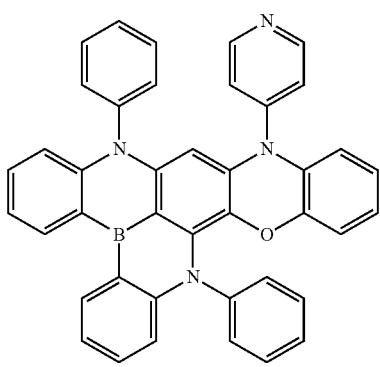
103
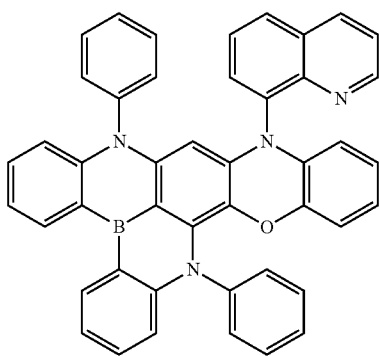
104
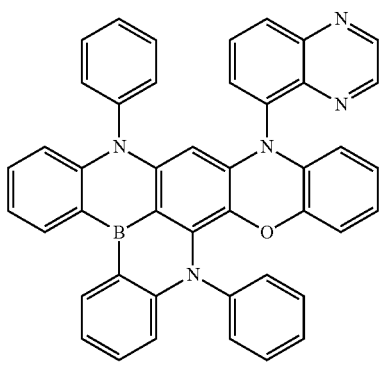

-continued
105
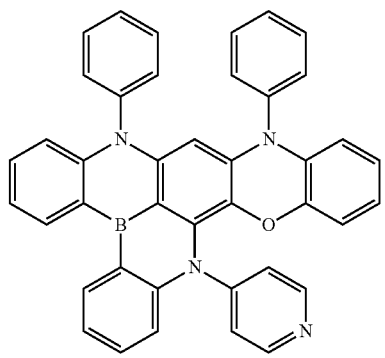
106
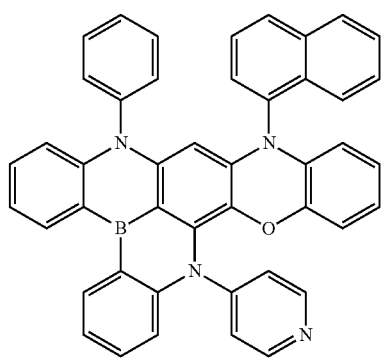
107
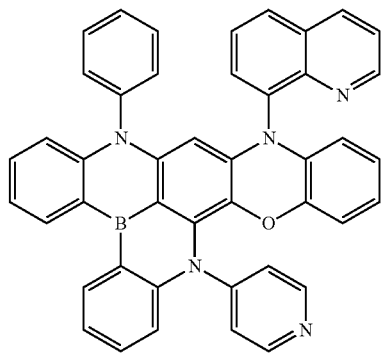
108
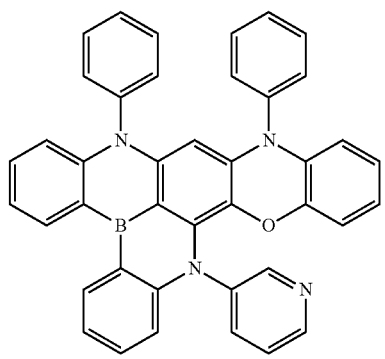
-continued
109
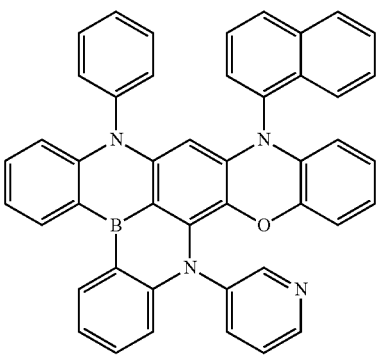
110
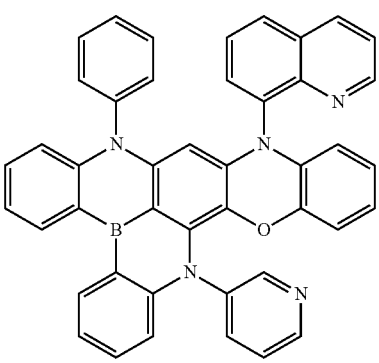
111
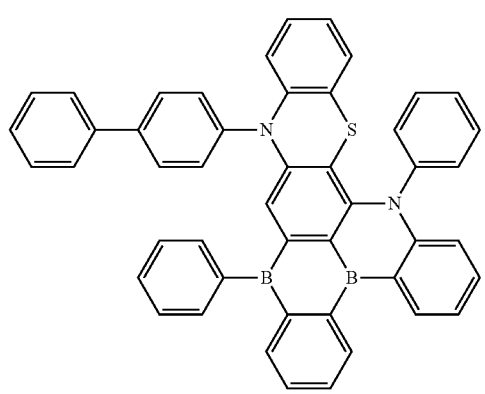
112
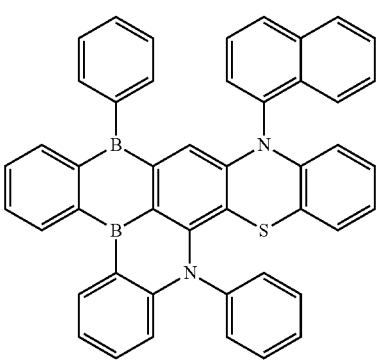

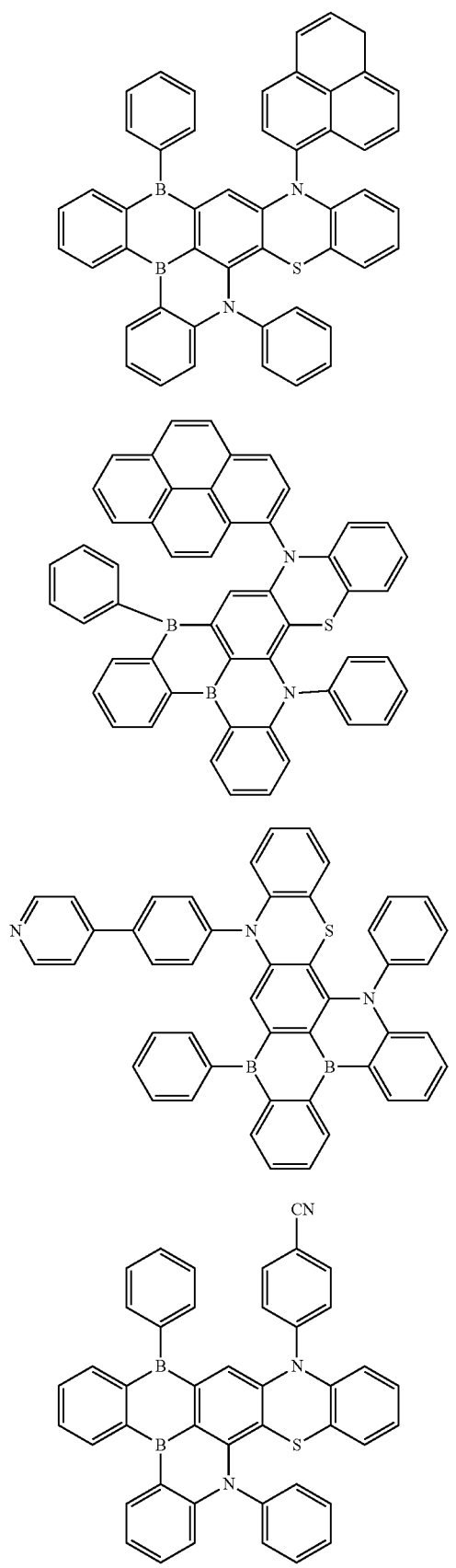
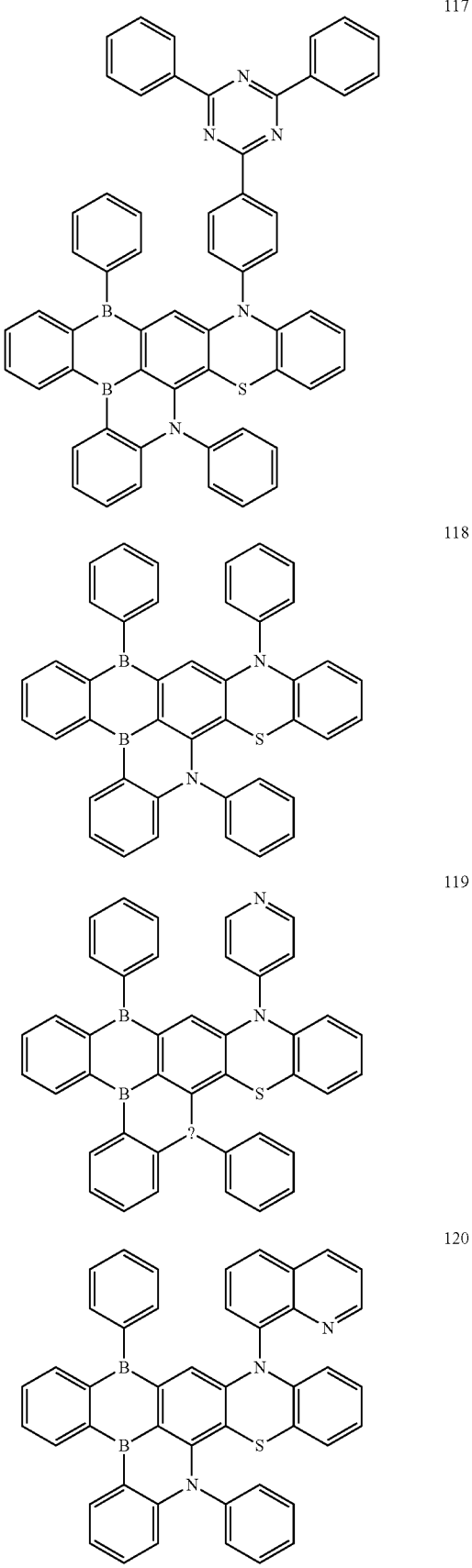

121 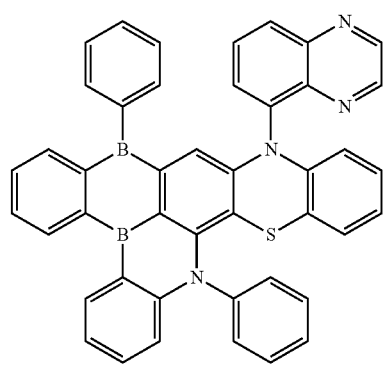
122 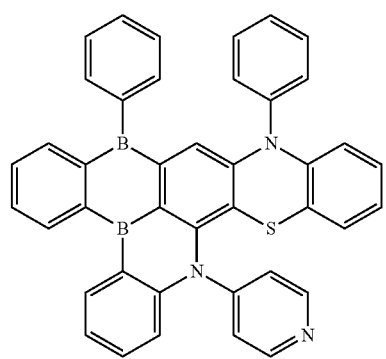
123 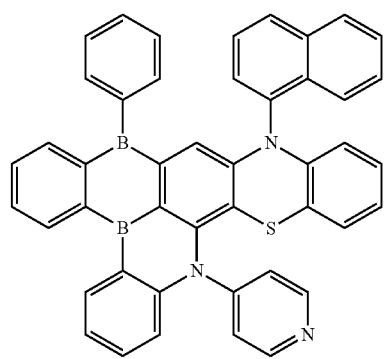
124 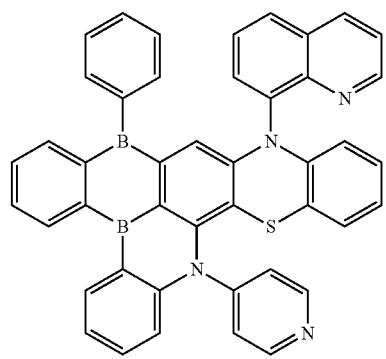
125 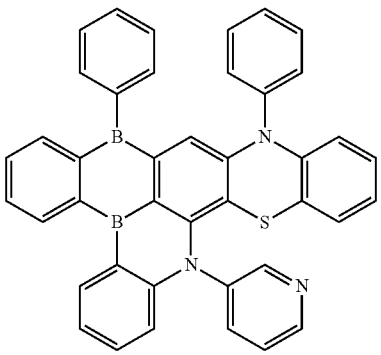
126 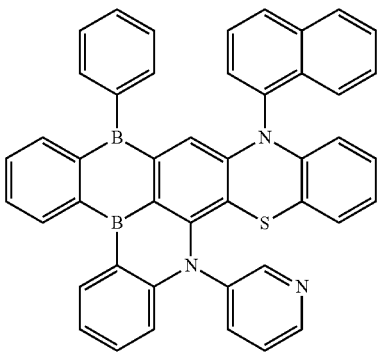
127 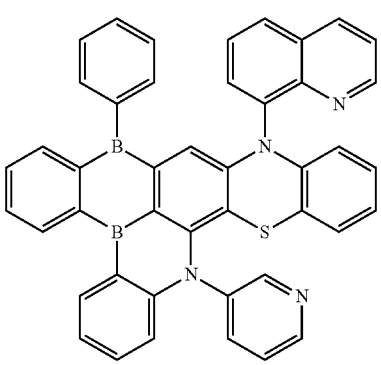
128 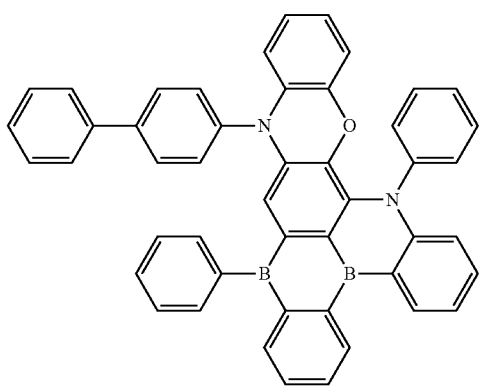

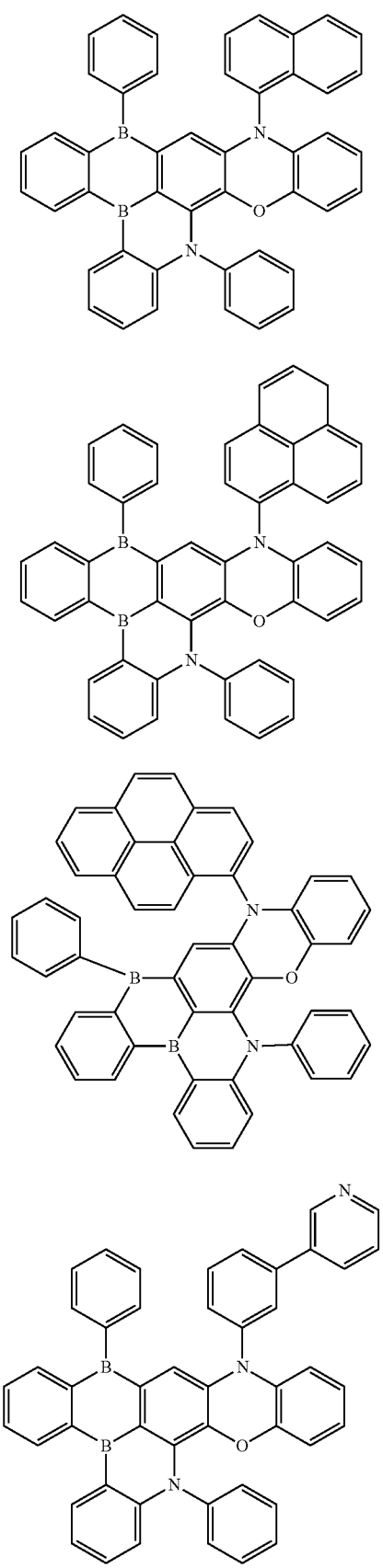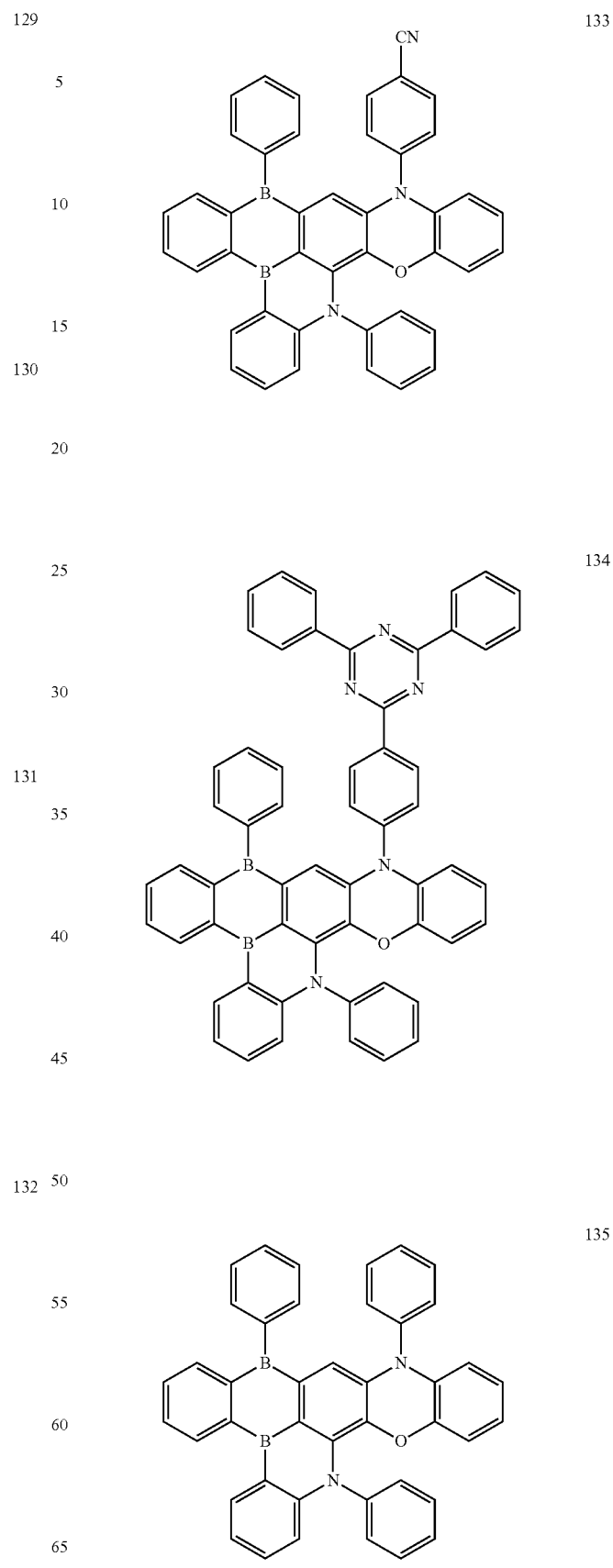

136
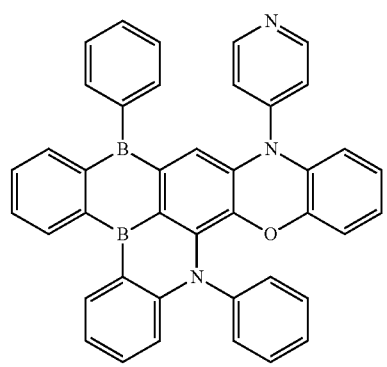
137
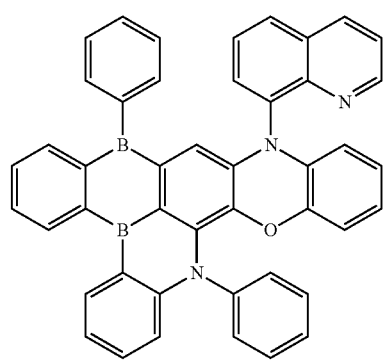
138
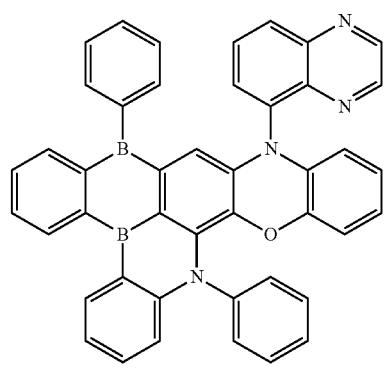
139
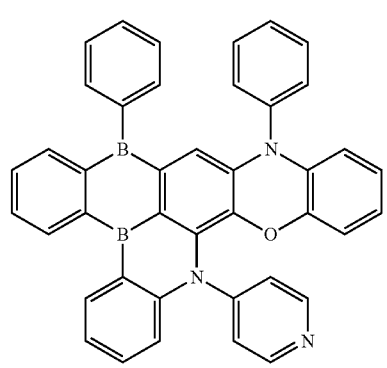
140
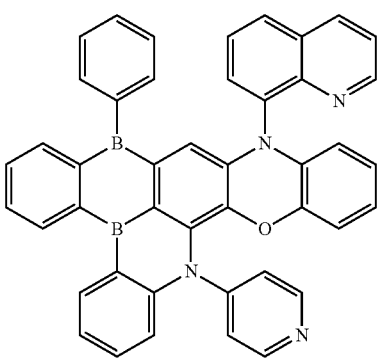
141
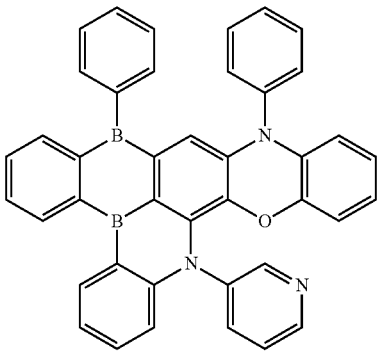
142
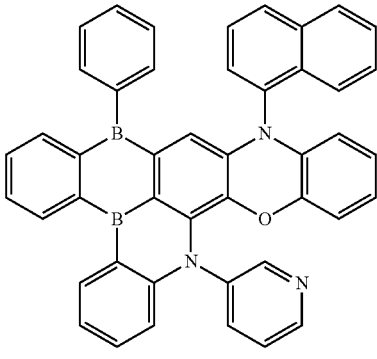
143
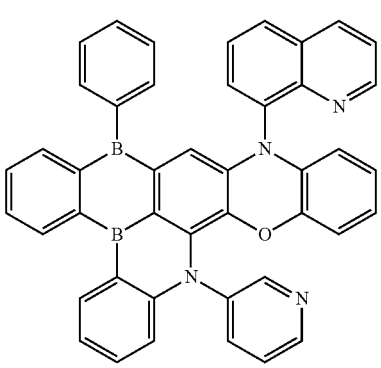

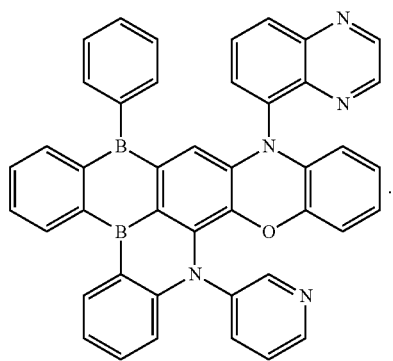
144
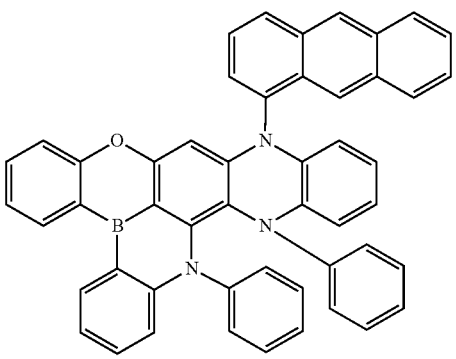
147
When X is a divalent heteroatom and Y is a trivalent heteroatom, the organic compound provided by the present disclosure may have any one of the structures shown in formula (145) to formula (207):
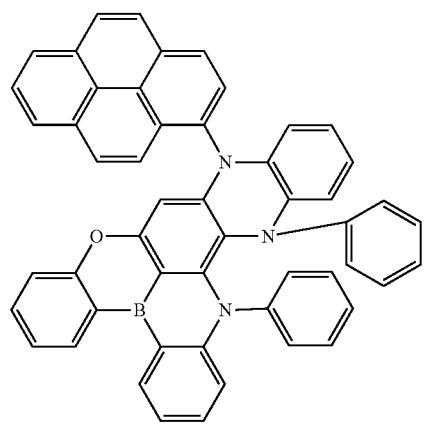
148
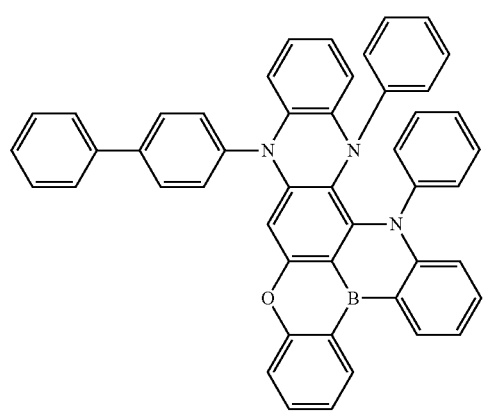
145
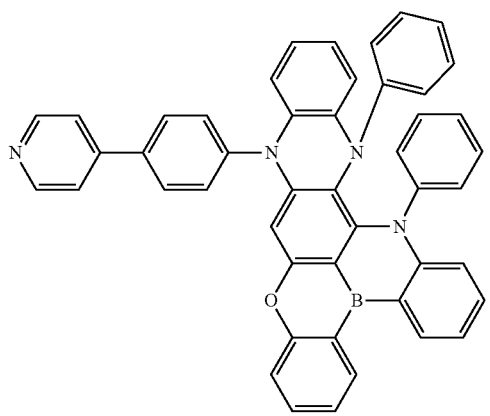
149
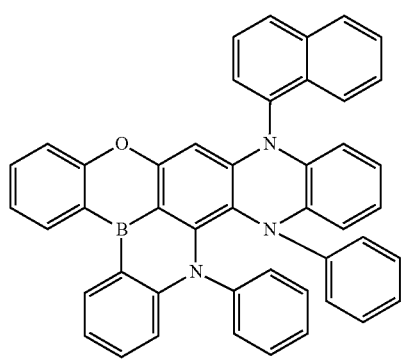
146
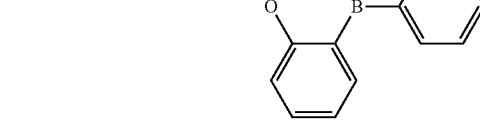
150

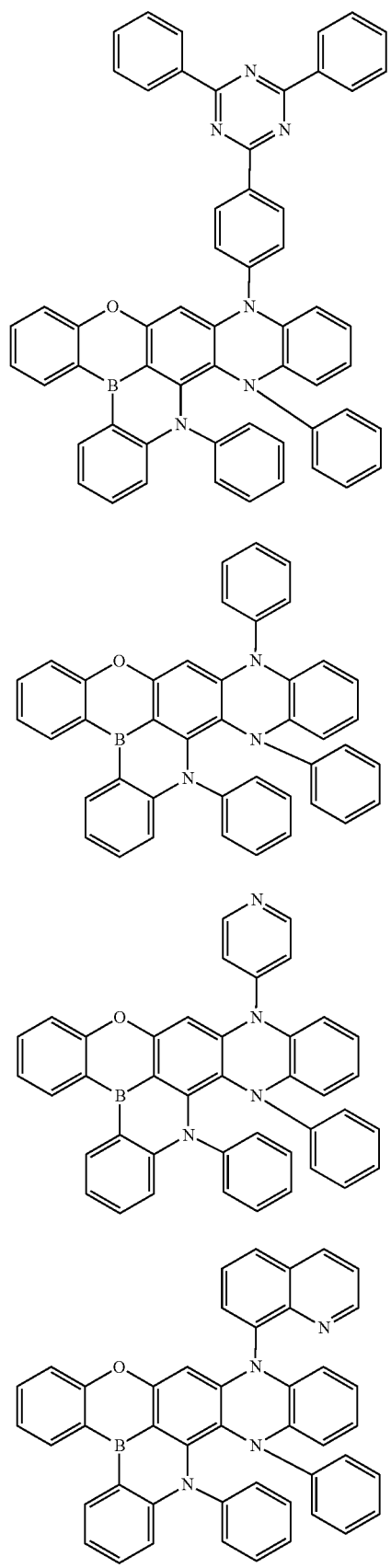
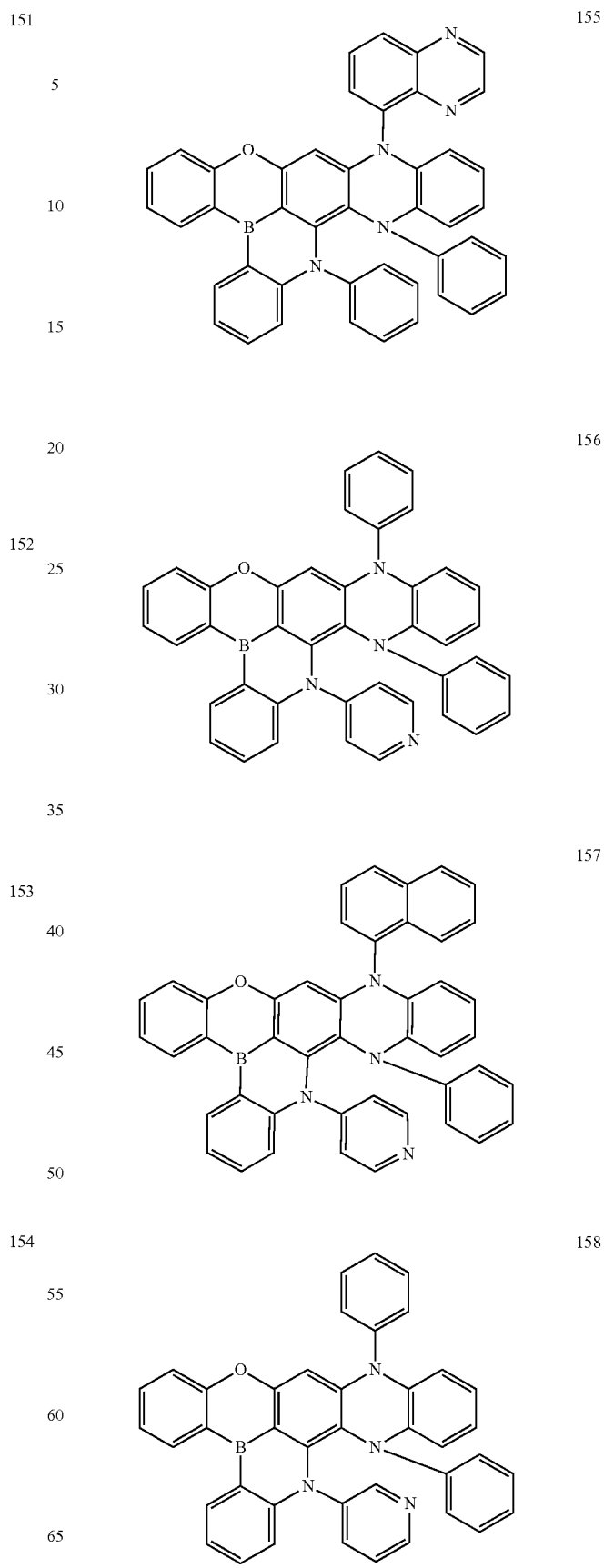

159
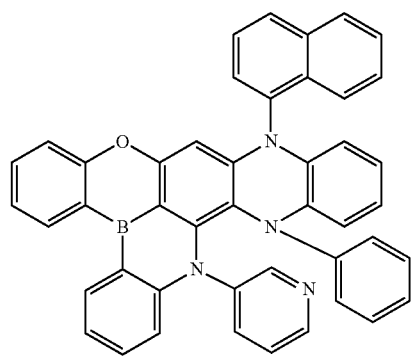
160
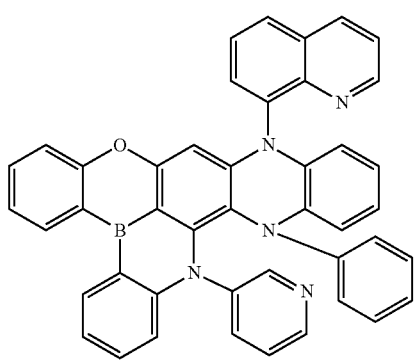
161
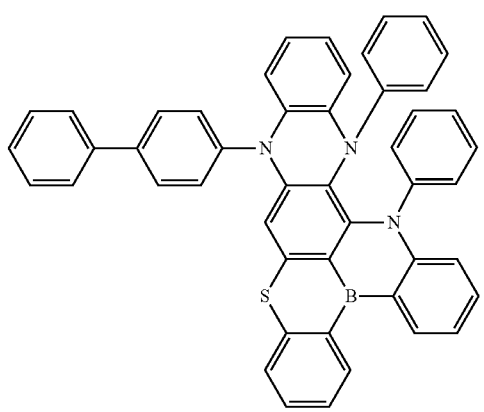
162
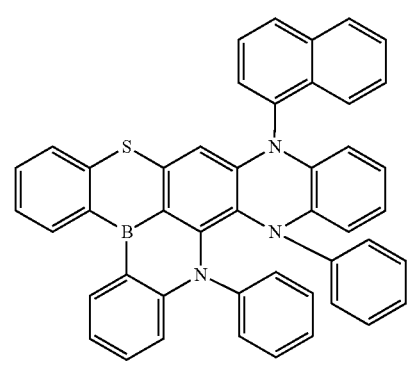
163
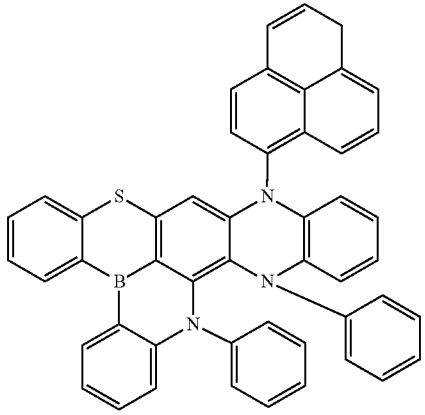
164
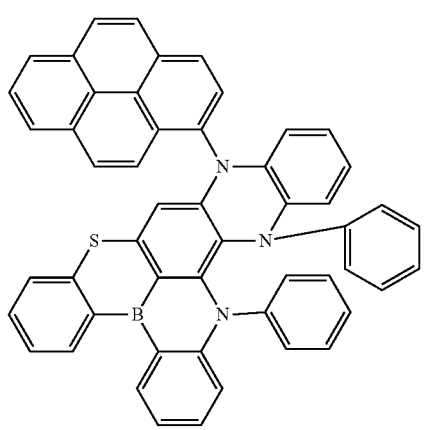
165
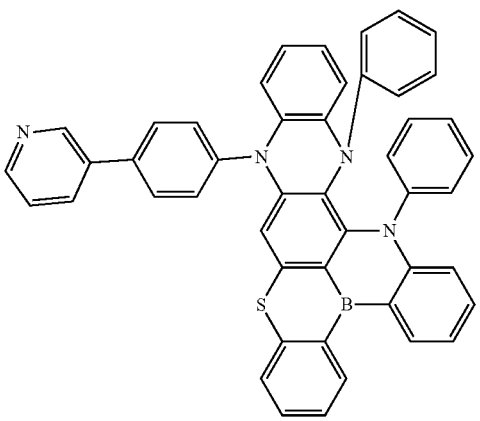
166
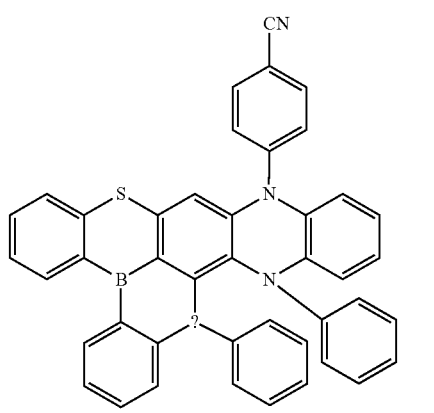

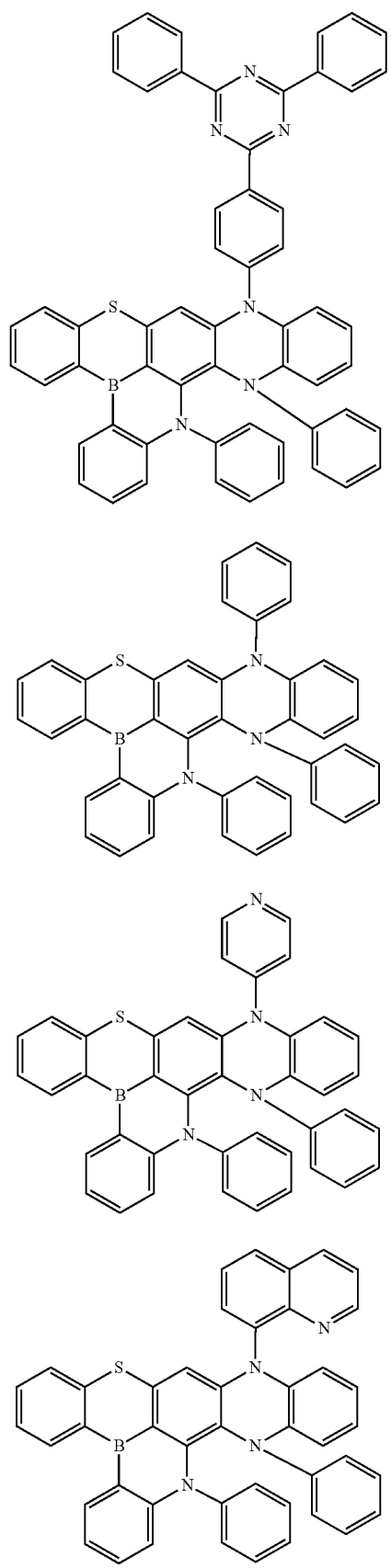
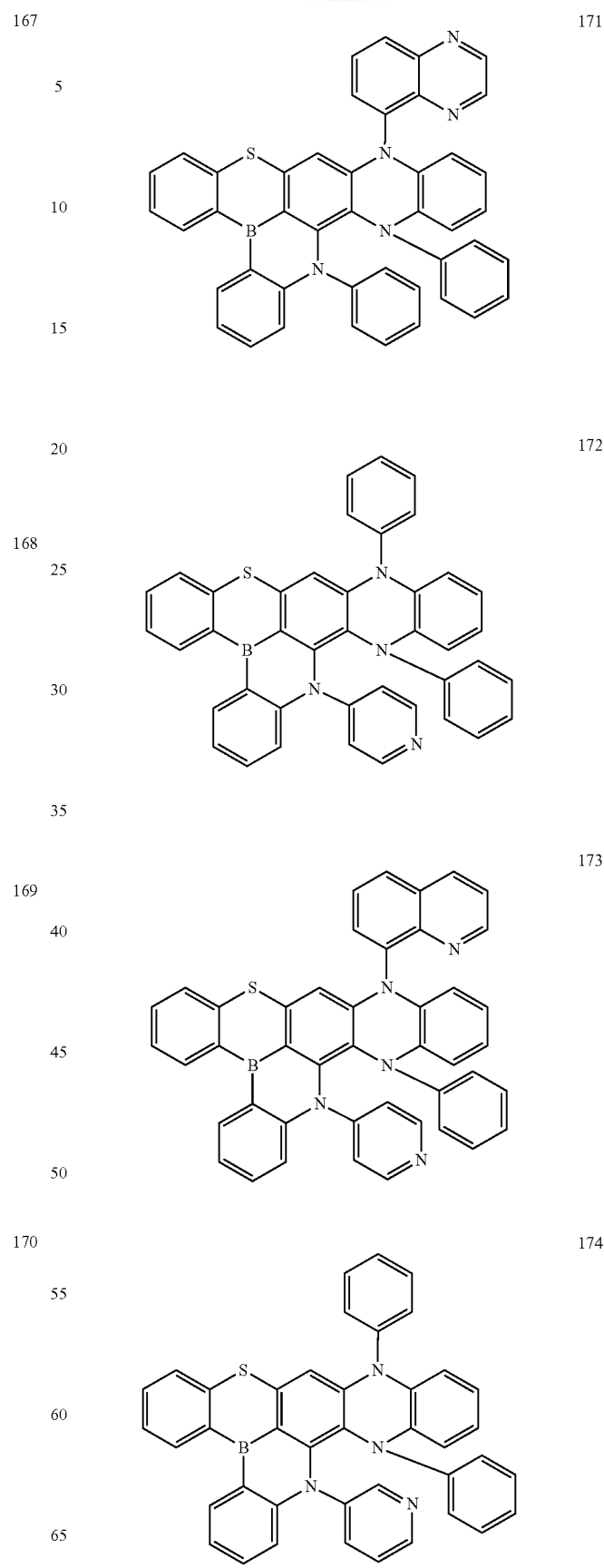

-continued
175
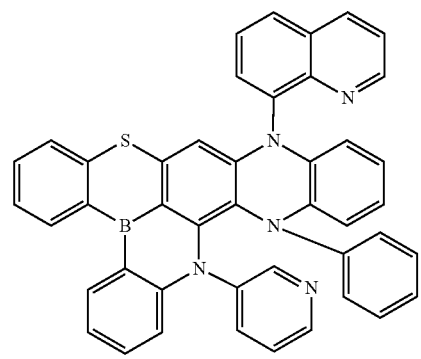
176
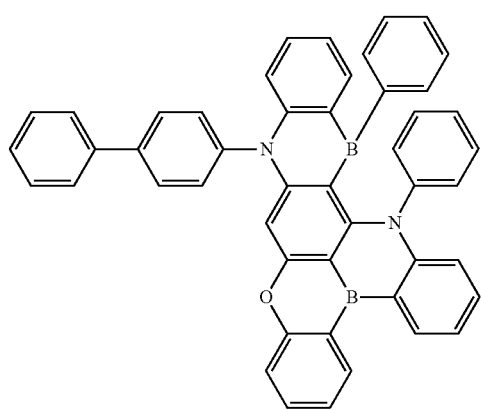
177
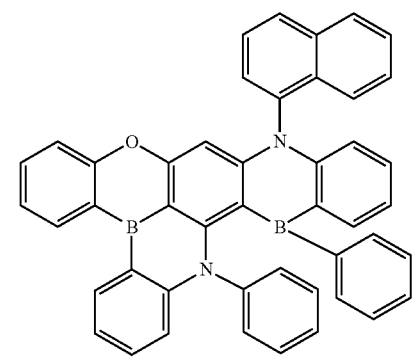
178
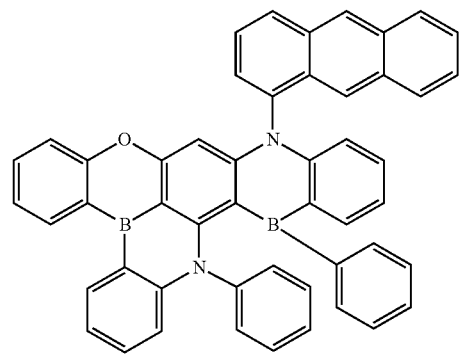
-continued
179
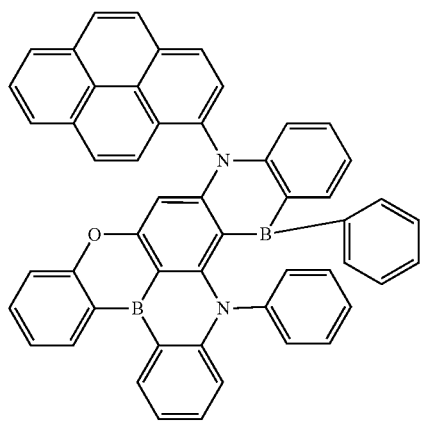
180
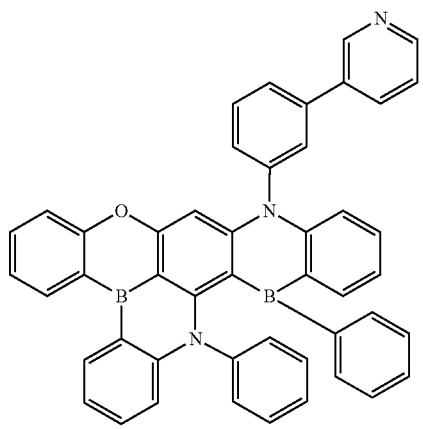
181
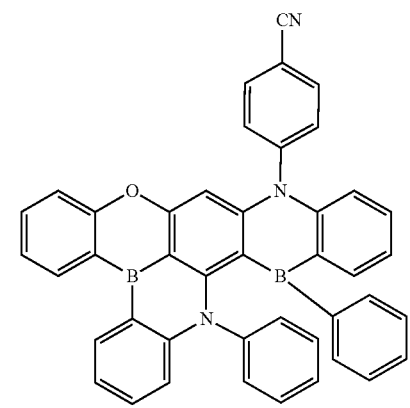

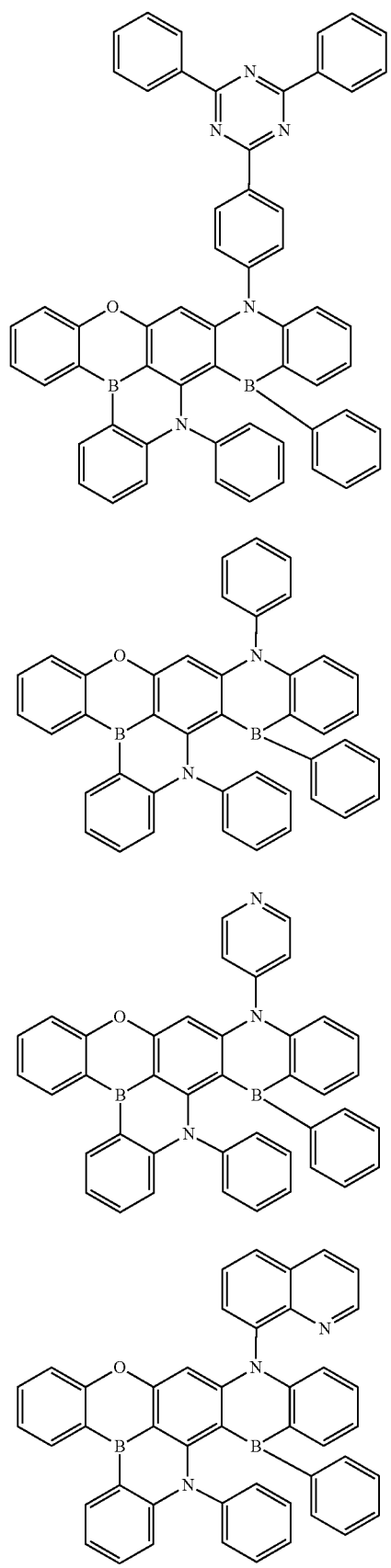

190
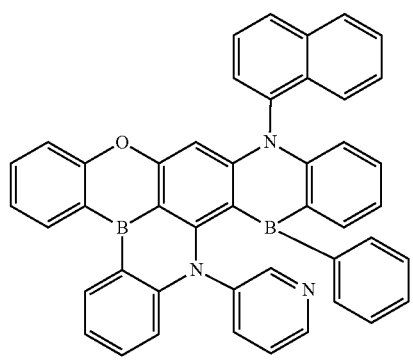
191
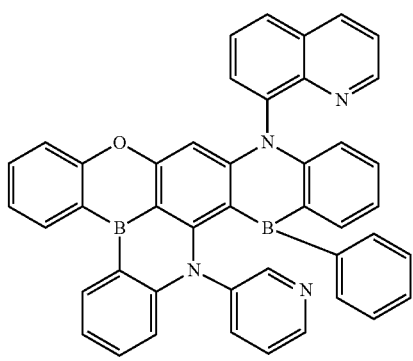
192
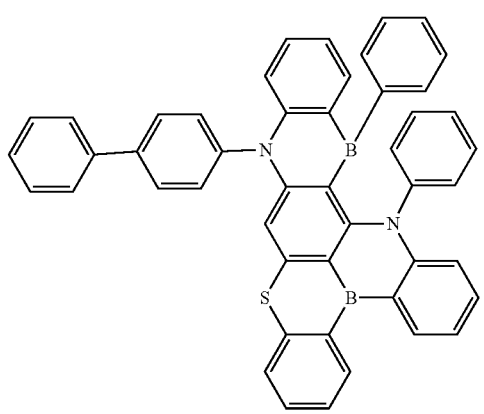
193
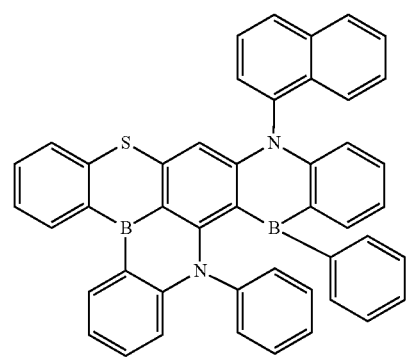
194
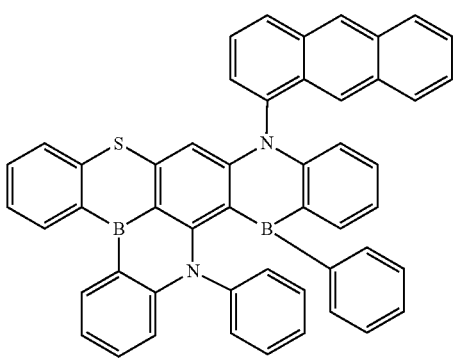
195
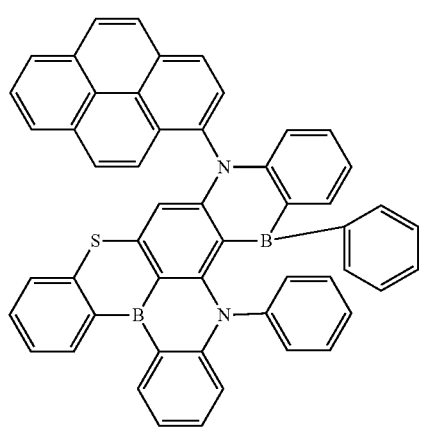
196
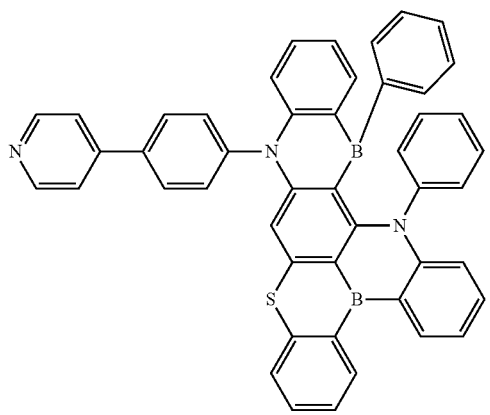
197
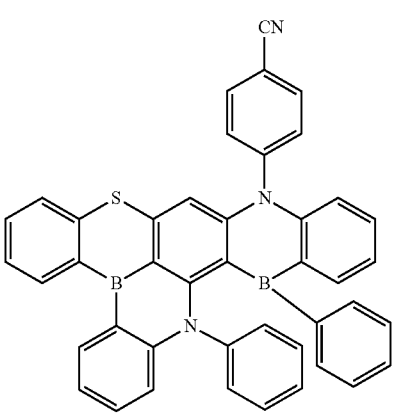

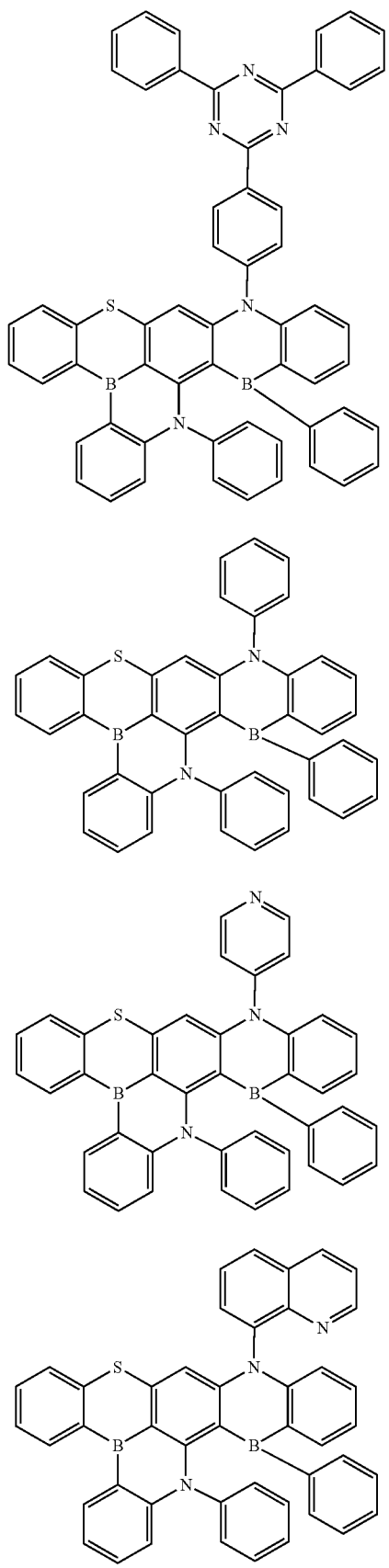
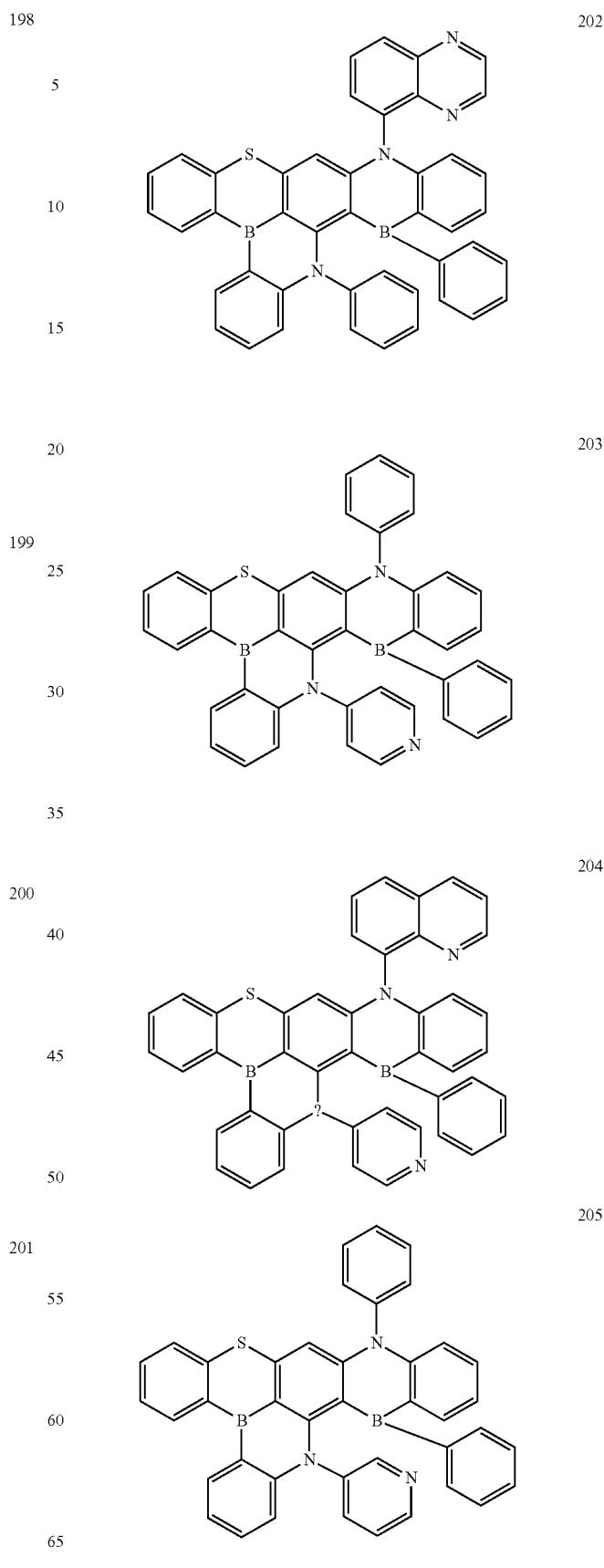

206
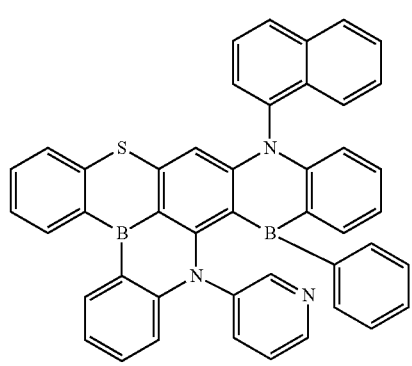
207
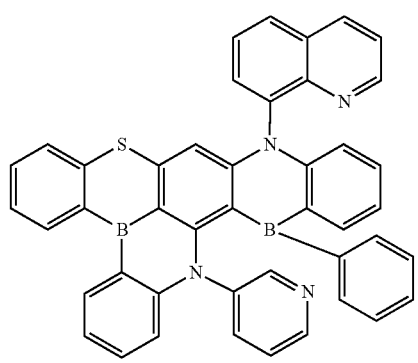
When X and Y are both trivalent heteroatoms, the organic compound provided by the present disclosure may have any one of the structures shown in formula (208) to formula (267):
208
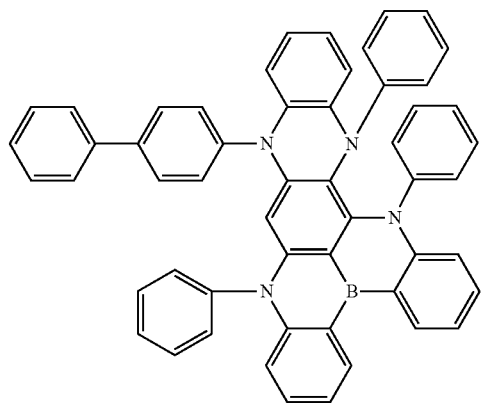
209
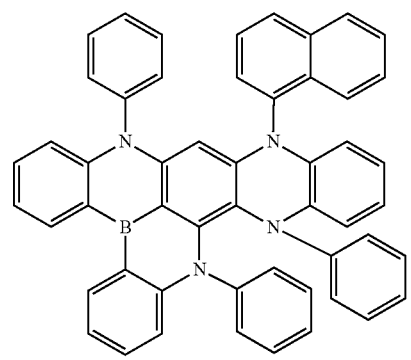
210
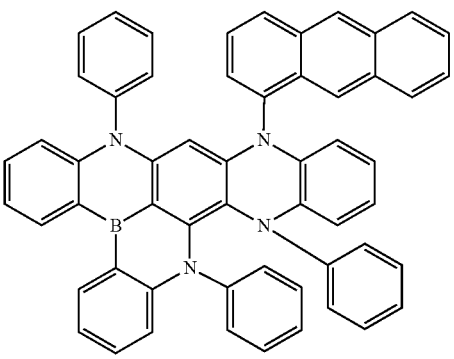
211
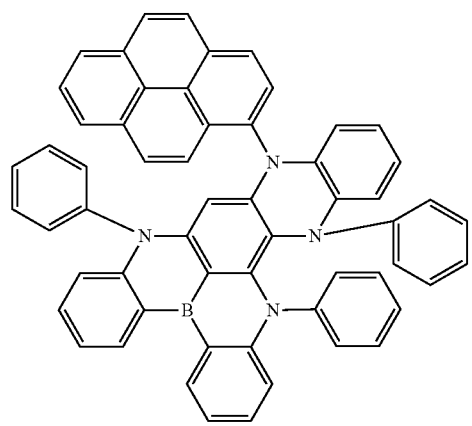
212
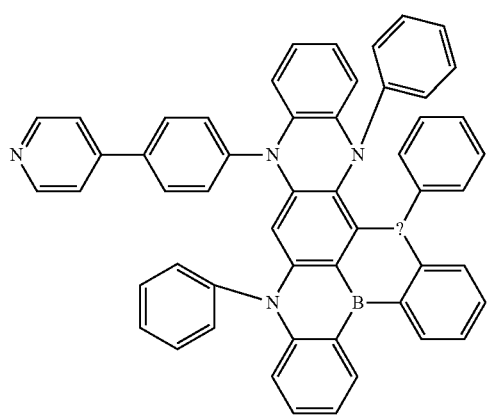
213
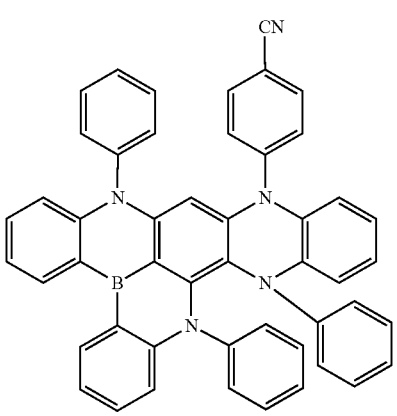

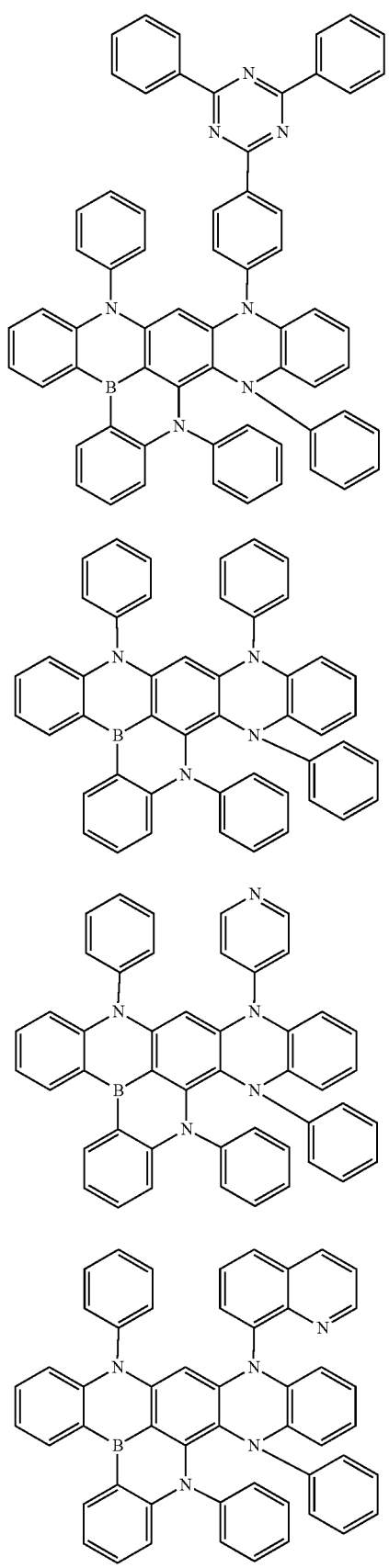
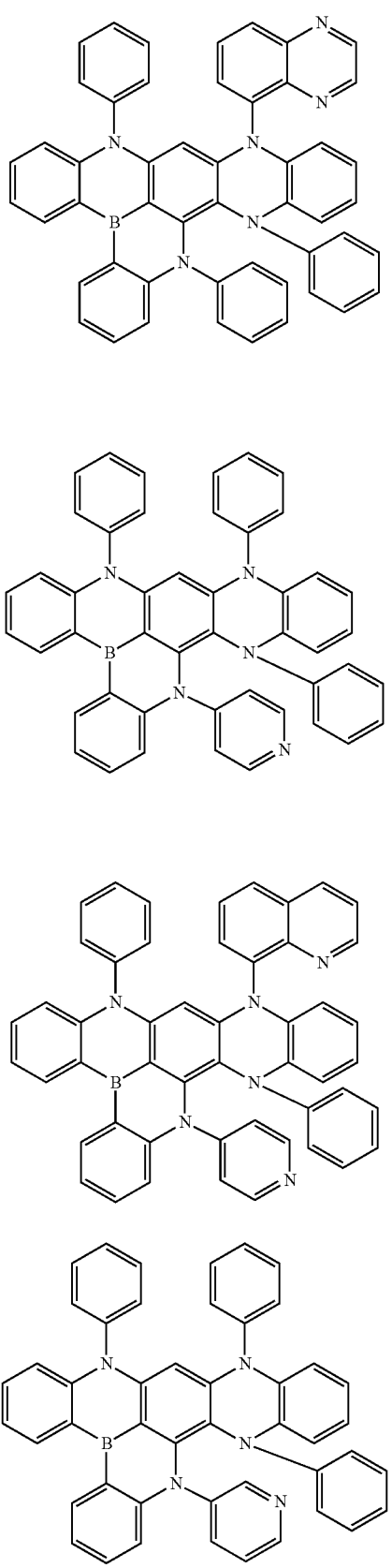

222
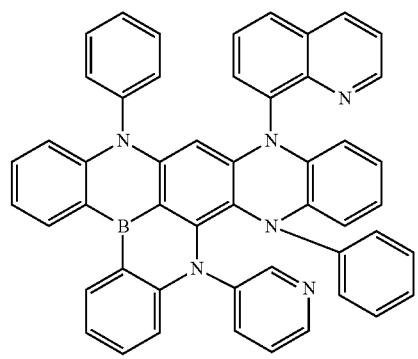
223
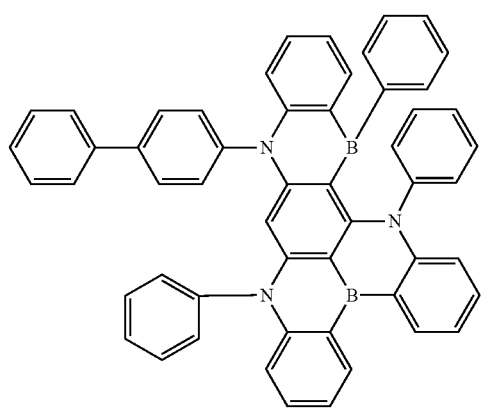
224
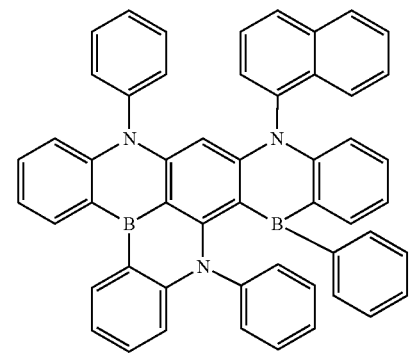
225
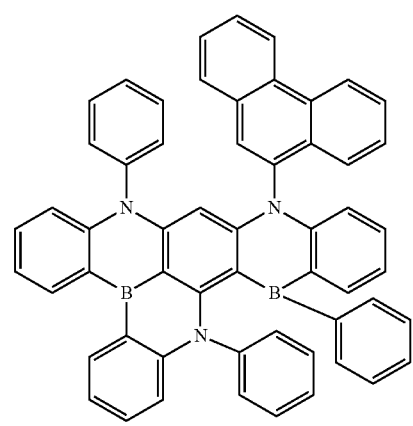
226
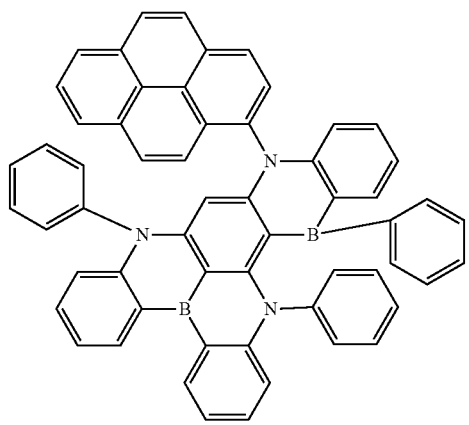
227
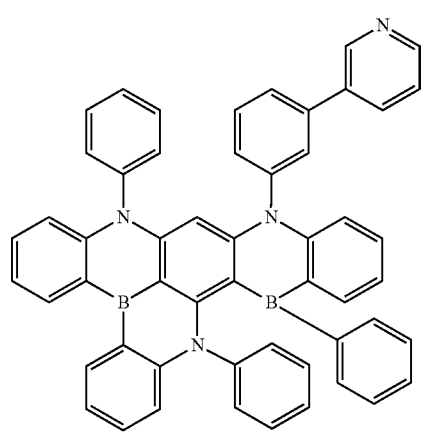
228
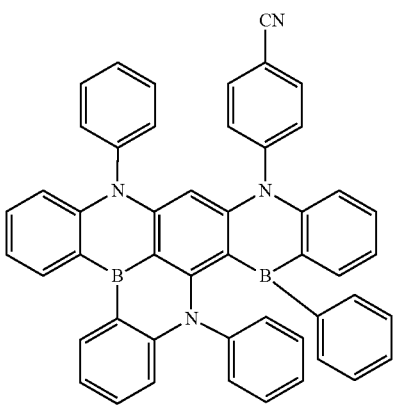

71
-continued
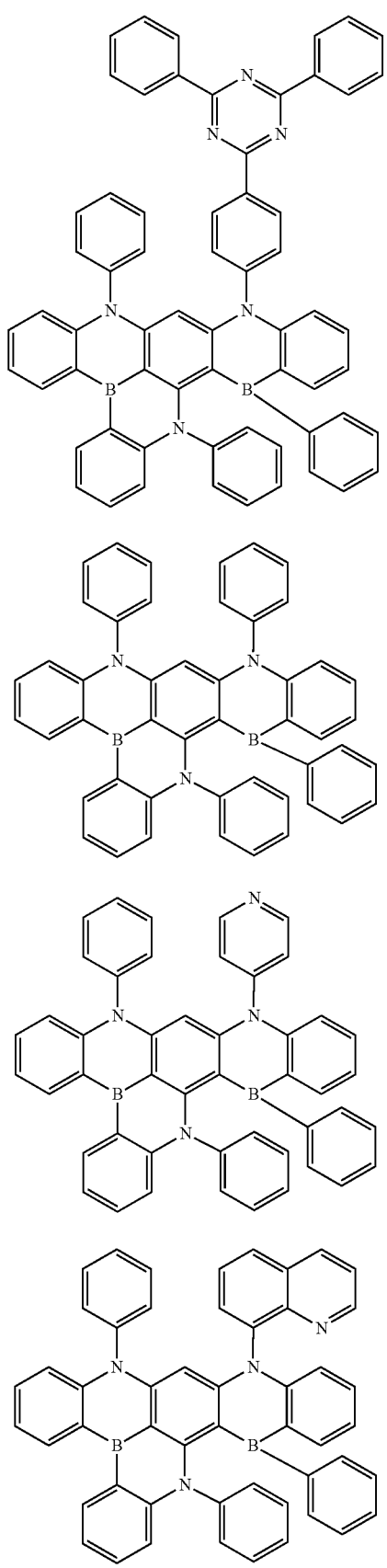
72
-continued
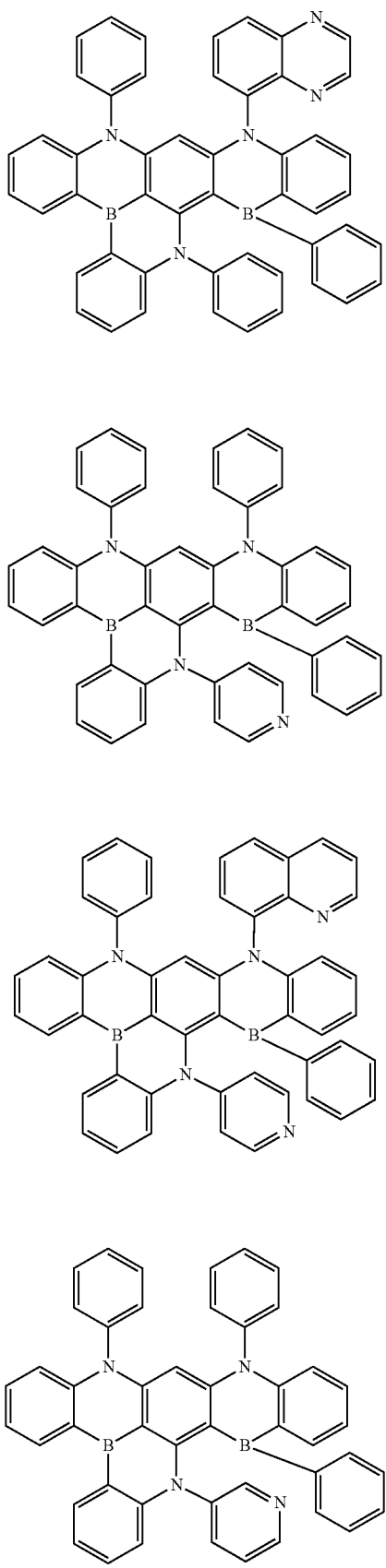

237
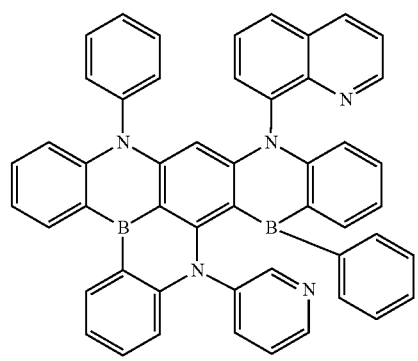
238
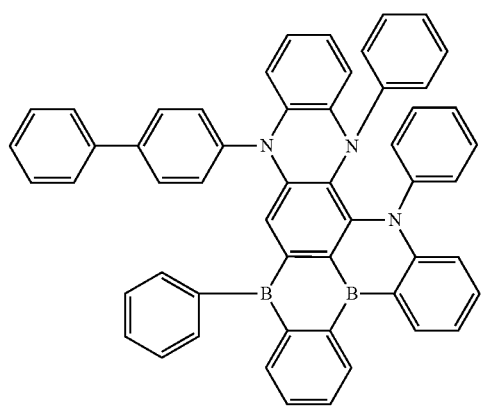
239
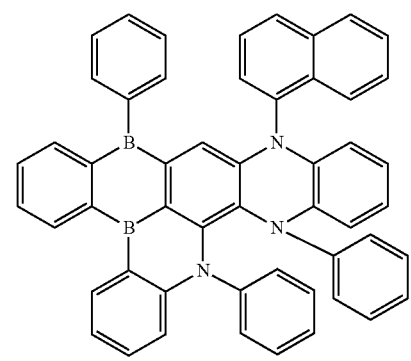
240
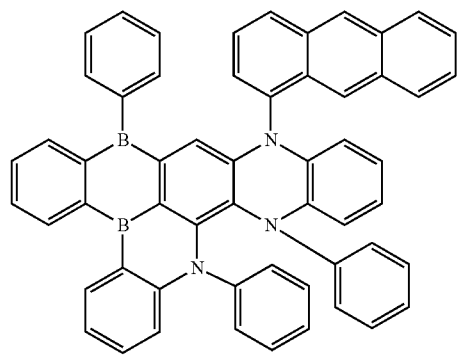
241
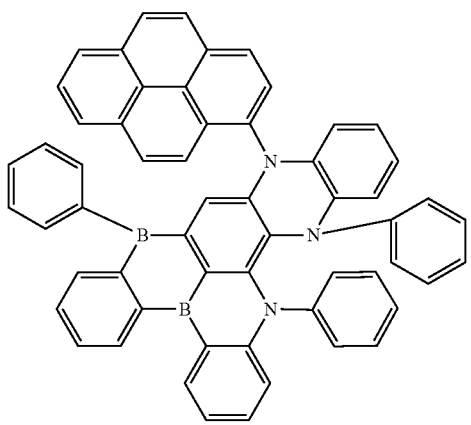
242
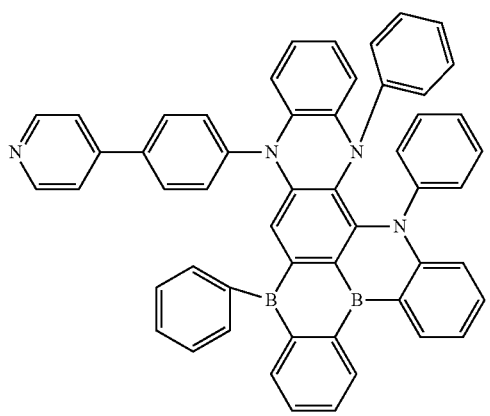
243
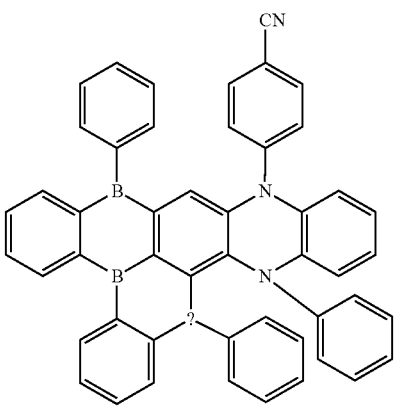

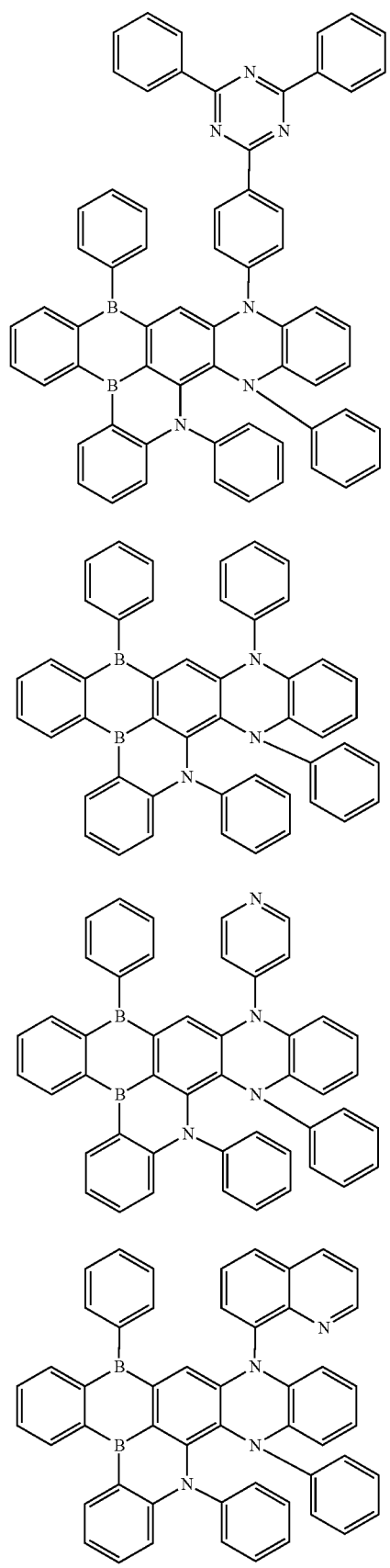
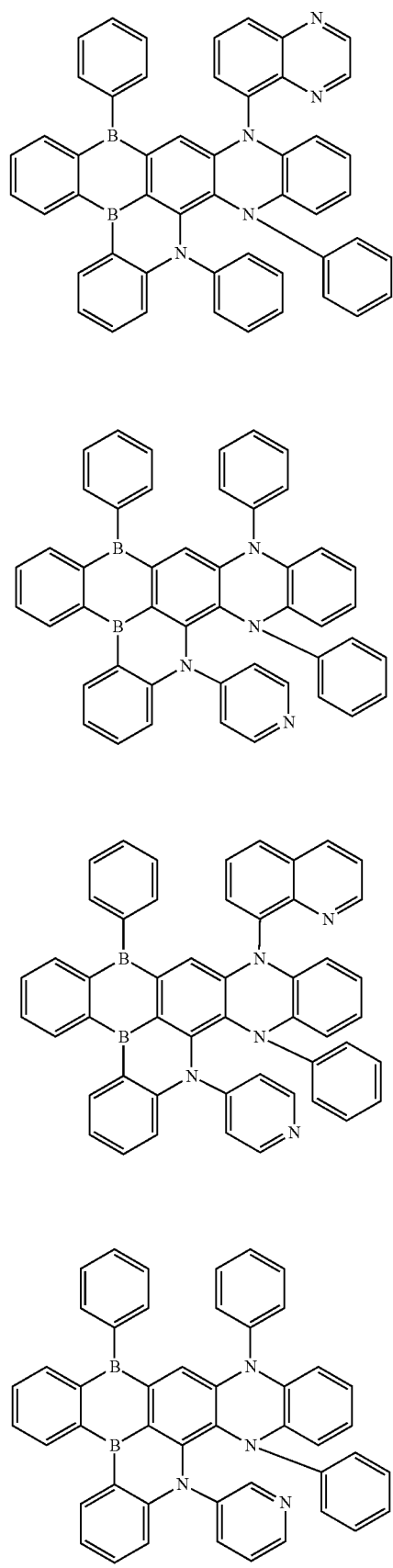

252
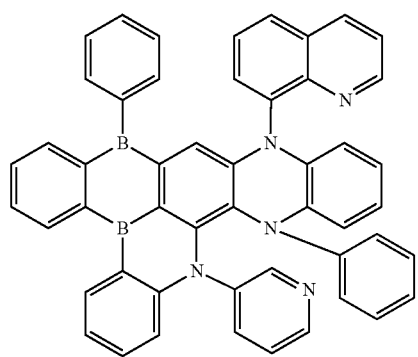
253
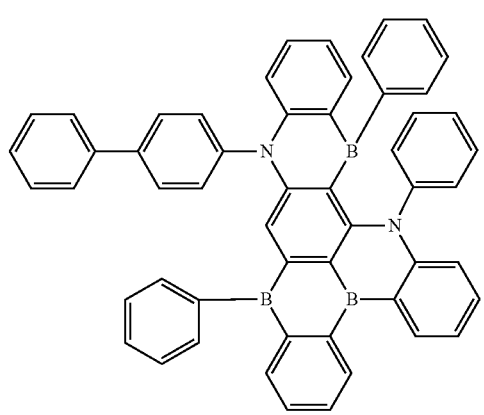
254
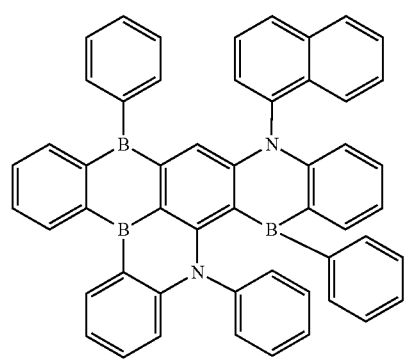
255
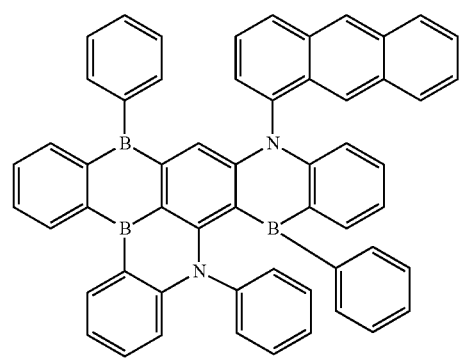
256
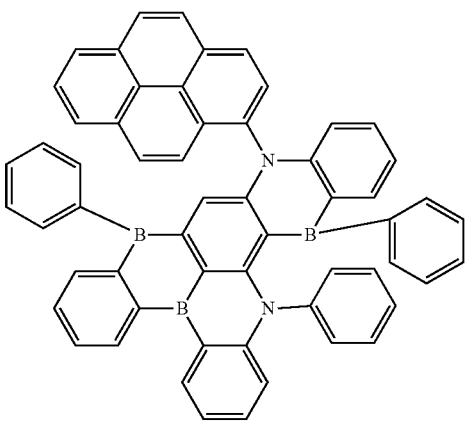
257
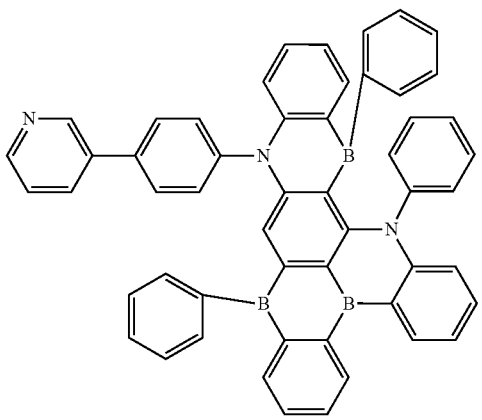
258
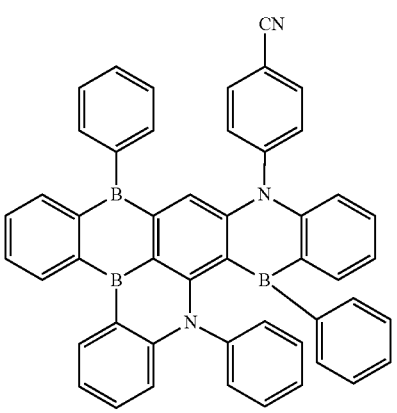

US 12,421,448 B2
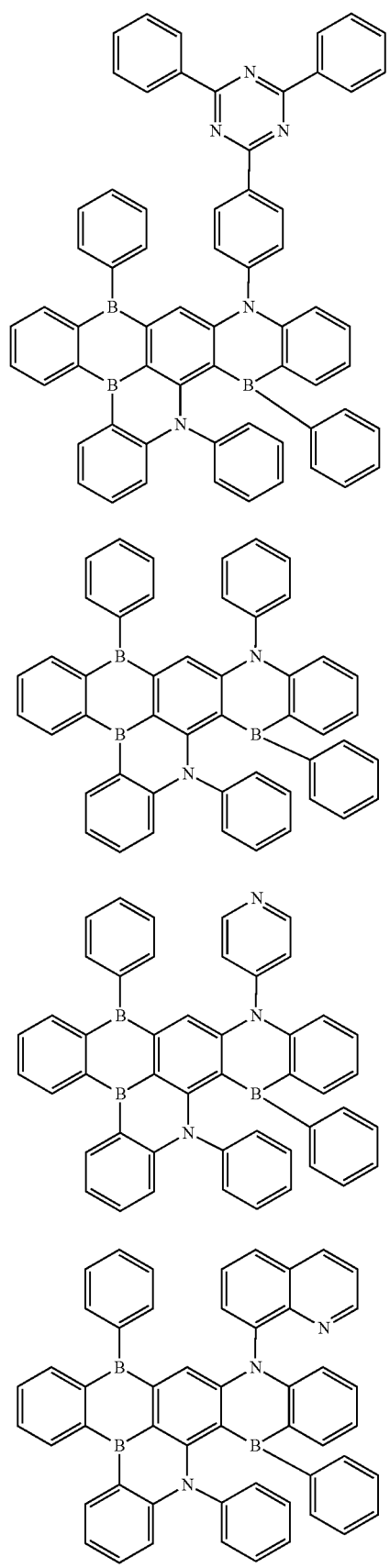
259
260
261
262
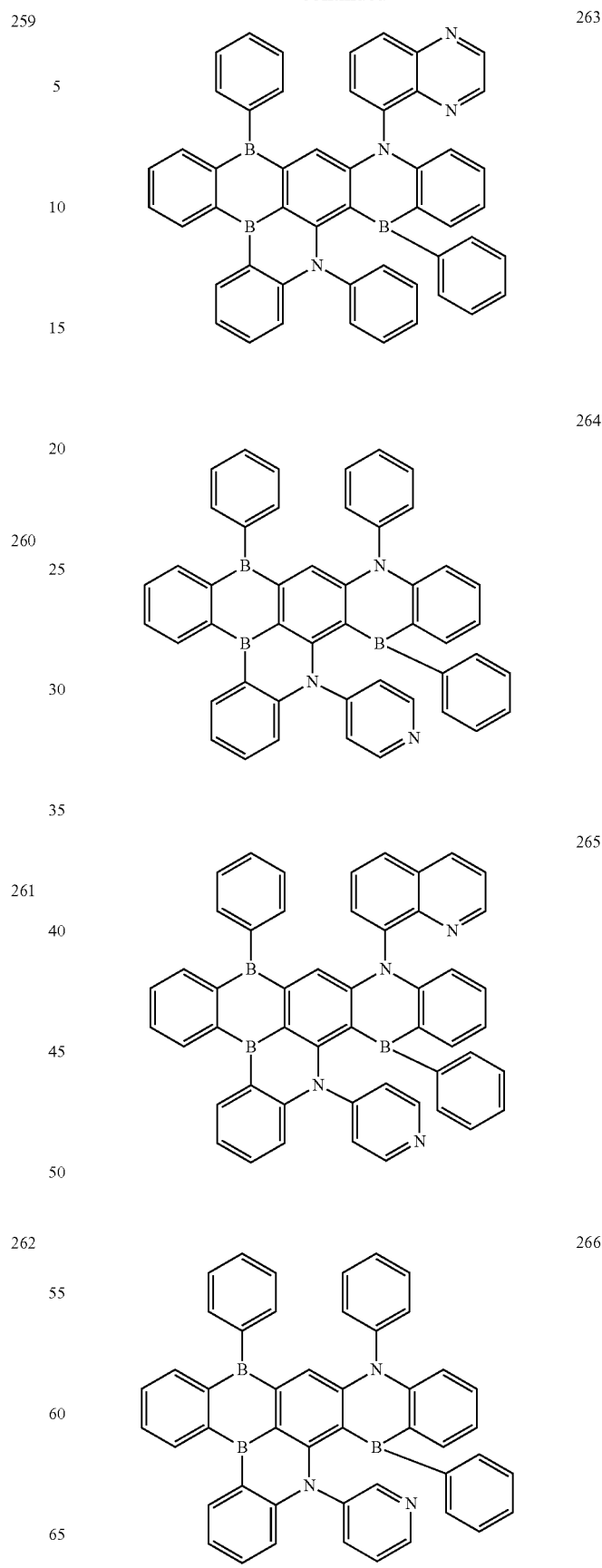
263
264
265
266

267
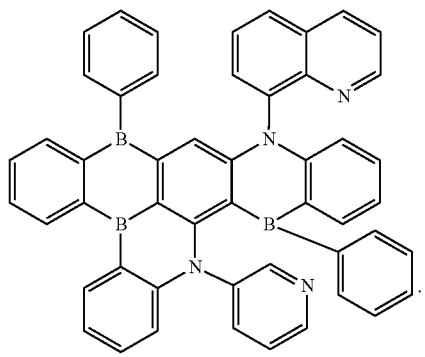
When X is a carbon atom or a tetravalent heteroatom, and Y is a divalent heteroatom, the organic compound may have any one of the structures shown in formula (268) to formula (329):
268
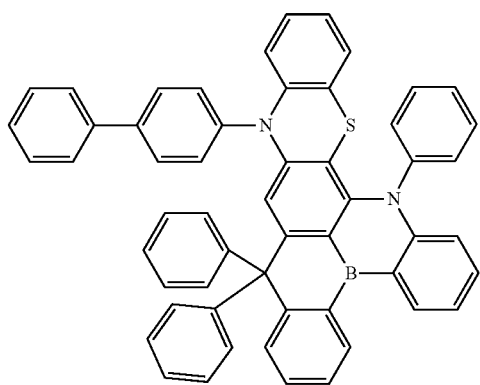
269
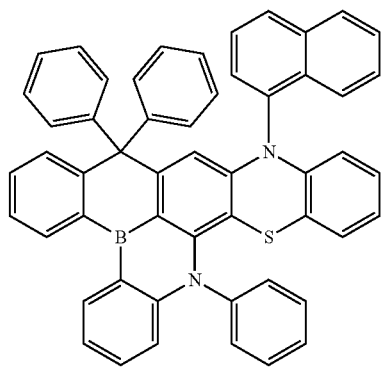
270
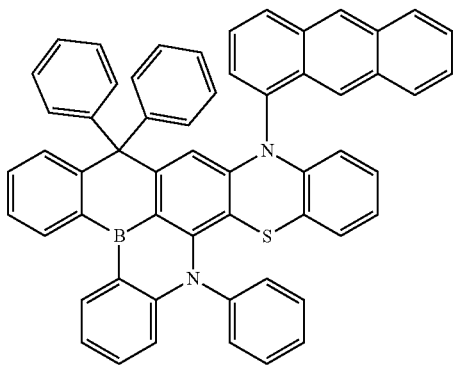
271
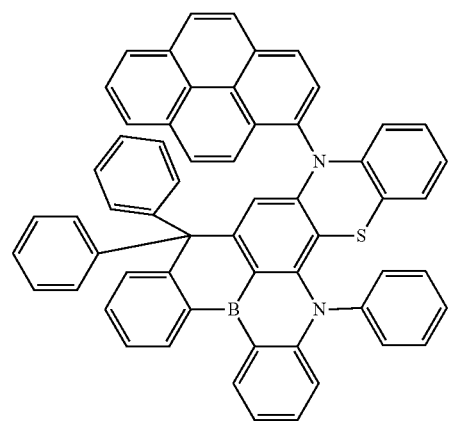
272
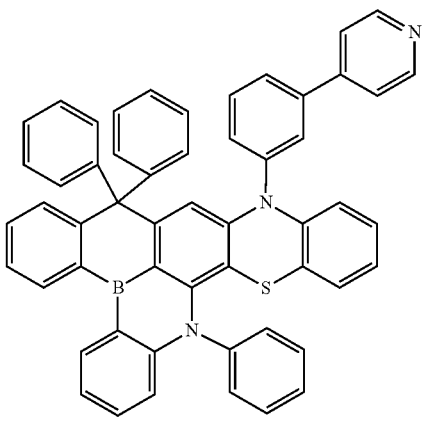
273
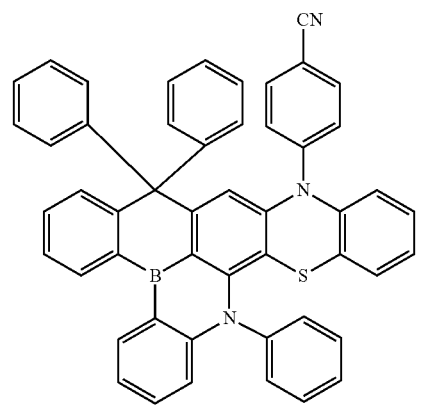

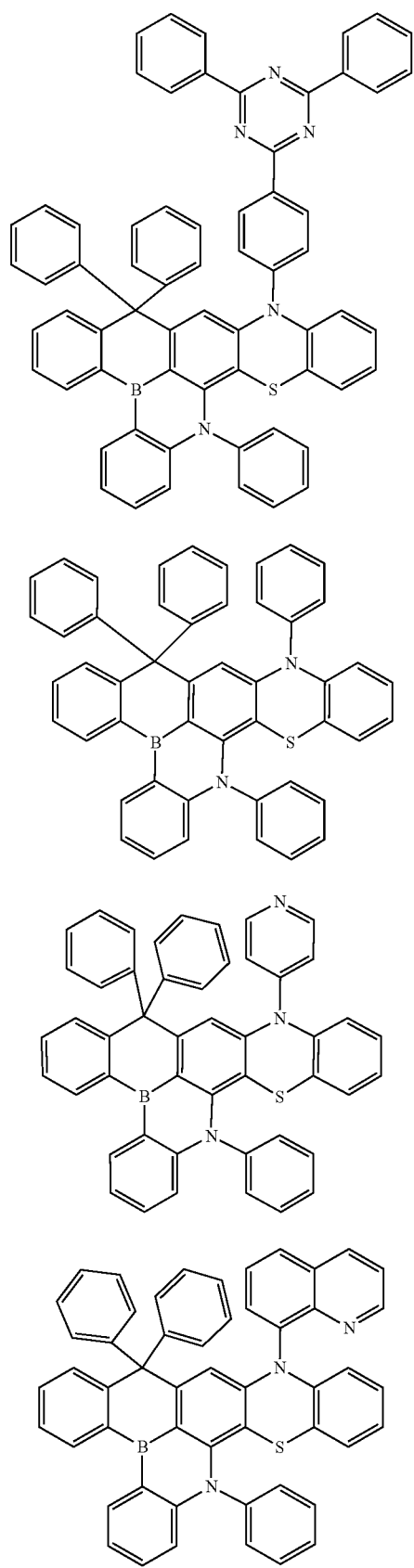
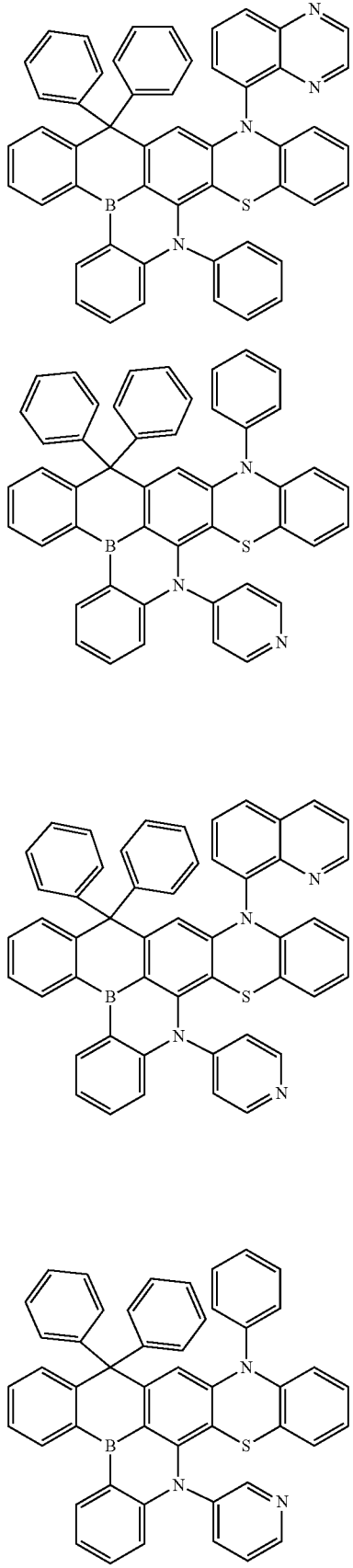

282
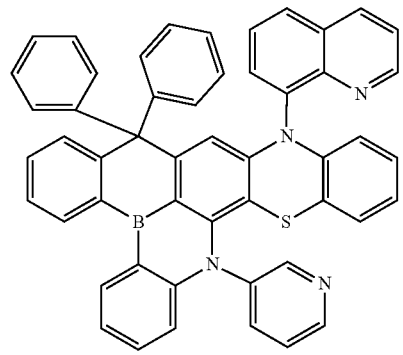
283
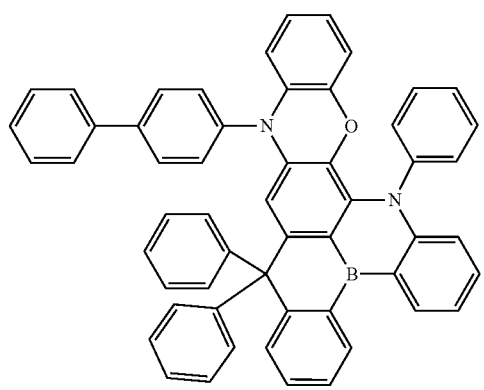
284
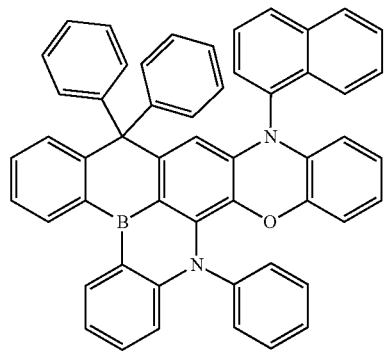
285
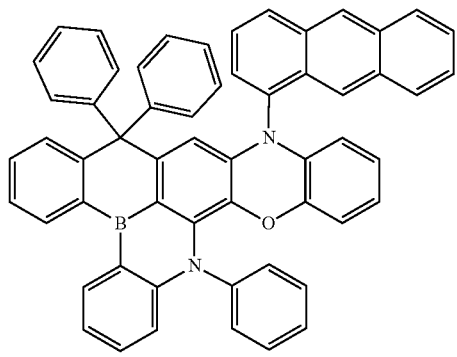
286
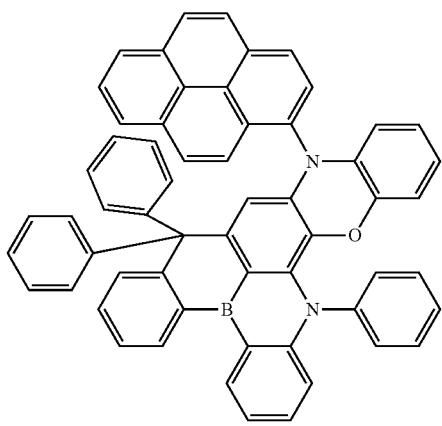
287
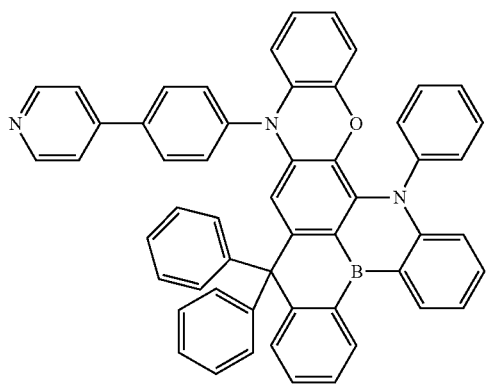
288
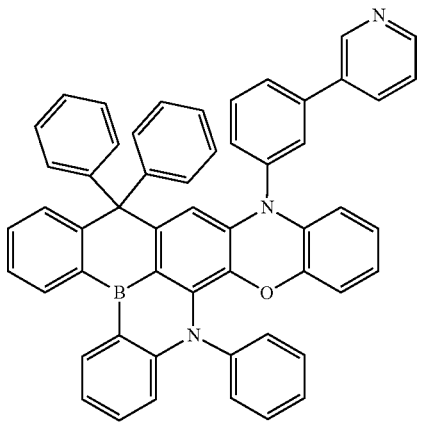
289
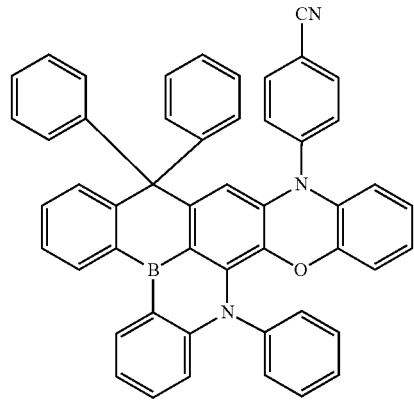

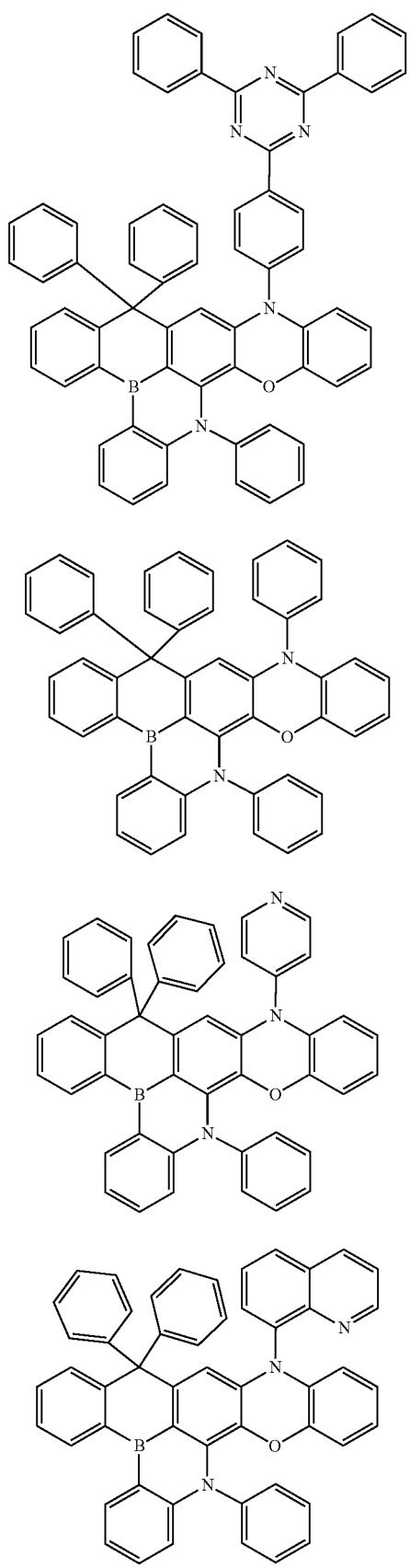

298
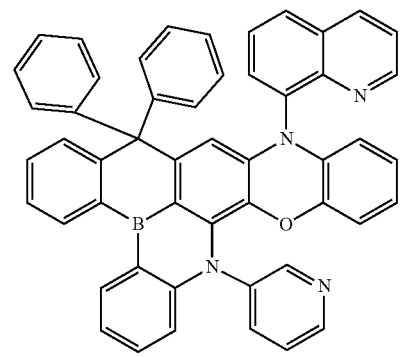
299
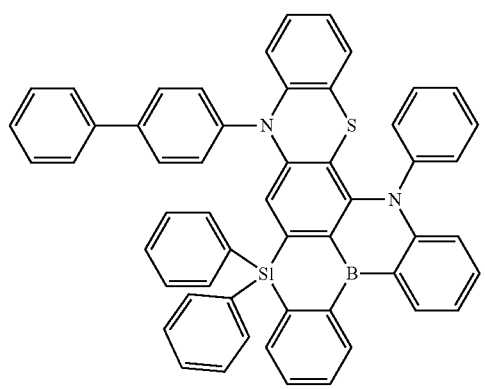
300
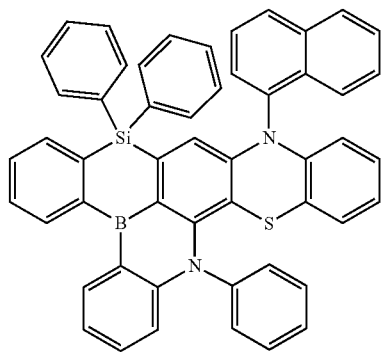
301
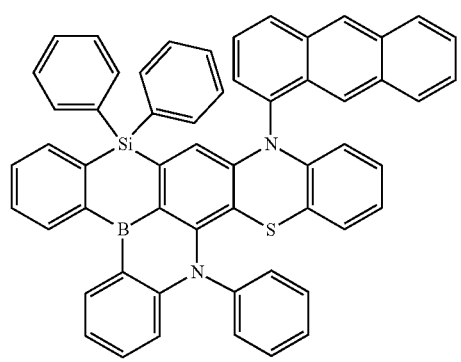
302
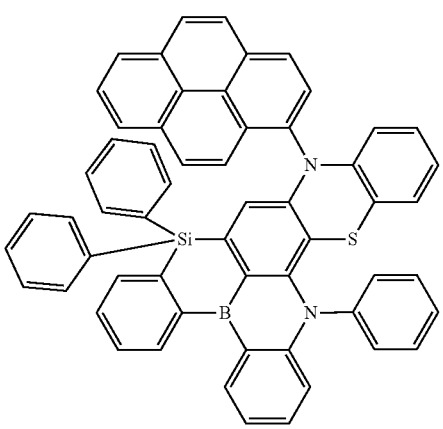
303
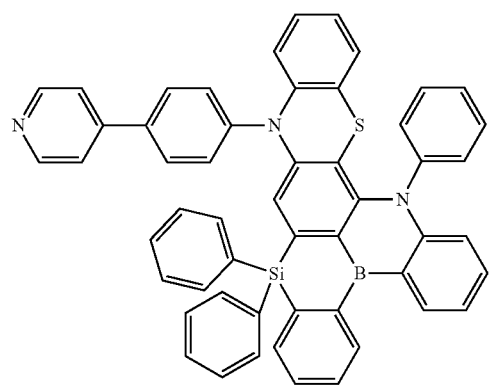
304
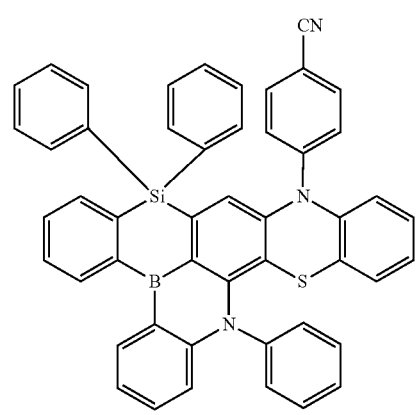

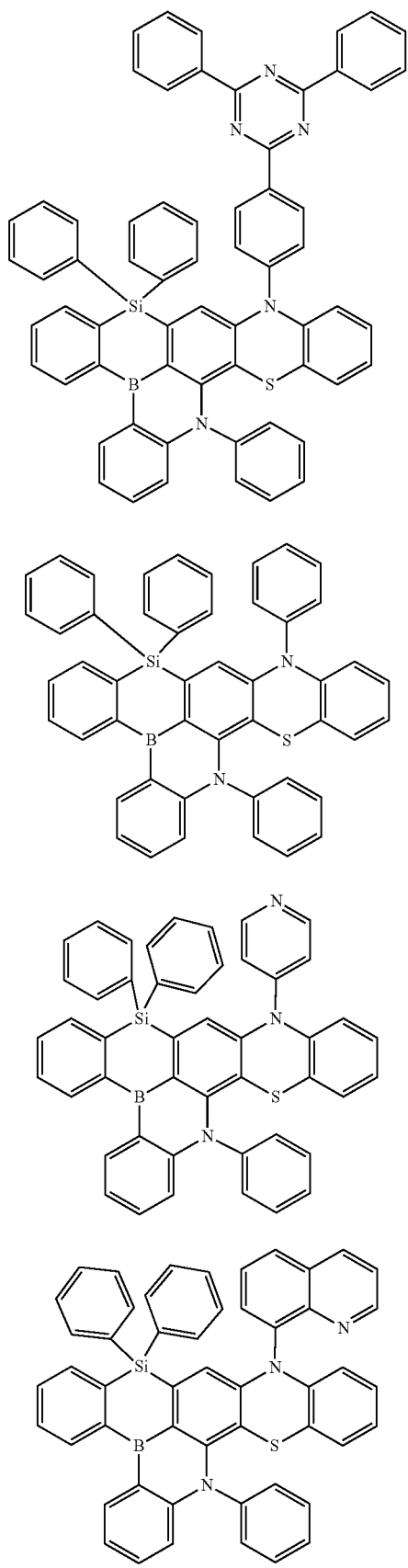
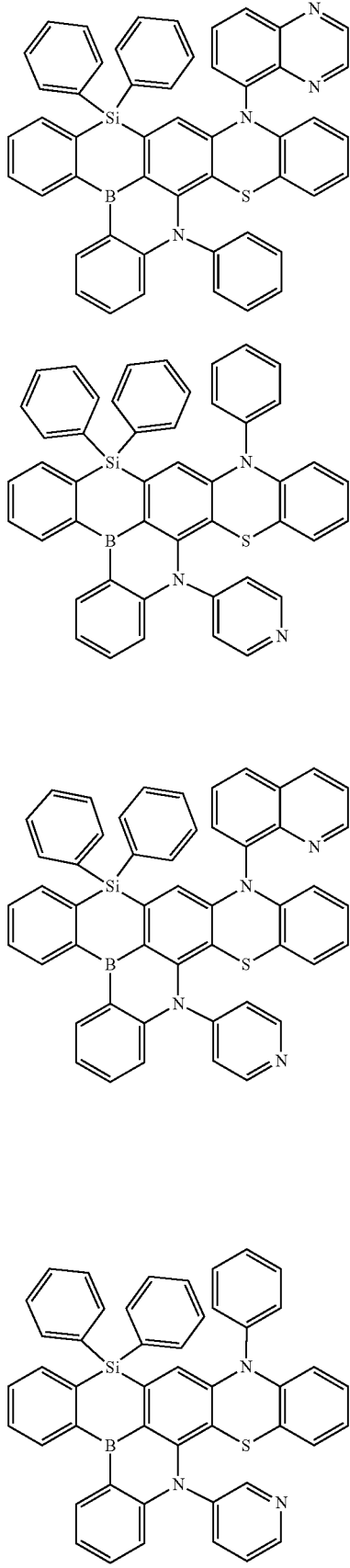

93
-continued
313
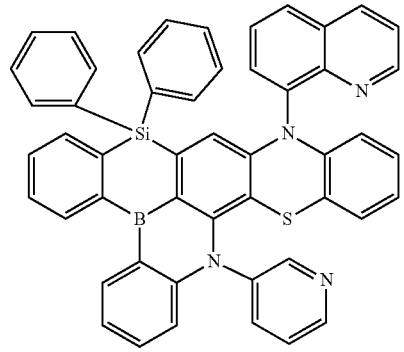
314
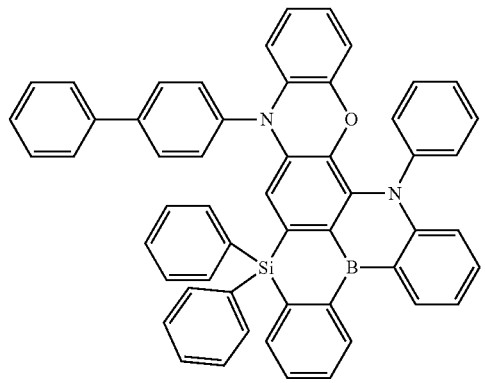
315
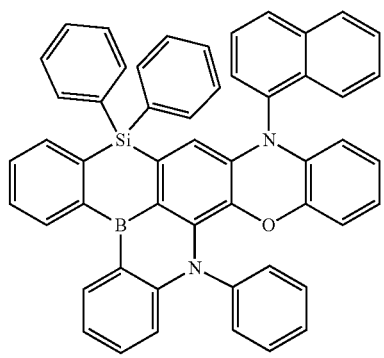
316
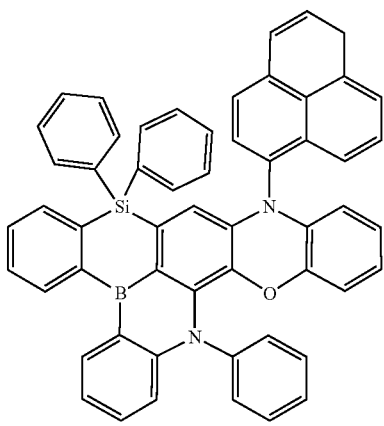
94
-continued
317
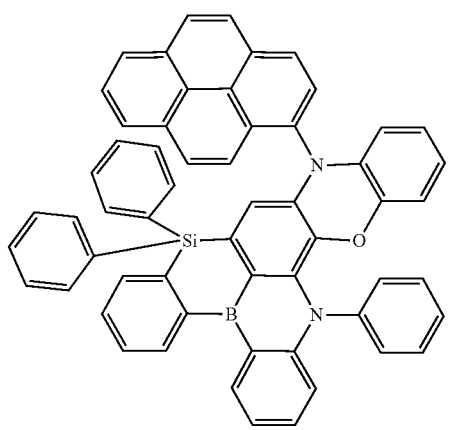
318
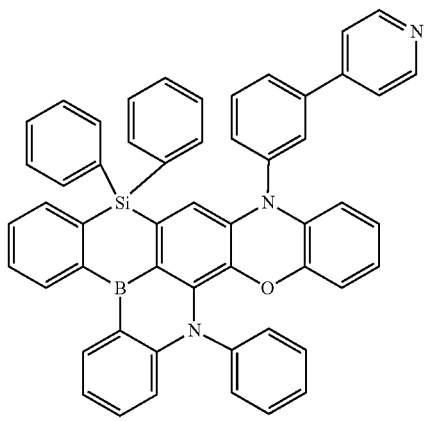
319
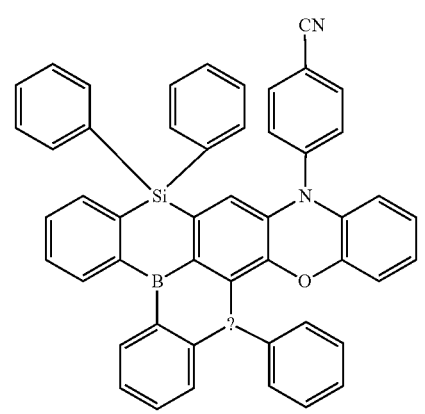

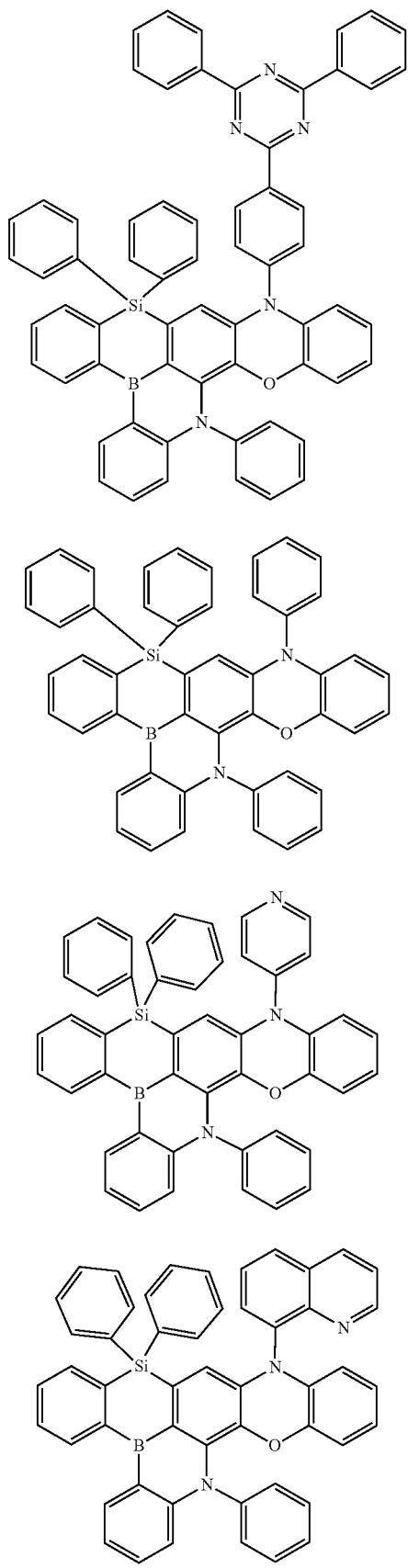
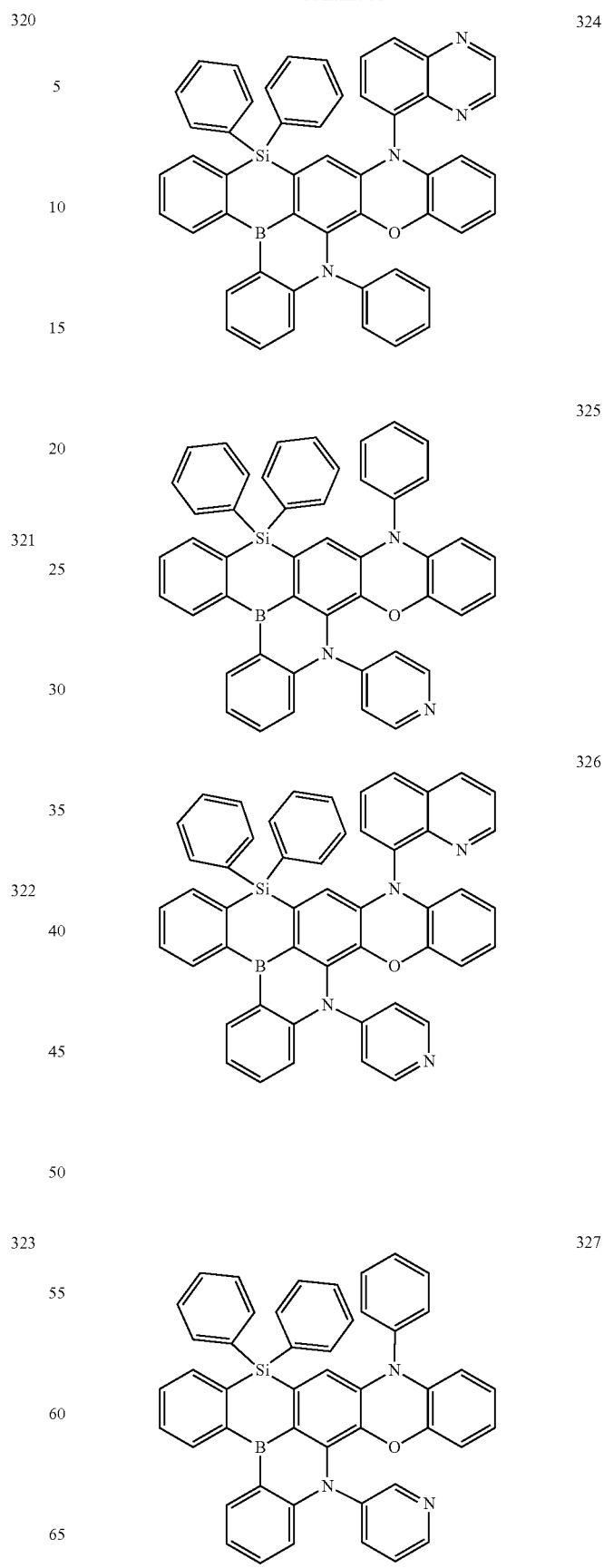

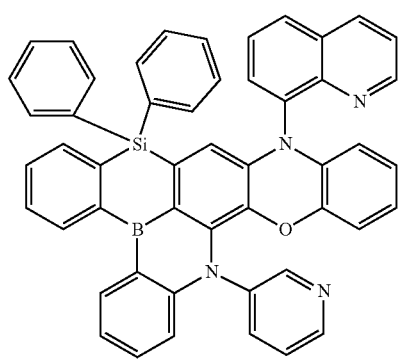
328
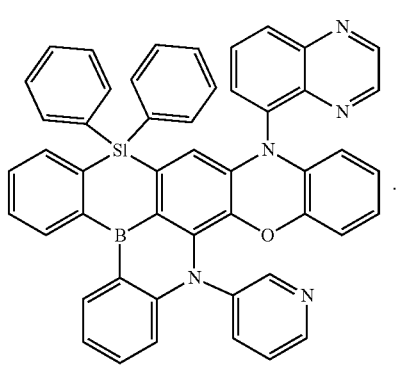
329
When X is a carbon atom or a tetravalent heteroatom, and Y is a trivalent heteroatom, the organic compound provided by the present disclosure may have any one of the structures shown in formula (330) to formula (400):
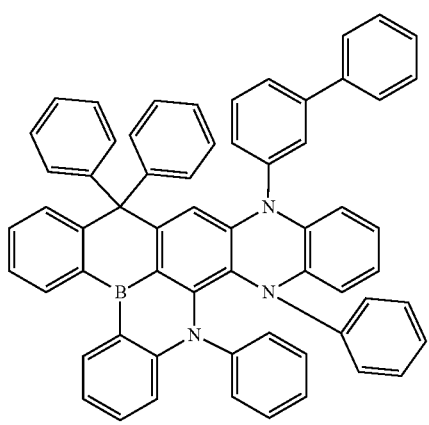
330
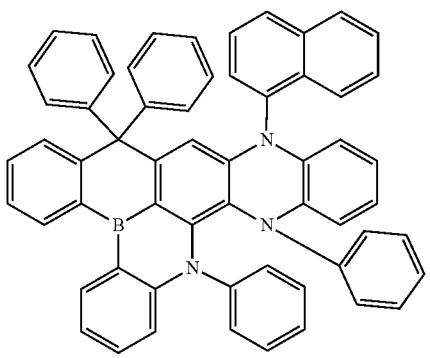
331
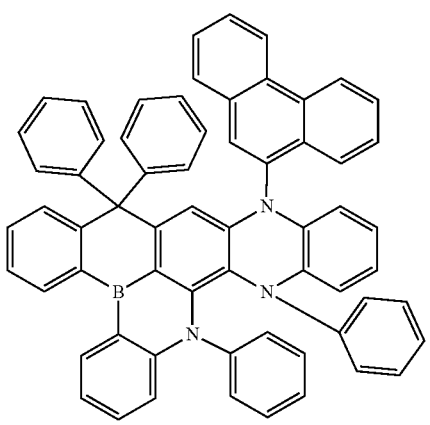
332
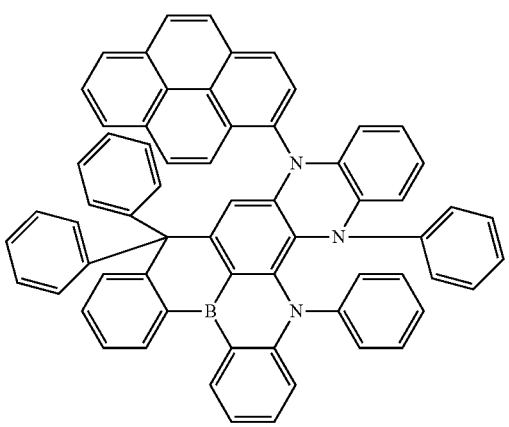
333
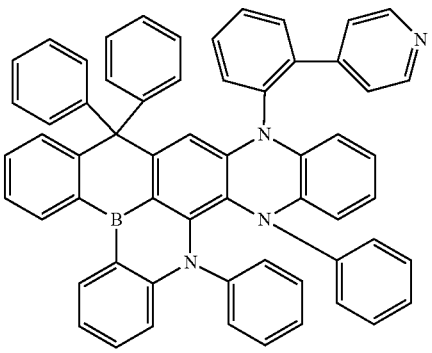
334

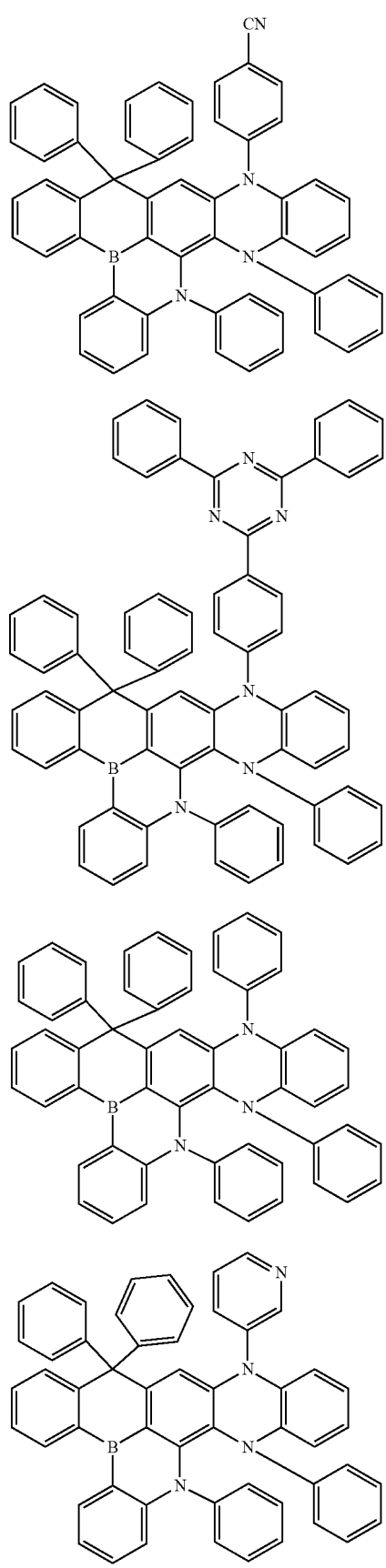
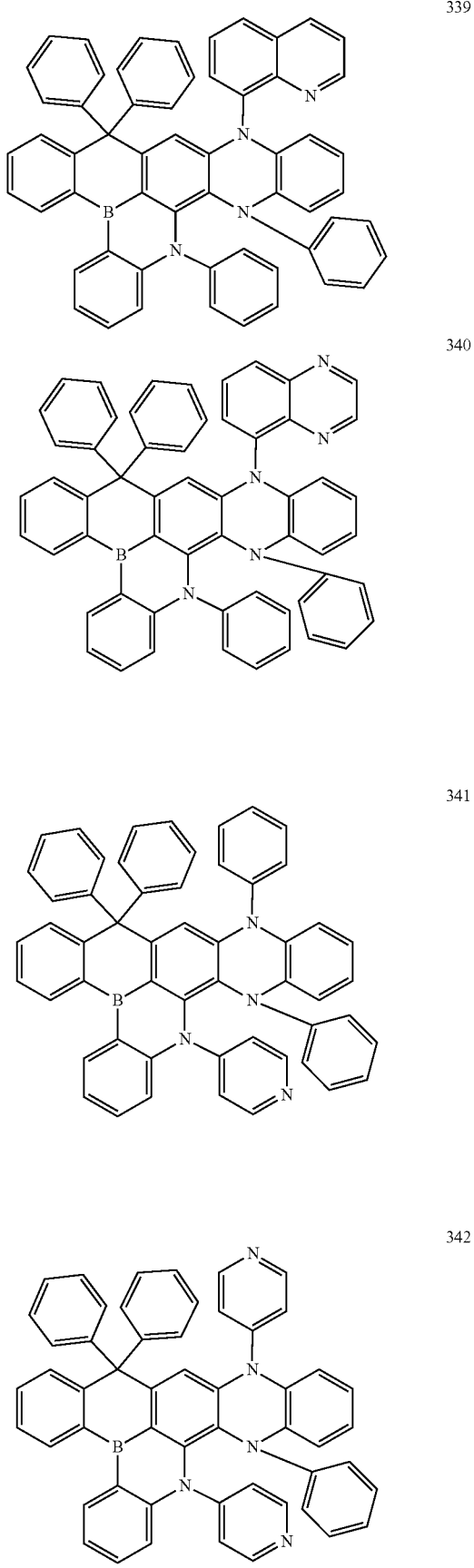

343
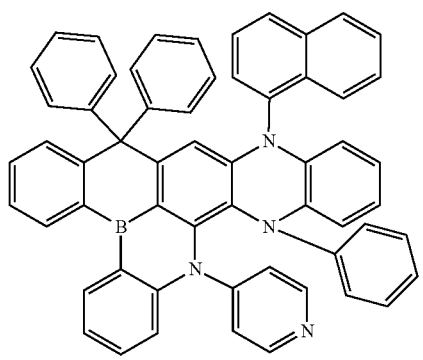
344
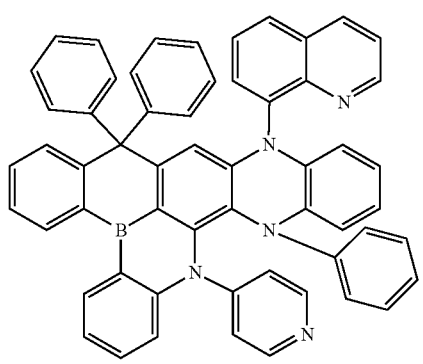
345
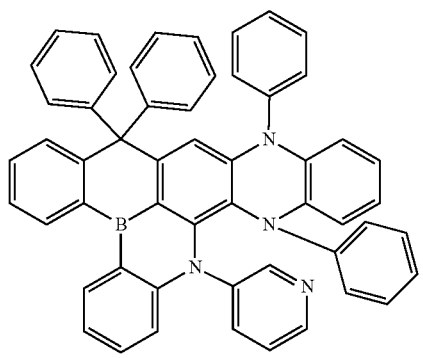
346
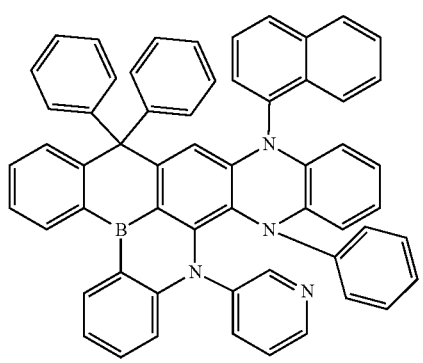
347
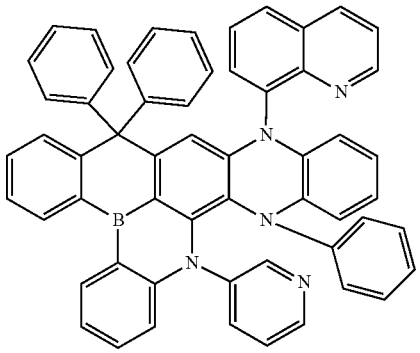
348
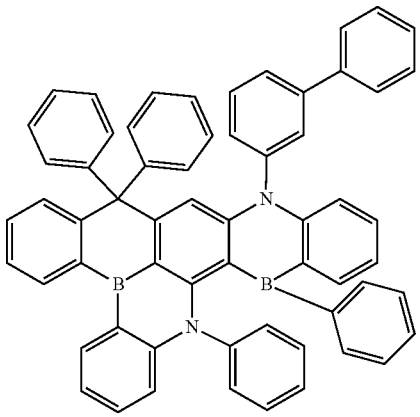
349
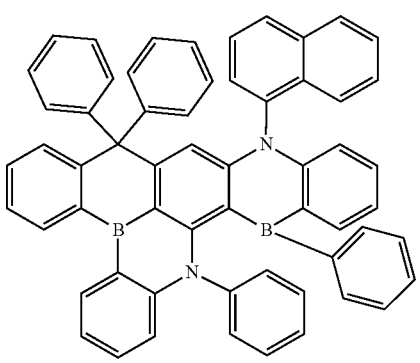
350
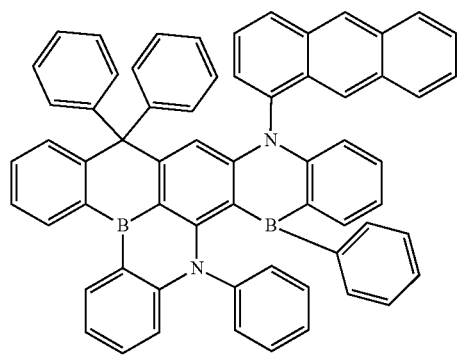

103
-continued
351
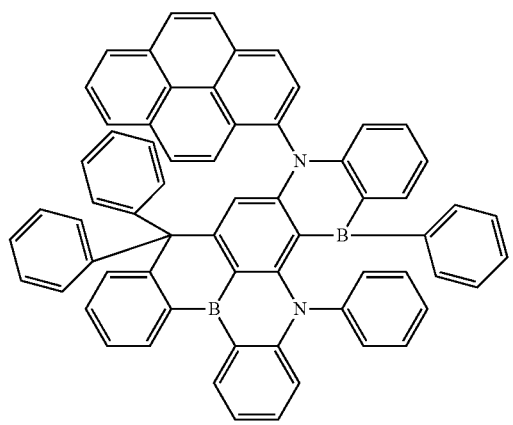
352
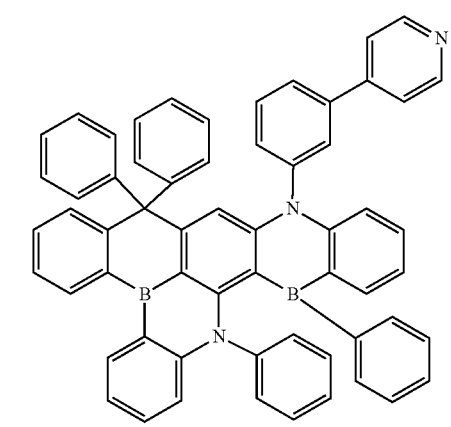
353
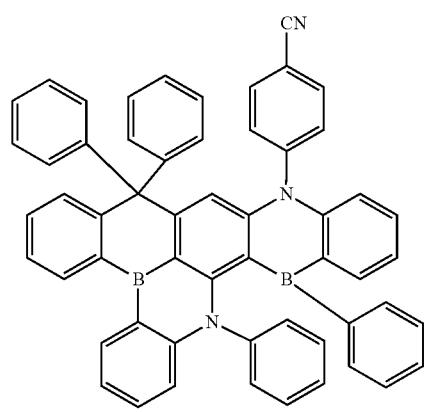
104
-continued
354
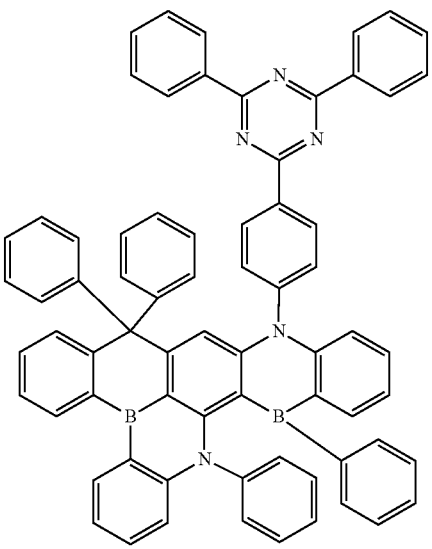
355
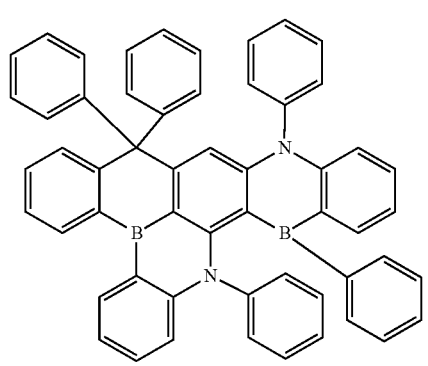
356
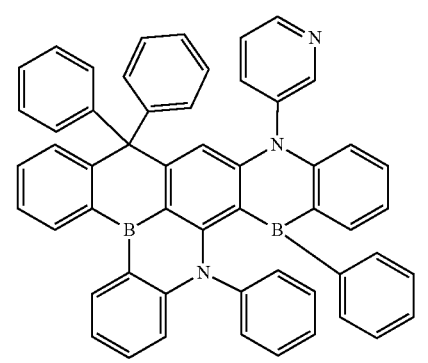
357
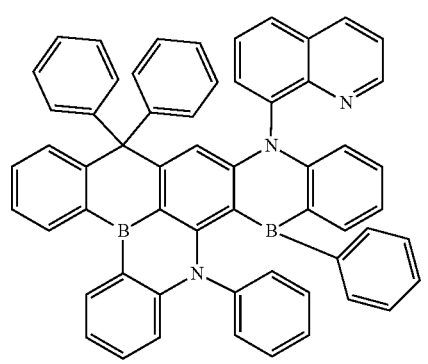

105
-continued
358
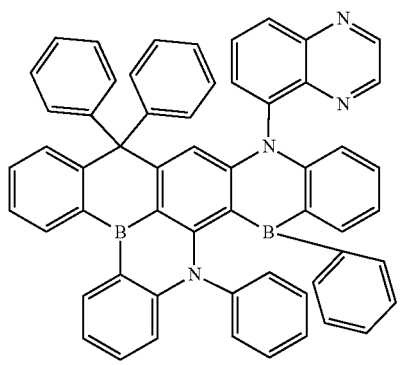
359
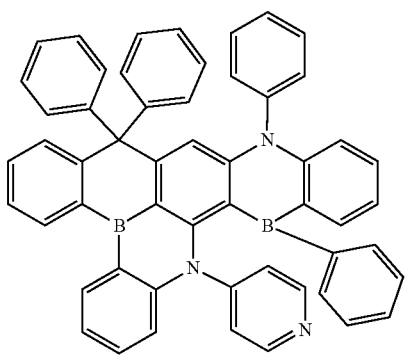
360
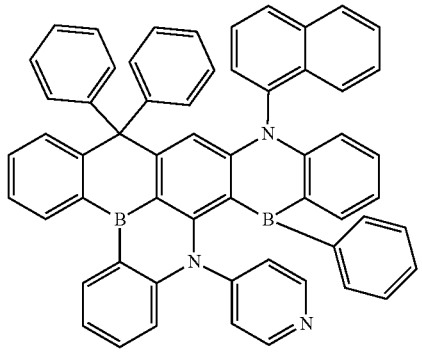
361
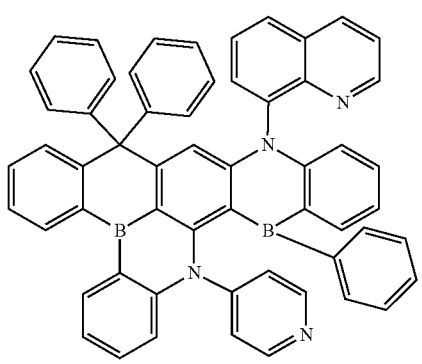
106
-continued
362
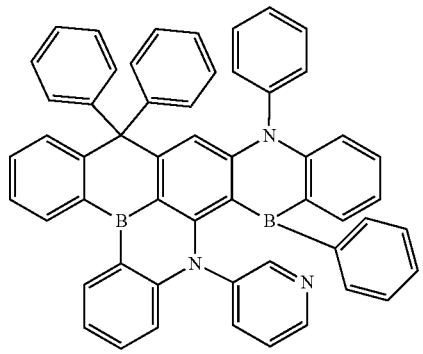
363
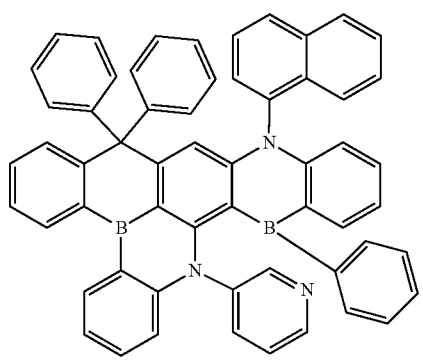
364
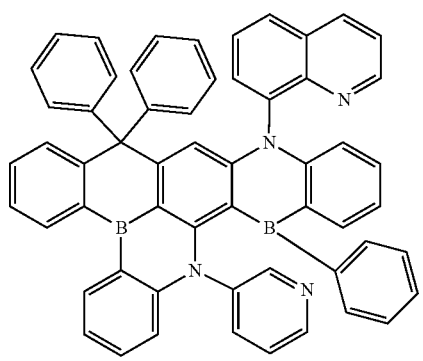
365
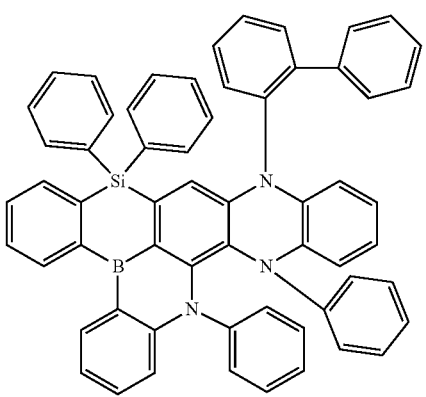

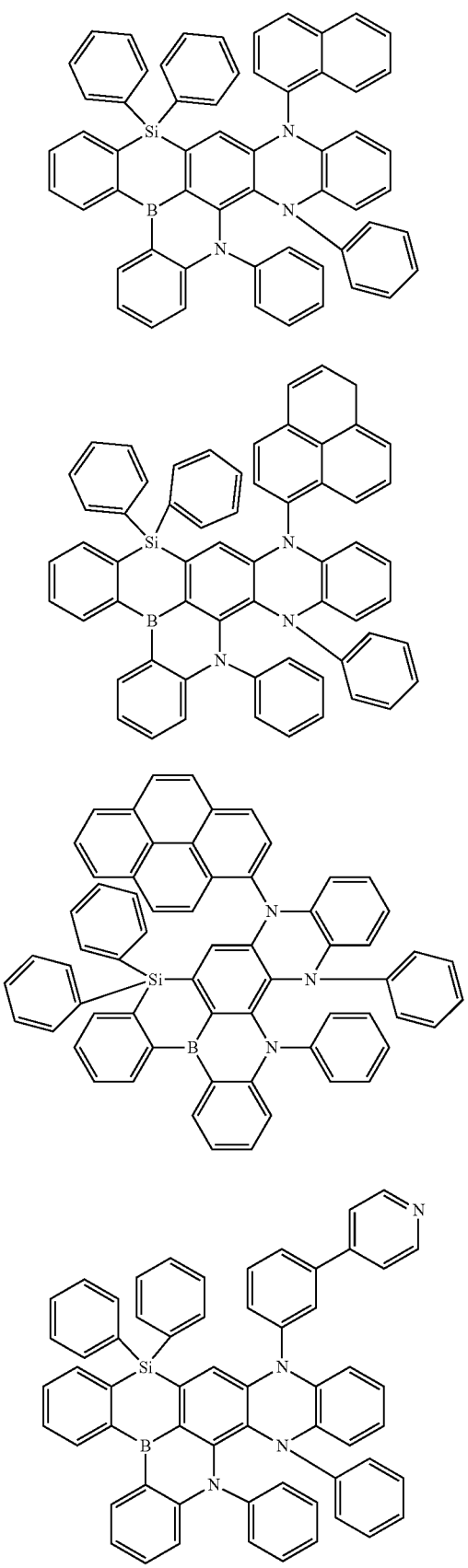
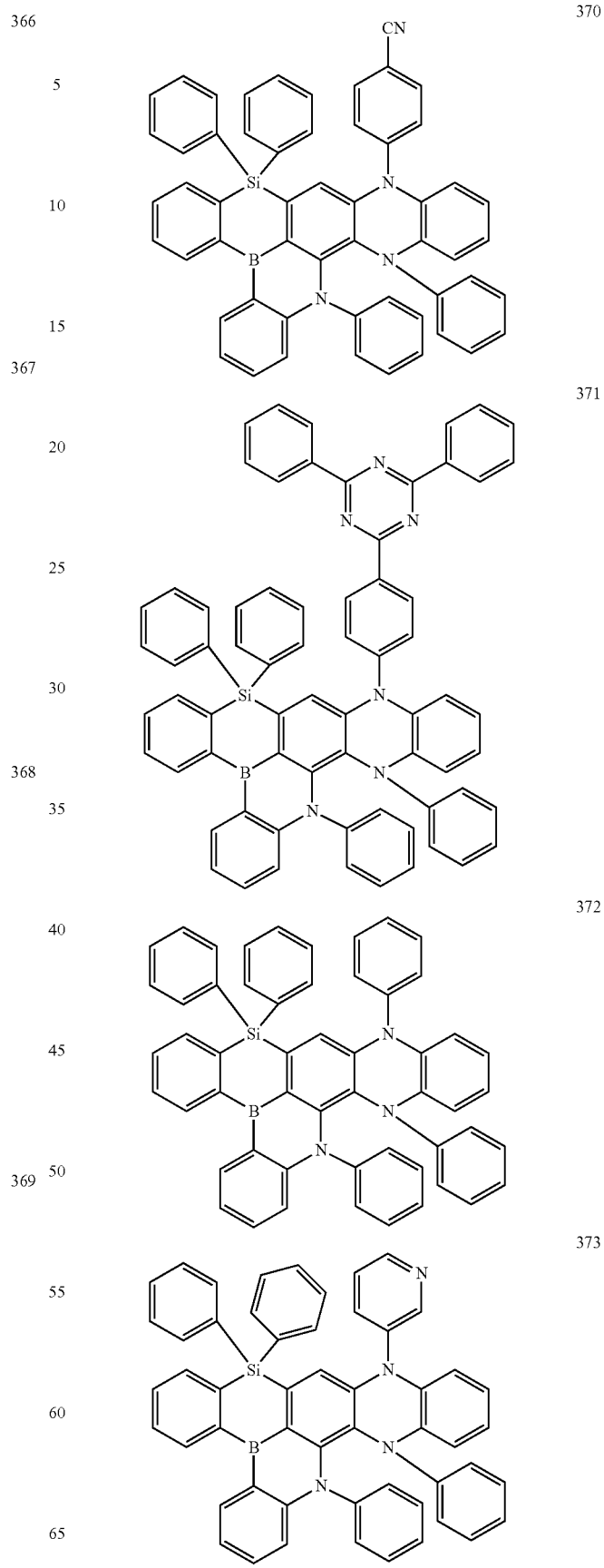

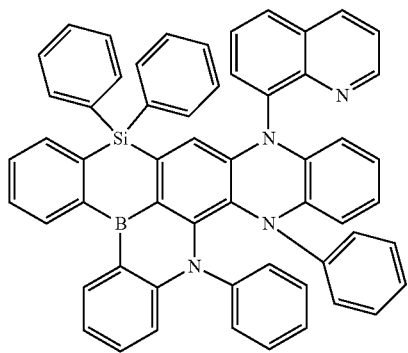
374
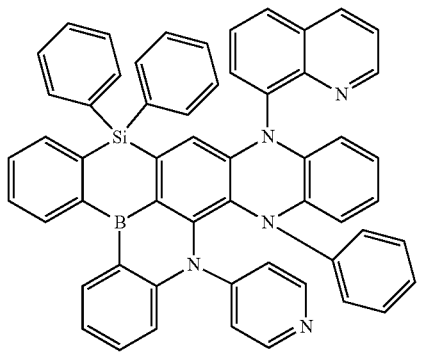
378
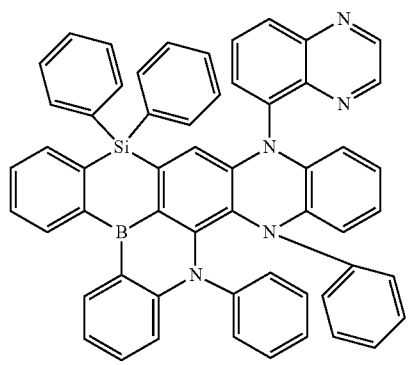
375
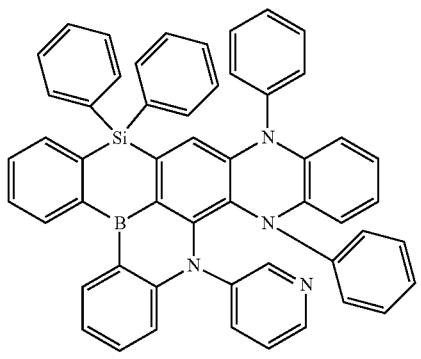
379
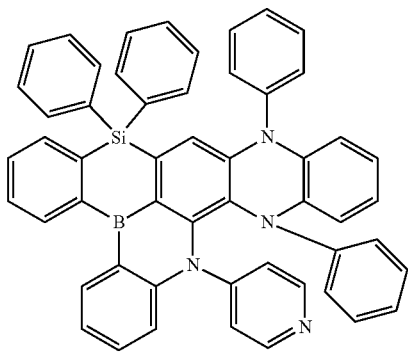
376
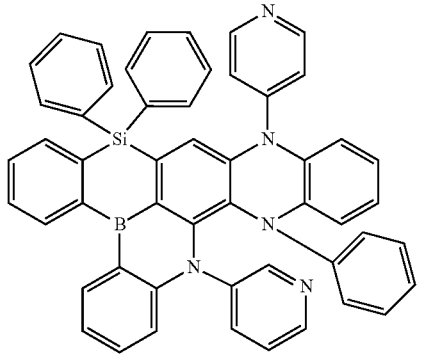
380
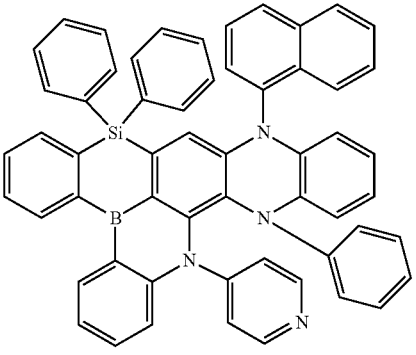
377
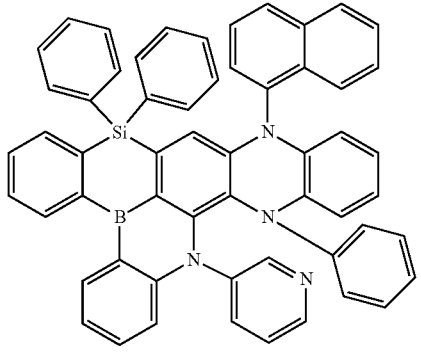
381

382
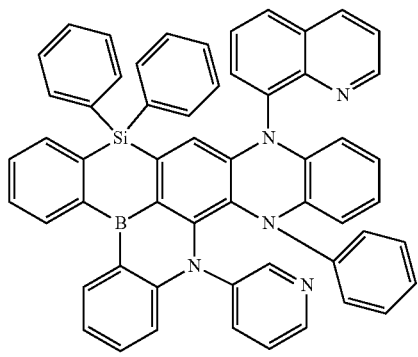
383
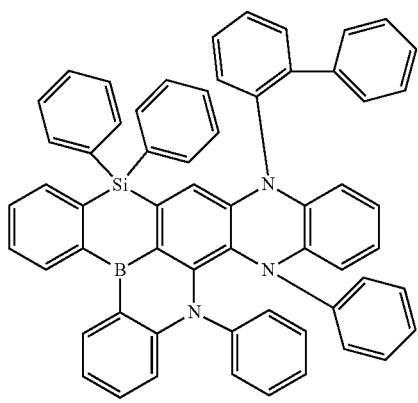
384
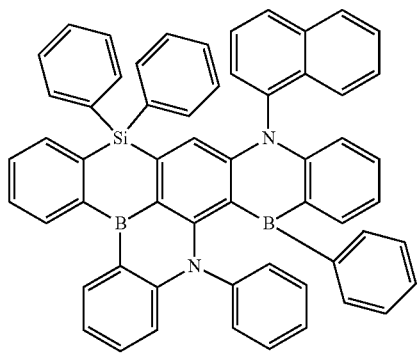
385
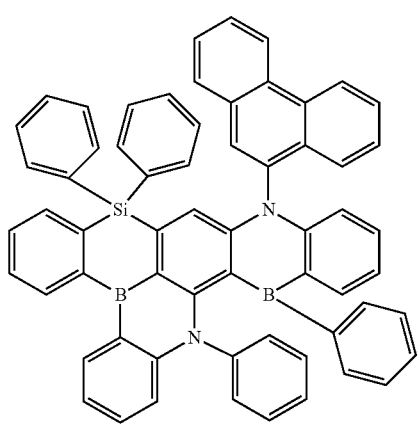
386
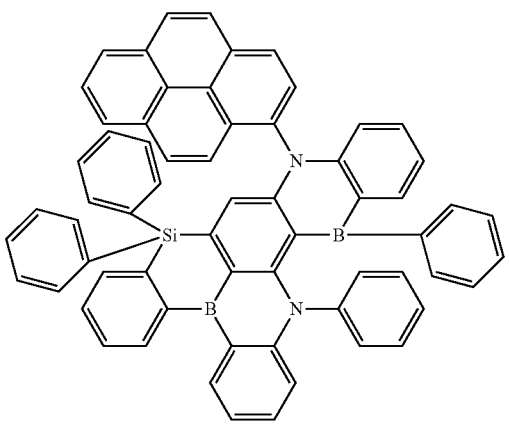
387
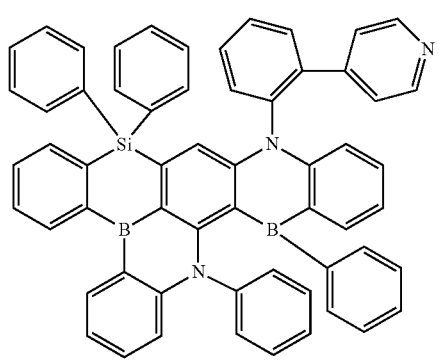
388
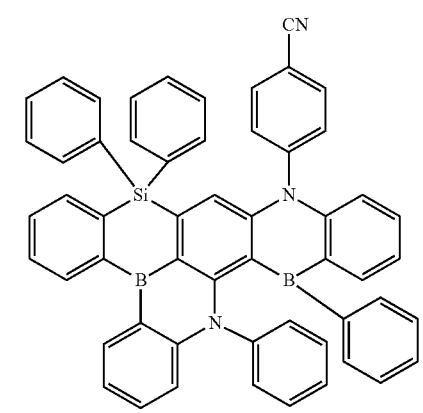

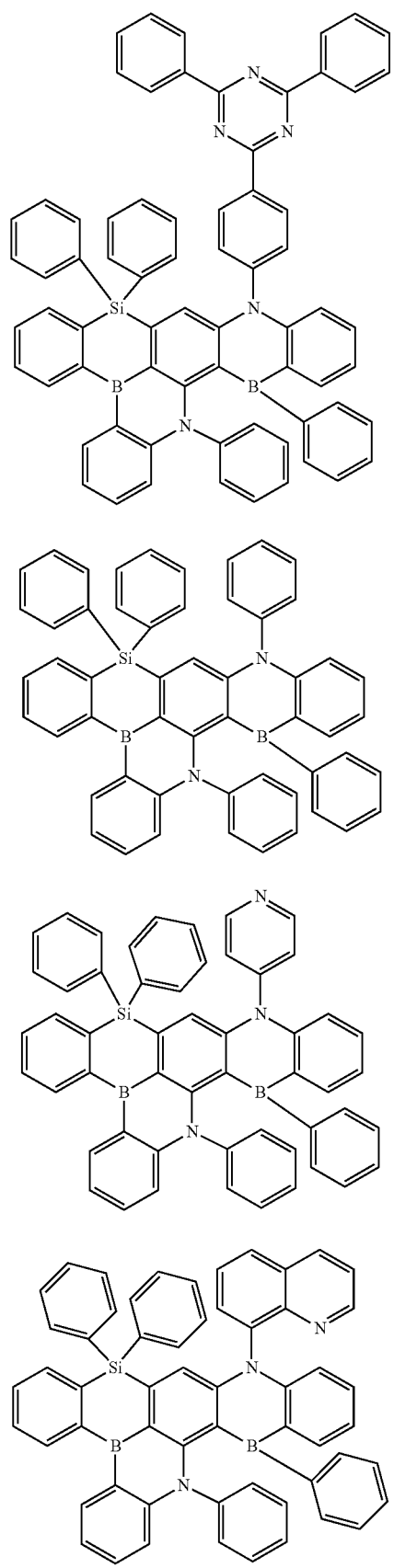
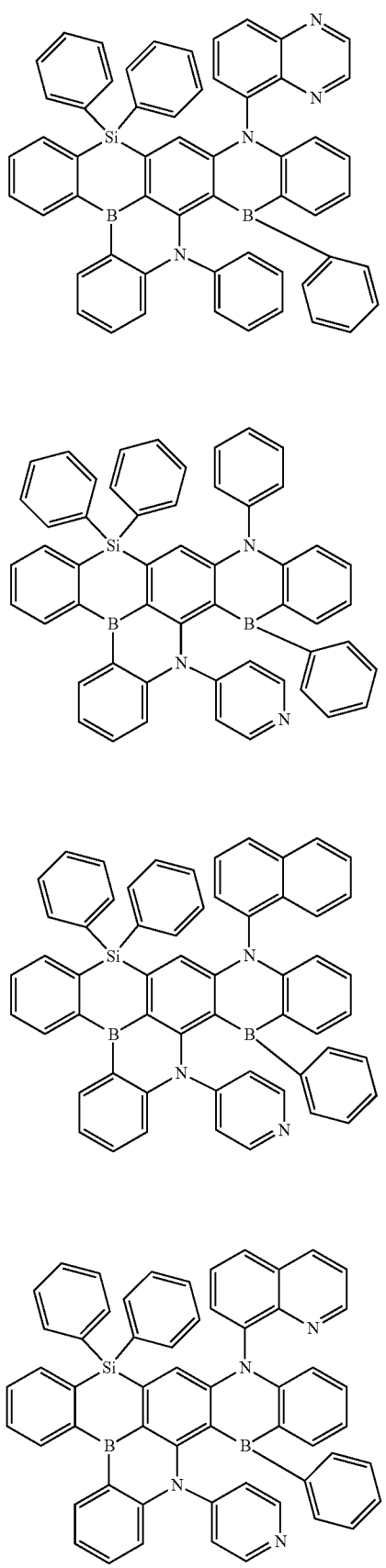

-continued

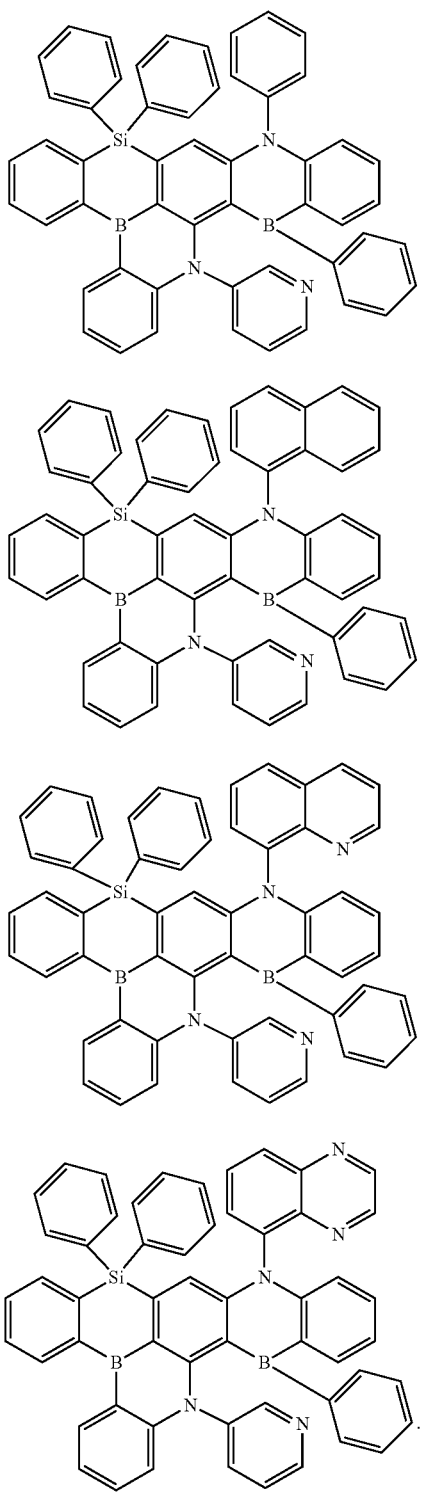

397

398

399

400

The organic compound provided by the present disclosure uses a large heterocyclic ring with N and B atoms as the skeleton to be connected with an aromatic amine ring as a TADF material, and has a small energy level difference and a high luminous quantum efficiency. The organic compound, as the material of the OLED light-emitting layer, may improve the luminous efficiency of organic optoelectronic devices, and may be environmentally friendly with relatively low cost compared to phosphorescent metal complexes.

Furthermore, for the present disclosure, the organic compound may become a branched structure through the selection of X and Y, thereby improving the solubility of the material, and the device containing the organic compound may have desirable performance and more suitable for mass production.

In the present disclosure, the formula (I), an organic compound with a large heterocyclic ring containing N and B atoms as a skeleton connected with an aromatic ring structure of an aromatic amine, may be obtained by bonding the ring through the tandem hetero-Friedel-Crafts reaction (continuous aromatic electrophilic substitution reaction), which is well known to those skilled in the art. In the present disclosure, optionally, the compound represented by the formula (II) may be subjected to the tandem hetero-Friedel-Crafts reaction (continuous aromatic electrophilic substitution reaction) to obtain the compound represented by the formula (I). For example, one or more of n-butyllithium, sec-butyllithium and tert-butyllithium may be used as a catalyst for ortho-metallization of the compound represented by the formula (II); then boron trichloride and/or boron trihalide may be added; after the lithium-boron metal exchange is performed, a base such as N,N-diisopropylethylamine may be added, and the tandem hetero-Friedel-Crafts reaction may be performed to obtain the compound represented by the formula (I). In the present disclosure, optionally, the following steps may be included: after the heating reaction of the compound represented by the formula (II) with tert-butyl lithium, the temperature may be decreased, boron tribromide may be added to react at room temperature, N,N-diisopropylethylamine may be added, and the temperature of the reaction may be increased to obtain the organic compound represented by the formula (I). The temperature of the heating reaction may be optionally about 50° C. to about 70° C., for example, about 60° C.; the time of the heating reaction may be optionally about 3 h to about 5 h, for example, 4 h; the temperature decrease may be optionally the reduction to about −40° C. to about −20° C., for example, about −30° C.; and the reaction time at room temperature may be optionally about 30 min to about 90 min, for example, about 40 min to 80 min, and even more preferably about 60 min.

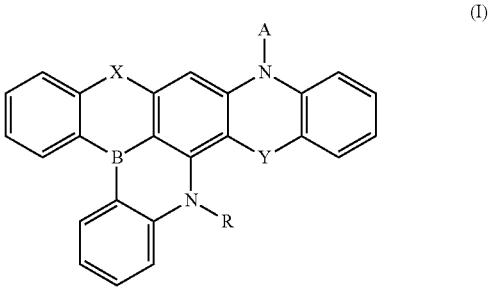

(I)

-continued

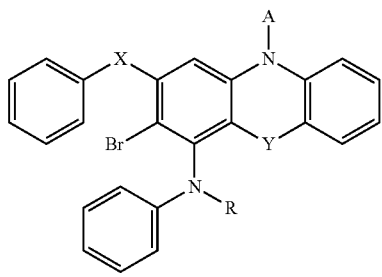
(II)

In the present disclosure, a Grignard reagent may also be used for substitution of substituents.

The X, Y, A and R may all be same as the above, which may not be described in detail herein.

The present disclosure also provides the application of the organic compound represented by the above-mentioned formula (I) as an organic light-emitting material and/or electron transport material in the organic light-emitting element.

The present disclosure also provides a display panel including an organic light-emitting element. The organic light-emitting element may include an anode, a cathode, and at least one organic compound layer between the anode and the cathode; and the organic compound layer may include at least one organic compound represented by the above-mentioned formula (I).

In the display panel provided by the present disclosure, the anode material of the organic light-emitting element may be selected from metals such as copper, gold, silver, iron, chromium, nickel, manganese, palladium, platinum and the like, and alloys thereof. The anode material may also be selected from metal oxides such as indium oxide, zinc oxide, indium tin oxide (ITO), indium zinc oxide (IZO) and the like. The anode material may also be selected from conductive polymers such as polyaniline, polypyrrole, poly(3-methylthiophene) and the like. In addition, the anode material may also be selected from materials that facilitate hole injection other than the anode materials listed above and combinations thereof, which may include known materials suitable for anodes.

In the display panel provided by the present disclosure, the cathode material of the organic light-emitting element may be selected from metals, such as aluminum, magnesium, silver, indium, tin, titanium and the like, and alloys thereof. The cathode material may also be selected from multilayer metal materials such as LiF/Al, $LiO_2$/Al, $BaF_2$/Al, and the like. In addition to the cathode materials listed above, the cathode materials may also be materials that facilitate electron injection and combinations thereof, which may include known materials suitable for cathodes.

At least one organic compound layer may be disposed between the anode and the cathode; according to the present disclosure, the organic compound layer may optionally include a light-emitting layer; and the light-emitting layer may optionally include at least one compound represented by the above-mentioned formula (I).

According to the present disclosure, the organic compound layer may optionally include an electron transport layer; and the electron transport layer may optionally include at least one compound represented by the above-mentioned formula (I).

According to one embodiment of the display panel of the present disclosure, the organic compound layer in the organic light-emitting element may at least include a light-emitting layer, and optionally further include one or more of a hole injection layer, a hole transport layer, an electron blocking layer, a hole blocking layer, an electron transport layer, and an electron injection layer.

The organic electroluminescence device can be fabricated according to methods in the existing technology, which may not be described in detail herein. In the present disclosure, the organic electroluminescence device can be fabricated as follows: an anode may be formed on a transparent or opaque smooth substrate, an organic thin layer may be formed on the anode, and a cathode may be formed on the organic thin layer. For the formation of the organic thin layer, known film forming methods such as evaporation, sputtering, spin coating, dipping, and ion plating can be used.

For example, referring to FIG. 1, FIG. 1 illustrates a structural schematic of an organic light-emitting element according to various embodiments of the present disclosure. The organic light-emitting element may include a substrate 1, an anode 2, a first hole transport layer 3, a second hole transport layer 4, a light-emitting layer 5, a first electron transport layer 6, a second electron transport layer 7, a cathode 8 and a cap layer 9 which are stacked sequentially.

Figure 2:
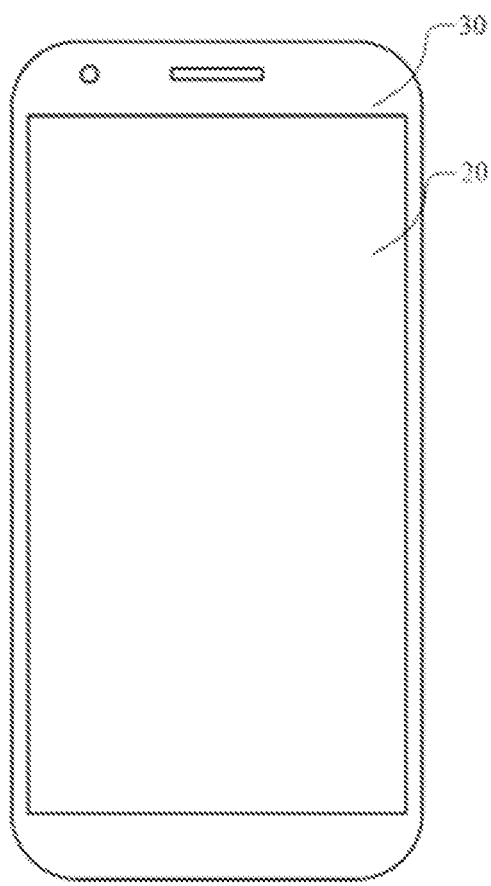
FIG. 2 illustrates a schematic of a display device according to various embodiments of the present disclosure.

The present disclosure also provides a display device including the above-mentioned display panel. In the present disclosure, the display device may be a mobile phone display screen, a computer display screen, a TV display screen, a smart watch display screen, a smart car display screen, a VR or AR helmet display screen, a display screen of various smart devices and the like. For example, the display device is shown in FIG. 2, and FIG. 2 illustrates a schematic of the display device according to various embodiments of the present disclosure, where 30 is a smart phone, and 20 is a display panel.

The technical solutions of various embodiments of the present disclosure are clearly and completely described in the following. Obviously, the described embodiments are only a part of various embodiments of the present invention, rather than all embodiments. Based on various embodiments of the present disclosure, all other embodiments obtained by those skilled in the art without creative work shall fall within the protection scope of the present disclosure.

Exemplary Embodiment 1

Synthesis of the Compound Represented by the Formula 007

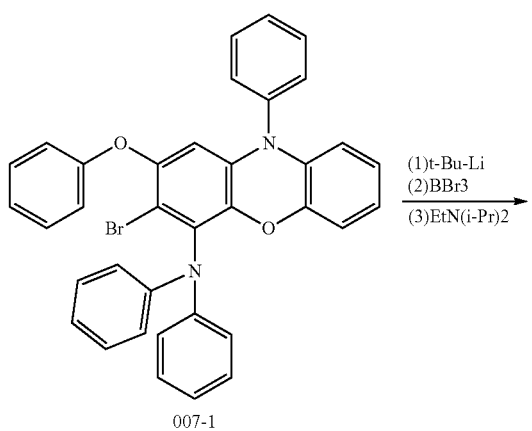

007-1

119
-continued

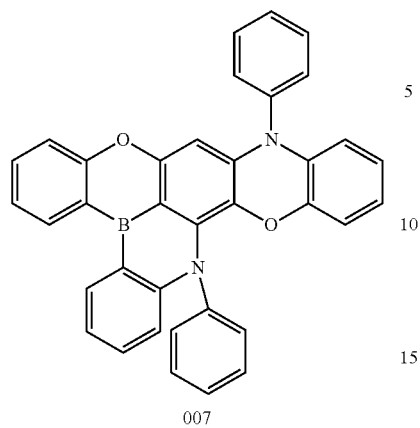

007

A pentane solution of tert-butyllithium (15.8 mL, 1.70 M, 26.76 mmol) may be slowly added to a tert-butylbenzene (120 mL) solution with the compound 007-1 (4.40 mmol) at 0° C., and the temperature may be increased to 60° C. for 4 hours reaction; after the reaction is completed, the temperature may be decreased to −30° C., boron tribromide (53.60 mmol) may be slowly added, and the solution may be stirred continuously for 1 hour at room temperature; N,N-diisopropylethylamine (80.40 mmol) may be added at room temperature, and the reaction may be stopped after continuous reaction at 145° C. for 6 hours. The solution may be spin-dried in vacuum to remove solvents and pass through a silica gel column to obtain the target compound 007 with a yield of 64%.

The molecular mass determined by mass spectrometry analysis may be: 526.20 (calculated value: 526.19); and the theoretical element content (%) $C_{36}H_{23}BN_2O_2$ may be: C, 82.14; H, 4.40; B, 2.05; N, 5.32; and O, 6.08.

Exemplary Embodiment 2

Synthesis of the Compound Represented by the Formula 010

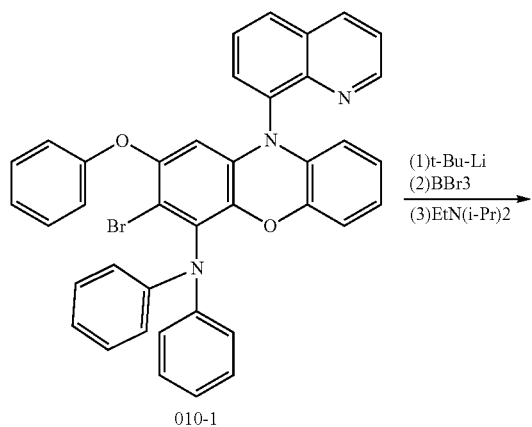

010-1

120
-continued

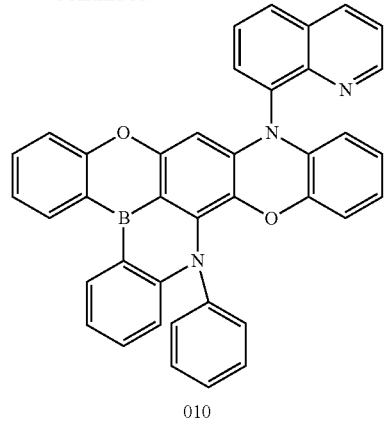

010

One embodiment may be similar to the synthesis method of the compound 007, with the difference that: in one embodiment, 007-1 may need to be replaced with 010-1 in the equivalent amount. The target compound 010 may have the yield of 63%. The molecular mass determined by mass spectrometry analysis may be: 577.21 (calculated value: 577.20); and the theoretical element content (%) $C_{39}H_{24}BN_3O_2$ may be: C, 81.12; H, 4.19; B, 1.87; N, 7.28; and O, 5.54.

Exemplary Embodiment 3

Synthesis of the Compound Represented by the Formula 028

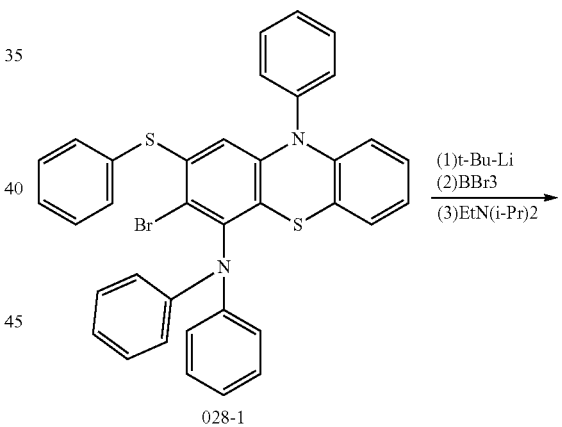

028-1

028

One embodiment may be similar to the synthesis method of the compound 007, with the difference that: in one embodiment, 007-1 needs to be replaced with 028-1 of the equivalent amount. The target compound 028 may have the yield of 58%. The molecular mass determined by mass spectrometry analysis may be: 558.16 (calculated value: 558.14); and the theoretical element content (%) $C_{36}H_{23}BN_2S_2$ may be: C, 77.42; H, 4.15; B, 1.94; N, 5.02; and S, 11.48.

Exemplary Embodiment 4

Synthesis of the Compound Represented by the Formula 029
One embodiment may be similar to the synthesis method of the compound 007, with the difference that: in one embodiment, 007-1 needs to be replaced with 029-1 of the equivalent substance. The target compound 029 may have the yield of 57%. The molecular mass determined by mass spectrometry analysis may be: 609.17 (calculated value: 609.15); and the theoretical element content (%) $C_{39}H_{24}BN_3S_2$ may be: C, 76.84; H, 3.97; B, 1.77; N, 6.89; and S, 10.52.

Exemplary Embodiment 5

Synthesis of the Compound Represented by the Formula 099

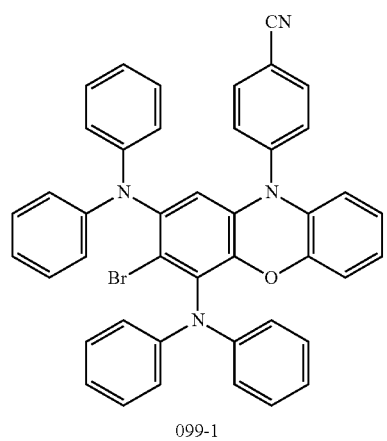

099-1

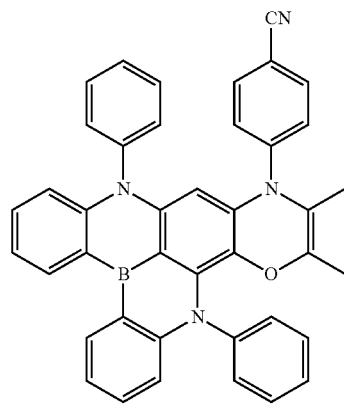

099

One embodiment may be similar to the synthesis method of the compound 007, with the difference that: in one embodiment, 007-1 needs to be replaced with 099-1 in the equivalent amount. The target compound 099 may have the yield of 55%. The molecular mass determined by mass spectrometry analysis may be: 626.25 (calculated value: 626.23); and the theoretical element content (%) $C_{43}H_{27}BN_4O$ may be: C, 82.43; H, 4.34; B, 1.73; N, 8.94; and O, 2.55.

Exemplary Embodiment 6

Synthesis of the Compound Represented by the Formula 100

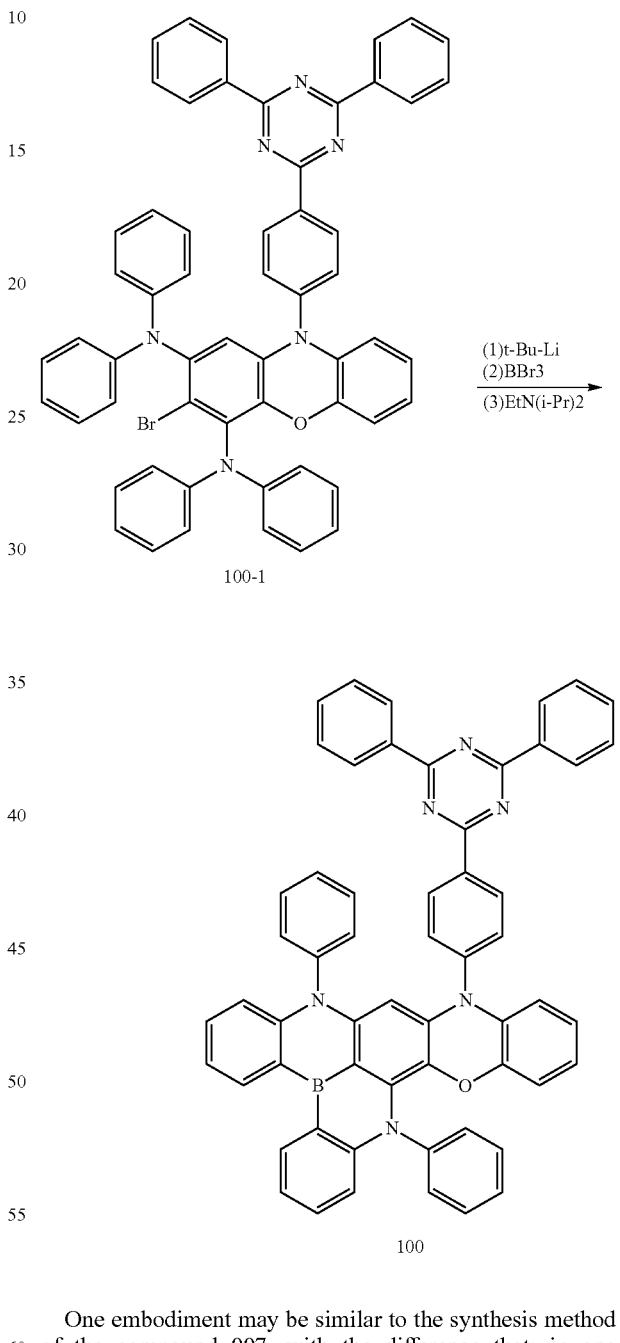

One embodiment may be similar to the synthesis method of the compound 007, with the difference that: in one embodiment, 007-1 needs to be replaced with 100-1 of the equivalent substance. The target compound 100 may have the yield of 62%. The molecular mass determined by mass spectrometry analysis may be: 832.33 (calculated value: 832.31); and the theoretical element content (%) $C_{57}H_{37}BN_6O$ may be: C, 82.21; H, 4.48; B, 1.30; N, 10.09; and O, 1.92.

Exemplary Embodiment 7

Synthesis of the Compound Represented by the Formula 103

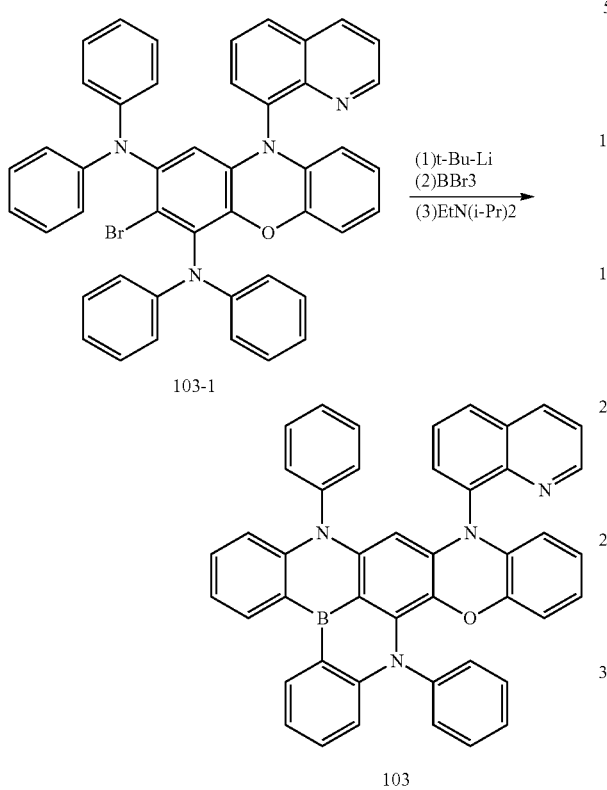

One embodiment may be similar to the synthesis method of the compound 007, with the difference that: in one embodiment, 007-1 needs to be replaced with 103-1 of the equivalent substance. The target compound 103 may have the yield of 58%. The molecular mass determined by mass spectrometry analysis may be: 652.25 (calculated value: 652.24); and the theoretical element content (%) $C_{45}H_{29}BN_4O$ may be: C, 82.83; H, 4.48; B, 1.66; N, 8.59; and O, 2.45.

Exemplary Embodiment 8

Synthesis of the Compound Represented by the Formula 232

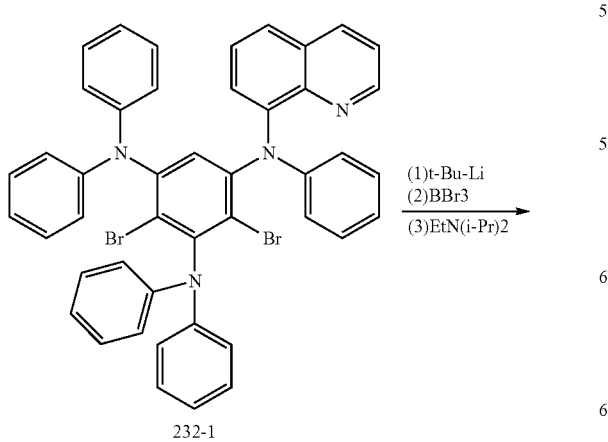

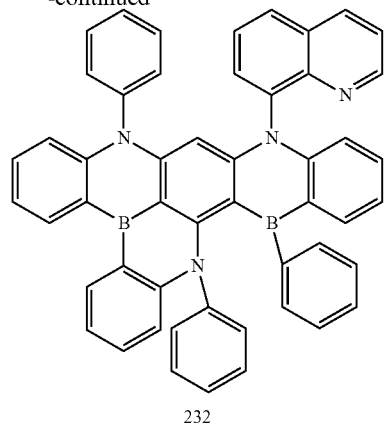

A pentane solution of tert-butyllithium (18.59 mL, 1.60 M, 29.75 mmol) may be slowly added to a tert-butylbenzene (70 mL) solution with 232-1 (4.96 mmol) at 0° C., and then the reaction temperature may be gradually increased to 60° C. for 4 hours reaction. After the reaction is completed, the temperature may be decreased to −30° C., boron tribromide (19.86 mmol) may be slowly added, and the mixture may be stirred for 1 hour at room temperature. N,N-diisopropylethylamine (19.86 mmol) may be added at room temperature, the reaction may be continued at 145° C. for 12 hours, then the reaction mixture may be cooled to room temperature, phenylmagnesium bromide (19.86 mmol) may be added at this point, and the reaction may be stopped after continuous reaction for 2 hours. The mixture may be spin-dried in vacuum to remove solvents and pass through a silica gel column to obtain the target compound 232 with a comprehensive yield of 46%. The molecular mass determined by mass spectrometry analysis may be: 724.32 (calculated value: 724.30); and the theoretical element content (%) $C_{51}H_{34}B_2N_4$ may be: C, 84.55; H, 4.73; B, 2.98; and N, 7.73.

Exemplary Embodiments 9 and 10

The synthesis of the compounds in exemplary embodiments 9 and 10 may be similar to the synthesis of the compound 007, with the difference that: 007-1 may need to be replaced with the equivalent mass of the compound 293-1 and the compound 323-1 to obtain the target compound 293 and the target compound 323 shown in Table 1.

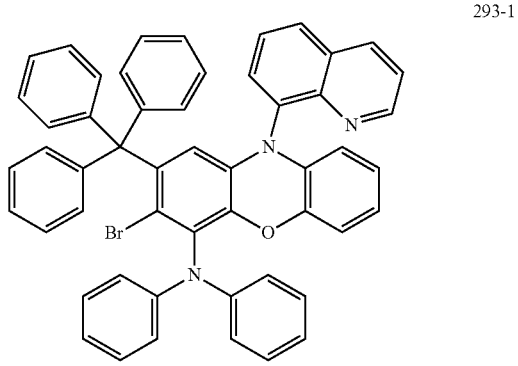

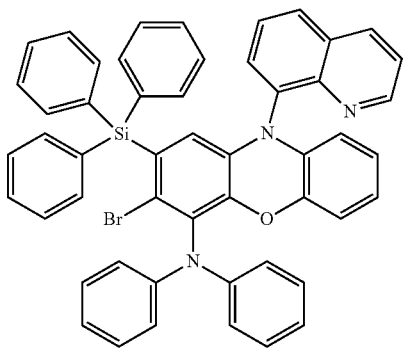

323-1

Using the density functional theory (DFT), for the organic compounds provided by the present disclosure, the distribution of molecular frontier orbitals HOMO and LUMO may be optimized and calculated through the Guassian 09 program package (Guassian Inc.) at the B3LYP/6-31G(d) calculation level; and the singlet energy level $E_S$ and the triplet energy level $E_T$ of the compound molecule may be calculated based on the time-dependent density functional theory (TD-DFT) simulation, and Δest may be obtained. The calculation results are shown in Table 1.

TABLE 1

Gaussian simulation calculation results of organic compounds

| | Compound ID | Compound structure | HOMO (eV) | LUMO (eV) | $E_S$ (eV) | $E_T$ (eV) | Δest (eV) | Wavelength λ (nm) |
|---|---|---|---|---|---|---|---|---|
| Embodient 1 | 007 | 007 | −4.657 | −1.262 | 2.870 | 2.482 | 0.388 | 432.43 |
| Embodiment 2 | 010 | 010 | −4.543 | −1.788 | 2.161 | 2.153 | 0.008 | 574.38 |

TABLE 1-continued

Gaussian simulation calculation results of organic compounds

| Compound ID | Compound structure | HOMO (eV) | LUMO (eV) | $E_S$ (eV) | $E_T$ (eV) | Δest (eV) | Wavelength λ (nm) |
|---|---|---|---|---|---|---|---|
| Embodiment 3 028 | 028 | −4.884 | −1.513 | 2.8274 | 2.4739 | 0.353 | 438.51 |
| Embodiment 4 029 | 029 | −4.781 | −1.808 | 2.4256 | 2.404 | 0.022 | 511.63 |
| Embodiment 5 099 | 099 | −4.659 | −1.752 | 2.3632 | 2.3369 | 0.026 | 525.14 |

TABLE 1-continued

Gaussian simulation calculation results of organic compounds

| Compound | ID | Compound structure | HOMO (eV) | LUMO (eV) | $E_S$ (eV) | $E_T$ (eV) | Δest (eV) | Wavelength λ (nm) |
|---|---|---|---|---|---|---|---|---|
| Embodiment 6 | 100 | 100 | −4.465 | −2.062 | 1.9908 | 1.9843 | 0.007 | 623.37 |
| Embodiment 7 | 103 | 103 | −4.347 | −1.777 | 2.0098 | 2.003 | 0.007 | 617.47 |
| Embodiment 8 | 232 | 232 | −4.786 | −1.762 | 2.486 | 2.452 | 0.034 | 499.16 |

TABLE 1-continued

Gaussian simulation calculation results of organic compounds

| | Compound ID | Compound structure | HOMO (eV) | LUMO (eV) | $E_S$ (eV) | $E_T$ (eV) | Δest (eV) | Wavelength λ (nm) |
|---|---|---|---|---|---|---|---|---|
| Embodiment 9 | 293 | 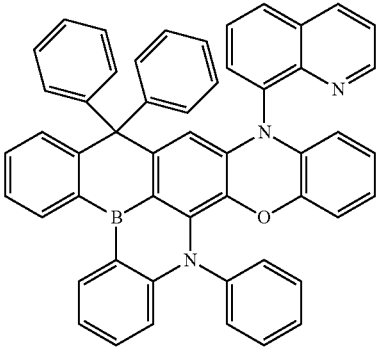 293 | −4.573 | −1.740 | 2.1972 | 2.1877 | 0.010 | 564.81 |
| Embodiment 10 | 323 | 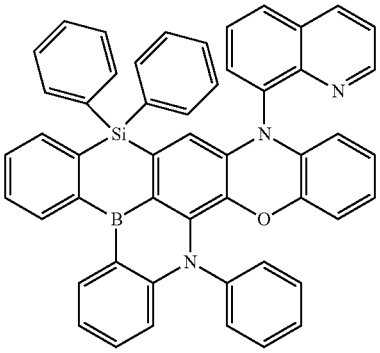 323 | −4.618 | −1.780 | 2.1976 | 2.1863 | 0.011 | 564.71 |

Listed below are a plurality of device examples of the organic compounds of the present disclosure applied to OLED devices.

Device Example 1

The present device example provides an OLED device, which may sequentially include: a glass substrate, an indium tin oxide (ITO) anode of 15 nm, a first hole transport layer of 10 nm, a second hole transport layer of 95 nm, and a light-emitting layer of 30 nm, a first electron transport layer of 35 nm, a second electron transport layer of 5 nm, a cathode of 10 nm (magnesium-silver electrode, the mass ratio of magnesium to silver is 1:9), and a cap layer (CPL) of 100 nm.

The OLED device may be prepared as the following.
1) The glass substrate is cut into a size of 50 mm×50 mm×0.7 mm, which is ultrasonically treated in isopropanol and deionized water for 30 min respectively, and then exposed to ozone cleaning for 10 minutes; and the obtained glass substrate with the ITO anode is installed on a vacuum deposition equipment.
2) Under a vacuum of $2×10^{-6}$ Pa, a compound HAT-CN is vacuum-evaporated on the ITO anode layer as the first hole transport layer with a thickness of about 10 nm.
3) A compound TAPC is vacuum-evaporated on the first hole transport layer as the second hole transport layer with a thickness of about 95 nm.
4) The light-emitting layer is vacuum-evaporated on the second hole transport layer. The organic compound 007 provided in exemplary embodiment one of the present disclosure is used as a host material, Ir(piq)$_2$(acac) is used as a doping material, the mass ratio of the organic compound 007 to Ir(piq)$_2$(acac) is 19:1, and the thickness is about 30 nm.
5) A compound BCP is vacuum-evaporated on the light-emitting layer as the first electron transport layer with a thickness of about 35 nm.
6) A compound Alq3 is vacuum-evaporated on the first electron transport layer as the second electron transport layer with a thickness of about 5 nm.
7) A magnesium-silver electrode is vacuum-evaporated on the second electron transport layer as a cathode, the mass ratio of Mg and Ag is 1:9, and the thickness is about 10 nm.
8) A high refractive index compound CBP is vacuum-evaporated on the cathode with a thickness of 100 nm, which is used as the cathode cover layer (the cap layer, CPL).

The structures of the compounds used in the OLED device preparation may be the following:

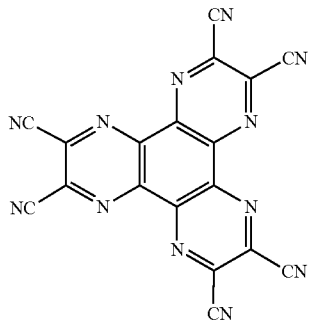

HAT-CN

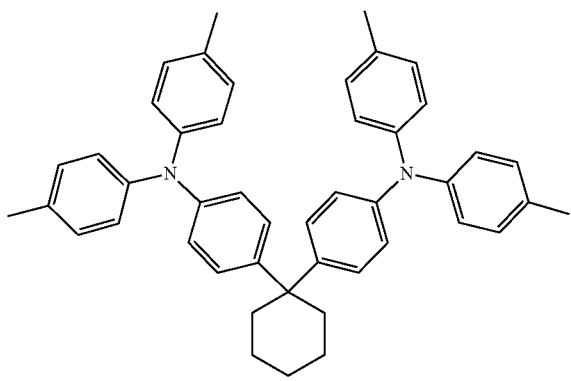

TAPC

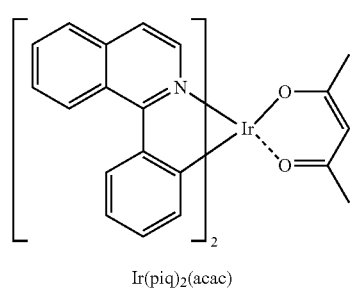

Ir(piq)₂(acac)

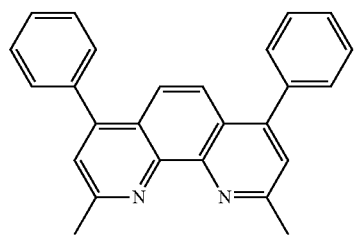

BCP

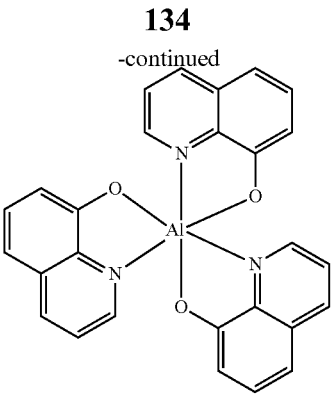

Alq₃

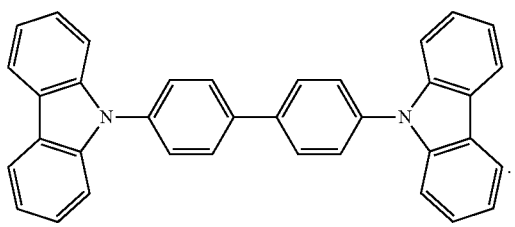

CBP

Device Example 2

The difference between the present device example and the device example 1 is only that the organic compound 007 in step (4) is replaced with an equivalent amount of the organic compound 010 provided by the present disclosure; and other preparation steps are same.

Device Example 3

The difference between the present device example and the device example 1 is only that the organic compound 007 in step (4) is replaced with an equivalent amount of the organic compound 028 provided by the present disclosure; and other preparation steps are same.

Device Example 4

The difference between the present device example and the device example 1 is only that the organic compound 007 in step (4) is replaced with an equivalent amount of the organic compound 029 provided by the present disclosure; and other preparation steps are same.

Device Example 5

The difference between the present device example and the device example 1 is only that the organic compound 007 in step (4) is replaced with an equivalent amount of the organic compound 099 provided by the present disclosure; and other preparation steps are same.

Device Example 6

The difference between the present device example and the device example 1 is only that the organic compound 007 in step (4) is replaced with an equivalent amount of the organic compound 100 provided by the present disclosure; and other preparation steps are same.

Device Example 7

The difference between the present device example and the device example 1 is only that the organic compound 007 in step (4) is replaced with an equivalent amount of the organic compound 103 provided by the present disclosure; and other preparation steps are same.

Device Example 8

The difference between the present device example and the device example 1 is only that the organic compound 007 in step (4) is replaced with an equivalent amount of the organic compound 232 provided by the present disclosure; and other preparation steps are same.

Device Example 9

The difference between the present device example and the device example 1 is only that the organic compound 007 in step (4) is replaced with an equivalent amount of the organic compound 293 provided by the present disclosure; and other preparation steps are same.

Device Example 10

The difference between the present device example and the device example 1 is only that the organic compound 007 in step (4) is replaced with an equivalent amount of the organic compound 323 provided by the present disclosure; and other preparation steps are same.

Device Comparative Example 1

The difference between the present device comparative example and the device example 1 is only that the organic compound 007 in step (4) is replaced with an equivalent amount of the comparative compound M1

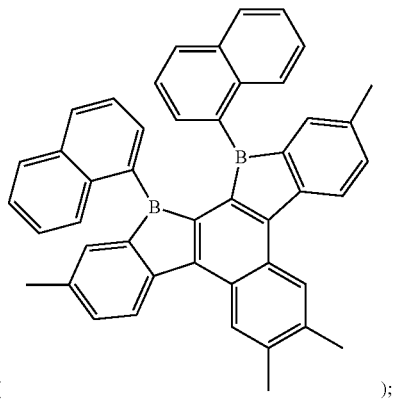

and other preparation steps are same.

Device Comparative Example 2

The difference between the present device comparative example and the device example 1 is only that the organic compound 007 in step (4) is re laced with an equivalent amount of the comparative compound M2

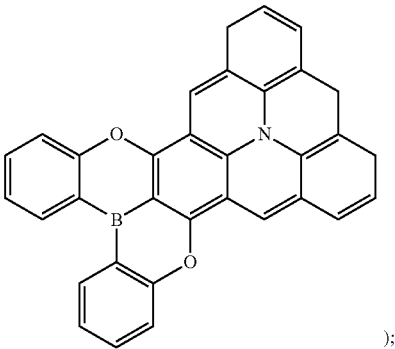

and other preparation steps are same.

Performance Evaluation of the OLED Devices

Keithley 2365A digital nanovoltmeter may be used to test the currents of the OLED device under different voltages, and then the currents may be divided by a light-emitting area to obtain the current densities of the OLED device under different voltages; Konicaminolta CS-2000 spectroradiometer may be used to test the brightness and radiant energy densities of OLED device under different voltages; according to the different densities and brightness of the OLED device under different voltages, the turn-on voltage and current efficiency (CE, Cd/A) at a same current density (10 mA/cm2) may be obtained, and Von is the turn-on voltage at a brightness of 1 Cd/m$^2$; and the lifetime T95 may be obtained by measuring the time when the brightness of the OLED device reaches 95% of the initial brightness (under 50 mA/cm$^2$ test condition), where the test data is shown in Table 2.

TABLE 2

Performance test results of the OLED devices

| OLED device | Host material of light-emitting layer | Host material structure of light-emitting layer | $V_{on}$ (V) | CE (Cd/A) | LT95 (h) |
|---|---|---|---|---|---|
| Device example 1 | 007 | 007 | 3.92 | 40.3 | 145 |
| Device example 2 | 010 | 010 | 3.84 | 45.6 | 155 |
| Device example 3 | 028 | 028 | 3.94 | 41.5 | 143 |

TABLE 2-continued
Performance test results of the OLED devices
| OLED device | Host material of light-emitting layer | Host material structure of light-emitting layer | $V_{on}$ (V) | CE (Cd/A) | LT95 (h) |
|---|---|---|---|---|---|
| Device example 4 | 029 | 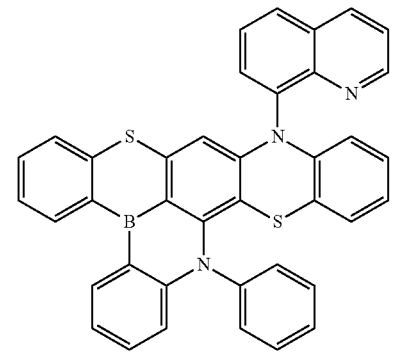<br>029 | 3.87 | 42.1 | 147 |
| Device example 5 | 099 | 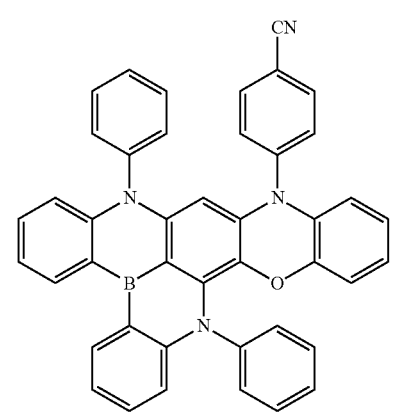<br>099 | 3.86 | 45.2 | 155 |
| Device example 6 | 100 | 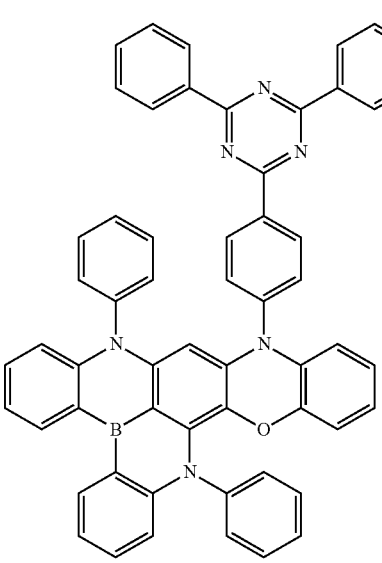<br>100 | 3.85 | 44.7 | 160 |

TABLE 2-continued

Performance test results of the OLED devices

| OLED device | Host material of light-emitting layer | Host material structure of light-emitting layer | $V_{on}$ (V) | CE (Cd/A) | LT95 (h) |
|---|---|---|---|---|---|
| Device example 7 | 103 | 103 | 3.83 | 44.5 | 158 |
| Device example 8 | 232 | 232 | 3.89 | 42.4 | 148 |
| Device example 9 | 293 | 293 | 3.85 | 45.3 | 153 |

TABLE 2-continued

Performance test results of the OLED devices

| OLED device | Host material of light-emitting layer | Host material structure of light-emitting layer | $V_{on}$ (V) | CE (Cd/A) | LT95 (h) |
|---|---|---|---|---|---|
| Device example 10 | 323 | (structure 323) | 3.89 | 45.7 | 153 |
| Device comparative example 1 | Comparative compound 1 | (structure) | 4. | 40.1 | 132 |
| Device comparative example 2 | Comparative compound 2 | (structure) | 4.03 | 41.7 | 145 |

From the data in Table 2, compared with the devices in comparative example 1 and comparative example 2, the electroluminescence device using the organic compound of the present disclosure may have a lower turn-on voltage of not higher than 3.95 V, where the turn-on voltage may be reduced by about 5%, such that the power consumption of the device may be effectively reduced; the device using the organic compound of the present disclosure may have higher current efficiency, and the CE in certain embodiments or examples may reach about 43.5-45.7 Cd/A which is increased by about 10% compared with the device comparative examples 1 and 2; and the device using the organic compound of the present disclosure may have a longer lifetime, and the lifetime of LT95 in certain embodiments or examples may reach more than 150 h which is extended by about 10% compared with the device comparative examples 1 and 2.

The organic compound provided by the present disclosure may have desirable carrier transport performance, and the balance and stability of electron mobility and hole mobility. As the host material of the light-emitting layer, it may significantly improve the luminous efficiency of the device, reduce energy consumption, and extend the working lifetime of the device, which may indicate that the compound of the present disclosure may play an important role as the host material.

The description of the above-mentioned embodiments may be merely used to help understand the method and core idea of the present disclosure. It should be understood that, for those skilled in the art, without departing from the principle of the present disclosure, certain improvements and modifications may be made to the present disclosure, and such improvements and modifications should also fall within the protection scope of the claims of the present disclosure.

338 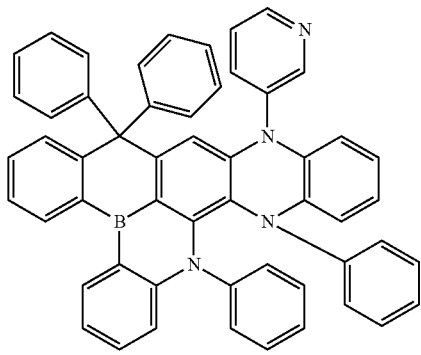
342 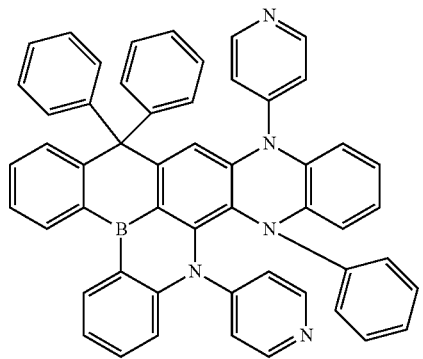
339 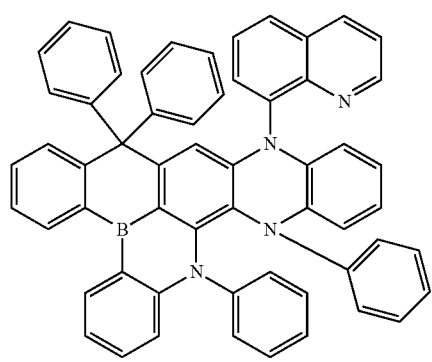
343 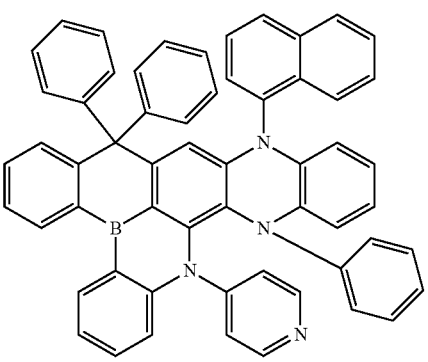
340 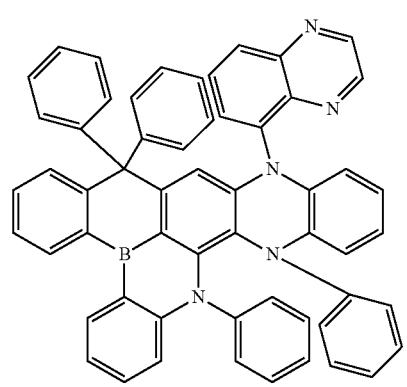
344 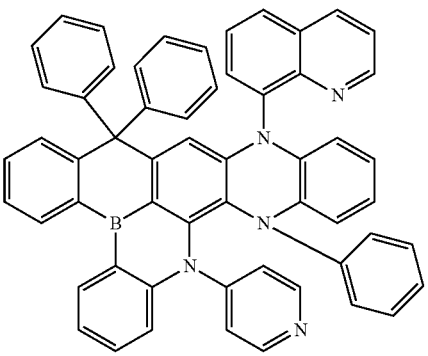
341 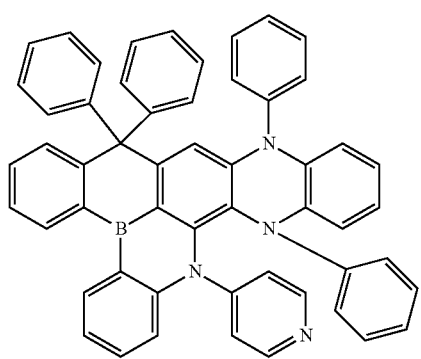
345 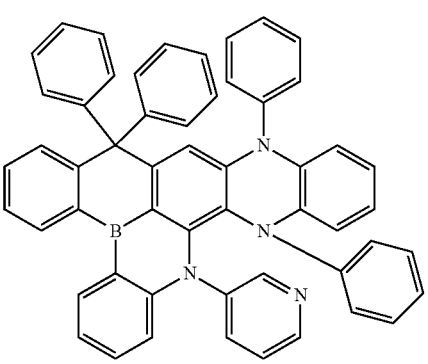

233
-continued
346
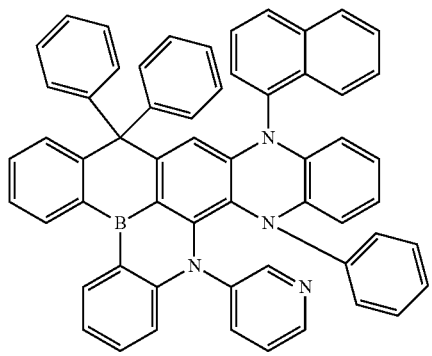
347
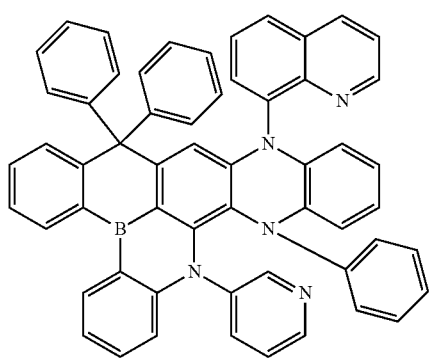
348
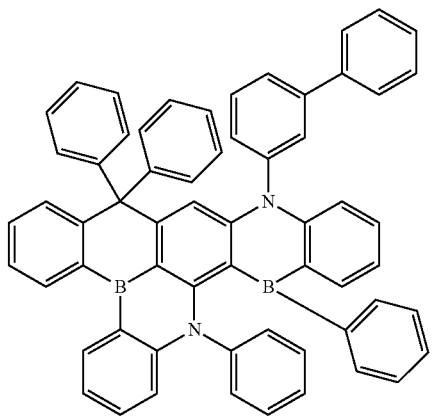
349
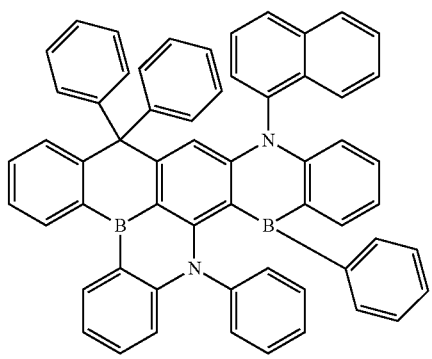
234
-continued
350
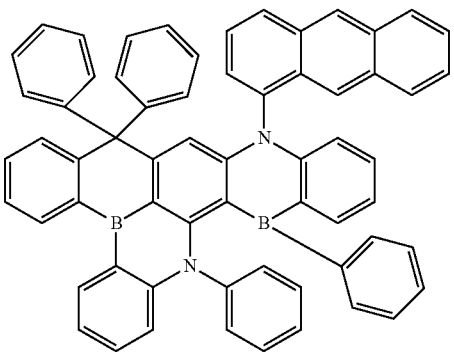
351
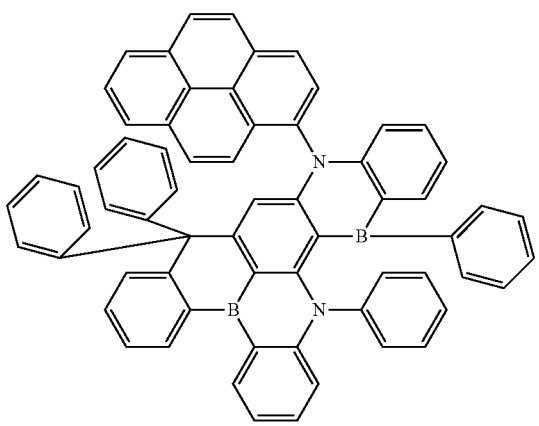
352
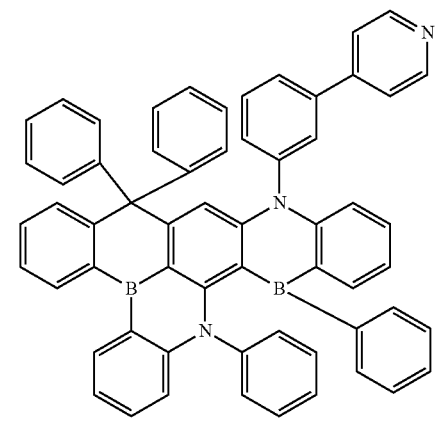
353
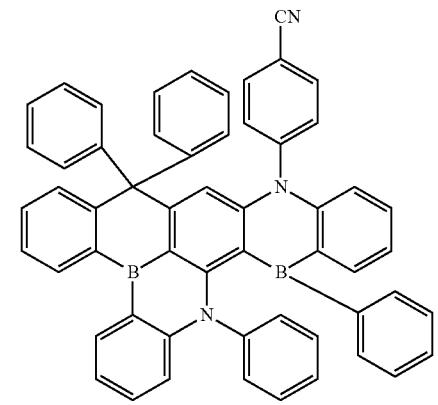

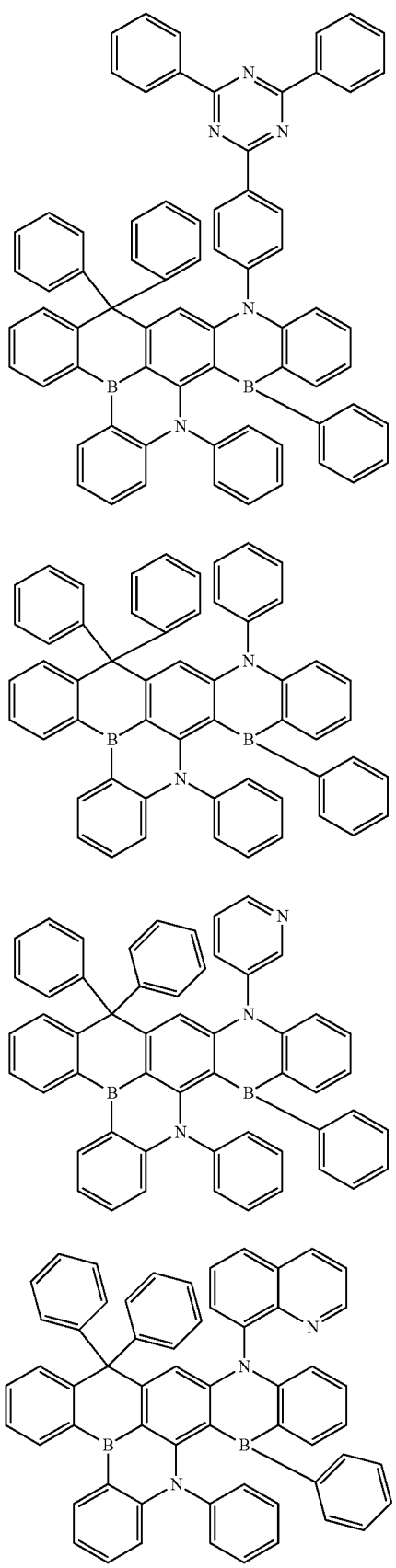
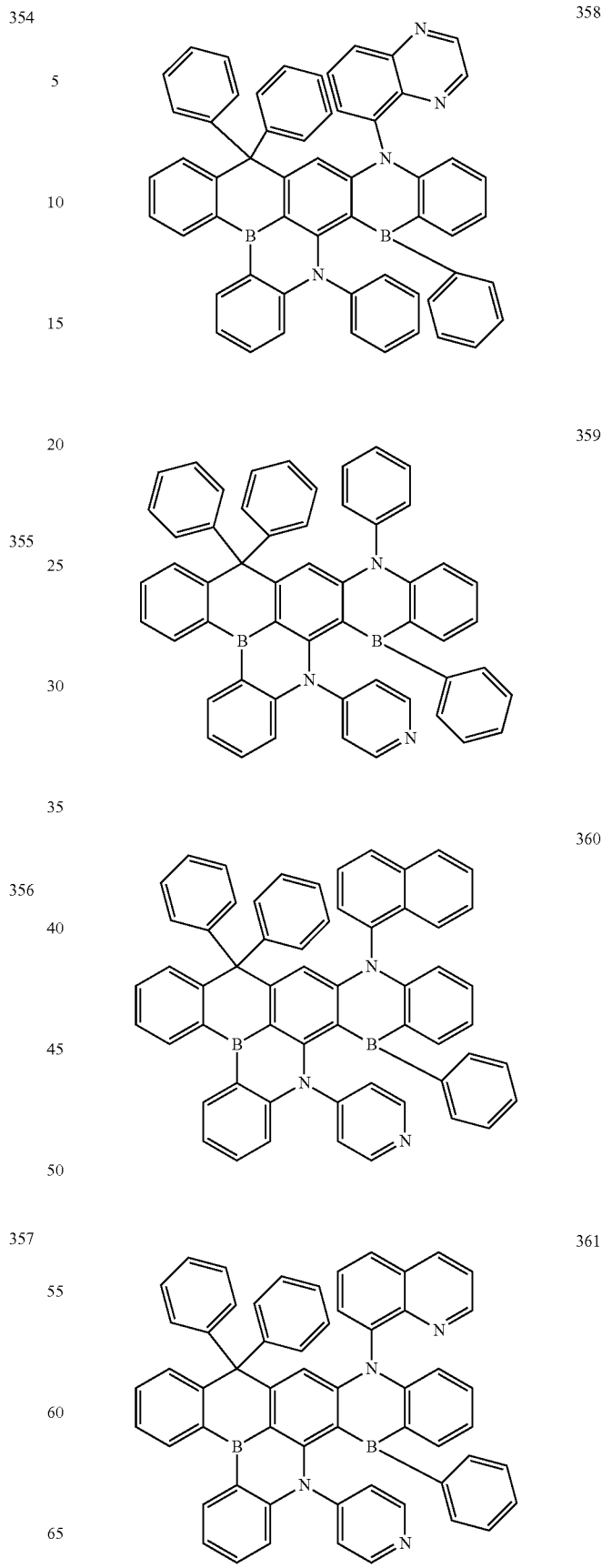

362
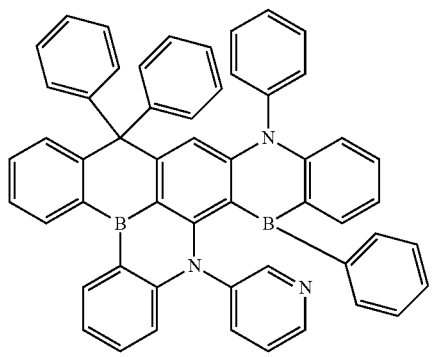
363
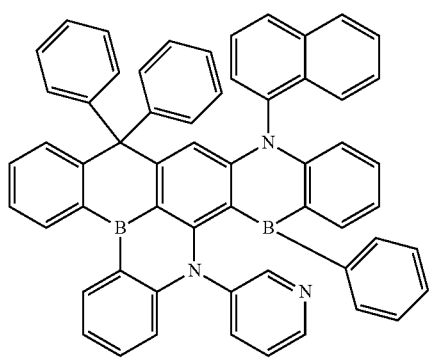
364
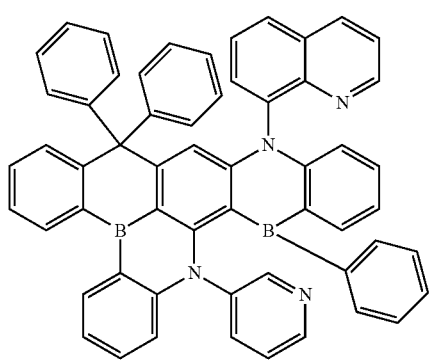
365
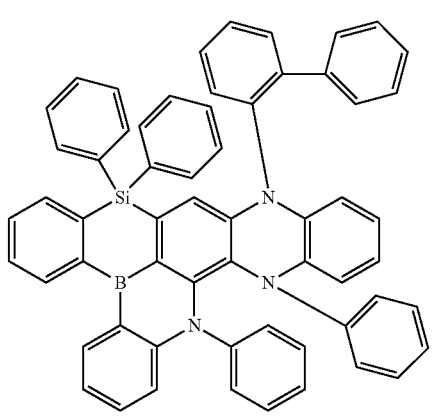
366
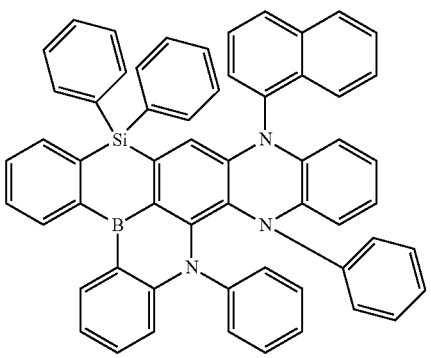
367
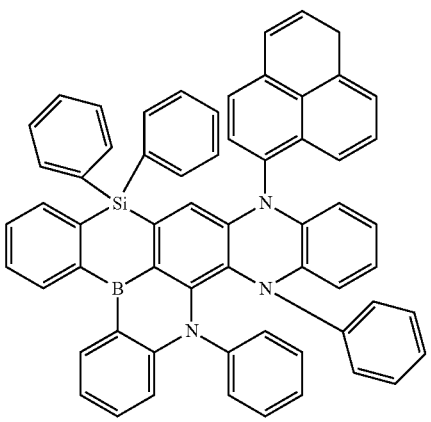
368
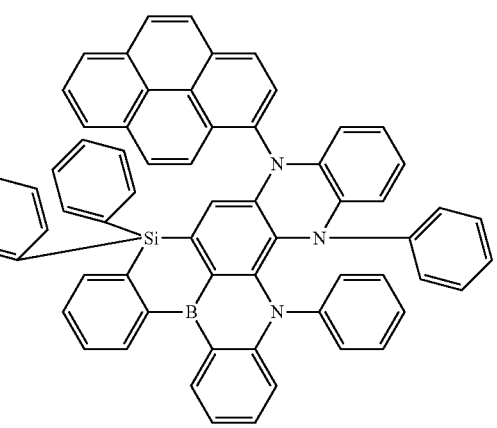
369
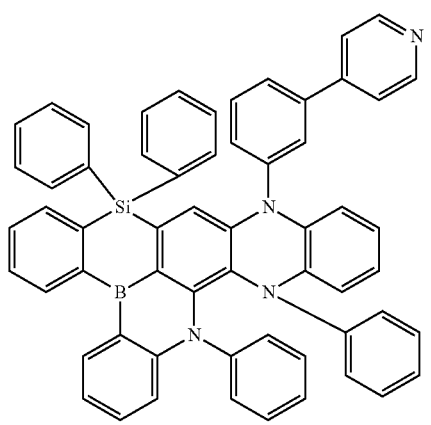

370 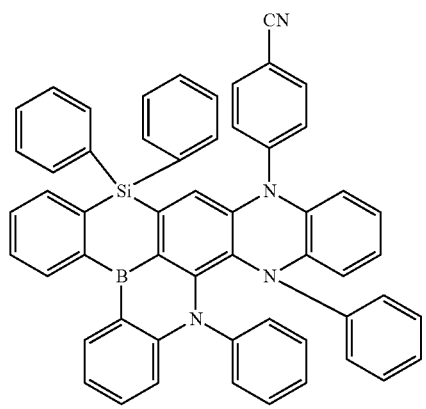
371 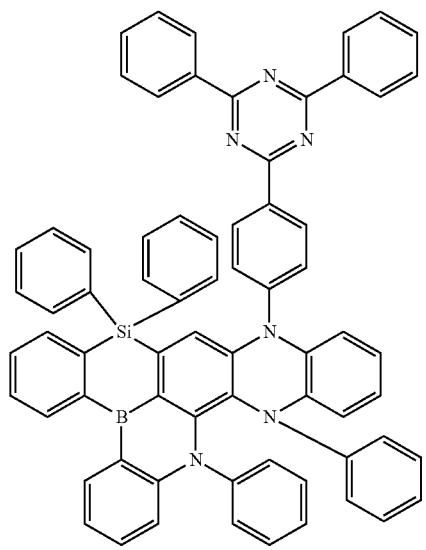
372 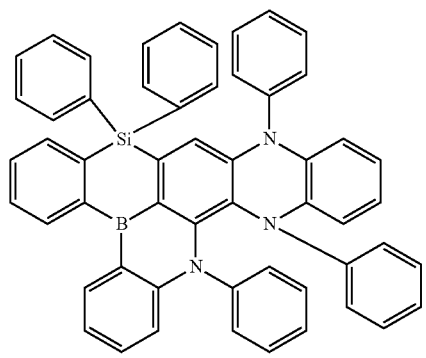
373 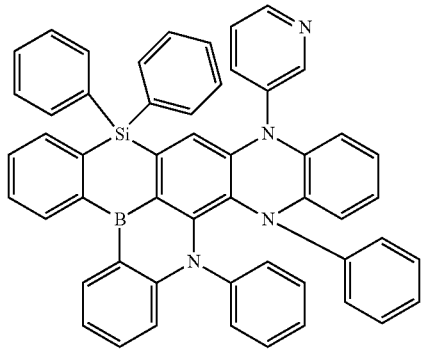
774 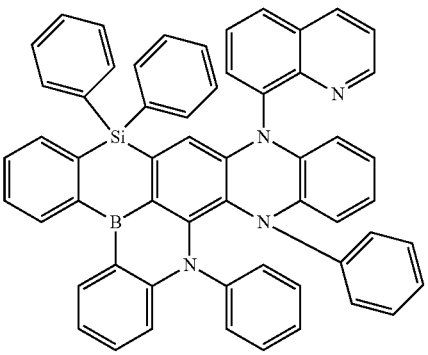
775 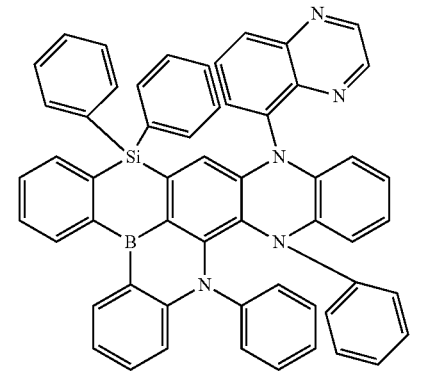
376 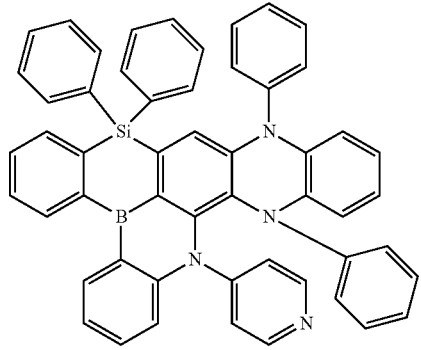

377
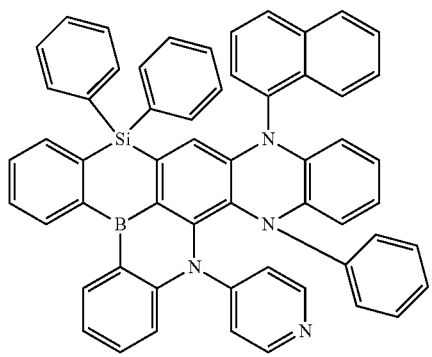
378
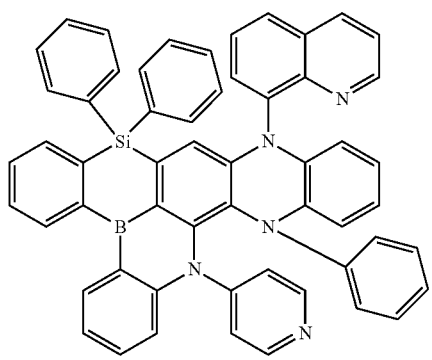
379
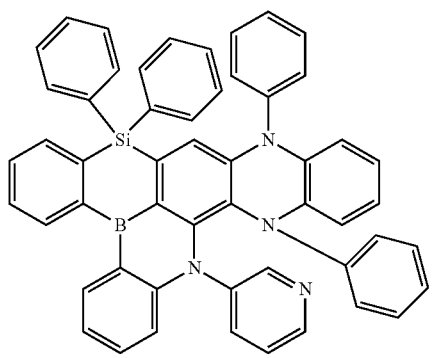
380
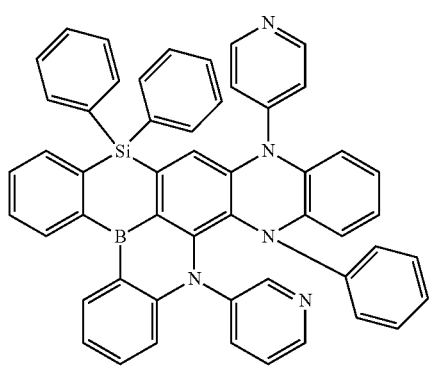
381
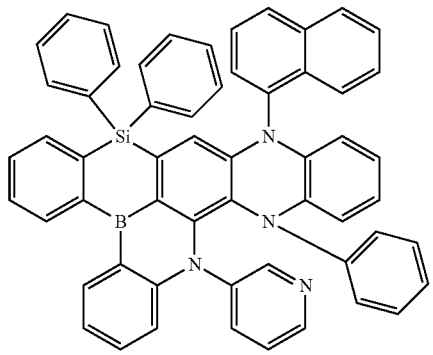
382
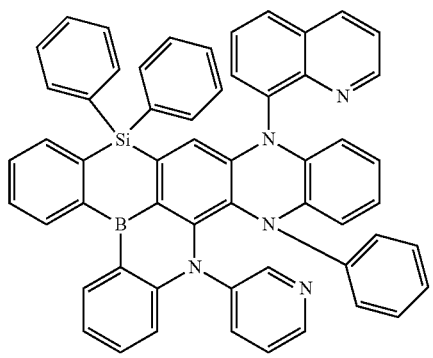
383
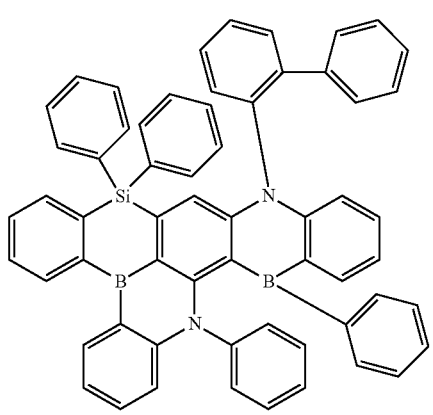
384
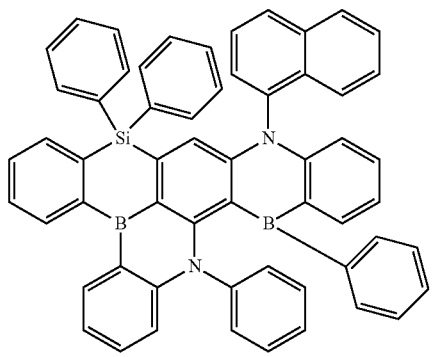

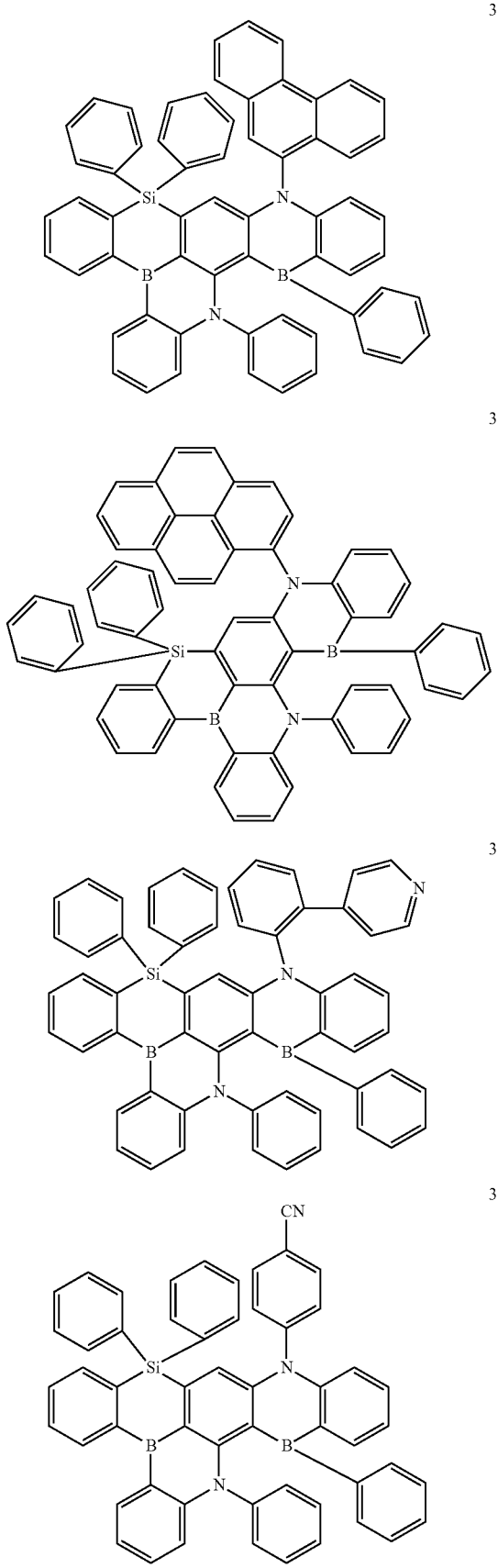
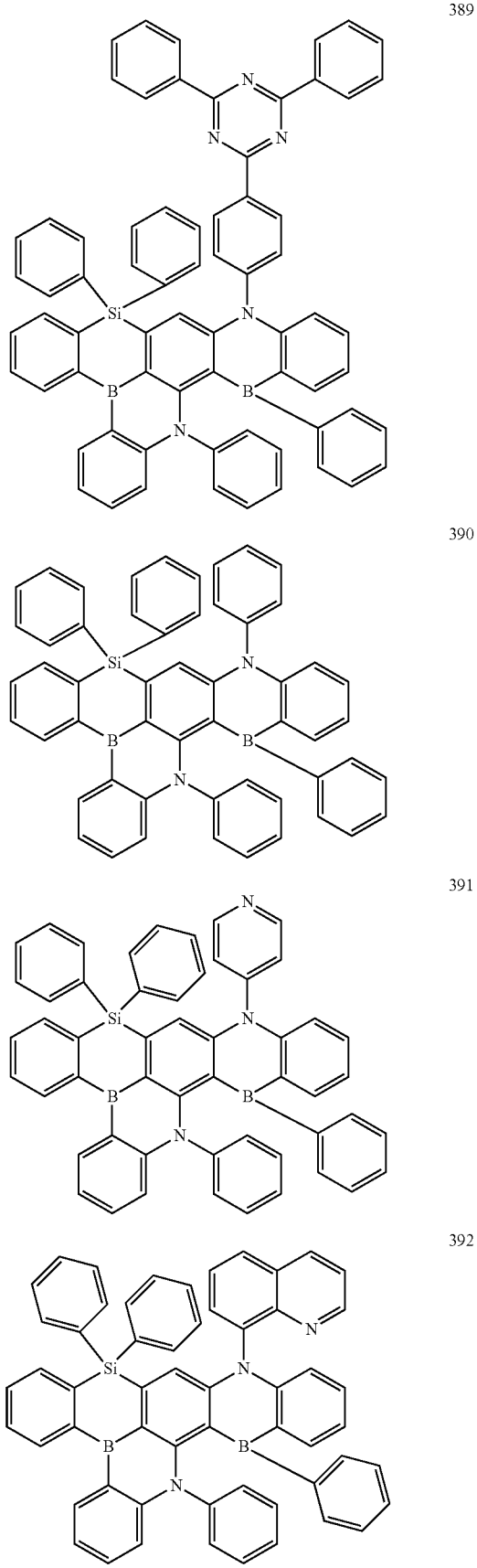

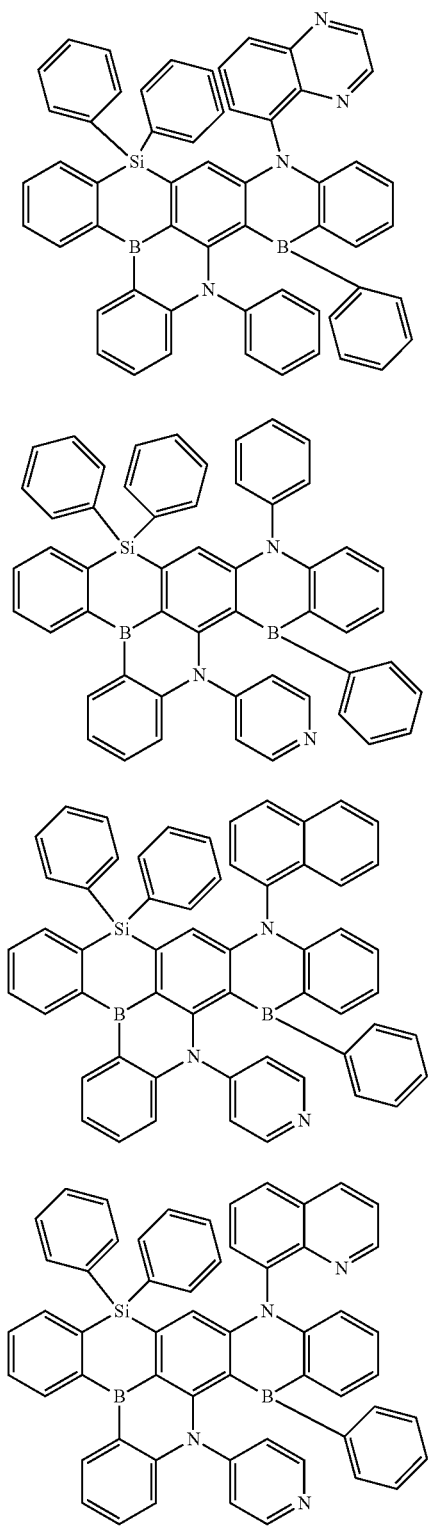
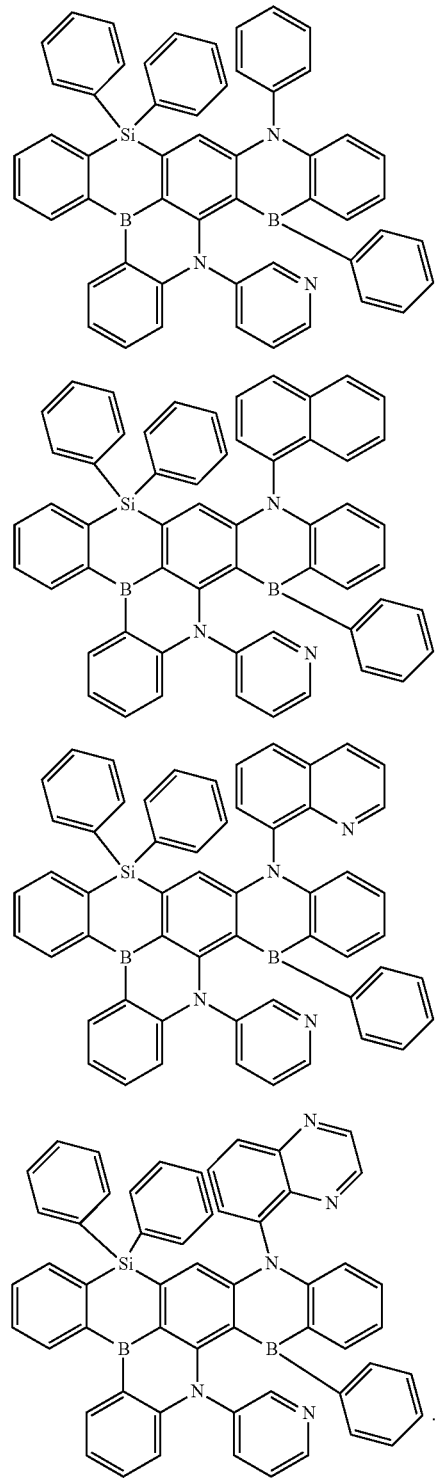

What is claimed is:

1. An organic compound, having one of structures shown in formula (II) to formula (VII):

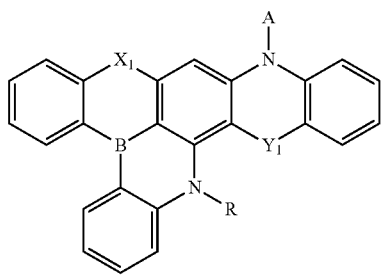
(II)

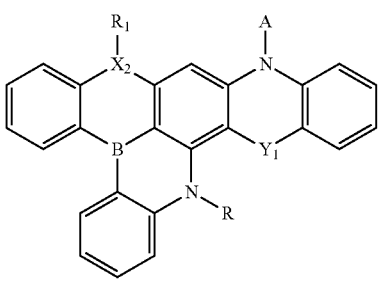
(III)

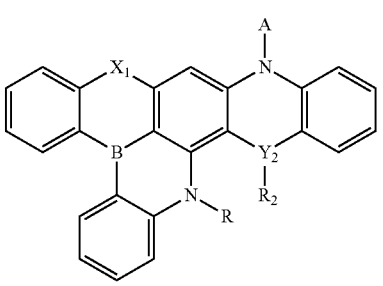
(IV)

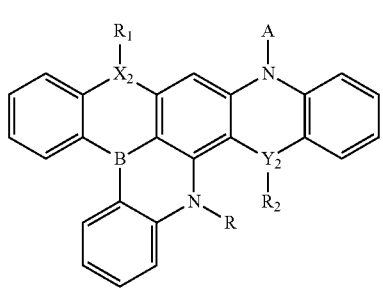
(V)

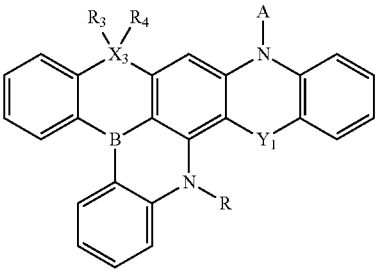
(VI)

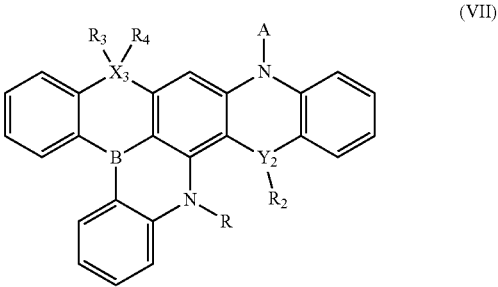
(VII)

wherein, $X_1$ and $Y_1$ are each independently selected from oxygen or sulfur; $X_2$ is boron and $Y_2$ is selected from nitrogen or boron; and $X_3$ is selected from carbon or silicon;

A and R are each independently selected from hydrogen, deuterium, substituted or unsubstituted C1-C10 alkyl, substituted or unsubstituted C6-C30 aryl, or substituted or unsubstituted C2-C30 heterocyclic, wherein when one of A and R is hydrogen or deuterium, another of A and R is not hydrogen or deuterium;

the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, or substituted and unsubstituted C2~C30 heterocyclic; and $R_1$ to $R_4$ are each independently selected from substituted or unsubstituted C1-C10 alkyl, substituted or unsubstituted C6-C30 aryl, or substituted or unsubstituted C2-C30 heterocyclic.

2. The organic compound according to claim 1, wherein:
A and R are each independently selected from hydrogen, deuterium, substituted or unsubstituted phenyl, substituted or unsubstituted biphenyl, substituted or unsubstituted terphenyl, substituted or unsubstituted tetraphenyl, substituted or unsubstituted naphthyl, substituted or unsubstituted phenanthrenyl, substituted or unsubstituted anthracenyl, substituted or unsubstituted triphenylene, substituted or unsubstituted pyrenyl, substituted or substituted chrysenyl, substituted or unsubstituted fluorenyl, substituted or unsubstituted spirobifluorenyl, substituted or unsubstituted pyrrolyl, substituted or unsubstituted furyl, substituted or unsubstituted thienyl, substituted or unsubstituted indolyl, substituted or unsubstituted benzofuranyl, substituted or unsubstituted benzothienyl, substituted or unsubstituted phenanthrolinyl, substituted or unsubstituted carbazolyl, substituted or unsubstituted dibenzofuranyl, substituted or unsubstituted dibenzothienyl, substituted or unsubstituted fluoranthryl, substituted or unsubstituted indenocarbazolyl, substituted or unsubstituted pyridyl, substituted or unsubstituted pyrimidinyl, substituted or unsubstituted pyrazinyl, substituted or unsubstituted pyridazinyl, substituted or unsubstituted triazinyl, substituted or unsubstituted indolocarbazolyl, substituted or unsubstituted indolobenzofuranyl, substituted or unsubstituted indolobenzothienyl, substituted or unsubstituted benzofuran pyrimidinyl, or substituted or unsubstituted benzothiophene pyrimidinyl.

3. The organic compound according to claim 1, wherein: A and R are each independently selected from hydrogen, deuterium, phenyl, nitro-substituted phenyl, cyano-substituted phenyl, biphenyl, nitro-substituted biphenyl, cyano-substituted biphenyl, terphenyl, nitro-substituted terphenyl, cyano-substituted terphenyl, tetraphenyl, nitro-substituted tetraphenyl, cyano-substituted tetraphenyl, naphthyl, nitro-substituted naphthyl, cyano-substituted naphthyl, phenanthrenyl, nitro-substituted phenanthrenyl, cyano-substituted phenanthrenyl, anthracenyl, nitro-substituted anthryl, cyano-substituted anthracenyl, triphenylene, nitro-substituted triphenylene, cyano-substituted triphenylene, pyrenyl, nitro-substituted pyrenyl, cyano-substituted pyrenyl, chrysenyl, nitro-substituted chrysenyl, cyano-substituted chrysenyl, fluorenyl, nitro-substituted fluorene, cyano-substituted fluorenyl, spirobifluorenyl, nitro-substituted spirobifluorenyl, cyano-substituted spirobifluorenyl, pyrrolyl, nitro-substituted pyrrolyl, cyano-substituted pyrrolyl, furyl, nitro-substituted furyl, cyano-substituted furyl, thienyl, nitro-substituted thienyl, cyano-substituted thienyl, indolyl, nitro-substituted indolyl, cyano-substituted indolyl, benzofuranyl, nitro-substituted benzofuranyl, cyano-substituted benzofuranyl, benzothienyl, nitro-substituted benzothienyl, cyano-substituted benzothienyl, phenanthrolinyl, nitro-substituted phenanthrolinyl, cyano-substituted phenanthrolinyl, carbazolyl, nitro-substituted carbazolyl, cyano-substituted carbazolyl, dibenzofuranyl, nitro-substituted dibenzofuranyl, cyano-substituted dibenzofuranyl, dibenzothienyl, nitro-substituted dibenzothienyl, cyano-substituted dibenzothienyl, fluoranthryl, nitro-substituted fluoranthryl, cyano-substituted fluoranthryl, indenocarbazolyl, nitro-substituted indenocarbazolyl, cyano-substituted indenocarbazolyl, pyridyl, nitro-substituted pyridyl, cyano-substituted pyridyl, pyrimidinyl, nitro-substituted pyrimidinyl, cyano-substituted pyrimidinyl, pyrazinyl, nitro-substituted pyrazinyl, cyano-substituted pyrazinyl, pyridazinyl, nitro-substituted pyridazinyl azinyl, cyano-substituted pyridazinyl, triazinyl, nitro-substituted triazinyl, cyano-substituted triazinyl, indolocarbazolyl, nitro-substituted indolocarbazolyl, cyano-substituted indolocarbazolyl, indolobenzofuranyl, nitro-substituted indolobenzofuranyl, cyano-substituted indolobenzofuranyl, indolobenzothienyl, nitro-substituted indolobenzothienyl, cyano-substituted indolobenzothienyl, benzofuran pyrimidinyl, nitro-substituted benzofuran pyrimidinyl, cyano-substituted benzofuran pyrimidinyl, benzothiophene pyrimidinyl, nitro-substituted benzothiophene pyrimidinyl, cyano-substituted benzothiophene pyrimidinyl, a group formed by a combination of the above-mentioned groups, or a group formed by fusing the above-mentioned groups.

4. The organic compound according to claim 1, wherein: $R_1$ to $R_4$ are each independently selected from substituted or unsubstituted phenyl, substituted or unsubstituted biphenyl, substituted or unsubstituted terphenyl, substituted or unsubstituted tetraphenyl, substituted or unsubstituted naphthyl, substituted or unsubstituted phenanthrenyl, substituted or unsubstituted anthracenyl, substituted or unsubstituted triphenylene, substituted or unsubstituted pyrenyl, substituted or unsubstituted chrysenyl, substituted or unsubstituted fluorenyl, substituted or unsubstituted spirobifluorenyl, substituted or unsubstituted pyrrolyl, substituted or unsubstituted furyl, substituted or unsubstituted thienyl, substituted or unsubstituted indolyl, substituted or unsubstituted benzofuranyl, substituted or unsubstituted benzothienyl, substituted or unsubstituted phenanthrolinyl, substituted or unsubstituted carbazolyl, substituted or unsubstituted dibenzofuranyl, substituted or unsubstituted dibenzothienyl, substituted or unsubstituted fluoranthryl, substituted or unsubstituted indenocarbazolyl, substituted or unsubstituted pyridyl, substituted or unsubstituted pyrimidinyl, substituted or unsubstituted pyrazinyl, substituted or unsubstituted pyridazinyl, substituted or unsubstituted triazinyl, substituted or unsubstituted indolocarbazolyl, substituted or unsubstituted indolobenzofuranyl, substituted or unsubstituted indolobenzothienyl, substituted or unsubstituted benzofuran pyrimidinyl, or substituted or unsubstituted benzothiophene pyrimidinyl.

5. The organic compound according to claim 1, wherein: $R_1$ to $R_4$ are each independently selected from phenyl, nitro-substituted phenyl, cyano-substituted phenyl, biphenyl, nitro-substituted biphenyl, cyano-substituted biphenyl, terphenyl, nitro-substituted terphenyl, cyano-substituted terphenyl, tetraphenyl, nitro-substituted tetraphenyl, cyano-substituted tetraphenyl, naphthyl, nitro-substituted naphthyl, cyano-substituted naphthyl, phenanthrenyl, nitro-substituted phenanthrenyl, cyano-substituted phenanthrenyl, anthracenyl, nitro-substituted anthryl, cyano-substituted anthracenyl, triphenylene, nitro-substituted triphenylene, cyano-substituted triphenylene, pyrenyl, nitro-substituted pyrenyl, cyano-substituted pyrenyl, chrysenyl, nitro-substituted chrysenyl, cyano-substituted chrysenyl, fluorenyl, nitro-substituted fluorene, cyano-substituted fluorenyl, spirobifluorenyl, nitro-substituted spirobifluorenyl, cyano-substituted spirobifluorenyl, pyrrolyl, nitro-substituted pyrrolyl, cyano-substituted pyrrolyl, furyl, nitro-substituted furyl, cyano-substituted furyl, thienyl, nitro-substituted thienyl, cyano-substituted thienyl, indolyl, nitro-substituted indolyl, cyano-substituted indolyl, benzofuranyl, nitro-substituted benzofuranyl, cyano-substituted benzofuranyl, benzothienyl, nitro-substituted benzothienyl, cyano-substituted benzothienyl, phenanthrolinyl, nitro-substituted phenanthrolinyl, cyano-substituted phenanthrolinyl, carbazolyl, nitro-substituted carbazolyl, cyano-substituted carbazolyl, dibenzofuranyl, nitro-substituted dibenzofuranyl, cyano-substituted dibenzofuranyl, dibenzothienyl, nitro-substituted dibenzothienyl, cyano-substituted dibenzothienyl, fluoranthryl, nitro-substituted fluoranthryl, cyano-substituted fluoranthryl, indenocarbazolyl, nitro-substituted indenocarbazolyl, cyano-substituted indenocarbazolyl, pyridyl, nitro-substituted pyridyl, cyano-substituted pyridyl, pyrimidinyl, nitro-substituted pyrimidinyl, cyano-substituted pyrimidinyl, pyrazinyl, nitro-substituted pyrazinyl, cyano-substituted pyrazinyl, pyridazinyl, nitro-substituted pyridazinyl azinyl, cyano-substituted pyridazinyl, triazinyl, nitro-substituted triazinyl, cyano-substituted triazinyl, indolocarbazolyl, nitro-substituted indolocarbazolyl, cyano-substituted indolocarbazolyl, indolobenzofuranyl, nitro-substituted indolobenzofuranyl, cyano-substituted indolobenzofuranyl, indolobenzothienyl, nitro-substituted indolobenzothienyl, cyano-substituted indolobenzothienyl, benzofuran pyrimidinyl, nitro-substituted benzofuran pyrimidinyl, cyano-substituted benzofuran pyrimidinyl, benzothiophene pyrimidinyl, nitro-substituted benzothiophene pyrimidinyl, cyano-substituted benzothiophene pyrimidinyl, a group formed by a combination of the above-mentioned groups, or a group formed by fusing the above-mentioned groups.

6. The organic compound according to claim 1, wherein $X_1$ and $Y_1$ are both oxygen or both sulfur.

7. The organic compound according to claim 1, wherein one of $X_1$ and $Y_1$ is oxygen, and another one of $X_1$ and $Y_1$ is sulfur.

8. The organic compound according to claim 1, having a structure corresponding to formula (III).

9. A display panel, comprising an organic light-emitting element, wherein:
the organic light-emitting element includes an anode, a cathode, and at least one organic compound layer between the anode and the cathode; and
the organic compound layer includes at least one organic compound according to claim 1.

10. The display panel according to claim 9, wherein the organic compound layer includes an electron transport layer, and the electron transport layer includes at least one organic compound according to claim 1.

11. The display panel according to claim 9, wherein the organic compound layer includes a light-emitting layer, and the light-emitting layer includes at least one organic compound according to claim 1.

12. The organic compound according to claim 6, wherein the organic compound has any one of structures shown in formula (001) to formula (038):

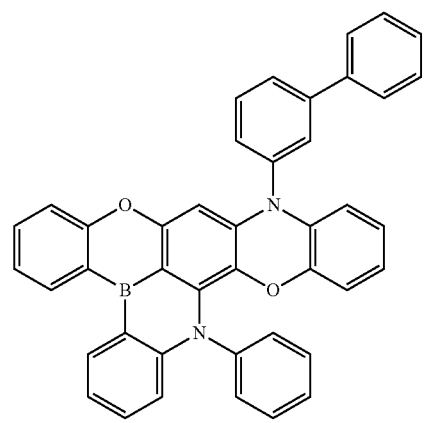

001

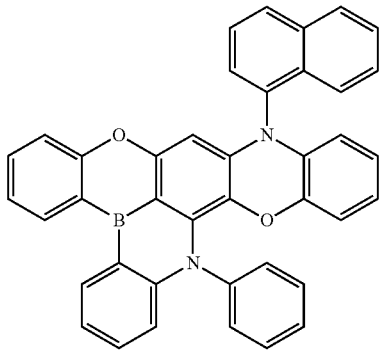

002

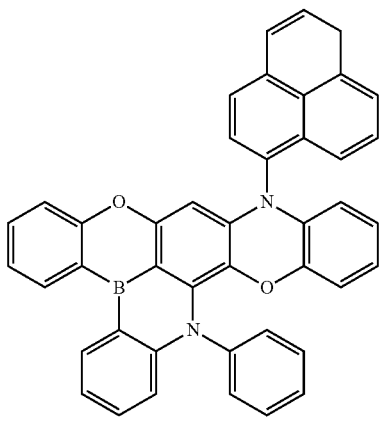

003

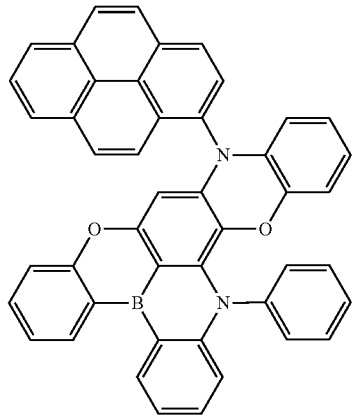

004

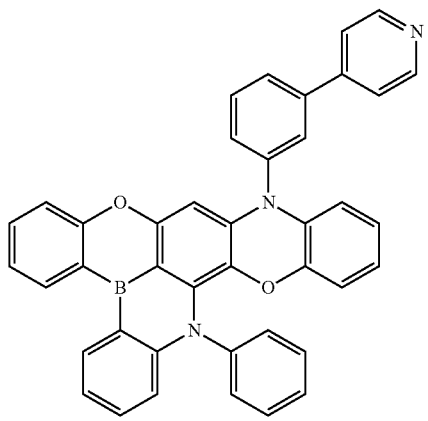

005

-continued
006
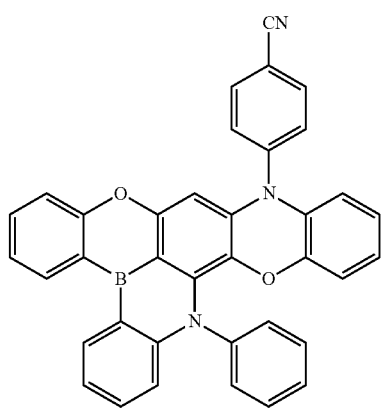
007
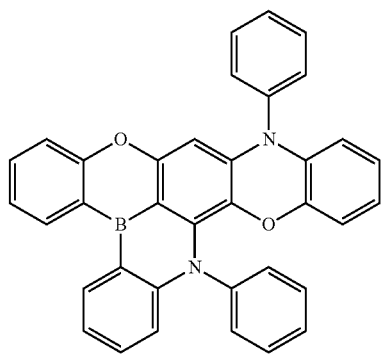
008
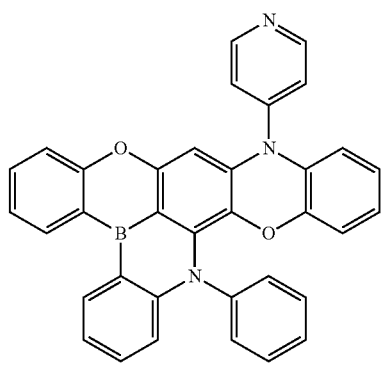
-continued
009
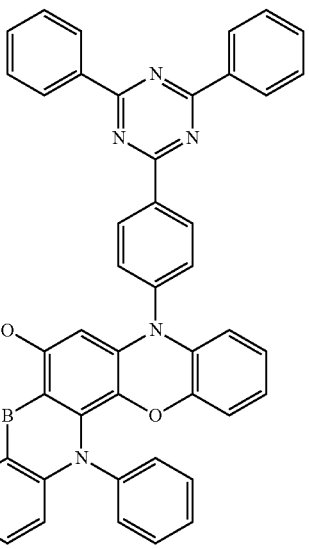
010
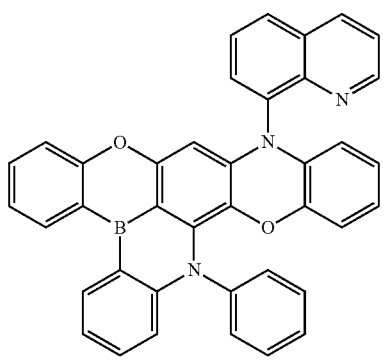
011
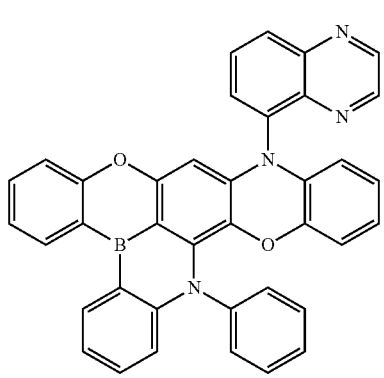
012
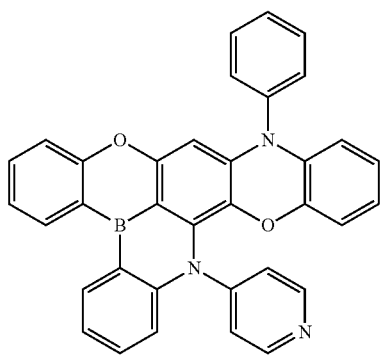

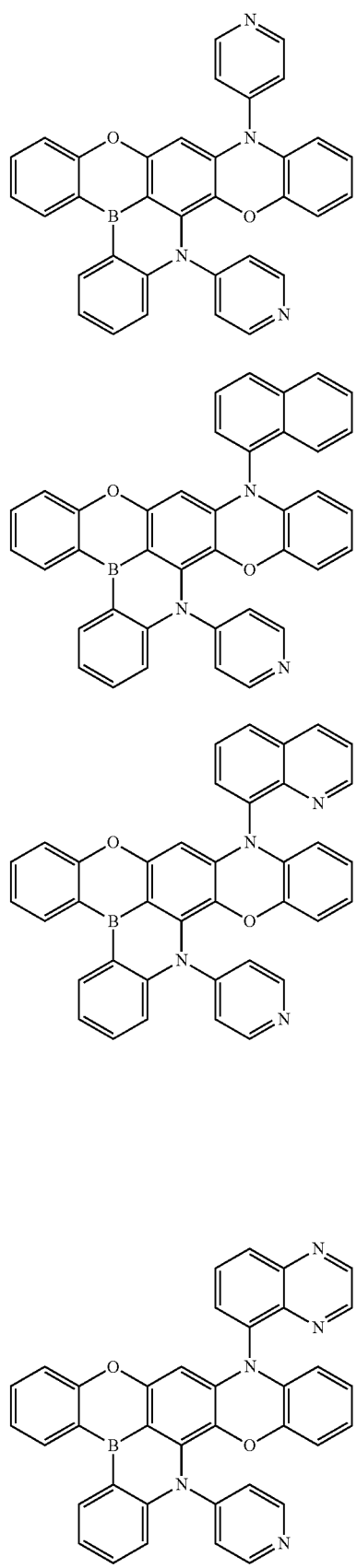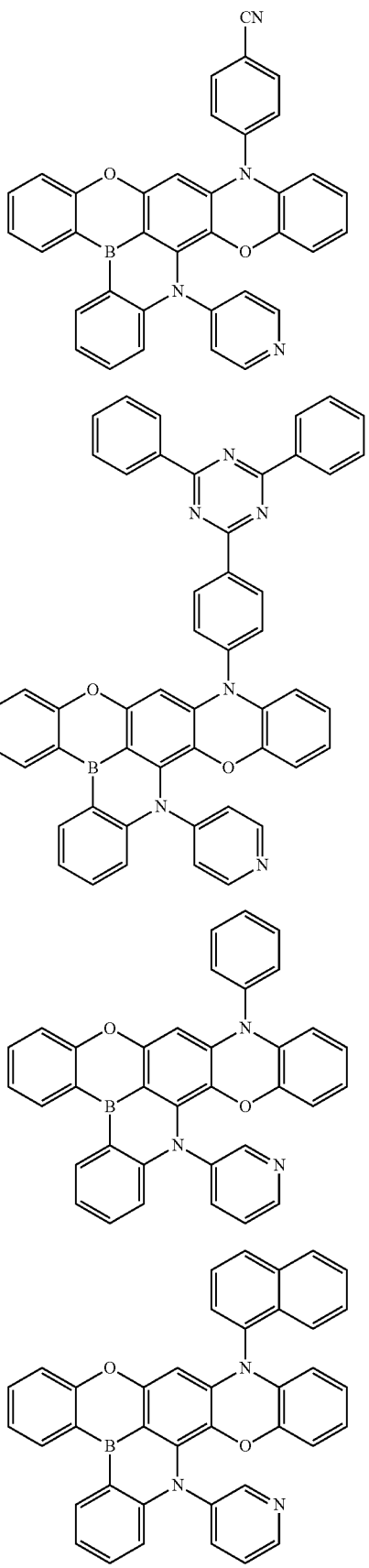

021
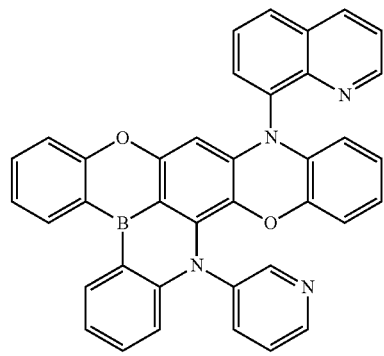
022
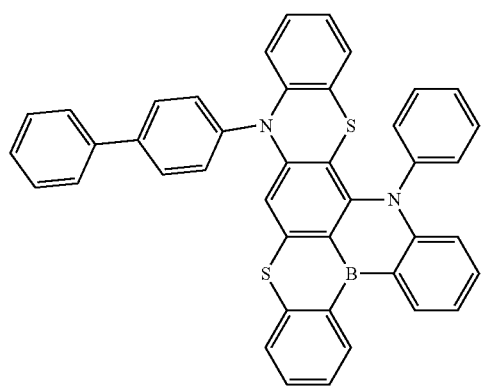
023
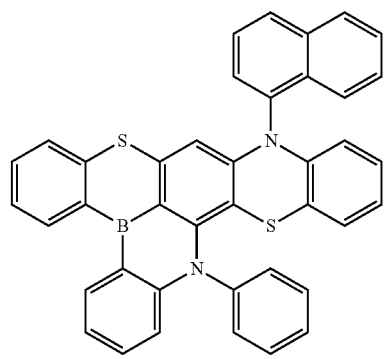
024
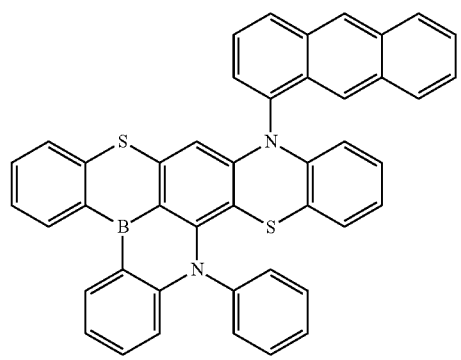
025
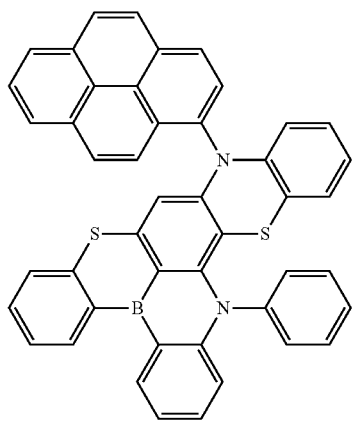
026
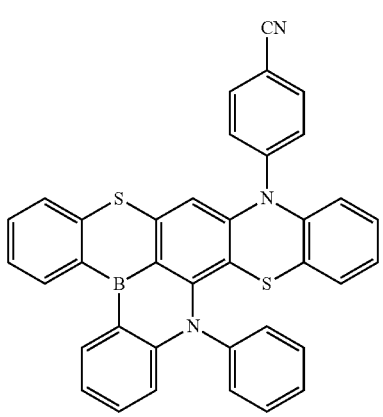
027
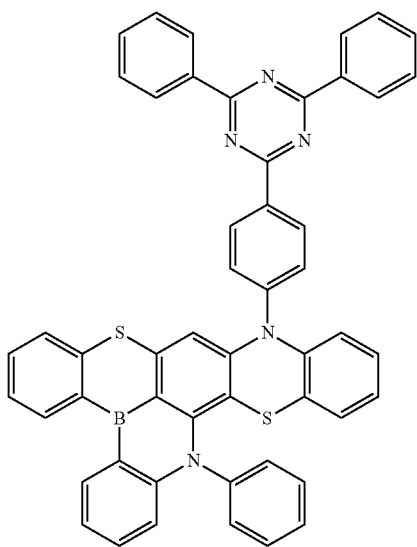

-continued
028
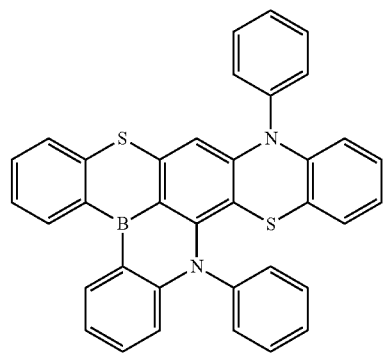
029
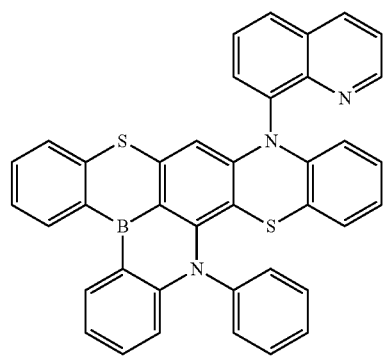
030
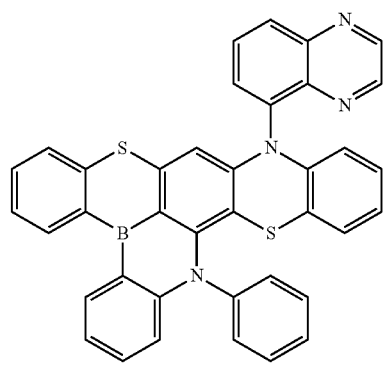
031
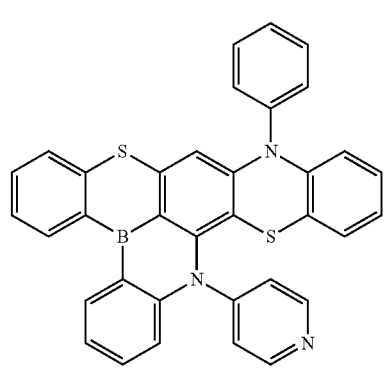
-continued
032
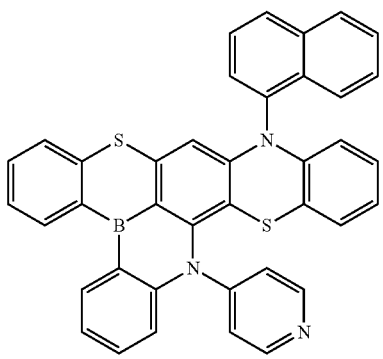
033
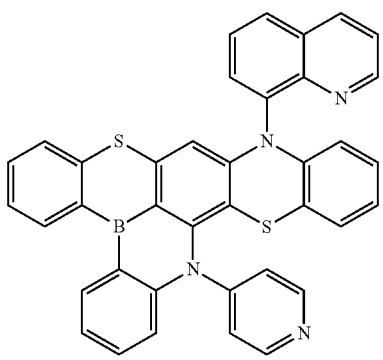
034
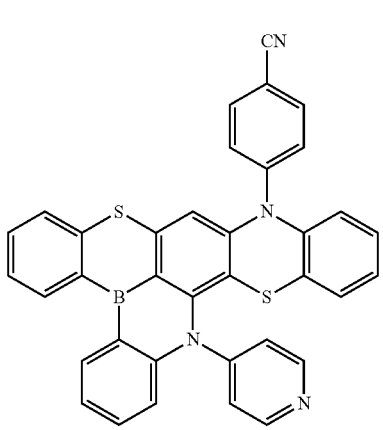
035
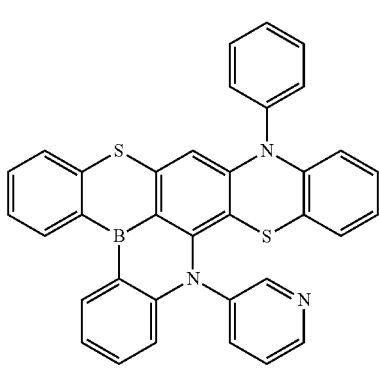

-continued
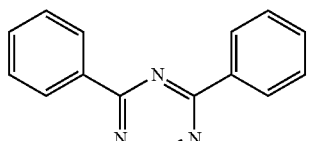
036
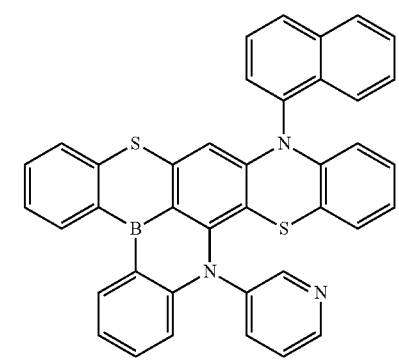
037
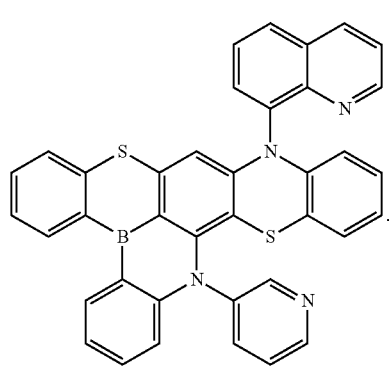
038
13. The organic compound according to claim 7, wherein the organic compound has any one of structures shown in formula (039) to formula (074):
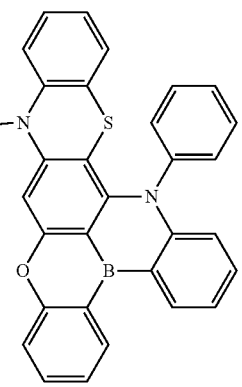
039
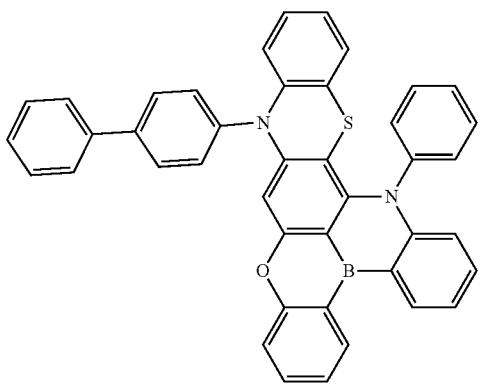
040
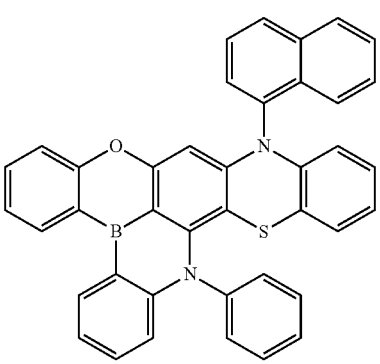
041
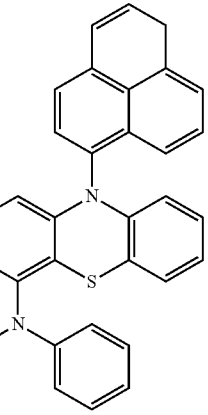
042
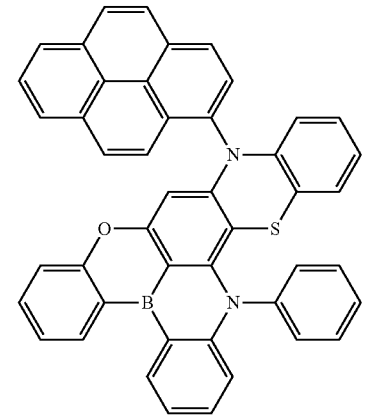

-continued
043
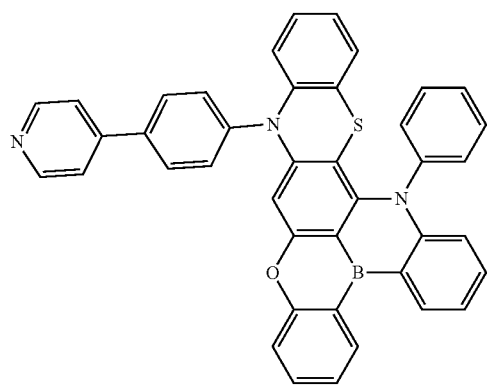
044
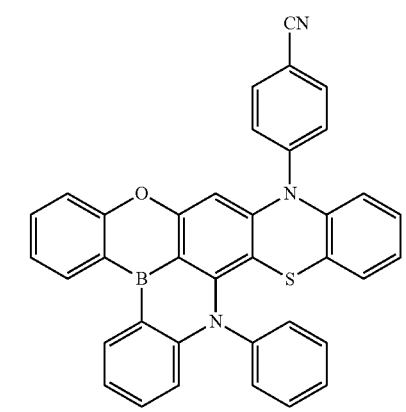
045
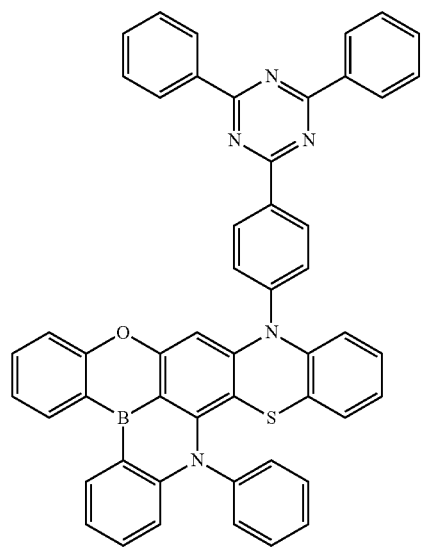
-continued
046
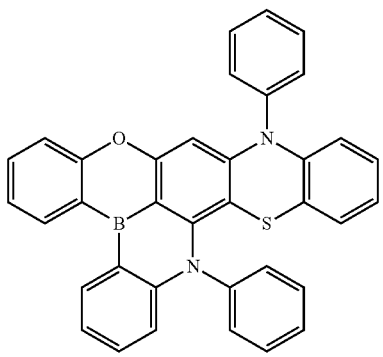
047
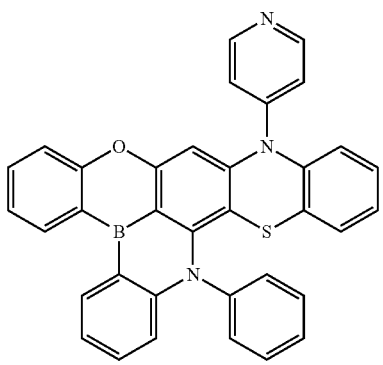
048
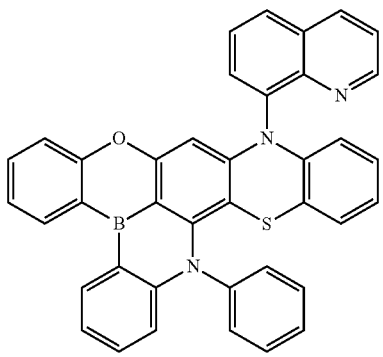
049
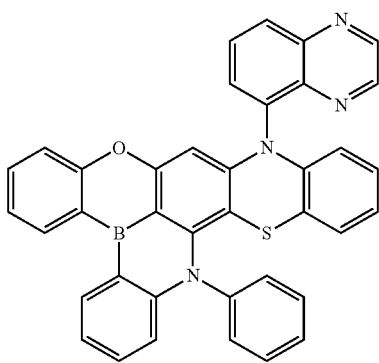

050
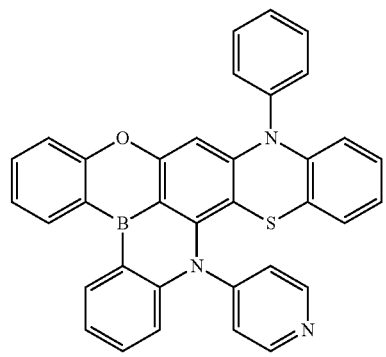
051
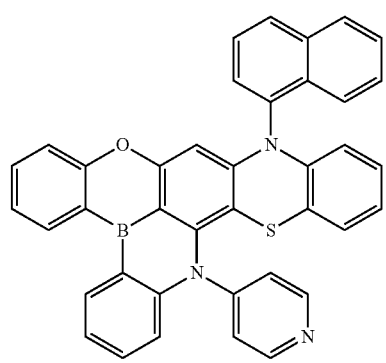
052
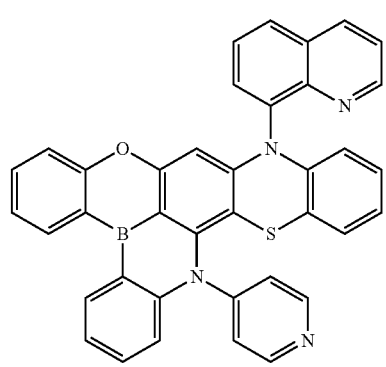
053
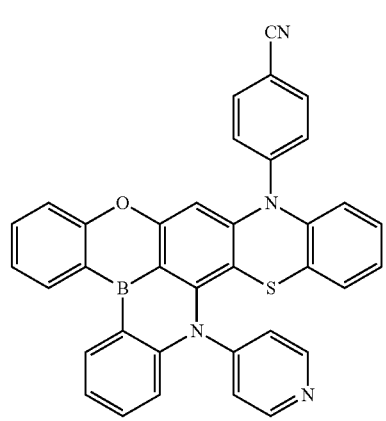
054
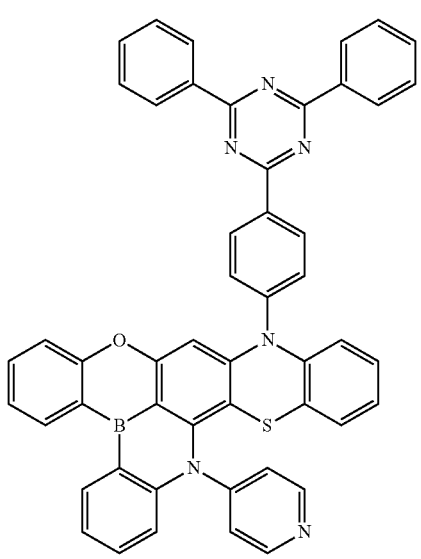
055
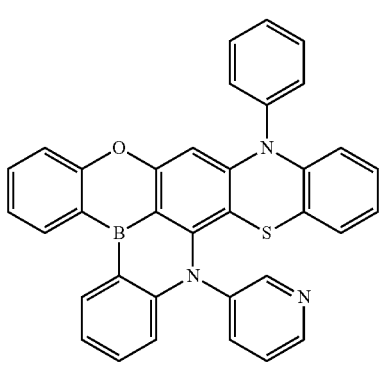
056
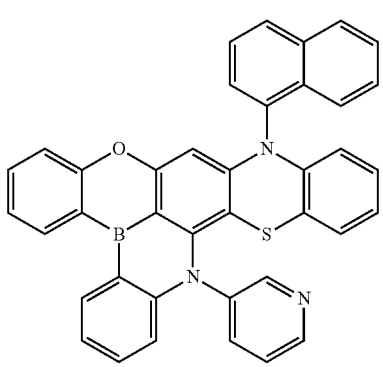
057
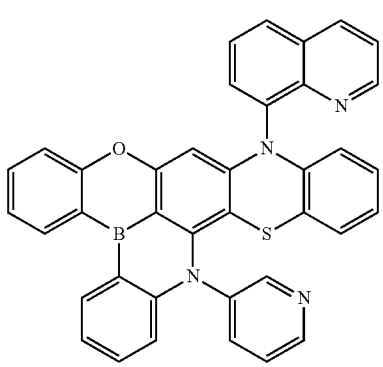

058
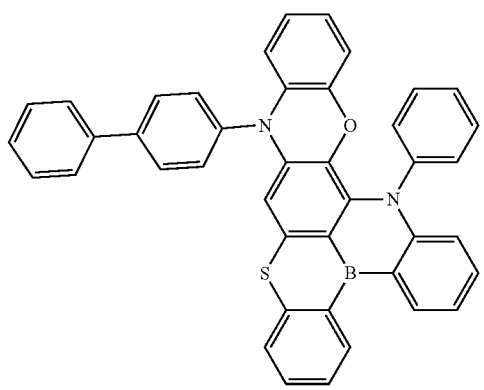
062
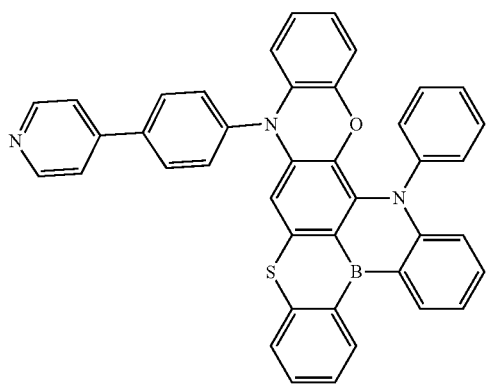
059
060
063
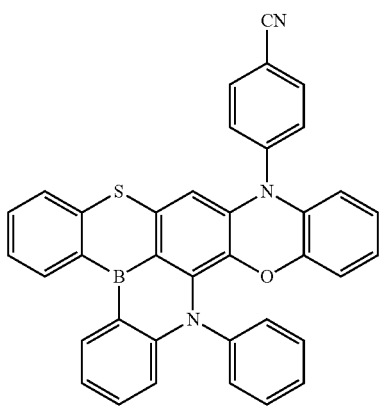
061
064
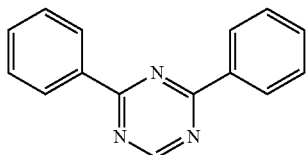
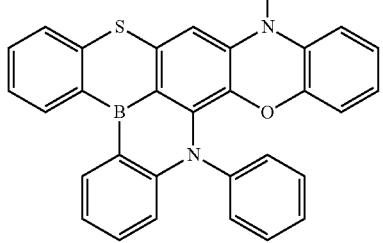

065
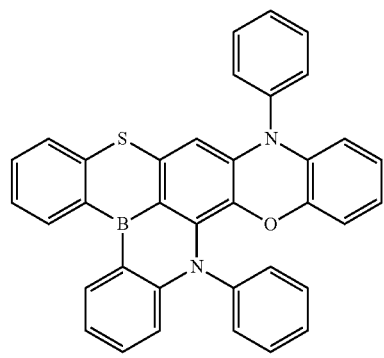
066
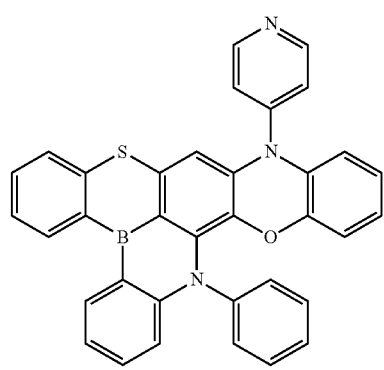
067
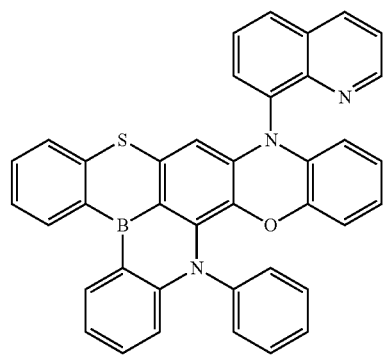
068
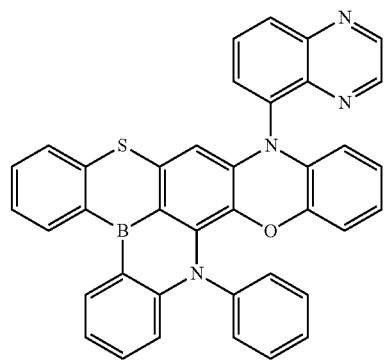
069
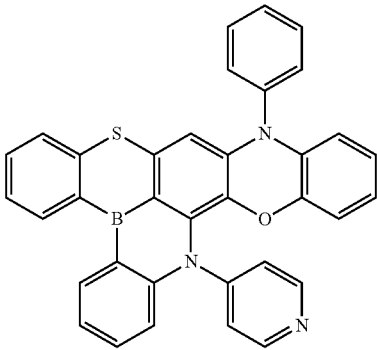
070
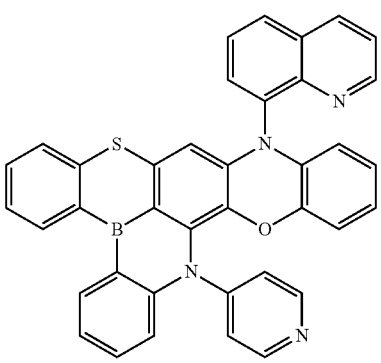
071
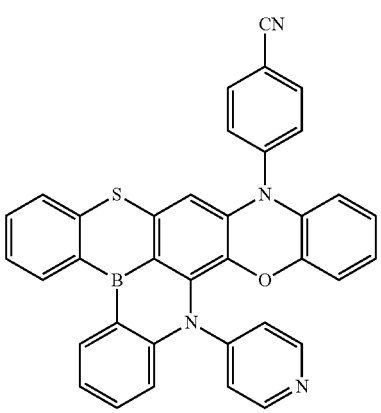

-continued
072
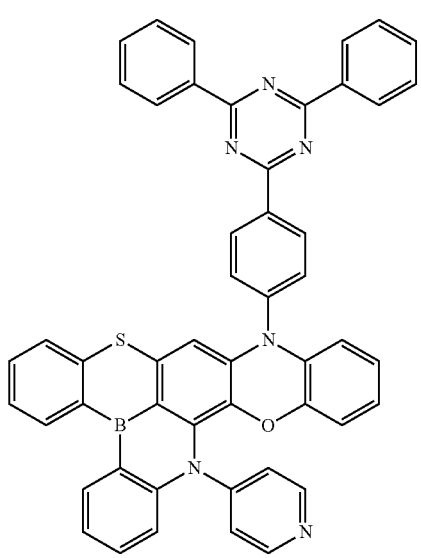
073
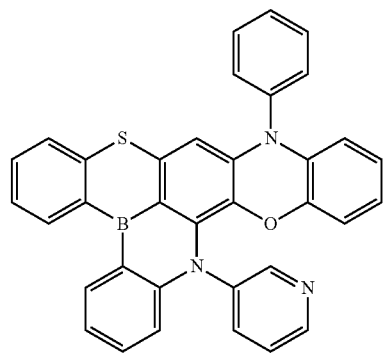
074
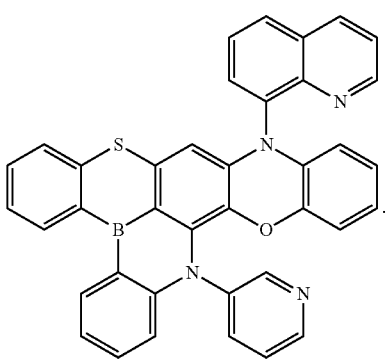
14. The organic compound according to claim 8, wherein the organic compound has any one of structures shown in formula (111) to formula (144):
111
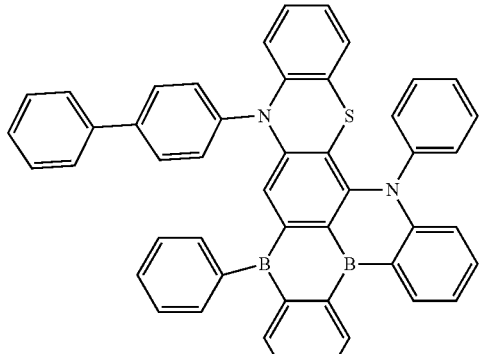
112
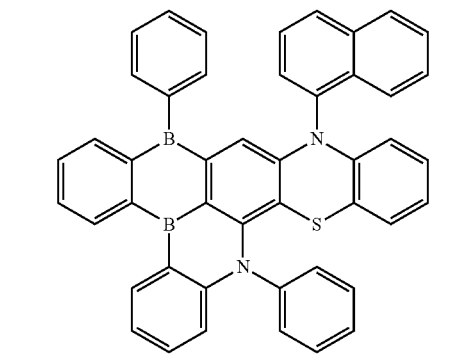
113
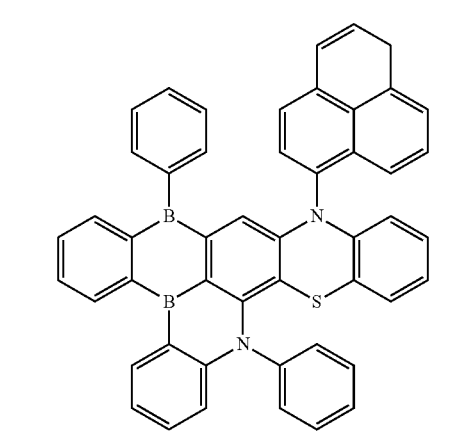
114
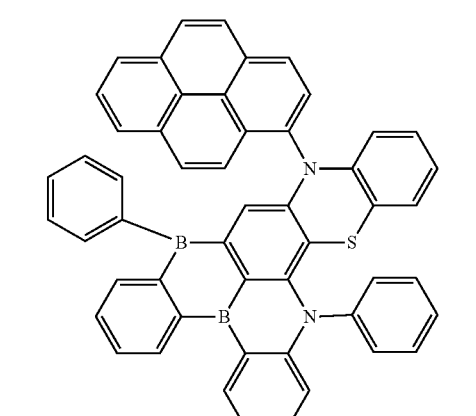

115
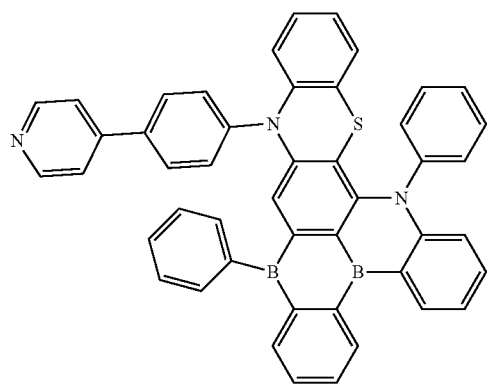
116
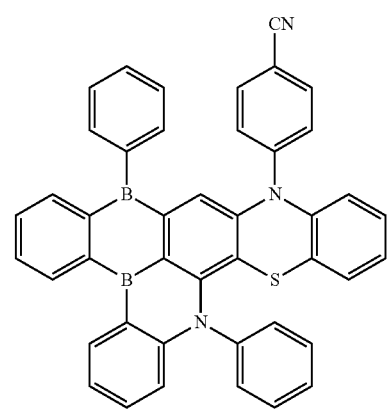
117
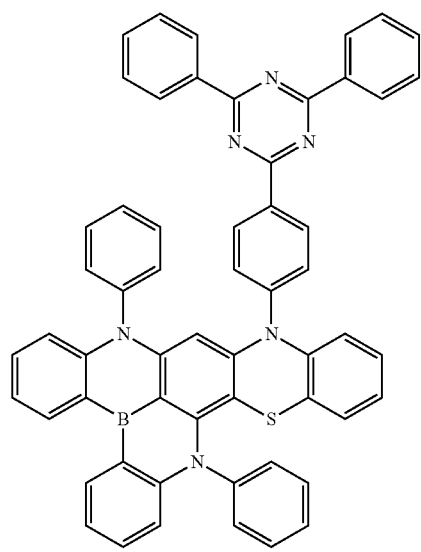
118
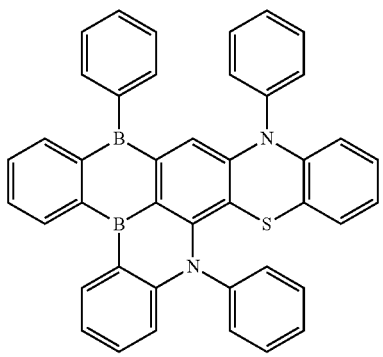
119
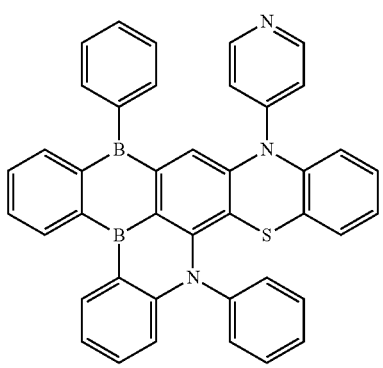
120
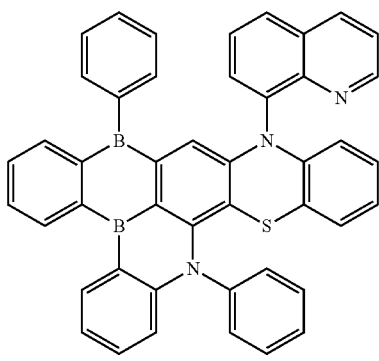
121
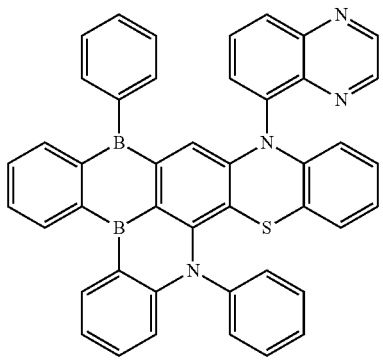

| 122 | 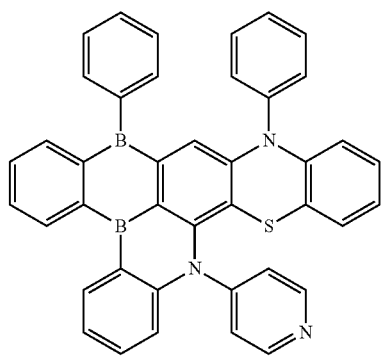 | 126 | 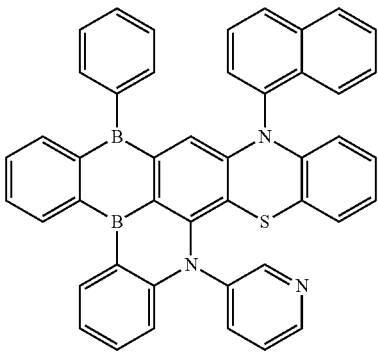 |
| 123 | 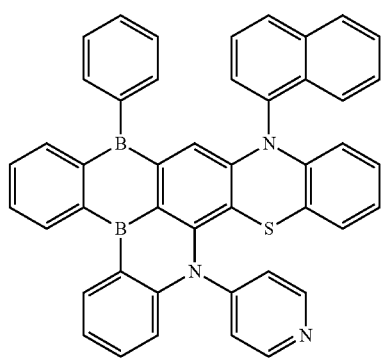 | 127 | 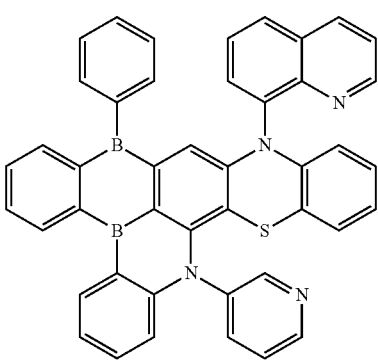 |
| 124 | 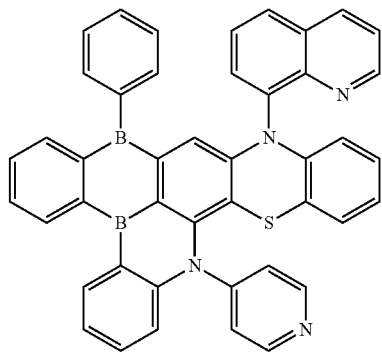 | 128 | 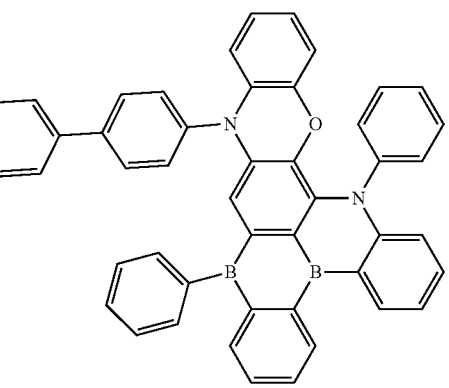 |
| 125 | 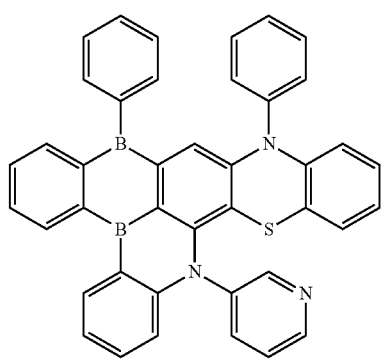 | 129 | 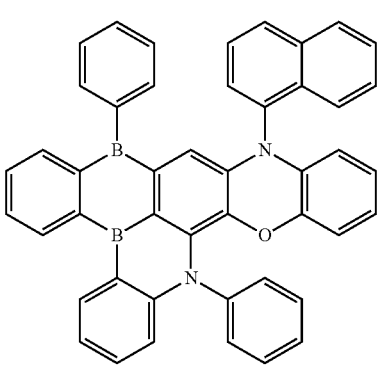 |

130
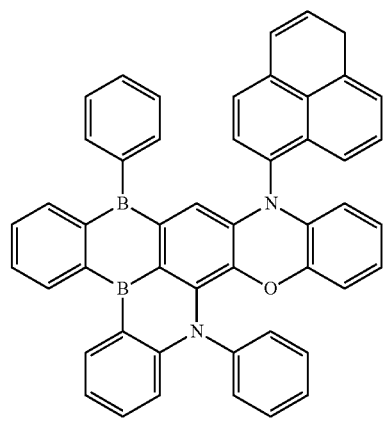
131
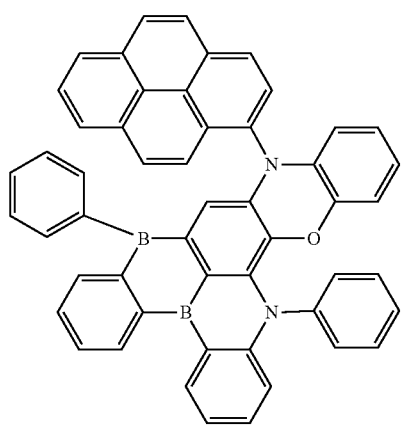
132
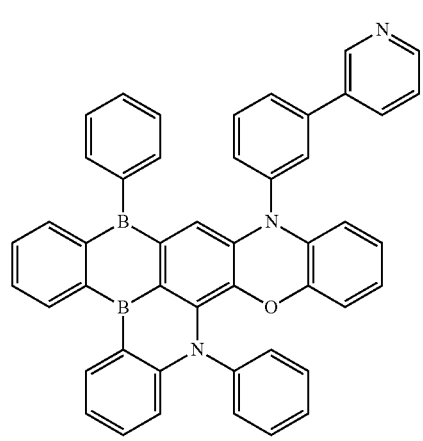
133
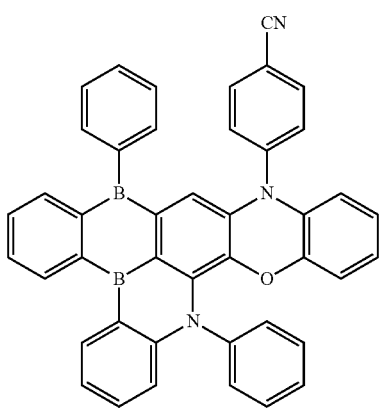
134
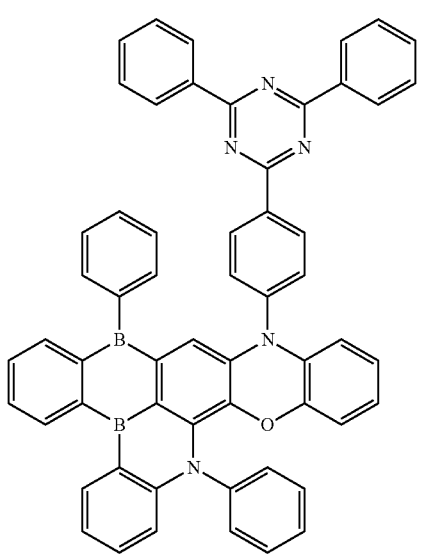
135
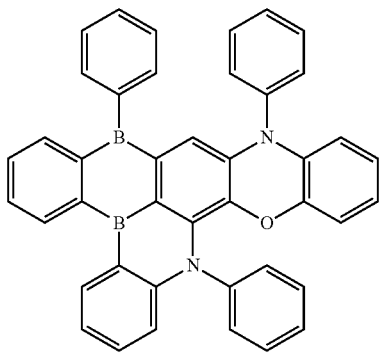

177
-continued
136
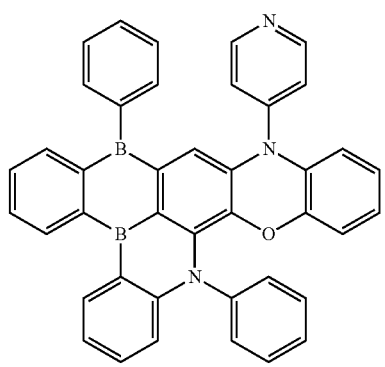
137
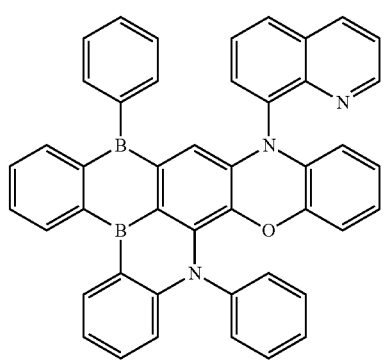
138
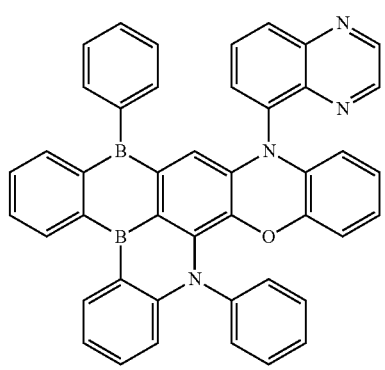
139
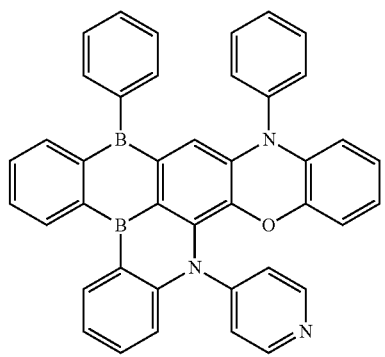
178
-continued
140
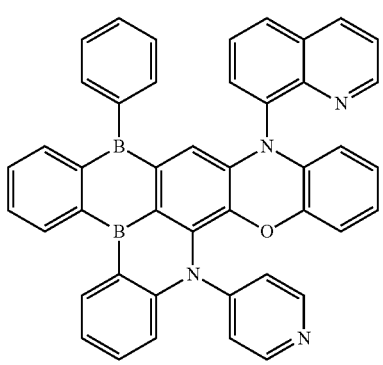
141
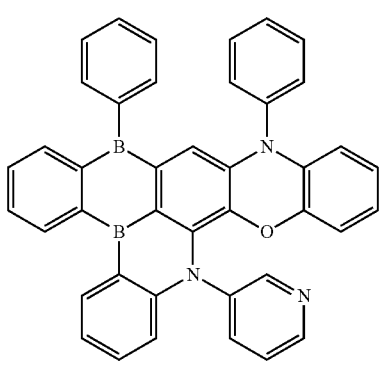
142
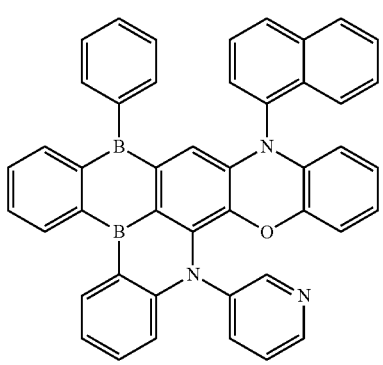
143
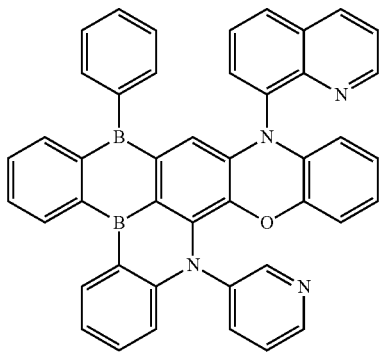

144

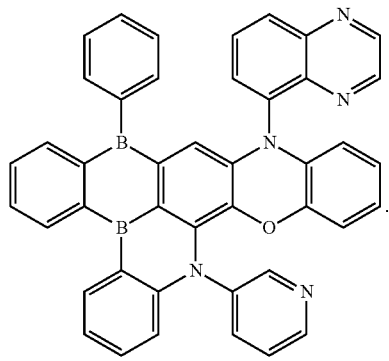

145

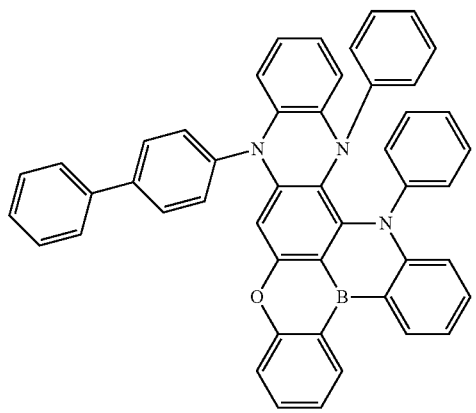

146

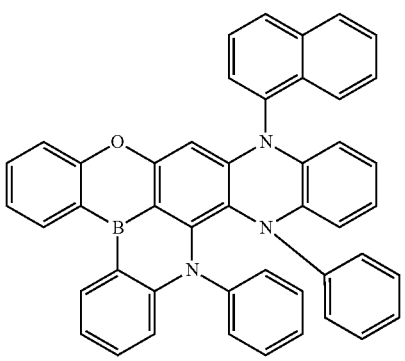

147

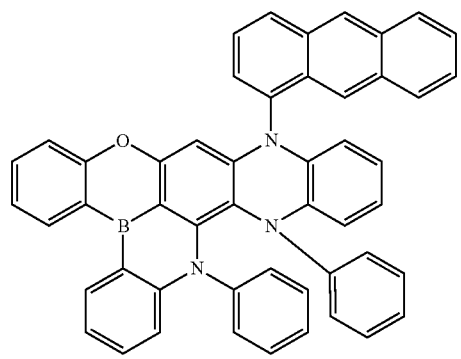

15. An organic compound, having a structure shown in formula (I), comprising:

formula (I)

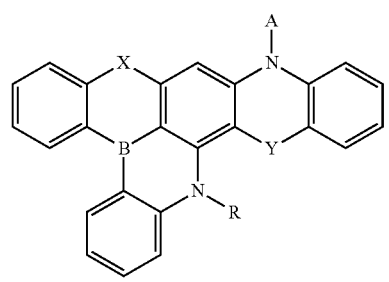

wherein X and Y are each independently selected from substituted carbon, divalent heteroatom, or substituted heteroatom with a valence greater than 2;

A and R are each independently selected from hydrogen, deuterium, substituted or unsubstituted C1-C10 alkyl, substituted or unsubstituted C6-C30 aryl, or substituted or unsubstituted C2-C30 heterocyclic; and when one of A and R is hydrogen or deuterium, another of A and R is not hydrogen or deuterium; and substituents of the substituted carbon, the substituted heteroatom with the valence greater than 2, the substituted C1-C10 alkyl, the substituted C6-C30 aryl and the substituted C2-C30 heterocyclic are each independently selected from one or a combination of deuterium, nitro, cyano, substituted or unsubstituted C1~C10 alkyl, substituted or unsubstituted C6~C30 aryl, or substituted and unsubstituted C2~C30 heterocyclic, wherein X is a divalent heteroatom, and Y is a trivalent heteroatom; or X and Y are both trivalent heteroatoms; or X is substituted carbon or a tetravalent heteroatom, and Y is a divalent heteroatom; or X is substituted carbon or a tetravalent heteroatom, and Y is a trivalent heteroatom.

16. The organic compound according to claim 15, wherein the organic compound has any one of structures shown in formula (145) to formula (400):

148

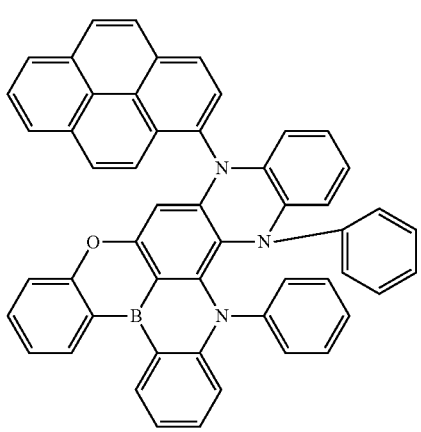

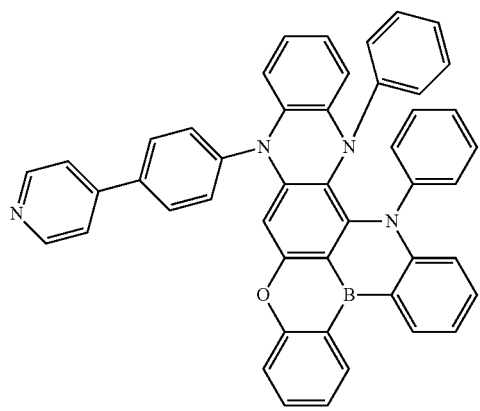
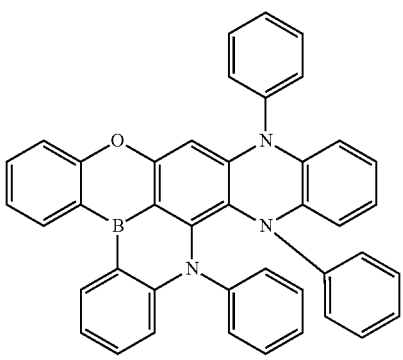
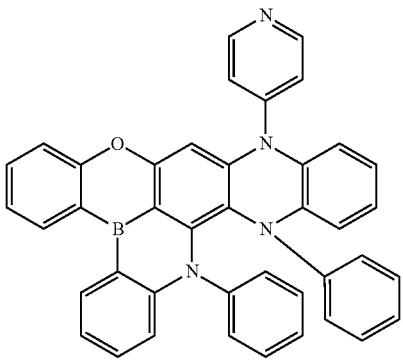
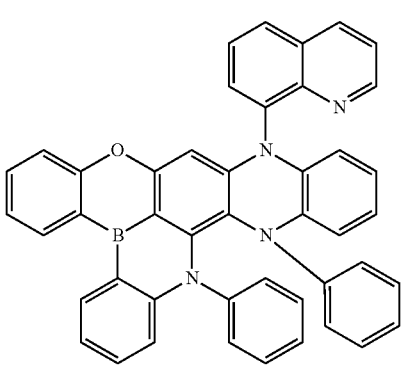
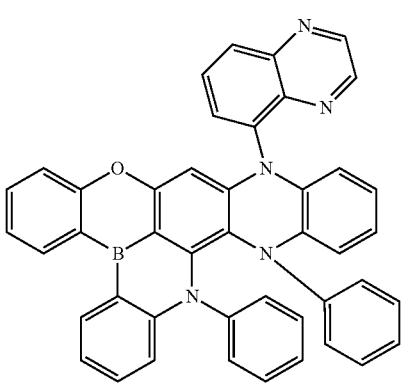

156 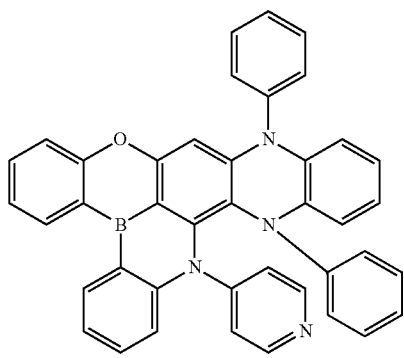
157 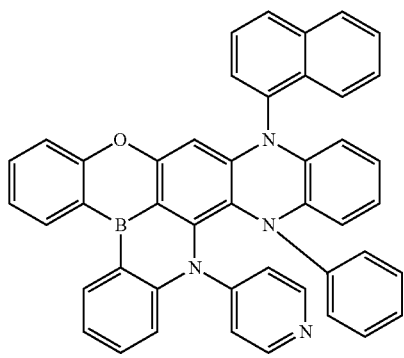
158 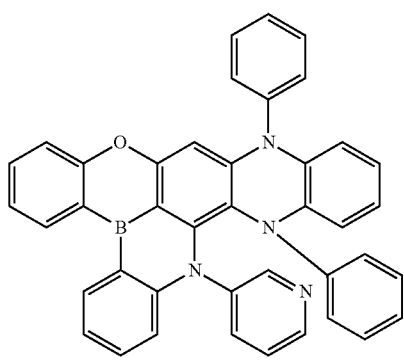
159 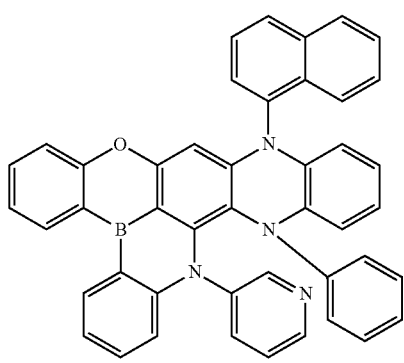
160 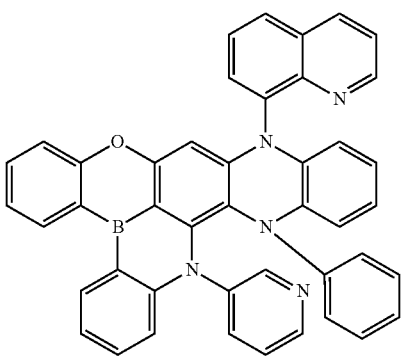
161 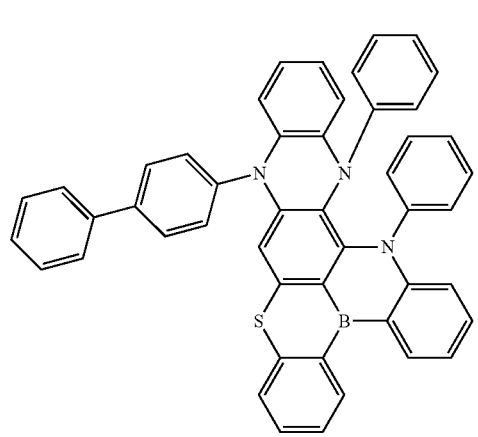
162 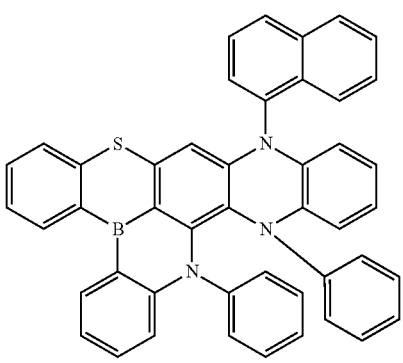
163 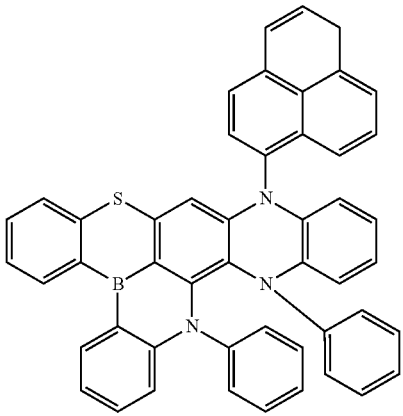

-continued
164
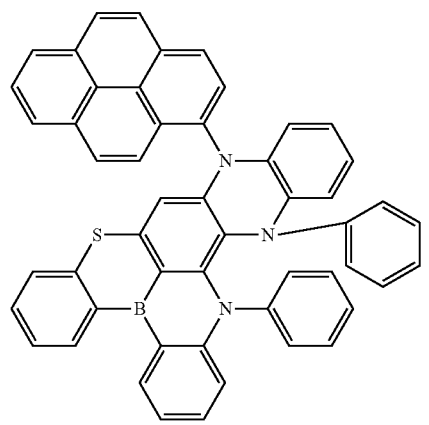
165
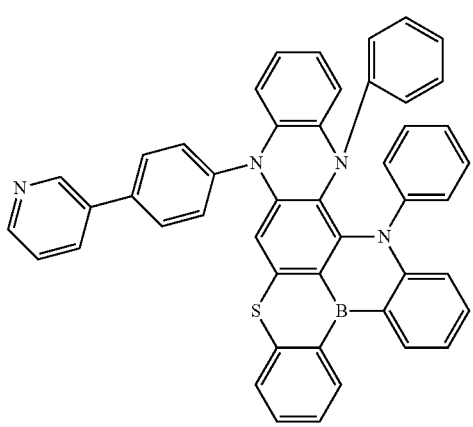
166
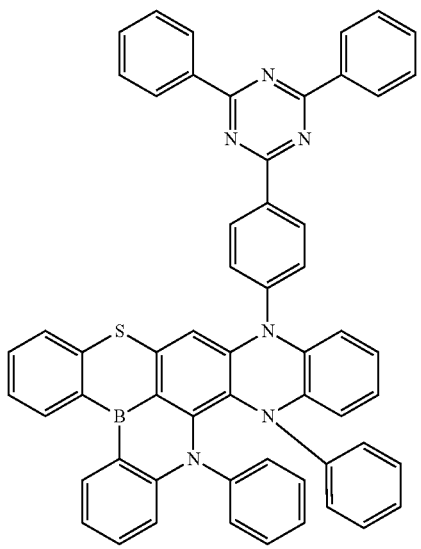
-continued
167
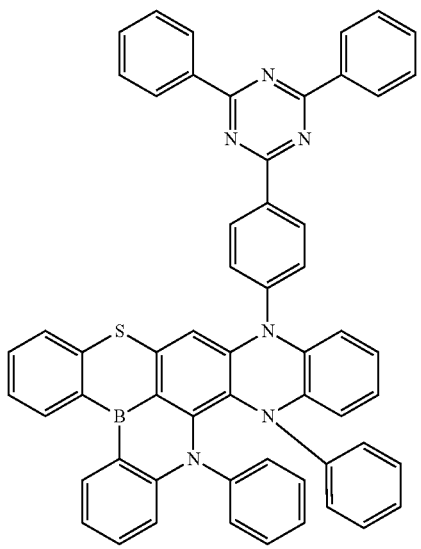
168
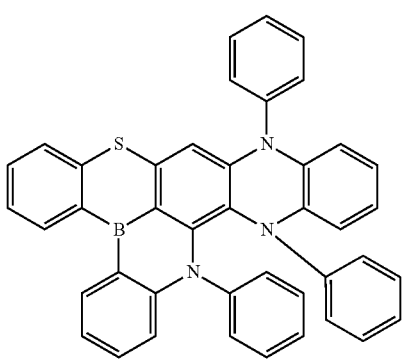
169
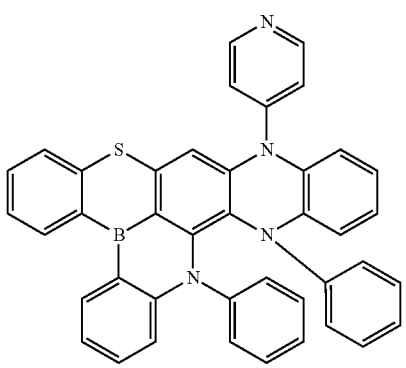
170
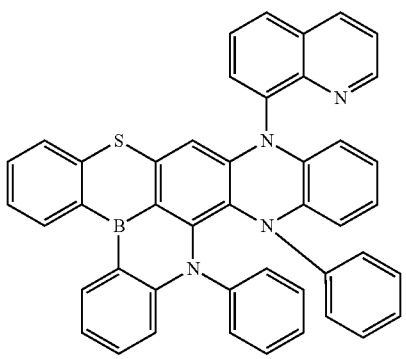

187 -continued
| | |
|---|---|
| 171 | 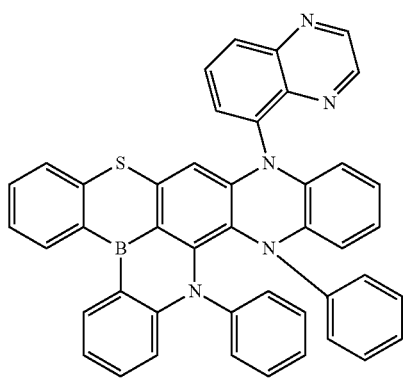 |
| 172 | 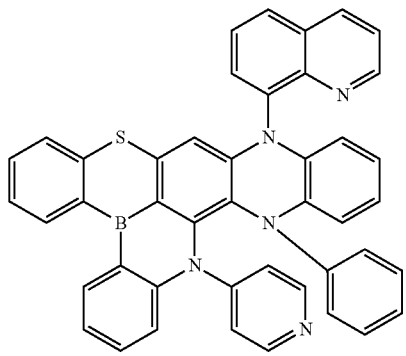 |
188 -continued
| | |
|---|---|
| 175 | 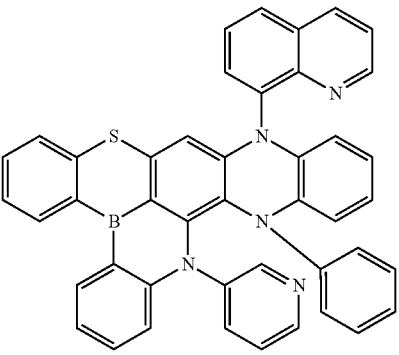 |
| 176 | 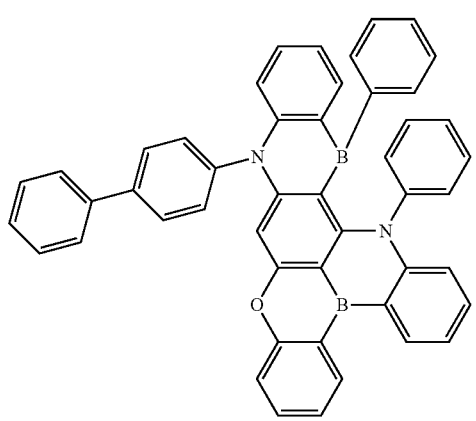 |
| 177 | 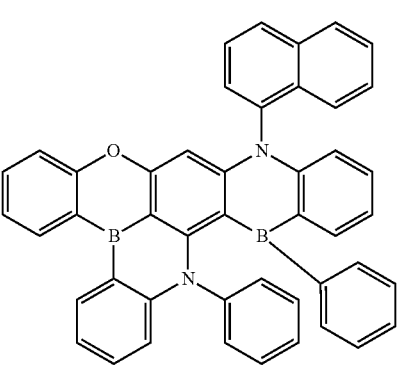 |
| 178 | 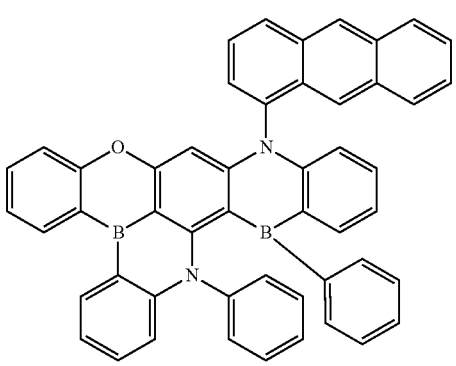 |
173
174

-continued
179
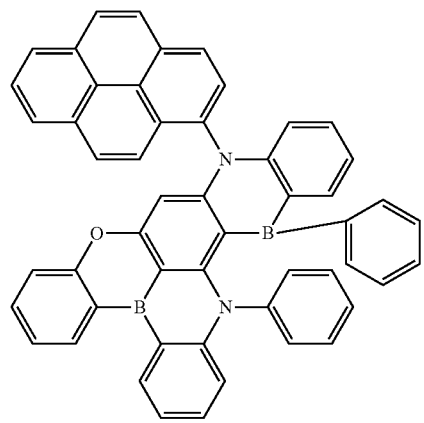
180
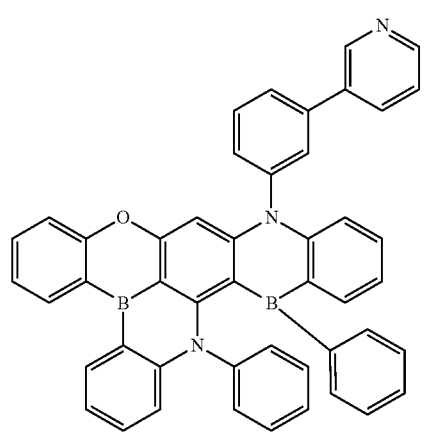
181
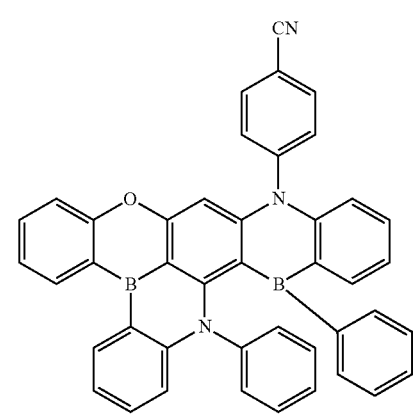
-continued
182
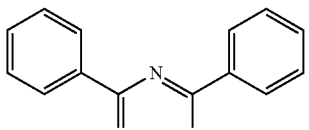
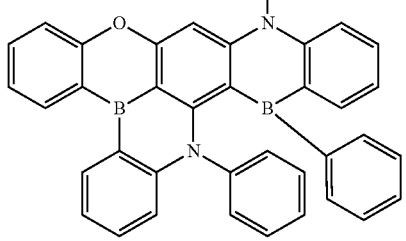
183
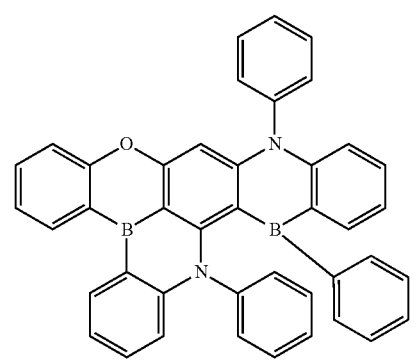
184
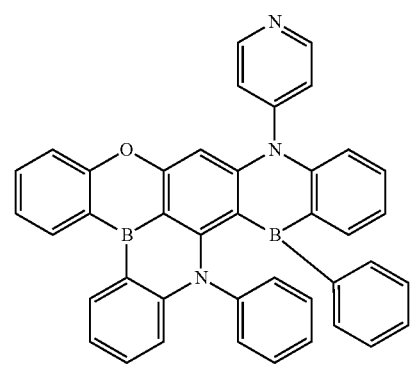
185
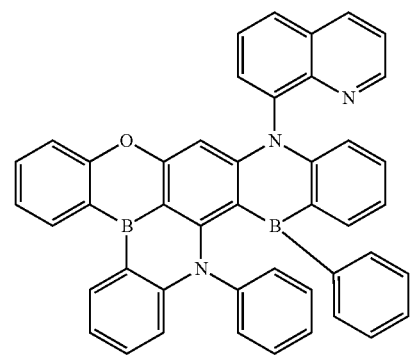

186
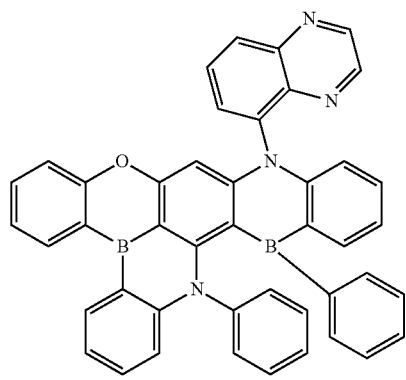
187
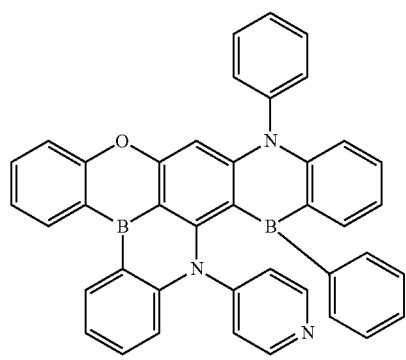
188
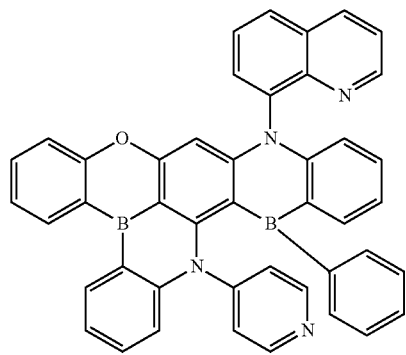
189
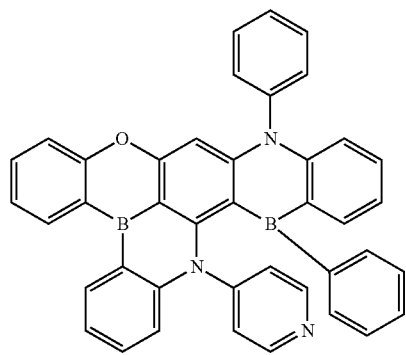
190
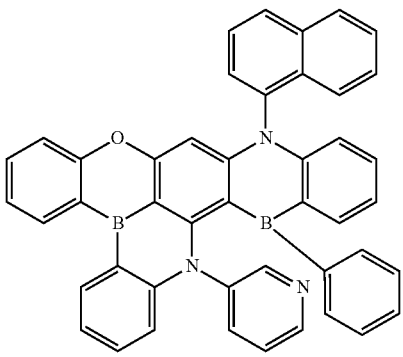
191
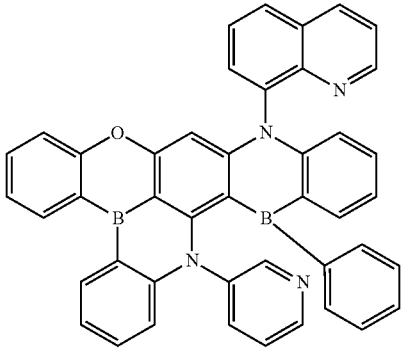
192
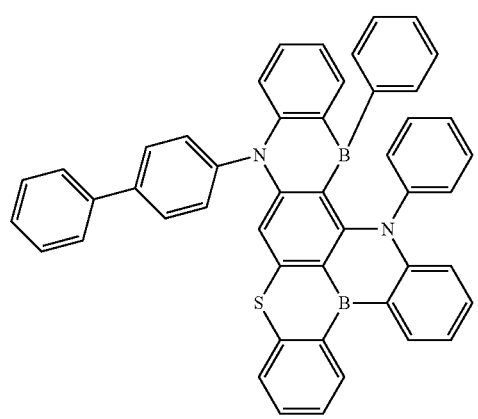
193
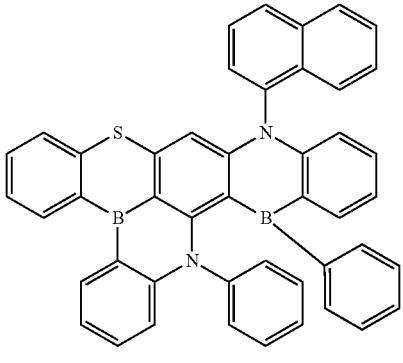

| | |
|---|---|
| 194 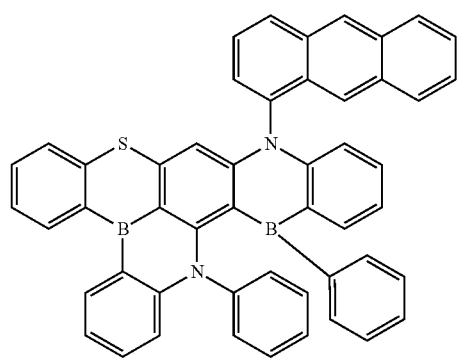 | 198 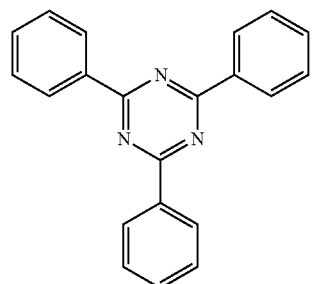 |
| 195 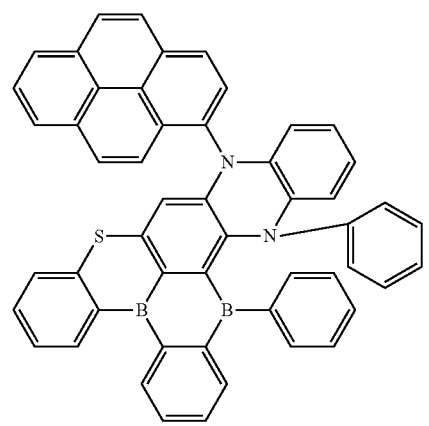 | 199 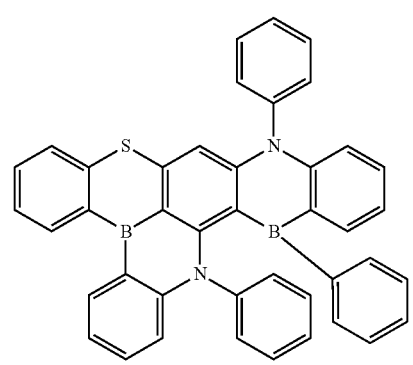 |
| 196 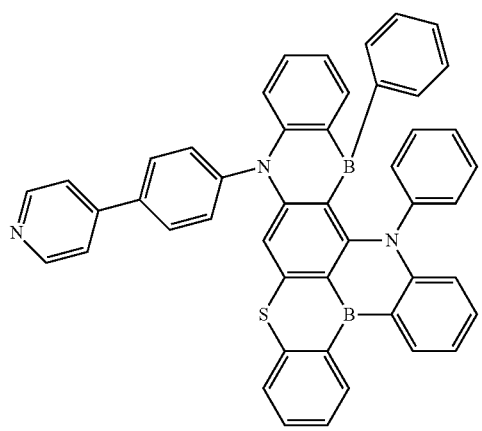 | 200 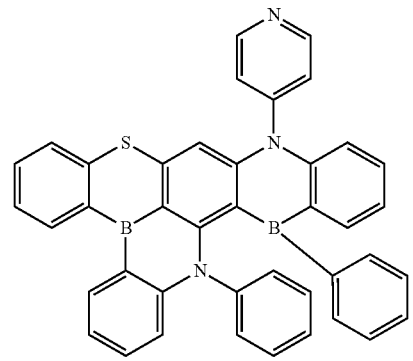 |
| 197 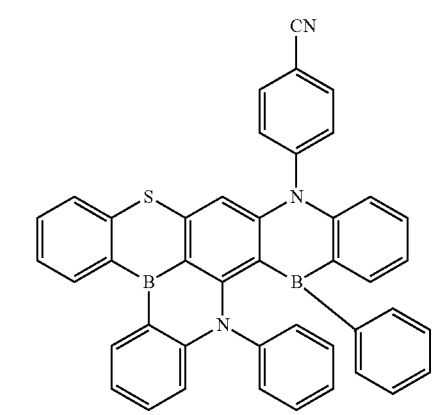 | 201 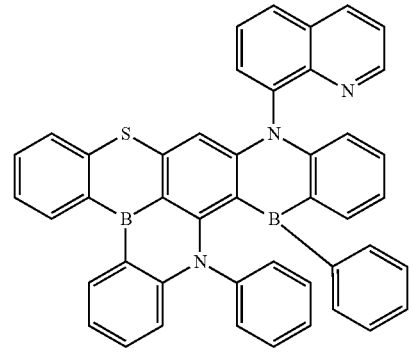 |

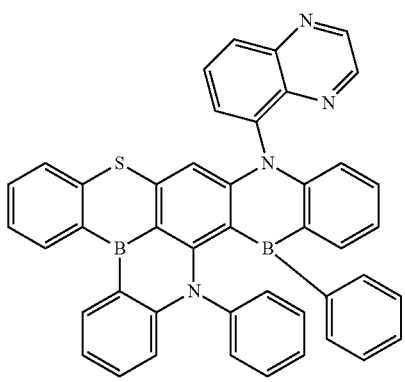
202
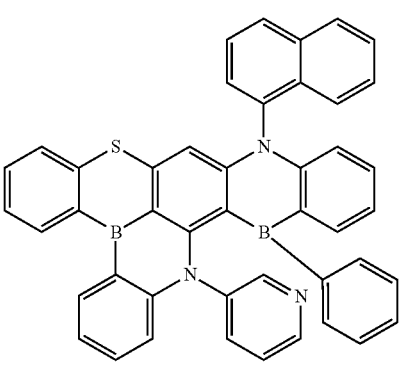
206
203
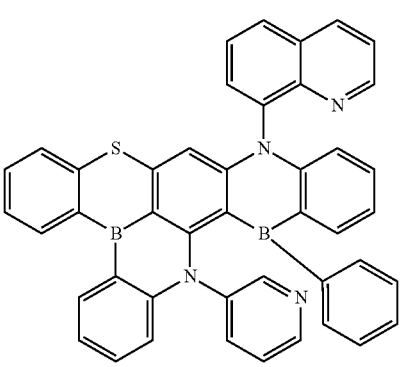
207
204
208
205
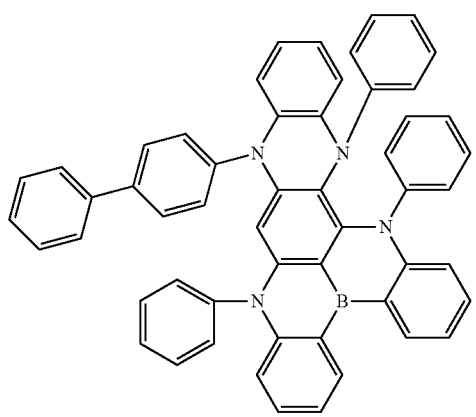
209
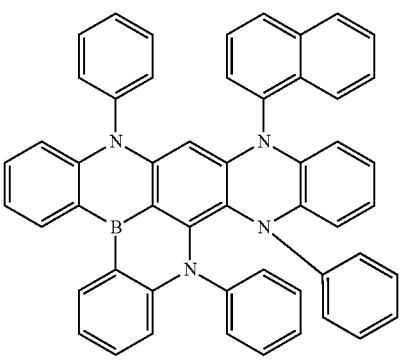

210
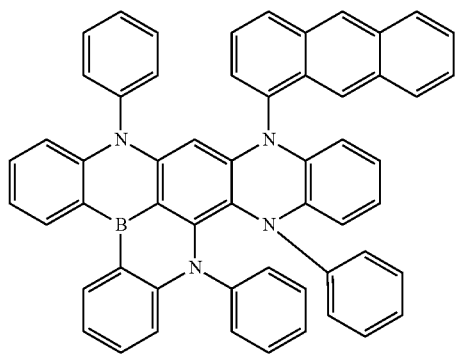
211
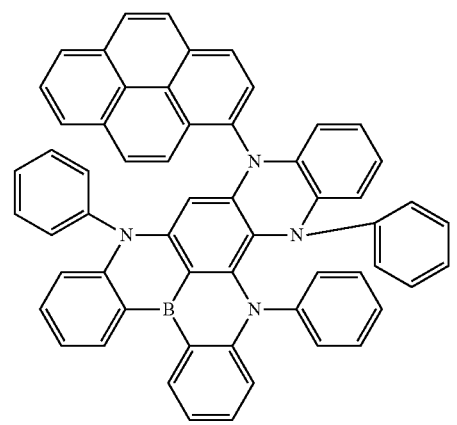
212
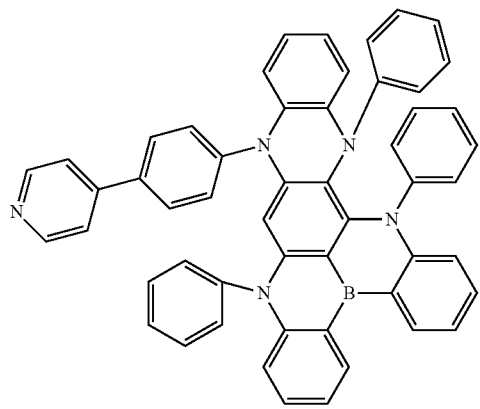
213
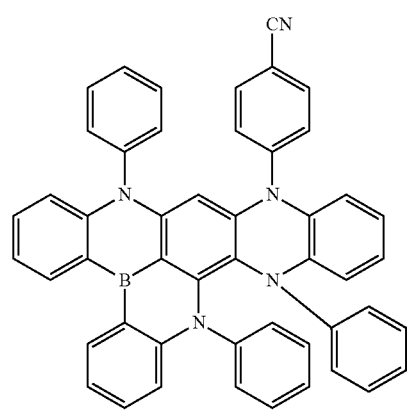
214
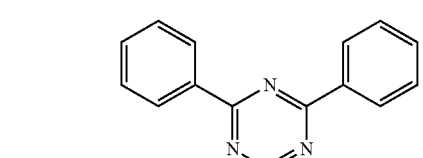
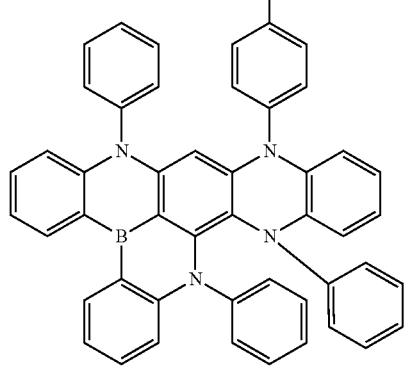
215
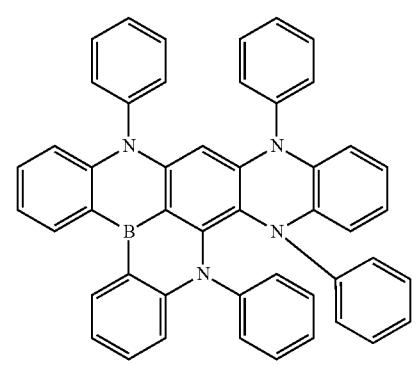
216
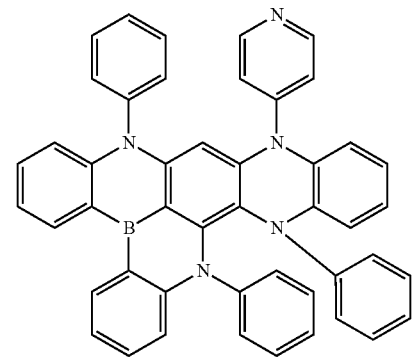
217

218
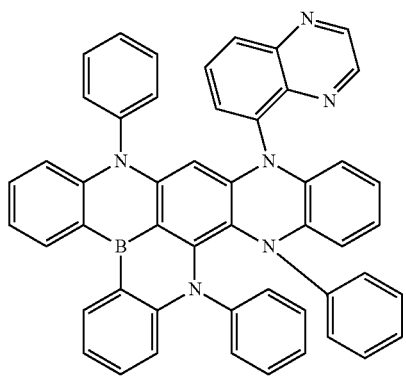
219
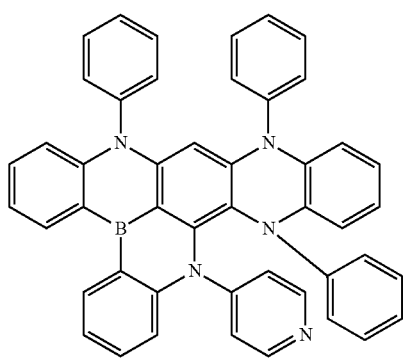
220
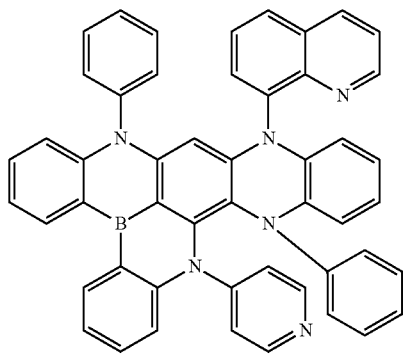
221
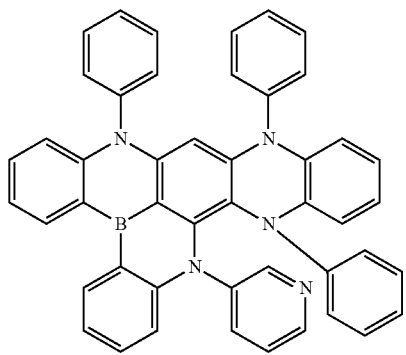
222
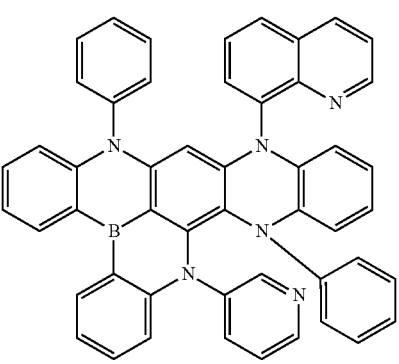
223
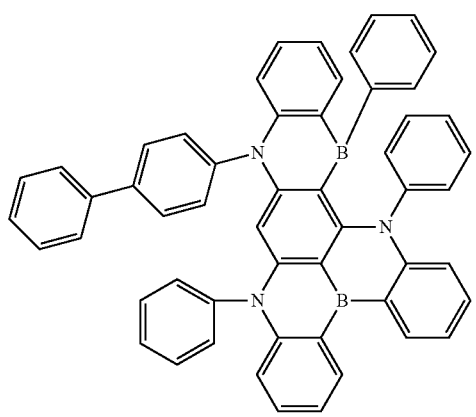
224
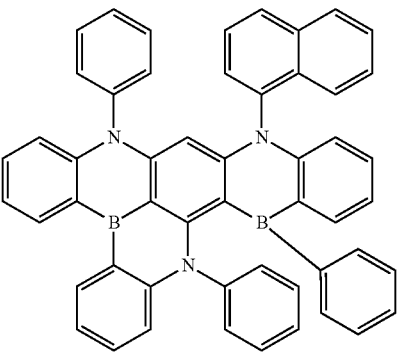
225
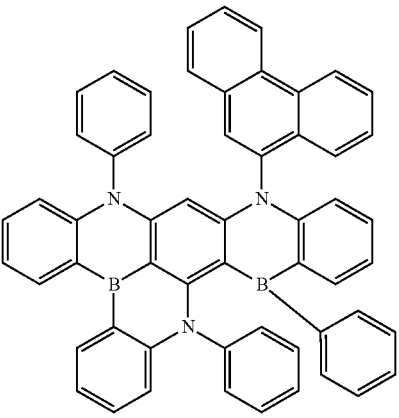

226
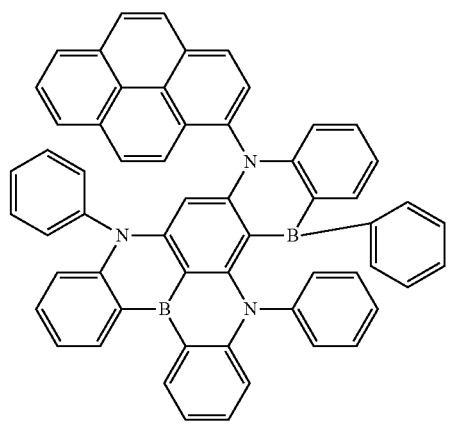
227
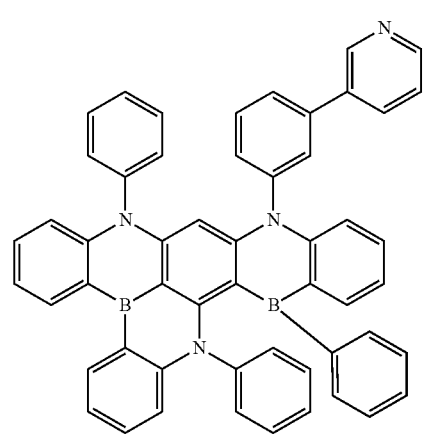
228
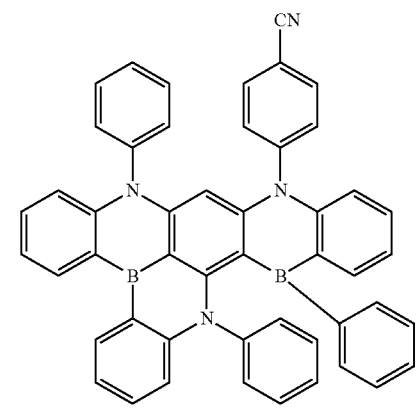
229
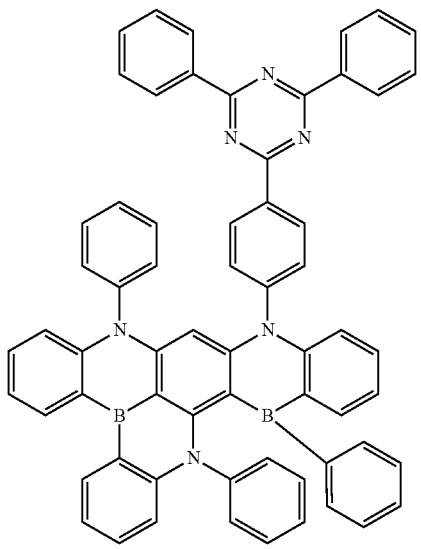
230
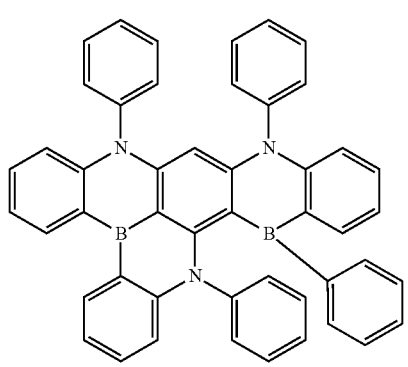
231
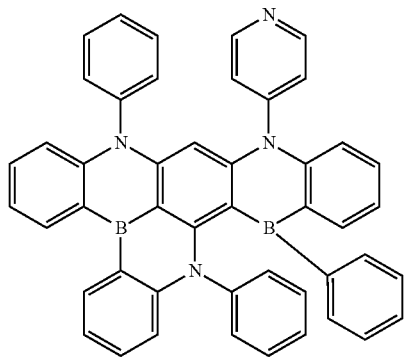
232
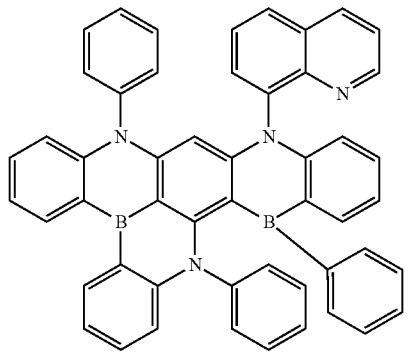

203
-continued
204
-continued
233
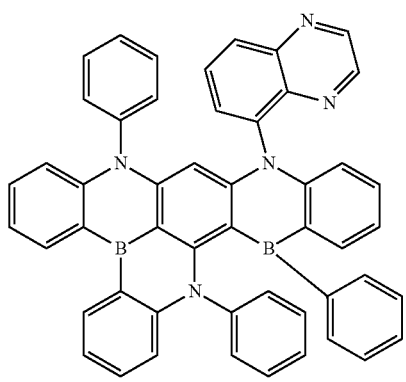
237
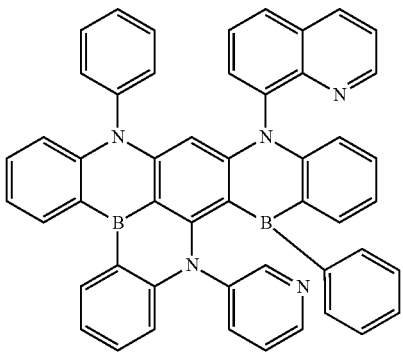
234
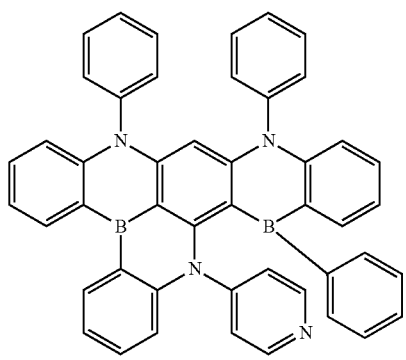
238
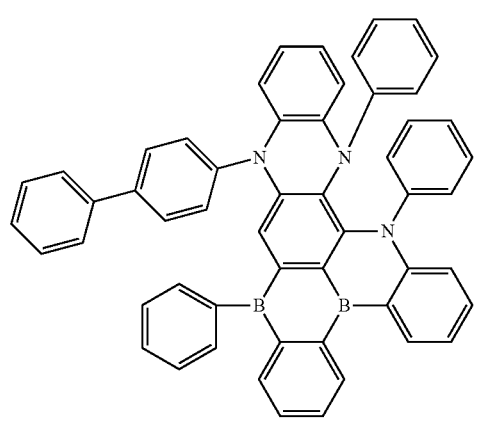
235
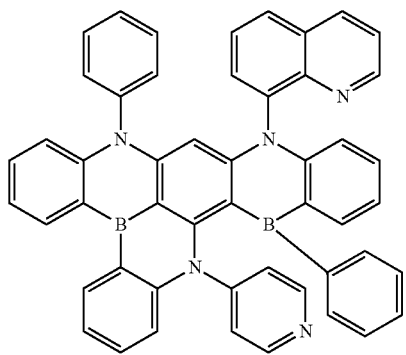
239
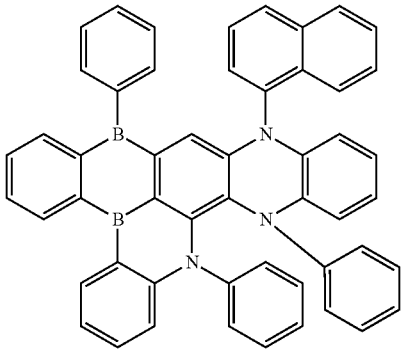
236
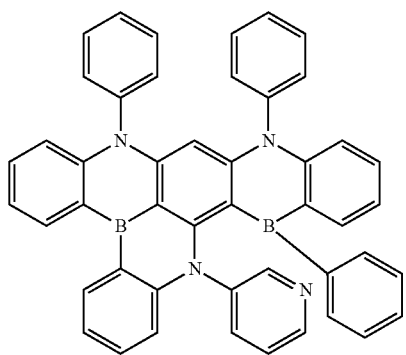
240
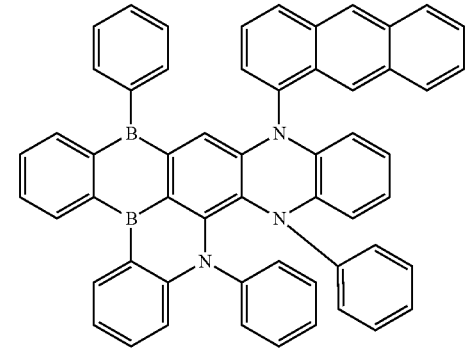

241
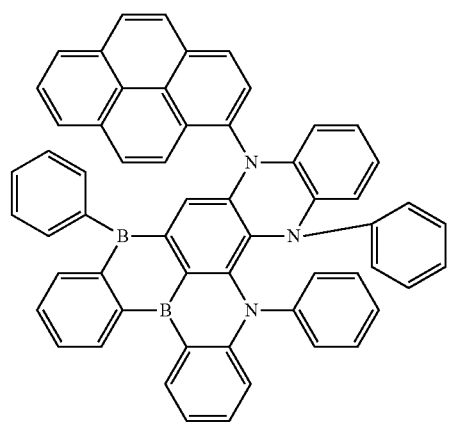
242
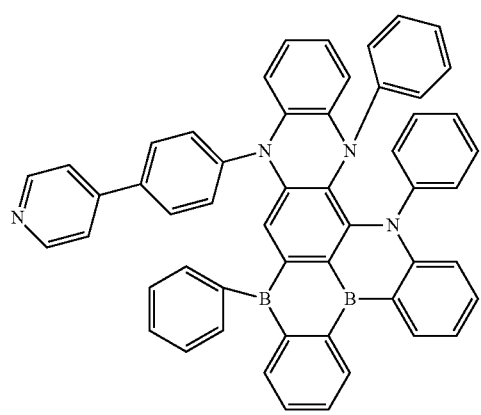
243
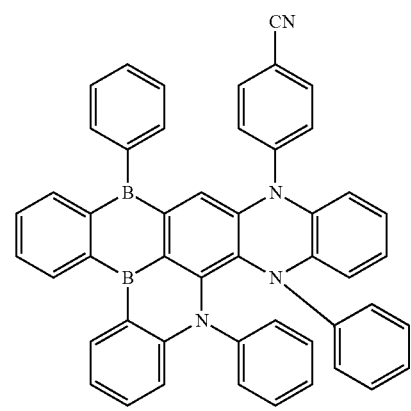
244
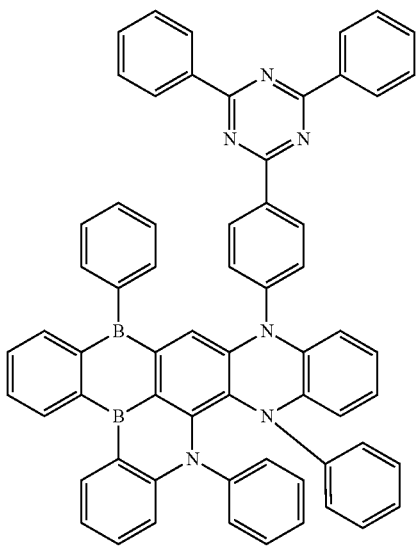
245
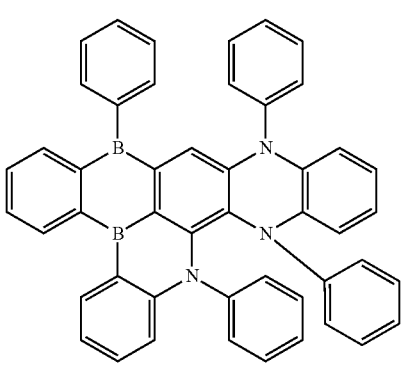
246
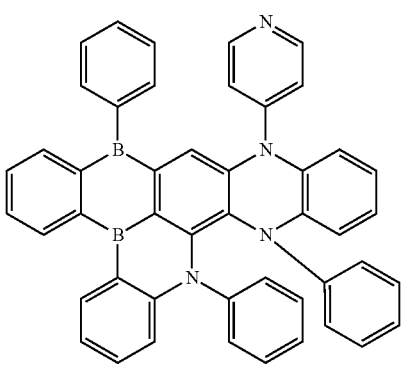
247
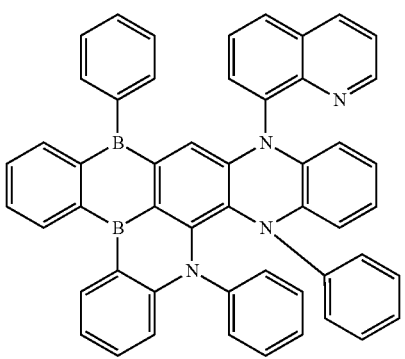

248
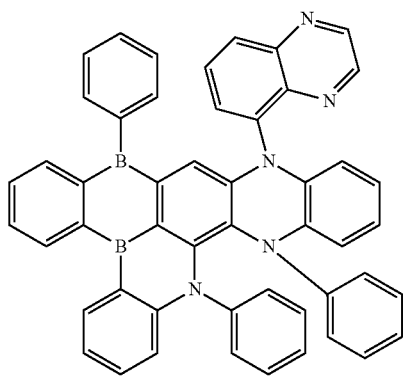
249
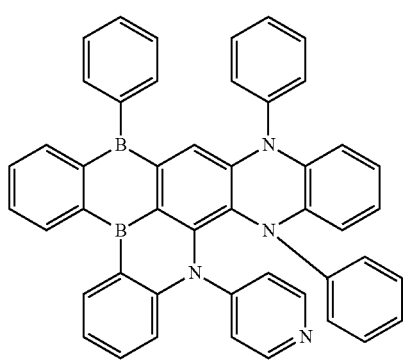
250
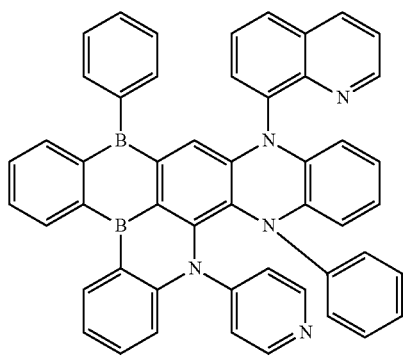
251
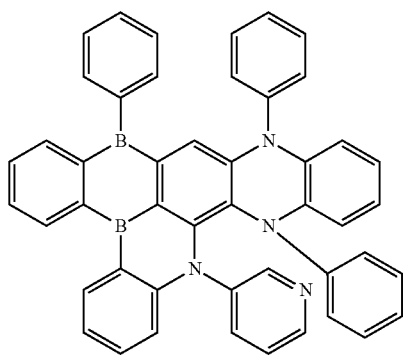
252
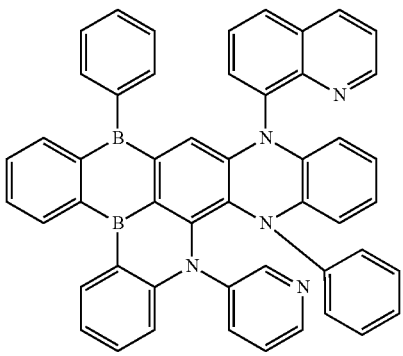
253
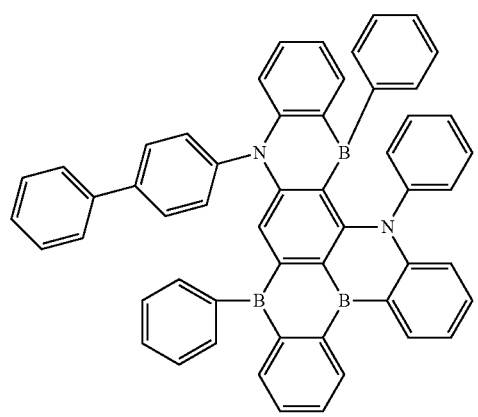
254
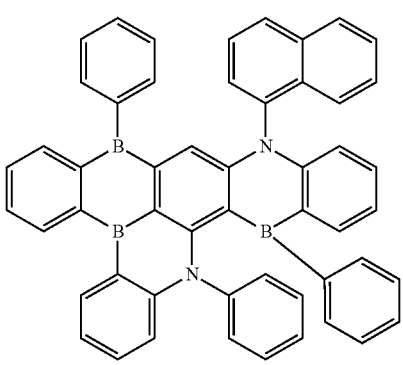
255
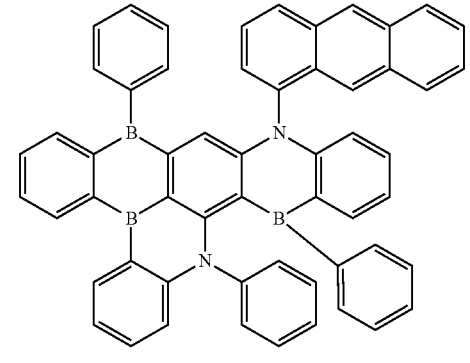

256
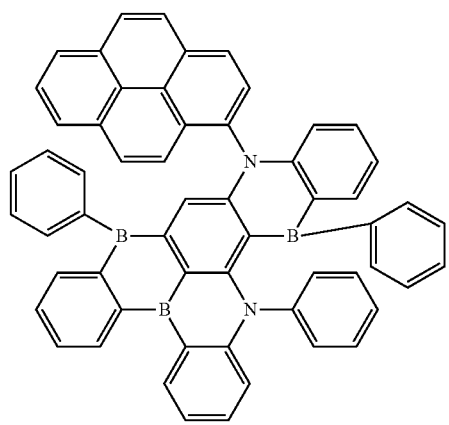
257
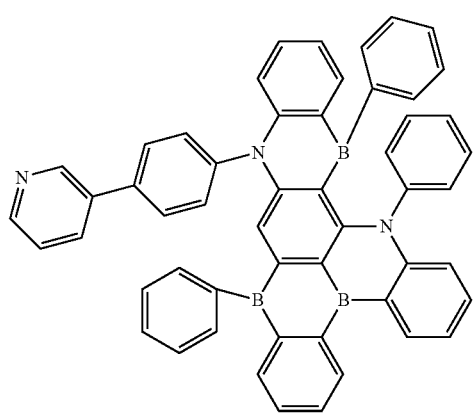
258
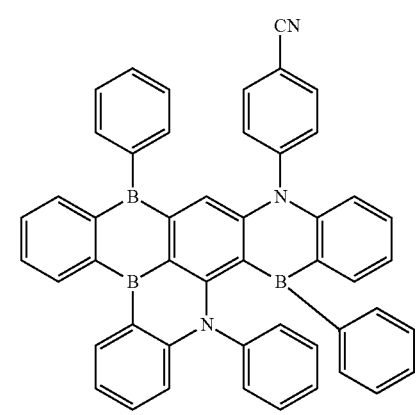
259
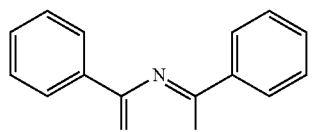
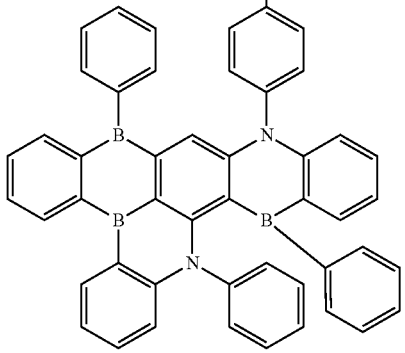
260
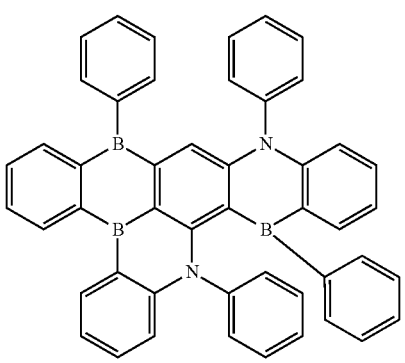
261
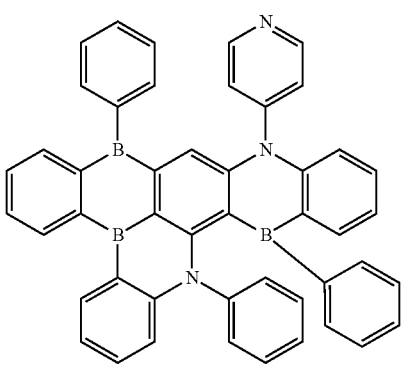
262
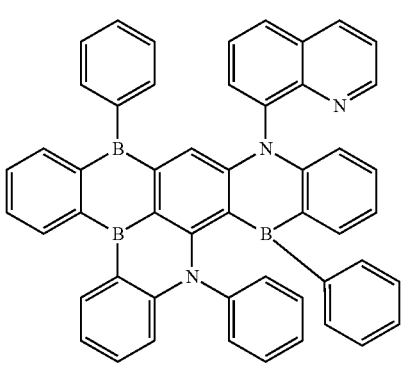

211
-continued
263
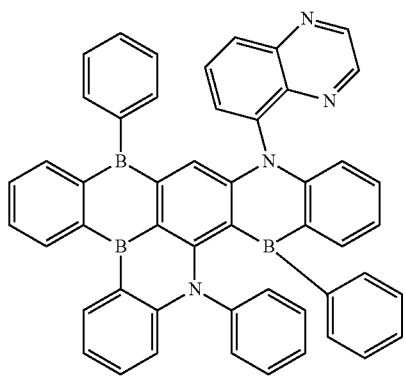
264
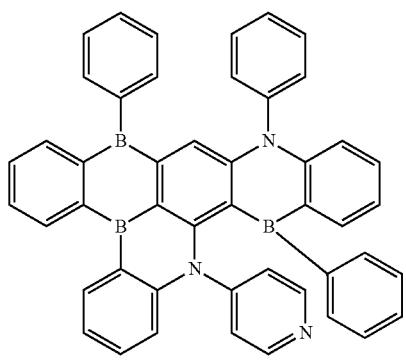
265
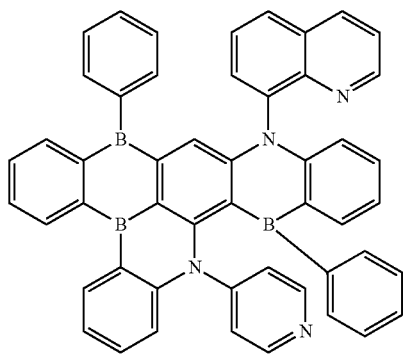
266
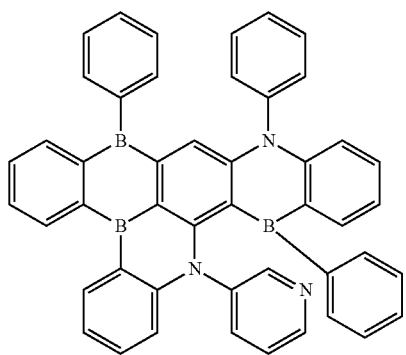
212
-continued
267
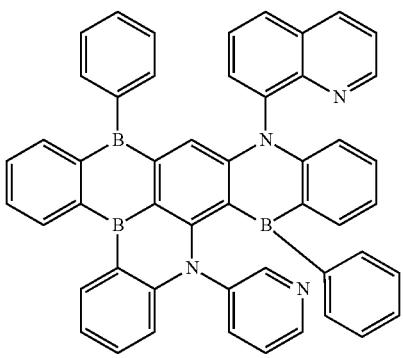
268
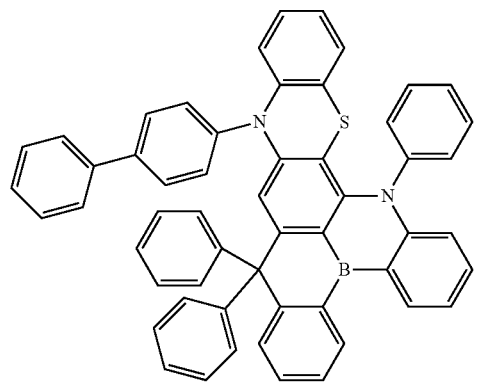
269
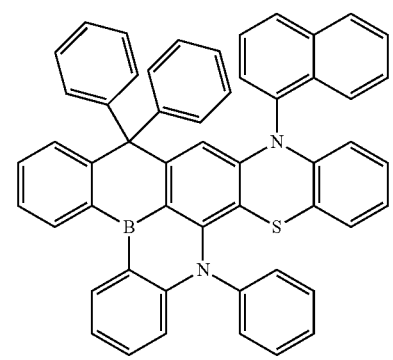
270
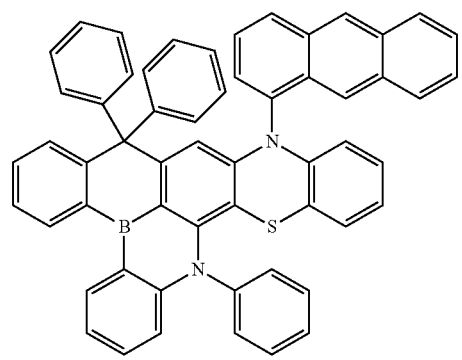

213
-continued
271
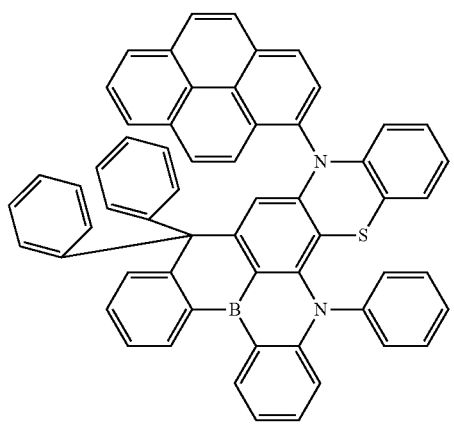
272
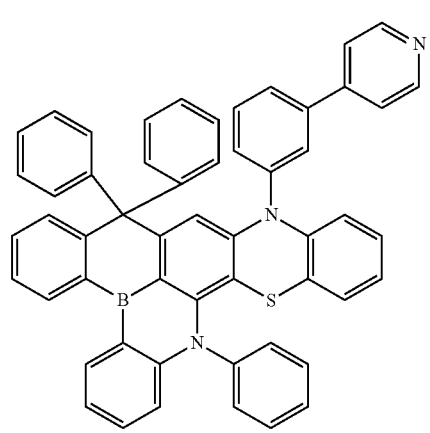
273
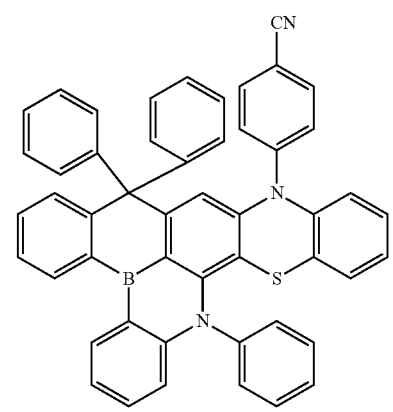
214
-continued
274
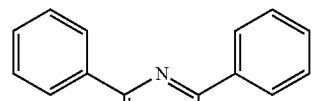
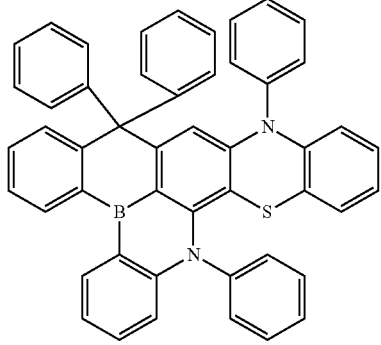
275
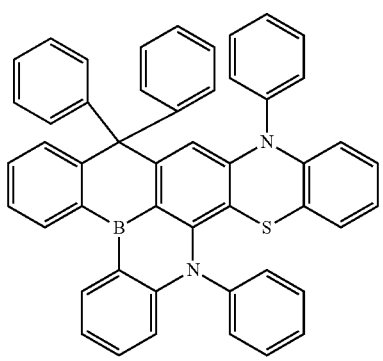
276
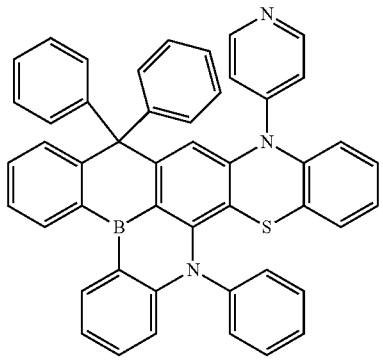
277
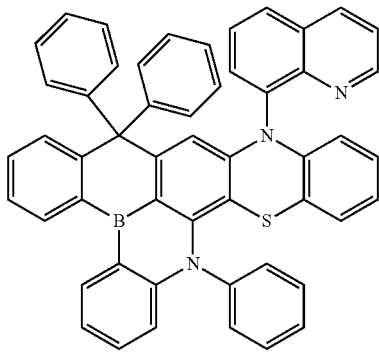

278
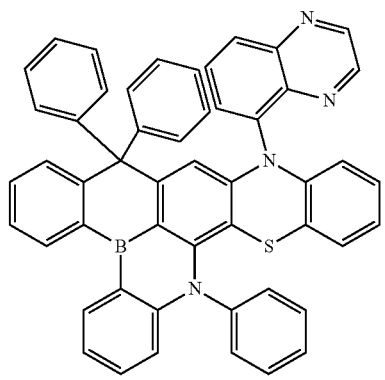
279
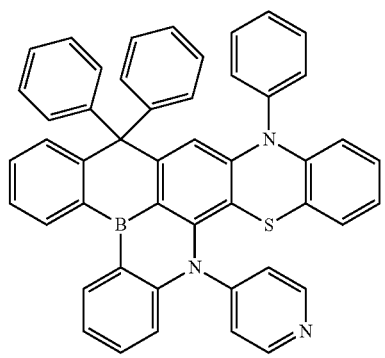
280
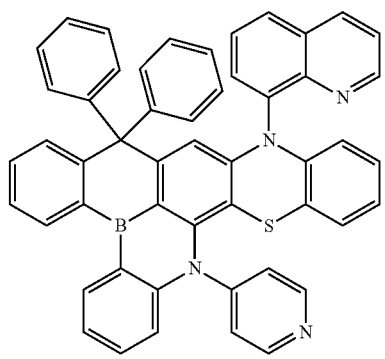
281
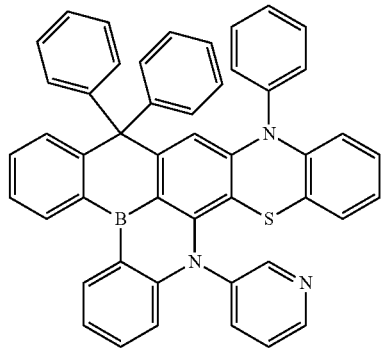
282
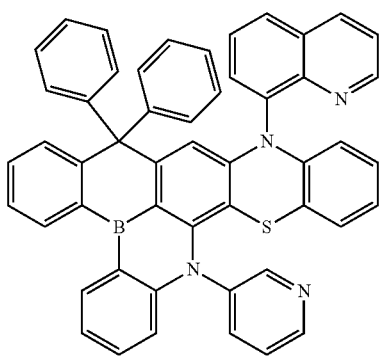
283
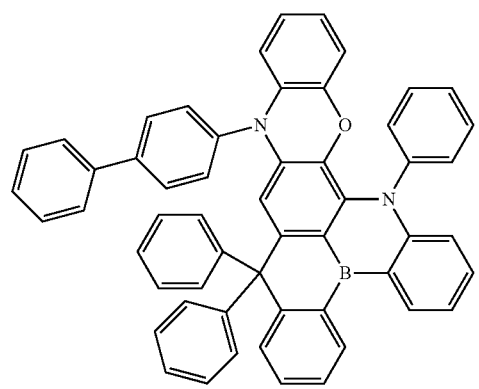
284
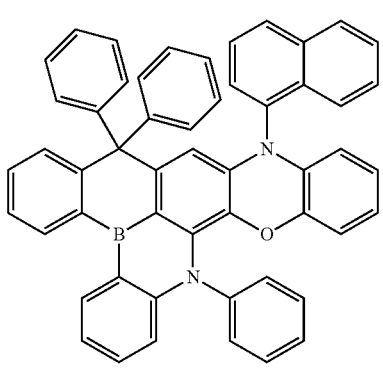
285
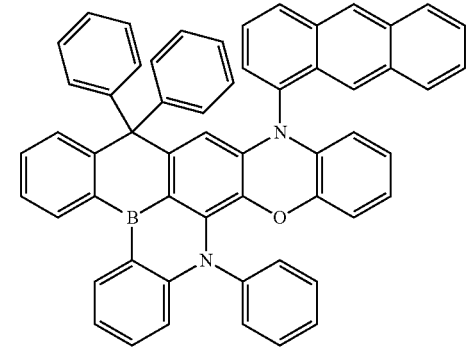

286
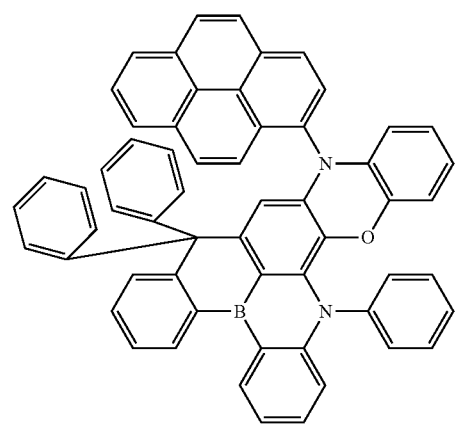
287
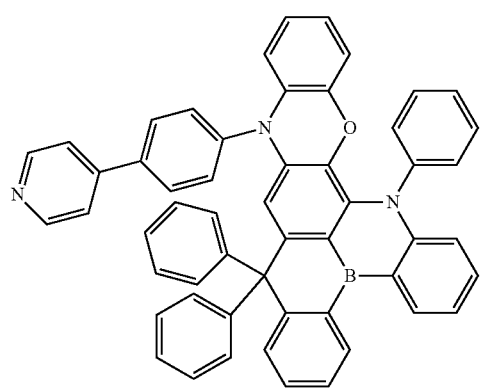
288
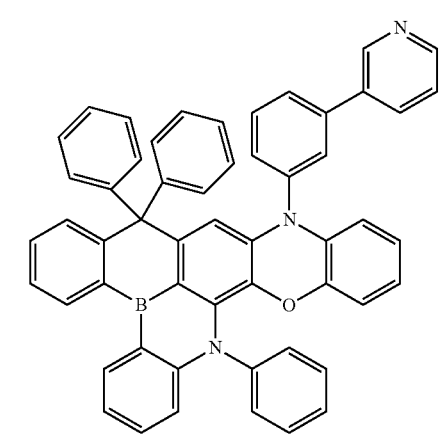
289
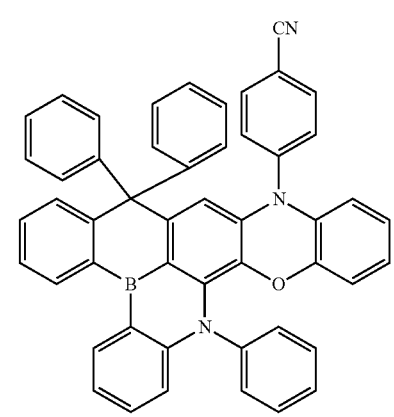
290
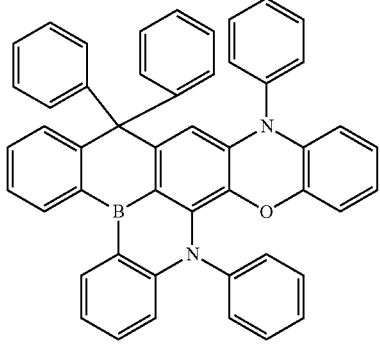
291
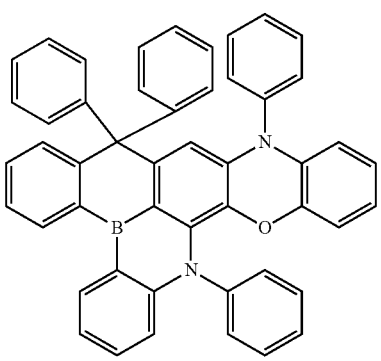
292
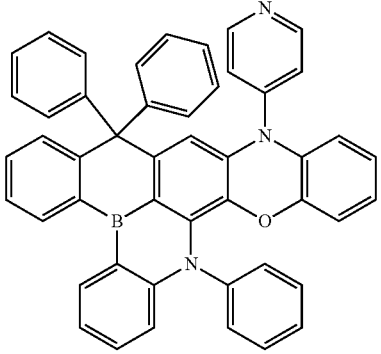
293
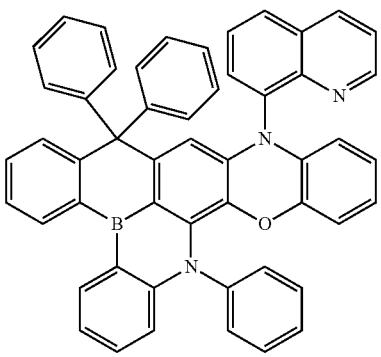

-continued
294
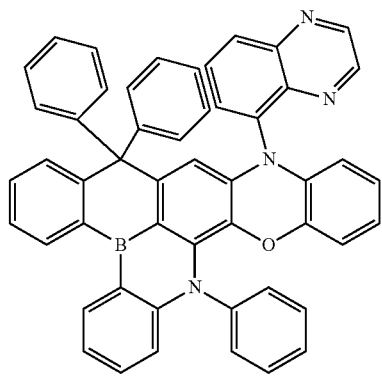
295
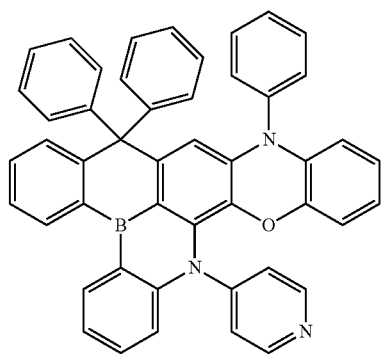
296
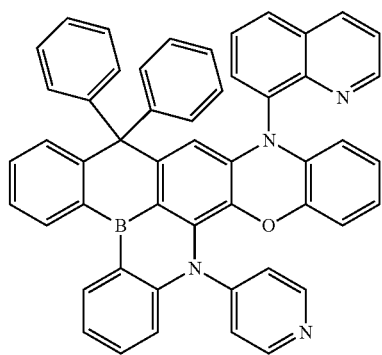
297
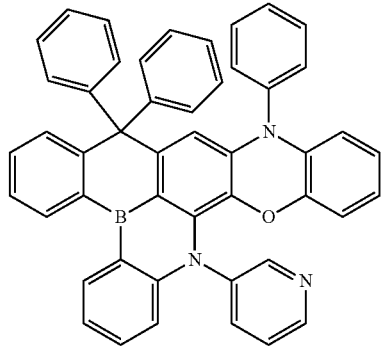
-continued
298
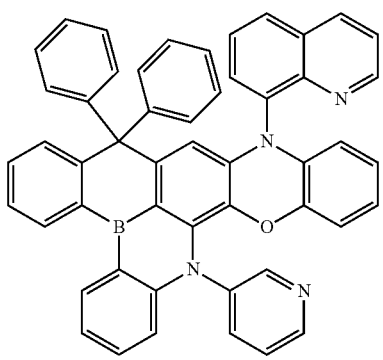
299
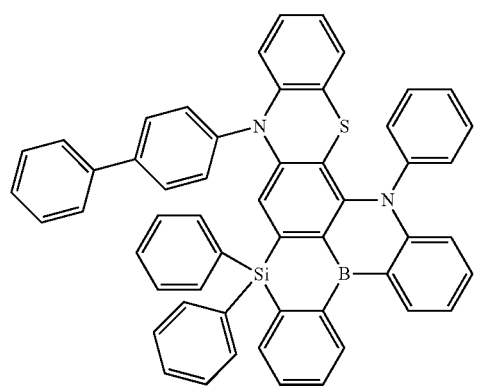
300
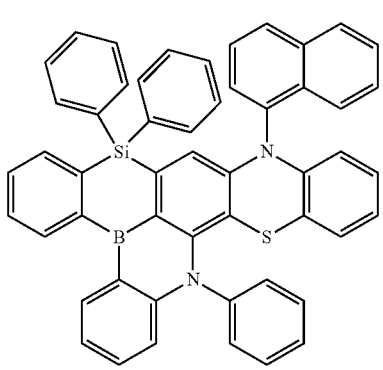
301
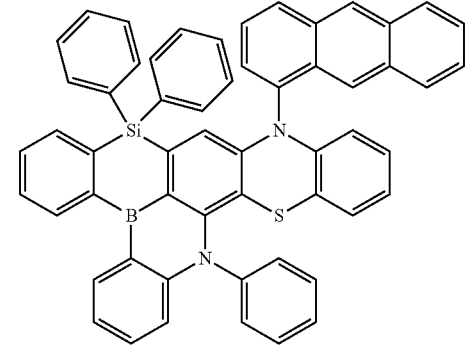

-continued
302
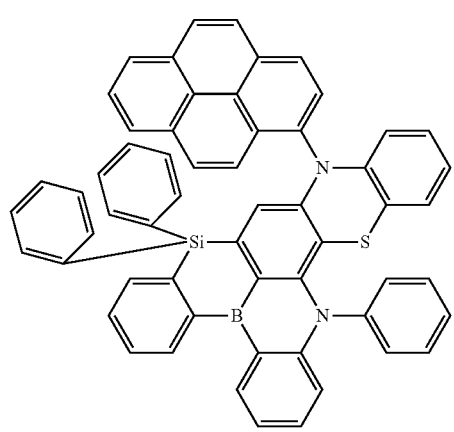
303
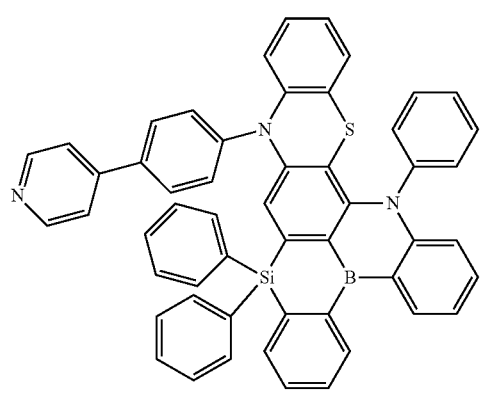
304
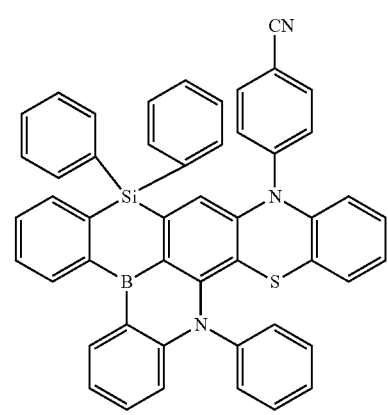
-continued
305
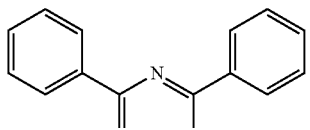
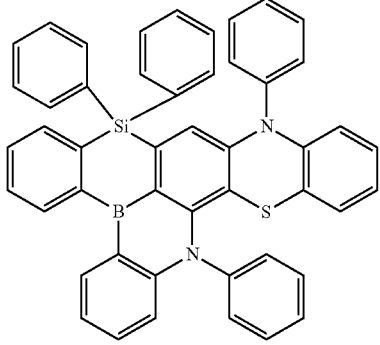
306
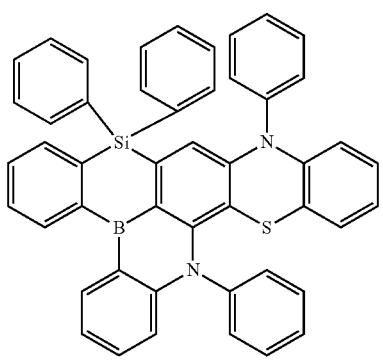
307
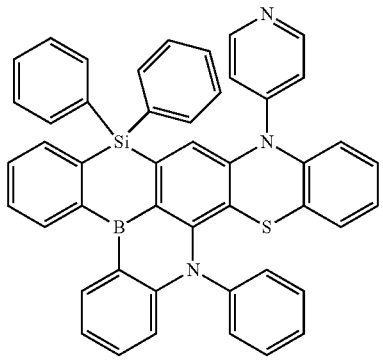
308
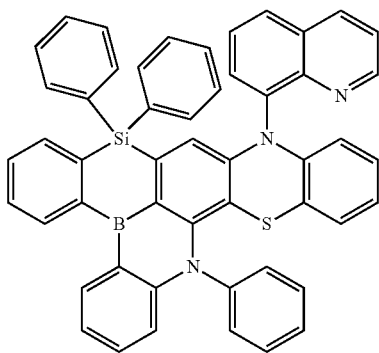

223
-continued
309
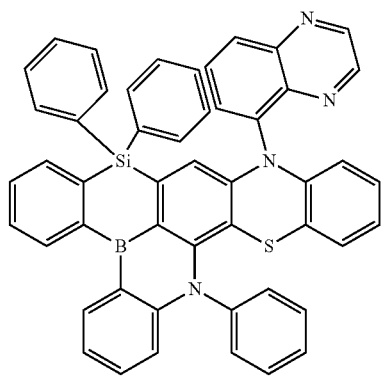
310
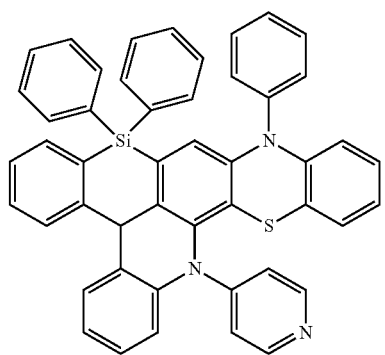
311
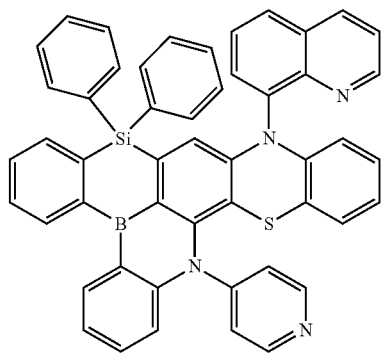
312
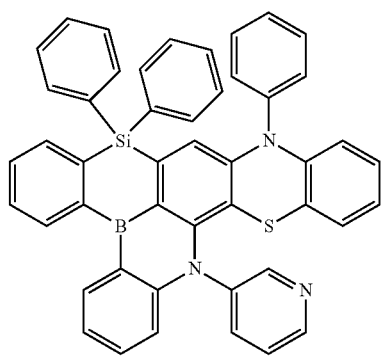
224
-continued
313
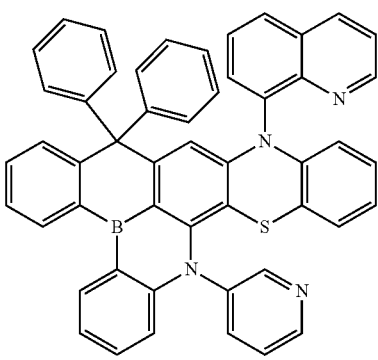
314
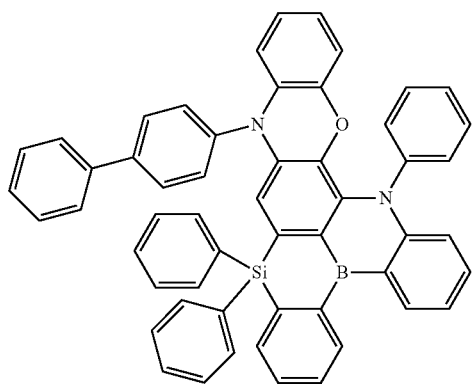
315
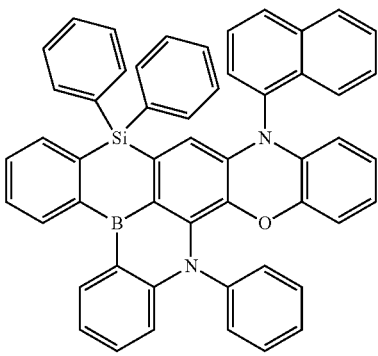
316
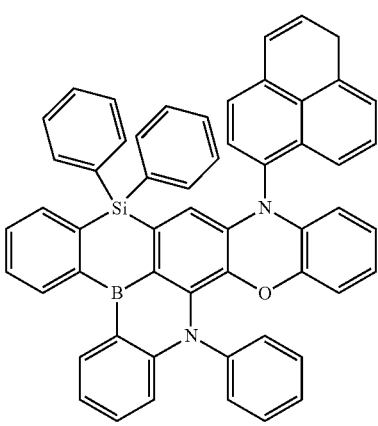

225
-continued
317
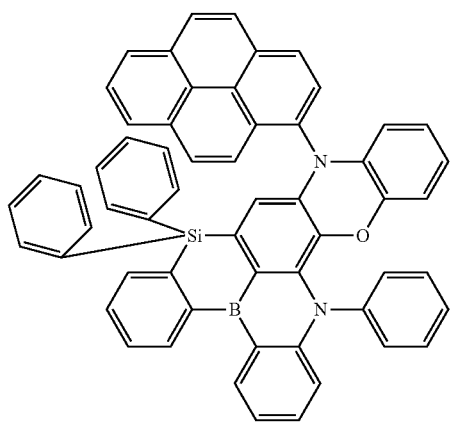
318
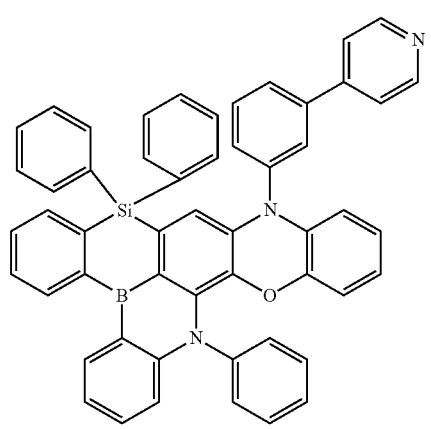
319
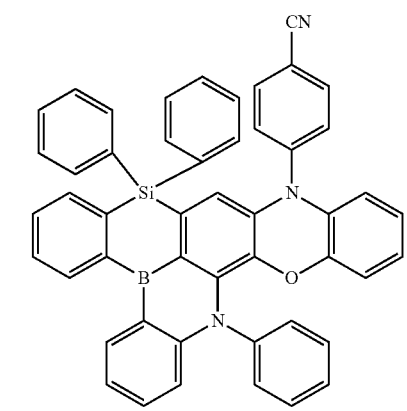
226
-continued
320
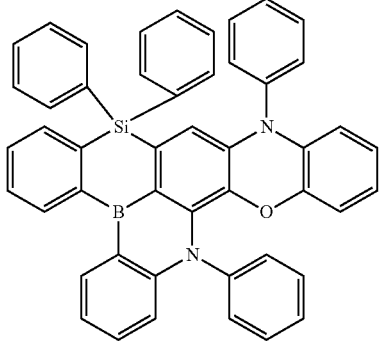
321
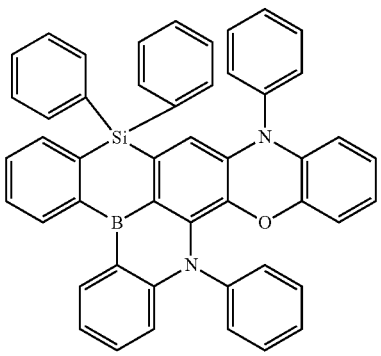
322
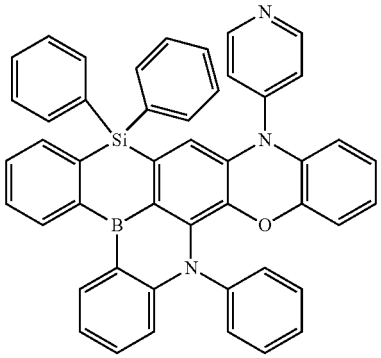
323
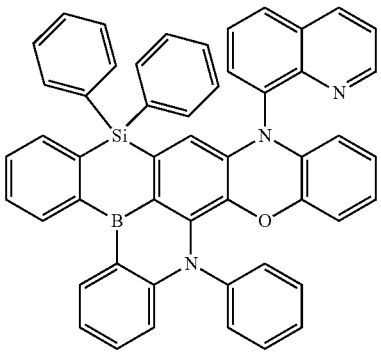

227
-continued
324
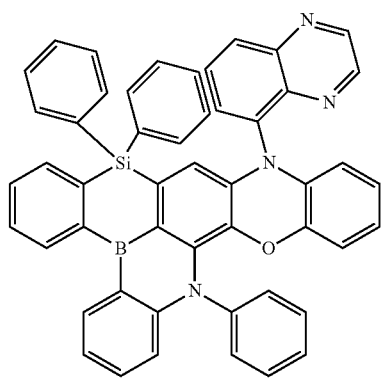
325
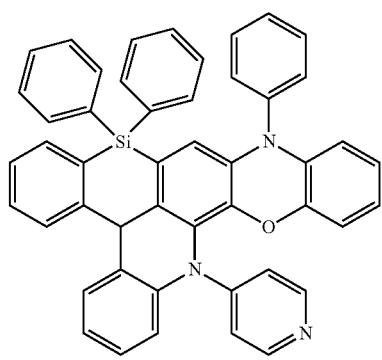
326
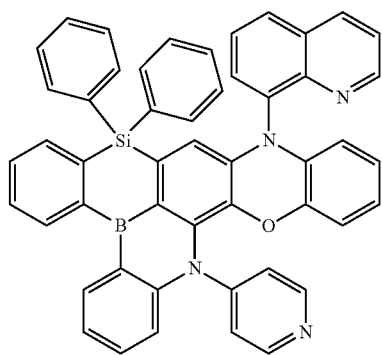
327
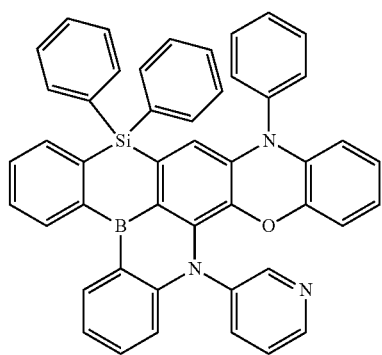
228
-continued
328
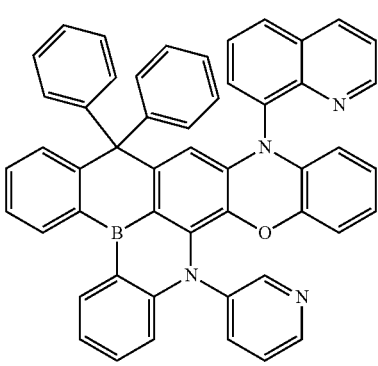
329
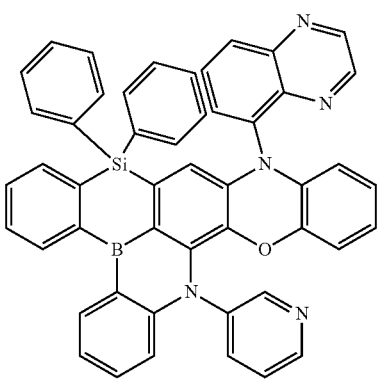
330
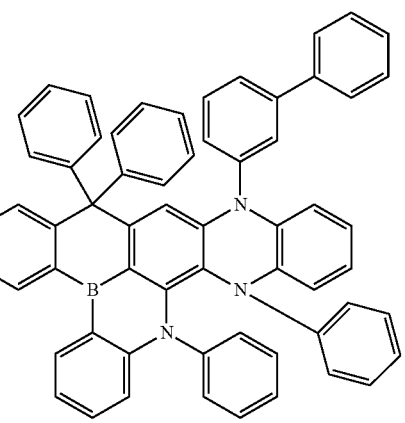
331
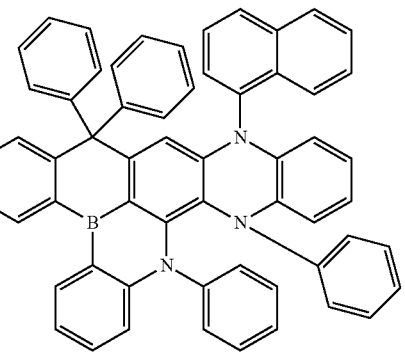

332
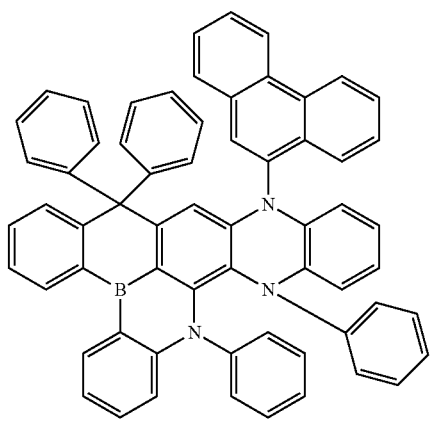
333
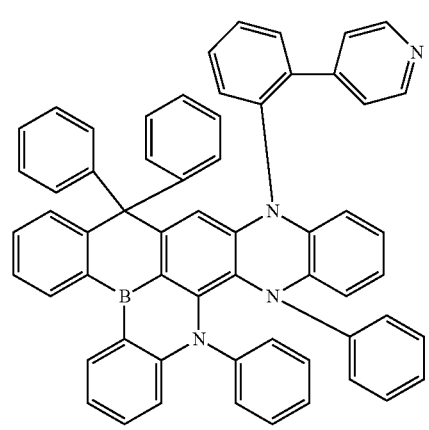
334
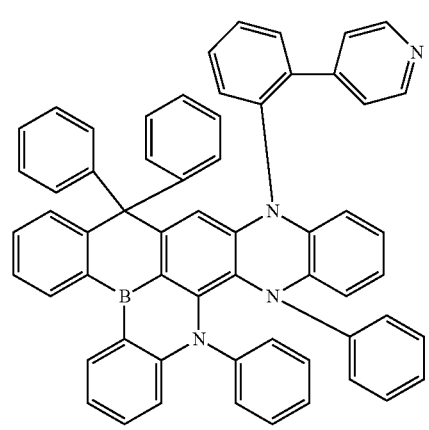
335
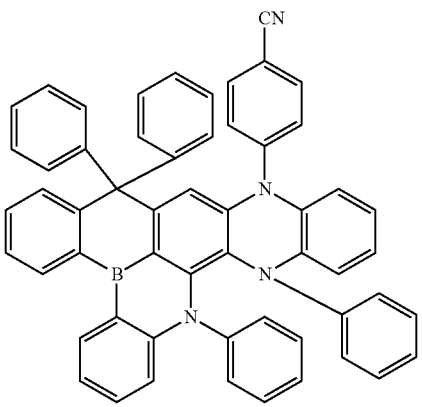
336
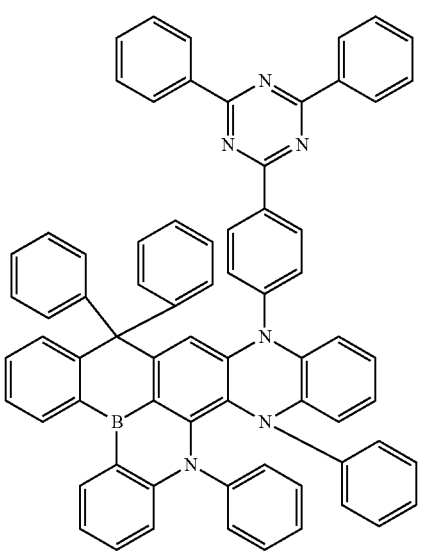
337